(12) United States Patent
Barzegar et al.

(10) Patent No.: US 11,082,091 B2
(45) Date of Patent: Aug. 3, 2021

(54) METHOD AND APPARATUS FOR COMMUNICATION UTILIZING ELECTROMAGNETIC WAVES AND A POWER LINE

(71) Applicant: AT&T Intellectual Property I, L.P., Atlanta, GA (US)

(72) Inventors: Farhad Barzegar, Branchburg, NJ (US); Giovanni Vannucci, Middletown, NJ (US); Paul Shala Henry, Holmdel, NJ (US); Thomas M. Willis, III, Tinton Falls, NJ (US); Irwin Gerszberg, Kendall Park, NJ (US); Robert Bennett, Southold, NY (US); Donald J. Barnickel, Flemington, NJ (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 0 days.

(21) Appl. No.: 16/203,899

(22) Filed: Nov. 29, 2018

(65) Prior Publication Data
US 2020/0177237 A1 Jun. 4, 2020

(51) Int. Cl.
*H04B 3/54* (2006.01)
*H04B 3/58* (2006.01)
(Continued)

(52) U.S. Cl.
CPC ........... *H04B 3/542* (2013.01); *H03H 7/0115* (2013.01); *H04B 3/04* (2013.01); *H04B 3/52* (2013.01);
(Continued)

(58) Field of Classification Search
CPC . H04B 3/542; H04B 3/52; H04B 3/04; H04B 3/58; H04B 3/548;
(Continued)

(56) References Cited

U.S. PATENT DOCUMENTS

| 2,542,980 A | 2/1951 | Barrow |
| 2,685,068 A | 7/1954 | Goubau |

(Continued)

FOREIGN PATENT DOCUMENTS

| CA | 2515560 A1 | 2/2007 |
| EP | 2568528 B1 | 12/2017 |

(Continued)

OTHER PUBLICATIONS

"International Search Report and Written Opinion", PCT/US2018/015634, dated Jun. 25, 2018, 8 pages.
(Continued)

*Primary Examiner* — Sam K Ahn
*Assistant Examiner* — Amneet Singh
(74) *Attorney, Agent, or Firm* — Guntin & Gust, PLC; Robert Gingher

(57) ABSTRACT

Aspects of the subject disclosure may include, a system for receiving communication signals that convey data, obtaining energy from a telecommunication line of a telecommunications network where an AC or DC power signal is injected into the telecommunication line and where the energy is utilized by at least a subset of components of a waveguide system, and transmitting electromagnetic waves that convey the data where the electromagnetic waves propagate along a power line of a power grid without requiring an electrical return path. Other embodiments are disclosed.

20 Claims, 93 Drawing Sheets

(51) Int. Cl.
*H04B 3/04* (2006.01)
*H04B 3/52* (2006.01)
*H03H 7/01* (2006.01)

(52) U.S. Cl.
CPC .............. *H04B 3/548* (2013.01); *H04B 3/58* (2013.01); *H04B 2203/5416* (2013.01)

(58) Field of Classification Search
CPC ............ H04B 2203/5416; H04B 5/005; H04B 5/0018; H04B 3/56; H04B 3/554; H04B 7/04; H04B 5/0012; H04B 10/807; H03H 7/0115; H04L 12/2854; H04L 12/2801; H04L 27/0002; H04L 12/10; H04L 12/28; Y02E 60/7892; Y02E 60/7815; Y04S 40/146; Y04S 40/121; H02J 13/002; G02B 6/12007; G02B 6/4246; G02B 6/4201; G02B 2006/12147; G02B 2006/12164; H04J 14/0227; H04J 14/02
See application file for complete search history.

(56) References Cited

U.S. PATENT DOCUMENTS

| | | |
|---|---|---|
| 2,737,632 A | 3/1956 | Grieg et al. |
| 2,770,783 A | 11/1956 | Thomas et al. |
| 2,852,753 A | 9/1958 | Walter et al. |
| 2,867,776 A | 1/1959 | Wilkinson, Jr. |
| 2,912,695 A | 11/1959 | Cutler |
| 2,921,277 A | 1/1960 | Goubau |
| 2,949,589 A | 8/1960 | Hafner |
| 3,201,724 A | 8/1965 | Hafner |
| 3,389,394 A | 6/1968 | Lewis et al. |
| 3,566,317 A | 2/1971 | Theodore |
| 3,588,754 A | 6/1971 | Theodore |
| 4,367,446 A | 1/1983 | Hall et al. |
| 4,730,172 A | 3/1988 | Bengeult |
| 4,783,665 A | 11/1988 | Lier et al. |
| 4,825,221 A | 4/1989 | Suzuki et al. |
| RE34,036 E | 8/1992 | McGeehan et al. |
| 5,642,121 A | 6/1997 | Martek et al. |
| 5,796,890 A | 8/1998 | Tsuji et al. |
| 5,889,449 A | 3/1999 | Fiedziuszko |
| 5,937,335 A | 8/1999 | Park et al. |
| 6,239,377 B1 | 5/2001 | Nishikawa et al. |
| 7,009,471 B2 | 3/2006 | Elmore |
| 7,043,271 B1 | 5/2006 | Seto et al. |
| 7,132,819 B1 * | 11/2006 | Cope ................ H04B 3/56 323/282 |
| 7,218,219 B2 | 5/2007 | Kline |
| 7,245,212 B2 | 7/2007 | Cope et al. |
| 7,280,033 B2 | 10/2007 | Berkman et al. |
| 7,301,424 B2 | 11/2007 | Suarez-gartner et al. |
| 7,345,623 B2 | 3/2008 | McEwan et al. |
| 7,567,154 B2 | 7/2009 | Elmore |
| 7,590,404 B1 | 9/2009 | Johnson et al. |
| 7,915,980 B2 | 3/2011 | Hardacker et al. |
| 7,925,235 B2 | 4/2011 | Konya et al. |
| 8,159,385 B2 | 4/2012 | Farneth et al. |
| 8,212,635 B2 | 7/2012 | Miller, II et al. |
| 8,237,617 B1 | 8/2012 | Johnson et al. |
| 8,253,516 B2 | 8/2012 | Miller, II et al. |
| 8,269,583 B2 | 9/2012 | Miller, II et al. |
| 8,344,829 B2 | 1/2013 | Miller, II et al. |
| 8,736,502 B1 | 5/2014 | Mehr et al. |
| 8,897,697 B1 | 11/2014 | Bennett et al. |
| 9,113,347 B2 | 8/2015 | Henry |
| 9,209,902 B2 | 12/2015 | Willis, III et al. |
| 9,312,919 B1 | 4/2016 | Barzegar et al. |
| 9,461,706 B1 | 10/2016 | Bennett et al. |
| 9,490,869 B1 | 11/2016 | Henry |
| 9,509,415 B1 | 11/2016 | Henry et al. |
| 9,520,945 B2 | 12/2016 | Gerszberg et al. |
| 9,525,524 B2 | 12/2016 | Barzegar et al. |
| 9,544,006 B2 | 1/2017 | Henry et al. |
| 9,564,947 B2 | 2/2017 | Stuckman et al. |
| 9,577,306 B2 | 2/2017 | Willis, III et al. |
| 9,608,692 B2 | 3/2017 | Willis, III et al. |
| 9,608,740 B2 | 3/2017 | Henry et al. |
| 9,615,269 B2 | 4/2017 | Henry et al. |
| 9,627,768 B2 | 4/2017 | Henry et al. |
| 9,628,116 B2 | 4/2017 | Willis, III et al. |
| 9,640,850 B2 | 5/2017 | Henry et al. |
| 9,653,770 B2 | 5/2017 | Henry et al. |
| 9,654,173 B2 | 5/2017 | Barzegar et al. |
| 9,680,670 B2 | 6/2017 | Henry et al. |
| 9,692,101 B2 | 6/2017 | Henry et al. |
| 9,705,561 B2 | 7/2017 | Henry et al. |
| 9,705,571 B2 | 7/2017 | Gerszberg et al. |
| 9,742,462 B2 | 8/2017 | Bennett et al. |
| 9,748,626 B2 | 8/2017 | Henry et al. |
| 9,749,053 B2 | 8/2017 | Henry et al. |
| 9,722,318 B2 | 9/2017 | Adriazola et al. |
| 9,768,833 B2 | 9/2017 | Fuchs et al. |
| 9,769,020 B2 | 9/2017 | Henry et al. |
| 9,780,834 B2 | 10/2017 | Henry et al. |
| 9,793,951 B2 | 10/2017 | Henry et al. |
| 9,793,954 B2 | 10/2017 | Bennett et al. |
| 9,847,566 B2 | 12/2017 | Henry et al. |
| 9,853,342 B2 | 12/2017 | Henry et al. |
| 9,860,075 B1 | 1/2018 | Gerszberg et al. |
| 9,865,911 B2 | 1/2018 | Henry et al. |
| 9,866,309 B2 | 1/2018 | Bennett et al. |
| 9,871,282 B2 | 1/2018 | Henry et al. |
| 9,871,283 B2 | 1/2018 | Henry et al. |
| 9,876,264 B2 | 1/2018 | Barnickel et al. |
| 9,876,570 B2 | 1/2018 | Henry et al. |
| 9,876,605 B1 | 1/2018 | Henry et al. |
| 9,882,257 B2 | 1/2018 | Henry et al. |
| 9,893,795 B1 | 2/2018 | Willis et al. |
| 9,912,381 B2 | 3/2018 | Bennett et al. |
| 9,917,341 B2 | 3/2018 | Henry et al. |
| 9,991,580 B2 | 6/2018 | Henry et al. |
| 9,997,819 B2 | 6/2018 | Bennett et al. |
| 9,998,172 B1 | 6/2018 | Barzegar et al. |
| 9,998,870 B1 | 6/2018 | Bennett et al. |
| 9,999,038 B2 | 6/2018 | Barzegar et al. |
| 10,003,364 B1 | 6/2018 | Willis, Iii et al. |
| 10,009,063 B2 | 6/2018 | Gerszberg et al. |
| 10,009,065 B2 | 6/2018 | Henry et al. |
| 10,009,067 B2 | 6/2018 | Birk et al. |
| 10,009,901 B2 | 6/2018 | Gerszberg |
| 10,027,397 B2 | 7/2018 | Kim |
| 10,027,427 B2 | 7/2018 | Vannucci et al. |
| 10,033,107 B2 | 7/2018 | Henry et al. |
| 10,033,108 B2 | 7/2018 | Henry et al. |
| 10,044,409 B2 | 8/2018 | Barzegar et al. |
| 10,051,483 B2 | 8/2018 | Barzegar et al. |
| 10,051,488 B1 | 8/2018 | Vannucci et al. |
| 10,062,970 B1 | 8/2018 | Vannucci et al. |
| 10,069,535 B2 | 9/2018 | Vannucci et al. |
| 10,079,661 B2 | 9/2018 | Gerszberg et al. |
| 10,090,606 B2 | 10/2018 | Henry et al. |
| 10,096,883 B2 | 10/2018 | Henry et al. |
| 10,097,241 B1 | 10/2018 | Bogdan et al. |
| 10,103,777 B1 | 10/2018 | Henry et al. |
| 10,103,801 B2 | 10/2018 | Bennett et al. |
| 10,123,217 B1 | 11/2018 | Barzegar et al. |
| 10,129,057 B2 | 11/2018 | Willis, Iii et al. |
| 10,135,145 B2 | 11/2018 | Henry et al. |
| 10,136,434 B2 | 11/2018 | Gerszberg et al. |
| 10,142,086 B2 | 11/2018 | Bennett et al. |
| 10,148,016 B2 | 12/2018 | Johnson et al. |
| 10,154,493 B2 | 12/2018 | Bennett et al. |
| 10,170,840 B2 | 1/2019 | Henry et al. |
| 10,171,158 B1 | 1/2019 | Barzegar et al. |
| 10,200,106 B1 | 2/2019 | Barzegar et al. |
| 10,205,212 B2 | 2/2019 | Henry et al. |
| 10,205,231 B1 | 2/2019 | Henry et al. |
| 10,205,655 B2 | 2/2019 | Barzegar et al. |
| 10,224,981 B2 | 3/2019 | Henry et al. |
| 10,230,426 B1 | 3/2019 | Henry et al. |
| 10,230,428 B1 | 3/2019 | Barzegar et al. |

(56) References Cited

U.S. PATENT DOCUMENTS

| | | |
|---|---|---|
| 10,243,270 B2 | 3/2019 | Henry et al. |
| 10,244,408 B1 | 3/2019 | Vannucci et al. |
| 10,264,586 B2 | 4/2019 | Beattie, Jr. et al. |
| 10,276,907 B2 | 4/2019 | Bennett et al. |
| 10,284,261 B1 | 5/2019 | Barzegar et al. |
| 10,291,286 B2 | 5/2019 | Henry et al. |
| 10,305,190 B2 | 5/2019 | Britz et al. |
| 10,305,192 B1 | 5/2019 | Rappaport |
| 10,305,197 B2 | 5/2019 | Henry et al. |
| 10,312,567 B2 | 6/2019 | Bennett |
| 10,320,586 B2 | 6/2019 | Henry et al. |
| 10,326,495 B1 | 6/2019 | Barzegar et al. |
| 10,340,573 B2 | 7/2019 | Johnson et al. |
| 10,340,600 B2 | 7/2019 | Henry et al. |
| 10,340,979 B1 | 7/2019 | Barzegar et al. |
| 10,348,391 B2 | 7/2019 | Bennett et al. |
| 10,355,745 B2 | 7/2019 | Henry et al. |
| 10,361,489 B2 | 7/2019 | Britz et al. |
| 10,371,889 B1 | 8/2019 | Barzegar et al. |
| 10,374,277 B2 | 8/2019 | Henry et al. |
| 10,374,278 B2 | 8/2019 | Henry et al. |
| 10,374,281 B2 | 8/2019 | Henry et al. |
| 10,374,316 B2 | 8/2019 | Bennett et al. |
| 10,389,029 B2 | 8/2019 | Henry et al. |
| 10,389,037 B2 | 8/2019 | Johnson et al. |
| 10,389,403 B2 | 8/2019 | Henry et al. |
| 10,389,419 B2 | 8/2019 | Johnson et al. |
| 10,405,199 B1 | 9/2019 | Henry et al. |
| 10,411,356 B2 | 9/2019 | Johnson et al. |
| 10,411,920 B2 | 9/2019 | Henry et al. |
| 10,418,678 B2 | 9/2019 | Henry et al. |
| 10,424,845 B2 | 9/2019 | Johnson et al. |
| 10,439,290 B2 | 10/2019 | Adriazola |
| 10,446,899 B2 | 10/2019 | Henry et al. |
| 10,446,936 B2 | 10/2019 | Henry et al. |
| 10,454,151 B2 | 10/2019 | Henry et al. |
| 10,469,156 B1 | 11/2019 | Barzegar et al. |
| 10,469,192 B2 | 11/2019 | Wolniansky et al. |
| 10,469,228 B2 | 11/2019 | Barzegar et al. |
| 10,498,589 B2 | 12/2019 | Barzegar et al. |
| 10,505,248 B2 | 12/2019 | Henry et al. |
| 10,505,249 B2 | 12/2019 | Henry et al. |
| 10,505,250 B2 | 12/2019 | Henry et al. |
| 10,505,252 B2 | 12/2019 | Stuckman et al. |
| 10,505,584 B1 | 12/2019 | Henry et al. |
| 10,511,346 B2 | 12/2019 | Henry et al. |
| 10,516,555 B2 | 12/2019 | Henry et al. |
| 10,523,269 B1 | 12/2019 | Henry et al. |
| 10,523,388 B2 | 12/2019 | Gerszberg et al. |
| 10,530,505 B2 | 1/2020 | Henry et al. |
| 10,547,545 B2 | 1/2020 | Barzegar et al. |
| 10,553,959 B2 | 2/2020 | Vannucci et al. |
| 10,553,960 B2 | 2/2020 | Vannucci et al. |
| 10,554,454 B2 | 2/2020 | Henry et al. |
| 10,555,249 B2 | 2/2020 | Barzegar et al. |
| 10,555,318 B2 | 2/2020 | Willis, Iii et al. |
| 10,560,152 B2 | 2/2020 | Birk et al. |
| 10,581,275 B2 | 3/2020 | Vannucci et al. |
| 10,587,310 B1 | 3/2020 | Bennett et al. |
| 10,601,494 B2 | 3/2020 | Vannucci |
| 10,608,312 B2 | 3/2020 | Henry et al. |
| 10,623,033 B1 | 4/2020 | Henry et al. |
| 10,623,056 B1 | 4/2020 | Bennett et al. |
| 10,623,057 B1 | 4/2020 | Bennett et al. |
| 10,629,995 B2 | 4/2020 | Rappaport |
| 10,637,149 B2 | 4/2020 | Britz |
| 10,637,535 B1 | 4/2020 | Vannucci et al. |
| 10,665,942 B2 | 5/2020 | Henry et al. |
| 10,673,116 B2 | 6/2020 | Henry et al. |
| 10,680,308 B2 | 6/2020 | Vannucci et al. |
| 10,686,493 B2 | 6/2020 | Barzegar et al. |
| 10,693,667 B2 | 6/2020 | Barzegar et al. |
| 10,714,824 B2 | 7/2020 | Bennett et al. |
| 10,714,831 B2 | 7/2020 | Vannucci et al. |
| 10,727,577 B2 | 7/2020 | Henry et al. |
| 10,727,583 B2 | 7/2020 | Henry et al. |
| 10,727,599 B2 | 7/2020 | Wolniansky |
| 10,727,955 B2 | 7/2020 | Barzegar et al. |
| 10,749,569 B2 | 8/2020 | Barzegar et al. |
| 10,749,570 B2 | 8/2020 | Bennett et al. |
| 10,763,916 B2 | 9/2020 | Henry et al. |
| 10,764,762 B2 | 9/2020 | Barzegar et al. |
| 10,778,286 B2 | 9/2020 | Henry et al. |
| 10,784,721 B2 | 9/2020 | Vannucci et al. |
| 10,790,569 B2 | 9/2020 | Bennett et al. |
| 10,790,593 B2 | 9/2020 | Bennett et al. |
| 10,804,959 B1 | 10/2020 | Bennett et al. |
| 10,804,962 B2 | 10/2020 | Britz |
| 10,811,767 B2 | 10/2020 | Henry et al. |
| 10,812,123 B1 | 10/2020 | Bennett et al. |
| 10,812,136 B1 | 10/2020 | Henry et al. |
| 10,812,139 B2 | 10/2020 | Barzegar et al. |
| 10,812,142 B2 | 10/2020 | Vannucci et al. |
| 10,812,143 B2 | 10/2020 | Vannucci et al. |
| 10,812,144 B1 | 10/2020 | Henry et al. |
| 10,812,174 B2 | 10/2020 | Bennett et al. |
| 10,812,291 B1 | 10/2020 | Barzegar et al. |
| 10,819,035 B2 | 10/2020 | Wolniansky |
| 10,819,391 B2 | 10/2020 | Rappaport et al. |
| 10,820,329 B2 | 10/2020 | Willis, Iii et al. |
| 10,833,727 B2 | 11/2020 | Nanni et al. |
| 10,833,730 B1 | 11/2020 | Barzegar et al. |
| 10,886,589 B1 | 1/2021 | Rappaport et al. |
| 10,930,992 B1 | 2/2021 | Barzegar et al. |
| 10,931,012 B2 | 2/2021 | Henry et al. |
| 2003/0151548 A1 | 8/2003 | Kingsley et al. |
| 2004/0110469 A1 | 6/2004 | Judd et al. |
| 2004/0113756 A1 | 6/2004 | Mollenkopf et al. |
| 2004/0169572 A1 | 9/2004 | Elmore et al. |
| 2004/0218688 A1 | 11/2004 | Santhoff et al. |
| 2005/0017825 A1 | 1/2005 | Hansen |
| 2005/0042989 A1 | 2/2005 | Ho et al. |
| 2005/0085259 A1 | 4/2005 | Conner et al. |
| 2005/0111533 A1 | 5/2005 | Berkman et al. |
| 2005/0258920 A1 | 11/2005 | Elmore et al. |
| 2006/0083269 A1 | 4/2006 | Kang et al. |
| 2006/0097573 A1 | 5/2006 | Gidge et al. |
| 2007/0229231 A1 | 10/2007 | Hurwitz et al. |
| 2008/0064331 A1 | 3/2008 | Washiro et al. |
| 2008/0125036 A1 | 5/2008 | Konya et al. |
| 2008/0211727 A1 | 9/2008 | Elmore et al. |
| 2008/0252541 A1 | 10/2008 | Diaz et al. |
| 2009/0008753 A1 | 1/2009 | Rofougaran |
| 2009/0079660 A1 | 3/2009 | Elmore et al. |
| 2009/0258652 A1 | 10/2009 | Lambert et al. |
| 2010/0033391 A1 | 2/2010 | McLean et al. |
| 2010/0225426 A1 | 9/2010 | Unger et al. |
| 2010/0277003 A1 | 11/2010 | Von et al. |
| 2011/0110404 A1 | 5/2011 | Washiro |
| 2011/0132658 A1 | 6/2011 | Miller, II et al. |
| 2011/0136432 A1 | 6/2011 | Miller, II et al. |
| 2011/0140911 A1 | 6/2011 | Pant et al. |
| 2011/0187578 A1 | 8/2011 | Farneth et al. |
| 2011/0215887 A1 | 9/2011 | Kunes |
| 2011/0243255 A1 | 10/2011 | Paoletti |
| 2012/0133373 A1 | 5/2012 | Ali et al. |
| 2012/0306587 A1 | 12/2012 | Strid et al. |
| 2013/0064311 A1 | 3/2013 | Turner et al. |
| 2013/0169499 A1 | 7/2013 | Lin et al. |
| 2014/0037077 A1 | 2/2014 | Marchetti |
| 2014/0155054 A1 | 6/2014 | Henry et al. |
| 2014/0167882 A1 | 6/2014 | Shinoda et al. |
| 2014/0176340 A1 | 6/2014 | Liang et al. |
| 2014/0285277 A1 | 9/2014 | Herbsommer et al. |
| 2015/0126107 A1 | 5/2015 | Robert et al. |
| 2015/0188584 A1 | 7/2015 | Laurent-Michel |
| 2016/0080839 A1 | 3/2016 | Fuchs et al. |
| 2016/0094879 A1 | 3/2016 | Gerszberg et al. |
| 2016/0112093 A1 | 4/2016 | Barzegar |
| 2016/0149614 A1 | 5/2016 | Barzegar |
| 2016/0164571 A1 | 6/2016 | Bennett et al. |
| 2016/0182096 A1 | 6/2016 | Panioukov et al. |
| 2016/0197642 A1 | 7/2016 | Henry et al. |
| 2016/0315660 A1 | 10/2016 | Henry |

(56) References Cited

U.S. PATENT DOCUMENTS

| | | |
|---|---|---|
| 2016/0315662 A1 | 10/2016 | Henry |
| 2016/0359530 A1* | 12/2016 | Bennett .............. H04B 7/15507 |
| 2016/0359541 A1 | 12/2016 | Bennett |
| 2016/0359546 A1 | 12/2016 | Bennett |
| 2016/0360533 A1 | 12/2016 | Bennett et al. |
| 2016/0365966 A1 | 12/2016 | Bennett et al. |
| 2017/0012667 A1 | 1/2017 | Bennett |
| 2017/0018852 A1 | 1/2017 | Adriazola et al. |
| 2017/0019130 A1 | 1/2017 | Henry et al. |
| 2017/0033465 A1 | 2/2017 | Henry et al. |
| 2017/0033953 A1 | 2/2017 | Paul et al. |
| 2017/0033954 A1 | 2/2017 | Henry et al. |
| 2017/0079037 A1 | 3/2017 | Gerszberg et al. |
| 2017/0079039 A1 | 3/2017 | Gerszberg et al. |
| 2017/0085003 A1 | 3/2017 | Johnson et al. |
| 2017/0093693 A1 | 3/2017 | Barzegar et al. |
| 2017/0110795 A1 | 4/2017 | Henry |
| 2017/0110804 A1 | 4/2017 | Henry et al. |
| 2017/0229782 A1 | 8/2017 | Adriazola et al. |
| 2018/0048497 A1 | 2/2018 | Henry et al. |
| 2018/0054232 A1 | 2/2018 | Henry et al. |
| 2018/0054233 A1 | 2/2018 | Henry et al. |
| 2018/0054234 A1 | 2/2018 | Stuckman et al. |
| 2018/0062886 A1 | 3/2018 | Paul et al. |
| 2018/0069594 A1 | 3/2018 | Henry et al. |
| 2018/0069731 A1 | 3/2018 | Henry et al. |
| 2018/0076515 A1* | 3/2018 | Perlman .................. H04B 1/38 |
| 2018/0076982 A1 | 3/2018 | Henry et al. |
| 2018/0076988 A1 | 3/2018 | Willis, III et al. |
| 2018/0077709 A1 | 3/2018 | Gerszberg |
| 2018/0108997 A1 | 4/2018 | Henry et al. |
| 2018/0108998 A1 | 4/2018 | Henry et al. |
| 2018/0108999 A1 | 4/2018 | Henry et al. |
| 2018/0115040 A1 | 4/2018 | Bennett et al. |
| 2018/0115058 A1 | 4/2018 | Henry et al. |
| 2018/0115060 A1 | 4/2018 | Bennett et al. |
| 2018/0115075 A1 | 4/2018 | Bennett et al. |
| 2018/0115081 A1 | 4/2018 | Johnson et al. |
| 2018/0123207 A1 | 5/2018 | Henry et al. |
| 2018/0123208 A1 | 5/2018 | Henry et al. |
| 2018/0123643 A1 | 5/2018 | Henry et al. |
| 2018/0123836 A1 | 5/2018 | Henry et al. |
| 2018/0151957 A1 | 5/2018 | Bennett et al. |
| 2018/0159195 A1 | 6/2018 | Henry et al. |
| 2018/0159196 A1 | 6/2018 | Henry et al. |
| 2018/0159228 A1 | 6/2018 | Britz et al. |
| 2018/0159229 A1 | 6/2018 | Britz |
| 2018/0159230 A1 | 6/2018 | Henry et al. |
| 2018/0159232 A1 | 6/2018 | Henry et al. |
| 2018/0159235 A1 | 6/2018 | Wolniansky |
| 2018/0159238 A1 | 6/2018 | Wolniansky |
| 2018/0159240 A1 | 6/2018 | Henry et al. |
| 2018/0159243 A1 | 6/2018 | Britz et al. |
| 2018/0166761 A1 | 6/2018 | Henry et al. |
| 2018/0166784 A1 | 6/2018 | Johnson et al. |
| 2018/0166785 A1 | 6/2018 | Henry et al. |
| 2018/0166787 A1 | 6/2018 | Johnson et al. |
| 2018/0166920 A1 | 6/2018 | Britz et al. |
| 2018/0167130 A1 | 6/2018 | Vannucci |
| 2018/0167927 A1 | 6/2018 | Beattie, Jr. et al. |
| 2018/0219579 A1 | 8/2018 | Britz et al. |
| 2018/0302162 A1 | 10/2018 | Gerszberg et al. |
| 2019/0013577 A1 | 1/2019 | Henry et al. |
| 2019/0074563 A1 | 3/2019 | Henry et al. |
| 2019/0074580 A1 | 3/2019 | Henry et al. |
| 2019/0074864 A1 | 3/2019 | Henry et al. |
| 2019/0074865 A1 | 3/2019 | Henry et al. |
| 2019/0074878 A1 | 3/2019 | Henry et al. |
| 2019/0075470 A1 | 3/2019 | Bennett et al. |
| 2019/0081747 A1 | 3/2019 | Barzegar et al. |
| 2019/0104012 A1 | 4/2019 | Barzegar et al. |
| 2019/0104419 A1 | 4/2019 | Barzegar et al. |
| 2019/0104420 A1 | 4/2019 | Barzegar et al. |
| 2019/0123442 A1 | 4/2019 | Vannucci et al. |
| 2019/0123783 A1 | 4/2019 | Henry et al. |
| 2019/0131717 A1 | 5/2019 | Vannucci |
| 2019/0131718 A1 | 5/2019 | Vannucci |
| 2019/0140679 A1 | 5/2019 | Vannucci et al. |
| 2019/0141714 A1 | 5/2019 | Willis, Iii et al. |
| 2019/0150072 A1 | 5/2019 | Barzegar |
| 2019/0173601 A1 | 6/2019 | Wolniansky et al. |
| 2019/0174506 A1 | 6/2019 | Willis, Iii et al. |
| 2019/0181532 A1 | 6/2019 | Vannucci et al. |
| 2019/0181683 A1 | 6/2019 | Vannucci et al. |
| 2019/0296430 A1 | 9/2019 | Bennett et al. |
| 2019/0305413 A1 | 10/2019 | Henry et al. |
| 2019/0305592 A1 | 10/2019 | Vannucci et al. |
| 2019/0305820 A1 | 10/2019 | Barzegar et al. |
| 2019/0306057 A1 | 10/2019 | Barzegar et al. |
| 2020/0014423 A1 | 1/2020 | Britz |
| 2020/0076088 A1 | 3/2020 | Bennett et al. |
| 2020/0083744 A1 | 3/2020 | Vannucci et al. |
| 2020/0083927 A1 | 3/2020 | Henry et al. |
| 2020/0106477 A1 | 4/2020 | Nanni et al. |
| 2020/0119934 A1 | 4/2020 | Barzegar et al. |
| 2020/0153095 A1 | 5/2020 | Henry et al. |
| 2020/0153096 A1 | 5/2020 | Henry et al. |
| 2020/0161757 A1 | 5/2020 | Henry |
| 2020/0174185 A1 | 6/2020 | Barzegar et al. |
| 2020/0174189 A1 | 6/2020 | Barzegar et al. |
| 2020/0176847 A1 | 6/2020 | Rappaport et al. |
| 2020/0176848 A1 | 6/2020 | Bennett et al. |
| 2020/0176875 A1 | 6/2020 | Johnson |
| 2020/0176879 A1 | 6/2020 | Wolniansky et al. |
| 2020/0176881 A1 | 6/2020 | Britz et al. |
| 2020/0176888 A1 | 6/2020 | Henry et al. |
| 2020/0176890 A1 | 6/2020 | Rappaport et al. |
| 2020/0177234 A1 | 6/2020 | Barzegar et al. |
| 2020/0177238 A1 | 6/2020 | Barzegar et al. |
| 2020/0177239 A1 | 6/2020 | Henry et al. |
| 2020/0194863 A1 | 6/2020 | Bennett et al. |
| 2020/0195302 A1 | 6/2020 | Vannucci et al. |
| 2020/0195303 A1 | 6/2020 | Vannucci et al. |
| 2020/0195304 A1 | 6/2020 | Vannucci et al. |
| 2020/0366534 A1 | 11/2020 | Wolniansky et al. |

FOREIGN PATENT DOCUMENTS

| | | |
|---|---|---|
| EP | 1898532 B1 | 12/2018 |
| WO | 8605327 A1 | 9/1986 |
| WO | 2004054159 A2 | 6/2004 |
| WO | 2013008292 A1 | 1/2013 |
| WO | 2015069431 A2 | 5/2015 |
| WO | 2016171914 A1 | 10/2016 |
| WO | 2018106455 A1 | 6/2018 |
| WO | 2018106684 A1 | 6/2018 |
| WO | 2018106915 A1 | 6/2018 |
| WO | 2019050752 A1 | 3/2019 |

OTHER PUBLICATIONS

"Introducing the Power Over Fiber System (PoF)", RLH Industries, Inc., Fiber Optic Link, https://www.fiberopticlink.com/introducing-the-power-over-fiber-system-pof/, 2 pp., 2018.

Akalin, Tahsin et al., "Single-Wire Transmission Lines at Terahertz Frequencies", IEEE Transactions on Microwave Theory and Techniques, vol. 54, No. 6, 2006, 2762-2767.

Alam, M. N. et al., "Novel Surface Wave Exciters for Power Line Fault Detection and Communications", Department of Electrical Engineering, University of South Carolina, Antennas and Propagation (APSURSI), 2011 IEEE International Symposium, IEEE, 2011, 1-4.

Barlow, H. M. et al., "Surface Waves", 621.396.11 : 538.566, Paper No. 1482 Radio Section, 1953, pp. 329-341.

Corridor Systems, "A New Approach to Outdoor DAS Network Physical Layer Using E-Line Technology", Mar. 2011, 5 pages.

Elmore, Glenn et al., "A Surface Wave Transmission Line", QEX, May/Jun. 2012, pp. 3-9.

Elmore, Glenn, "Introduction to the Propagating Wave on a Single Conductor", www.corridor.biz, Jul. 27, 2009, 30 pages.

(56) References Cited

OTHER PUBLICATIONS

Friedman, M et al., "Low-Loss RF Transport Over Long Distances", IEEE Transactions on Microwave Theory and Techniques, vol. 49, No. 2, Feb. 2001, 8 pages.
Goubau, Georg et al., "Investigation of a Surface-Wave Line for Long Distance Transmission", 1952, 263-267.
Goubau, Georg et al., "Investigations with a Model Surface Wave Transmission Line", IRE Transactions on Antennas and Propagation, 1957, 222-227.
Goubau, Georg, "Open Wire Lines", IRE Transactions on Microwave Theory and Techniques, 1956, 197-200.
Goubau, Georg, "Single-Conductor Surface-Wave Transmission Lines", Proceedings of the I.R.E., 1951, 619-624.
Goubau, Georg, "Surface Waves and Their Application to Transmission Lines", Radio Communication Branch, Coles Signal Laboratory, Mar. 10, 1950, 1119-1128.
Goubau, Georg, "Waves on Interfaces", IRE Transactions on Antennas and Propagation, Dec. 1959, 140-146.
Ren-Bin, Zhong et al., "Surface plasmon wave propagation along single metal wire", Chin. Phys. B, vol. 21, No. 11, May 2, 2012, 9 pages.
Sommerfeld, A., "On the propagation of electrodynamic waves along a wire", Annals of Physics and Chemistry New Edition, vol. 67, No. 2, 1899, 72 pages.
Wang, Hao et al., "Dielectric Loaded Substrate Integrated Waveguide (SIW)—Plan Horn Antennas", IEEE Transactions on Antennas and Propagation, IEEE Service Center, Piscataway, NJ, US, vol. 56, No. 3, Mar. 1, 2010, 640-647.
Wang, Kanglin, "Dispersion of Surface Plasmon Polaritons on Metal Wires in the Terahertz Frequency Range", Physical Review Letters, PRL 96, 157401, 2006, 4 pages.
Villaran, Michael et al., "Condition Monitoring of Cables Task 3 Report: Condition Monitoring Techniques for Electric Cables", Brookhaven National Laboratory, Technical Report, Nov. 30, 2009, 89 pages.

\* cited by examiner

300

400

500

550

600

700

800

900

950

1100

1200

1300

E-field Intensity Pattern

Antenna Gain Pattern

INTEGRATED DIELECTRIC ANTENNA

ASSEMBLED DIELECTRIC ANTENNA

Antenna Array Using Pyramidal Horns

2100

2120

2151

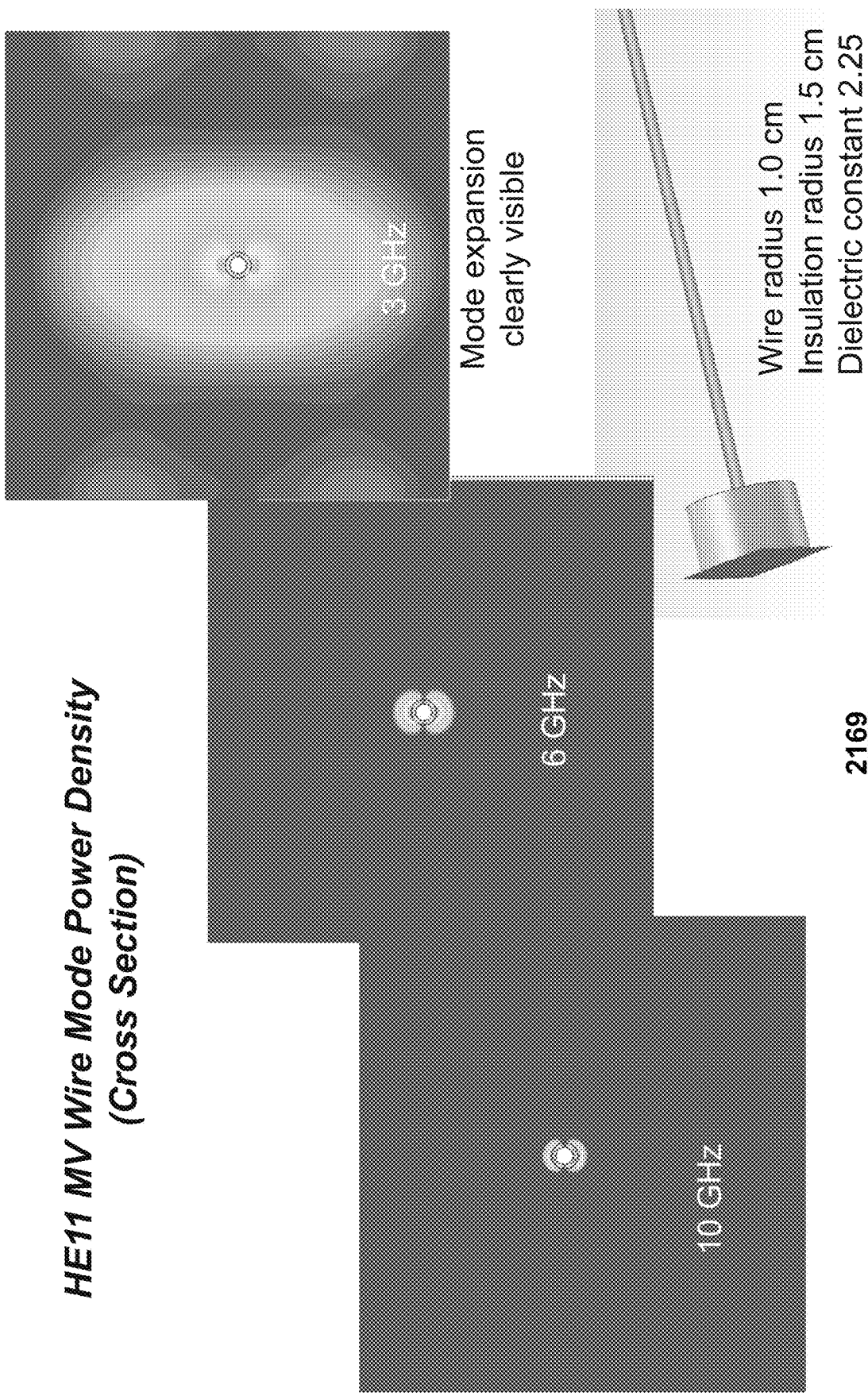

*HE11 Mode Launcher*

*HE11 Mode Launcher*

2560

Dry Uninsulated Conductor

Wet Uninsulated Conductor

Wet Uninsulated Conductor

2900

2900

3600

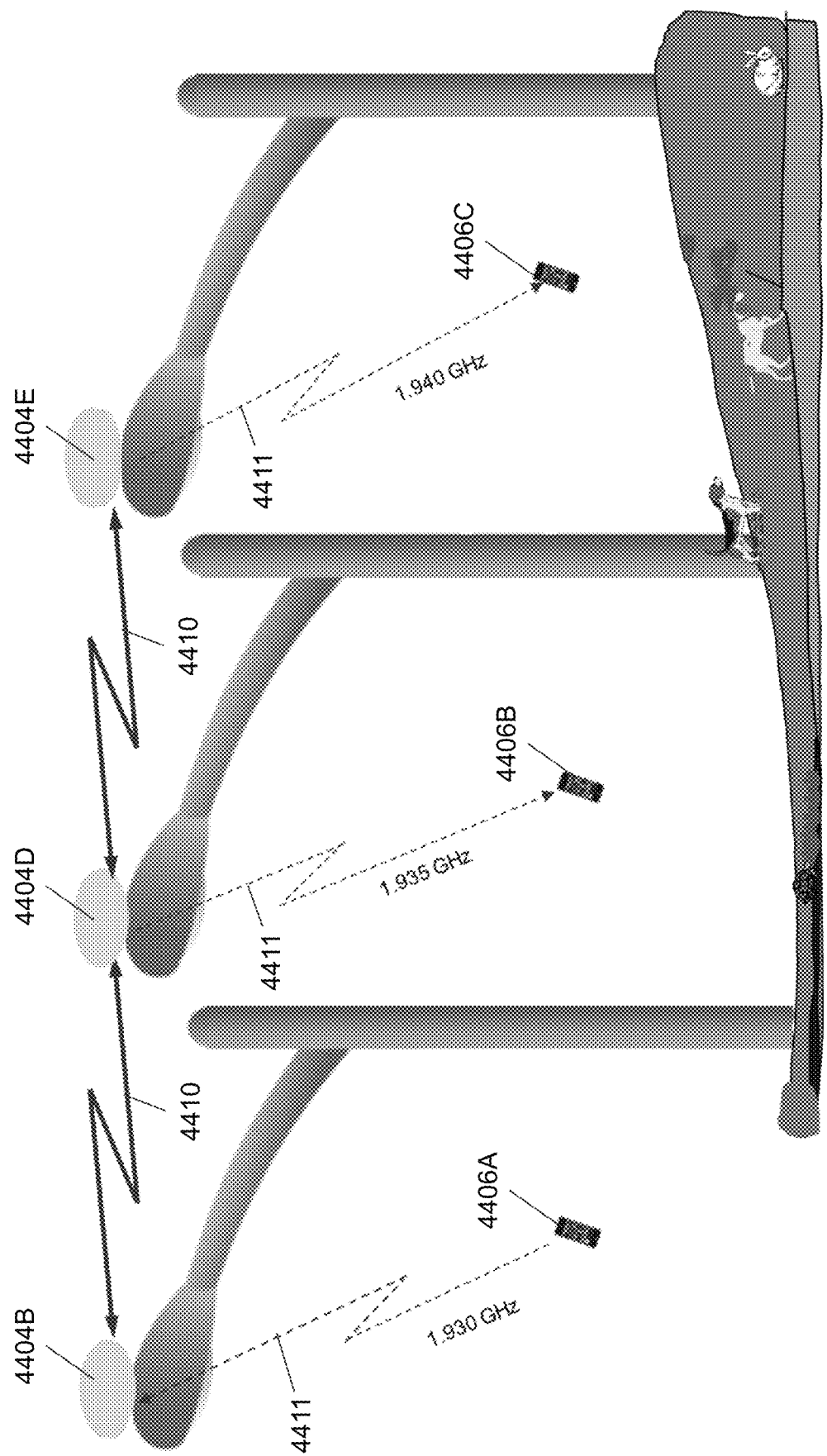

4460

4470

4610

4630

4640

4770C

4790

4796

METHOD AND APPARATUS FOR COMMUNICATION UTILIZING ELECTROMAGNETIC WAVES AND A POWER LINE

FIELD OF THE DISCLOSURE

The subject disclosure relates to methods and apparatus for communication utilizing electromagnetic waves and a power line.

BACKGROUND

As smart phones and other portable devices increasingly become ubiquitous, and data usage increases, macrocell base station devices and existing wireless infrastructure in turn require higher bandwidth capability in order to address the increased demand. To provide additional mobile bandwidth, small cell deployment is being pursued, with microcells and picocells providing coverage for much smaller areas than traditional macrocells.

In addition, most homes and businesses have grown to rely on broadband data access for services such as voice, video and Internet browsing, etc. Broadband access networks include satellite, 4G or 5G wireless, power line communication, fiber, cable, and telephone networks.

BRIEF DESCRIPTION OF THE DRAWINGS

Reference will now be made to the accompanying drawings, which are not necessarily drawn to scale, and wherein:

FIG. 21D is a block diagram illustrating an example, non-limiting embodiment of mode sizes of hybrid waves at various operating frequencies in accordance with various aspects described herein.

FIG. 44B is a block diagram illustrating an example, non-limiting embodiment of a portion of the communication system of FIG. 44A in accordance with various aspects described herein.

DETAILED DESCRIPTION

Figure 1:
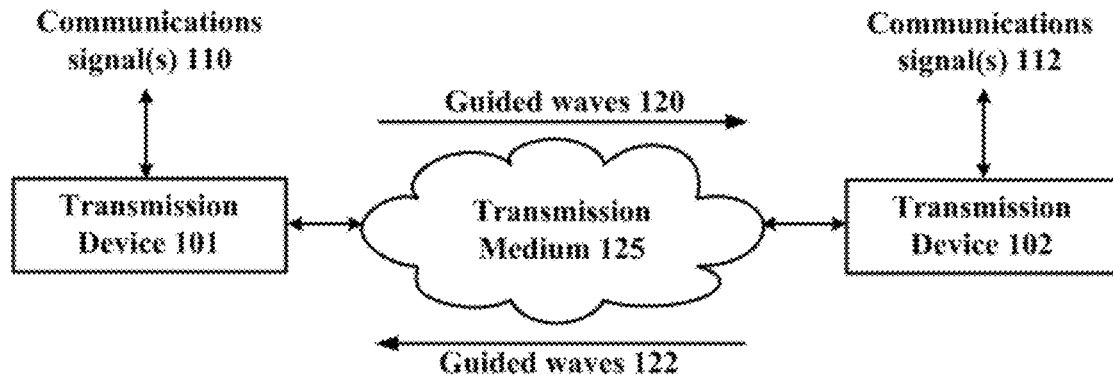
FIG. 1 is a block diagram illustrating an example, non-limiting embodiment of a guided-wave communications system in accordance with various aspects described herein.

One or more embodiments are now described with reference to the drawings, wherein like reference numerals are used to refer to like elements throughout the drawings. In the following description, for purposes of explanation, numerous details are set forth in order to provide a thorough understanding of the various embodiments. It is evident, however, that the various embodiments can be practiced without these details (and without applying to any particular networked environment or standard).

In an embodiment, a guided wave communication system is presented for sending and receiving communication signals such as data or other signaling via guided electromagnetic waves. The guided electromagnetic waves include, for example, surface waves or other electromagnetic waves that are bound to or guided by a transmission medium as described herein. It will be appreciated that a variety of transmission media can be utilized with guided wave communications without departing from example embodiments. Examples of such transmission media can include one or more of the following, either alone or in one or more combinations: wires, whether insulated or not, and whether single-stranded or multi-stranded; conductors of other shapes or configurations including unshielded twisted pair cables including single twisted pairs, Category 5e and other twisted pair cable bundles, other wire bundles, cables, rods, rails, pipes; non-conductors such as dielectric pipes, rods, rails, or other dielectric members; combinations of conductors and dielectric materials such as coaxial cables; or other guided wave transmission media.

The inducement of guided electromagnetic waves that propagate along a transmission medium can be independent of any electrical potential, charge or current that is injected or otherwise transmitted through the transmission medium as part of an electrical circuit. For example, in the case where the transmission medium is a wire, it is to be appreciated that while a small current in the wire may be formed in response to the propagation of the electromagnetic waves guided along the wire, this can be due to the propagation of the electromagnetic wave along the wire surface, and is not formed in response to electrical potential, charge or current that is injected into the wire as part of an electrical circuit. The electromagnetic waves traveling along the wire therefore do not require an electrical circuit (i.e., ground or other electrical return path) to propagate along the wire surface. The wire therefore is a single wire transmission line that is not part of an electrical circuit. For example, electromagnetic waves can propagate along a wire configured as an electrical open circuit. Also, in some embodiments, a wire is not necessary, and the electromagnetic waves can propagate along a single line transmission medium that is not a wire including a single line transmission medium that is conductorless. Accordingly, electromagnetic waves can propagate along a physical transmission medium without requiring an electrical return path.

More generally, "guided electromagnetic waves" or "guided waves" as described by the subject disclosure are affected by the presence of a physical object that is at least a part of the transmission medium (e.g., a bare wire or other conductor, a dielectric including a dielectric core without a conductive shield and/or without an inner conductor, an insulated wire, a conduit or other hollow element whether conductive or not, a bundle of insulated wires that is coated, covered or surrounded by a dielectric or insulator or other wire bundle, or another form of solid, liquid or otherwise non-gaseous transmission medium) so as to be at least partially bound to or guided by the physical object and so as to propagate along a transmission path of the physical object. Such a physical object can operate as at least a part of a transmission medium that guides, by way of one or more interfaces of the transmission medium (e.g., an outer surface, inner surface, an interior portion between the outer and the inner surfaces or other boundary between elements of the transmission medium). In this fashion, a transmission medium may support multiple transmission paths over different surfaces of the transmission medium. For example, a stranded cable or wire bundle may support electromagnetic waves that are guided by the outer surface of the stranded cable or wire bundle, as well as electromagnetic waves that are guided by inner cable surfaces between two, three or more individual strands or wires within the stranded cable or wire bundle. For example, electromagnetic waves can be guided within interstitial areas of a stranded cable, insulated twisted pair wires, or a wire bundle. The guided electromagnetic waves of the subject disclosure are launched from a sending (transmitting) device and propagate along the transmission medium for reception by at least one receiving device. The propagation of guided electromagnetic waves, can carry energy, data and/or other signals along the transmission path from the sending device to the receiving device.

As used herein the term "conductor" (based on a definition of the term "conductor" from *IEEE* 100, *the Authoritative Dictionary of IEEE Standards Terms*, 7$^{th}$ Edition, 2000) means a substance or body that allows a current of electricity to pass continuously along it. The terms "insulator", "conductorless" or "nonconductor" (based on a definition of the term "insulator" from *IEEE* 100, *the Authoritative Dictionary of IEEE Standards Terms*, 7$^{th}$ Edition, 2000) means a device or material in which electrons or ions cannot be moved easily. It is possible for an insulator, or a conductorless or nonconductive material to be intermixed intentionally (e.g., doped) or unintentionally into a resulting substance with a small amount of another material having the properties of a conductor. However, the resulting substance may remain substantially resistant to a flow of a continuous electrical current along the resulting substance. Furthermore, a conductorless member such as a dielectric rod or other conductorless core lacks an inner conductor and a conductive shield. As used herein, the term "eddy current" (based on a definition of the term "conductor" from *IEEE* 100, *the Authoritative Dictionary of IEEE Standards Terms*, 7$^{th}$ Edition, 2000) means a current that circulates in a metallic material as a result of electromotive forces induced by a variation of magnetic flux. Although it may be possible for an insulator, conductorless or nonconductive material in the foregoing embodiments to allow eddy currents that circulate within the doped or intermixed conductor and/or a very small continuous flow of an electrical current along the extent of the insulator, conductorless or nonconductive material, any such continuous flow of electrical current along such an insulator, conductorless or nonconductive material is de minimis compared to the flow of an electrical current along a conductor. Accordingly, in the subject disclosure an insulator, and a conductorless or nonconductor material are not considered to be a conductor. The term "dielectric" means an insulator that can be polarized by an applied electric field. When a dielectric is placed in an electric field, electric charges do not continuously flow through the material as they do in a conductor, but only slightly shift from their average equilibrium positions causing dielectric polarization. The terms "conductorless transmission medium or non-conductor transmission medium" can mean a transmission medium consisting of any material (or combination of materials) that may or may not contain one or more conductive elements but lacks a continuous conductor between the sending and receiving devices along the conductorless transmission medium or non-conductor transmission medium—similar or identical to the aforementioned properties of an insulator, conductorless or nonconductive material.

Unlike free space propagation of wireless signals such as unguided (or unbounded) electromagnetic waves that decrease in intensity inversely by the square of the distance traveled by the unguided electromagnetic waves, guided electromagnetic waves can propagate along a transmission medium with less loss in magnitude per unit distance than experienced by unguided electromagnetic waves.

Unlike electrical signals, guided electromagnetic waves can propagate along different types of transmission media from a sending device to a receiving device without requiring a separate electrical return path between the sending device and the receiving device. As a consequence, guided electromagnetic waves can propagate from a sending device to a receiving device along a conductorless transmission medium including a transmission medium having no conductive components (e.g., a dielectric strip, rod, or pipe), or via a transmission medium having no more than a single conductor (e.g., a single bare wire or insulated wire configured in an open electrical circuit). Even if a transmission medium includes one or more conductive components and the guided electromagnetic waves propagating along the transmission medium generate currents that flow in the one or more conductive components in a direction of the guided electromagnetic waves, such guided electromagnetic waves can propagate along the transmission medium from a sending device to a receiving device without requiring a flow of opposing currents on an electrical return path between the sending device and the receiving device (i.e., in an electrical open circuit configuration).

In a non-limiting illustration, consider electrical systems that transmit and receive electrical signals between sending and receiving devices by way of conductive media. Such systems generally rely on an electrical forward path and an electrical return path. For instance, consider a coaxial cable having a center conductor and a ground shield that are separated by an insulator. Typically, in an electrical system a first terminal of a sending (or receiving) device can be connected to the center conductor, and a second terminal of the sending (or receiving) device can be connected to the ground shield or other second conductor. If the sending device injects an electrical signal in the center conductor via the first terminal, the electrical signal will propagate along the center conductor causing forward currents in the center conductor, and return currents in the ground shield or other second conductor. The same conditions apply for a two terminal receiving device.

In contrast, consider a guided wave communication system such as described in the subject disclosure, which can utilize different embodiments of a transmission medium (including among others a coaxial cable) for transmitting and receiving guided electromagnetic waves without requiring an electrical return path. In one embodiment, for example, the guided wave communication system of the subject disclosure can be configured to induce guided electromagnetic waves that propagate along an outer surface of a coaxial cable. Although the guided electromagnetic waves can cause forward currents on the ground shield, the guided electromagnetic waves do not require return currents on, for example, the center conductor to enable the guided electromagnetic waves to propagate along the outer surface of the coaxial cable. The same can be said of other transmission media used by a guided wave communication system for the transmission and reception of guided electromagnetic waves. For example, guided electromagnetic waves induced by the guided wave communication system on a bare wire, an insulated wire, or a dielectric transmission medium (e.g., a dielectric core with no conductive materials), can propagate along the bare wire, the insulated bare wire, or the dielectric transmission medium without requiring return currents on an electrical return path.

Consequently, electrical systems that require forward and return conductors for carrying corresponding forward and reverse currents on conductors to enable the propagation of electrical signals injected by a sending device are distinct from guided wave systems that induce guided electromagnetic waves on an interface of a transmission medium without requiring an electrical return path to enable the propagation of the guided electromagnetic waves along the interface of the transmission medium. It is also noted that a transmission medium having an electrical return path (e.g., ground) for purposes of conducting currents (e.g., a power line) can be used to contemporaneously propagate electromagnetic waves along the transmission medium. However, the propagation of the electromagnetic waves is not dependent on the electrical currents flowing through the transmission medium. For example, if the electrical currents flowing through the transmission medium stop flowing for any reason (e.g., a power outage), electromagnetic waves propagating along the transmission medium can continue to propagate without interruption.

It is further noted that guided electromagnetic waves as described in the subject disclosure can have an electromagnetic field structure that lies primarily or substantially on an outer surface of a transmission medium so as to be bound to or guided by the outer surface of the transmission medium and so as to propagate non-trivial distances on or along the outer surface of the transmission medium. In other embodiments, guided electromagnetic waves can have an electromagnetic field structure that substantially lies above an outer surface of a transmission medium, but is nonetheless bound to or guided by the transmission medium and so as to propagate non-trivial distances on or along the transmission medium. In other embodiments, guided electromagnetic waves can have an electromagnetic field structure that has a field strength that is de minimis at the outer surface, below the outer surface, and/or in proximity to the outer surface of a transmission medium, but is nonetheless bound to or guided by the transmission medium and so as to propagate non-trivial distances along the transmission medium. In other embodiments, guided electromagnetic waves can have an electromagnetic field structure that lies primarily or substantially below an outer surface of a transmission medium so as to be bound to or guided by an inner material of the transmission medium (e.g., dielectric material) and so as to propagate non-trivial distances within the inner material of the transmission medium. In other embodiments, guided electromagnetic waves can have an electromagnetic field structure that lies within a region that is partially below and partially above an outer surface of a transmission medium so as to be bound to or guided by this region of the transmission medium and so as to propagate non-trivial distances along this region of the transmission medium. It will be appreciated that electromagnetic waves that propagate along a transmission medium or are otherwise guided by a transmission medium (i.e., guided electromagnetic waves) can have an electric field structure such as described in one or more of the foregoing embodiments. The desired electromagnetic field structure in an embodiment may vary based upon a variety of factors, including the desired transmission distance, the characteristics of the transmission medium itself, environmental conditions/characteristics outside of the transmission medium (e.g., presence of rain, fog, atmospheric conditions, etc.), and characteristics of an electromagnetic wave that are configurable by a launcher as will be described below (e.g., configurable wave mode, configurable electromagnetic field structure, configurable polarity, configurable wavelength, configurable bandwidth, and so on).

Various embodiments described herein relate to coupling devices, that can be referred to as "waveguide coupling devices", "waveguide couplers" or more simply as "couplers", "coupling devices" or "launchers" for launching and/or receiving/extracting guided electromagnetic waves to and from a transmission medium, wherein a wavelength of the guided electromagnetic waves can be small compared to one or more dimensions of the coupling device and/or the transmission medium such as the circumference of a wire or other cross sectional dimension. Such electromagnetic waves can operate at millimeter wave frequencies (e.g., 30 to 300 GHz), or lower than microwave frequencies such as 300 MHz to 30 GHz. Electromagnetic waves can be induced to propagate along a transmission medium by a coupling device, such as: a strip, arc or other length of dielectric material; a millimeter wave integrated circuit (MMIC), a horn, monopole, dipole, rod, slot or other antenna; an array of antennas; a magnetic resonant cavity or other resonant coupler; a coil, a strip line, a coaxial waveguide, a hollow waveguide, or other waveguide and/or other coupling device. In operation, the coupling device receives an electromagnetic wave from a transmitter or transmission medium. The electromagnetic field structure of the electromagnetic wave can be carried below an outer surface of the coupling device, substantially on the outer surface of the coupling device, within a hollow cavity of the coupling device, or a combination thereof. When the coupling device is in close proximity to a transmission medium, at least a portion of an electromagnetic wave couples to or is bound to the transmission medium, and continues to propagate as guided electromagnetic waves along the transmission medium. In a reciprocal fashion, a coupling device can receive or extract at least a portion of the guided electromagnetic waves from a transmission medium and transfer these electromagnetic waves to a receiver. The guided electromagnetic waves launched and/or received by the coupling device propagate along the transmission medium from a sending device to a receiving device without requiring an electrical return path between the sending device and the receiving device. In this circumstance, the transmission medium acts as a waveguide to support the propagation of the guided electromagnetic waves from the sending device to the receiving device.

According to an example embodiment, a surface wave is a type of guided wave that is guided by a surface of a transmission medium, such as an exterior or outer surface or an interior or inner surface including an interstitial surface of the transmission medium such as the interstitial area between wires in a multistranded cable, insulated twisted pair wires, or wire bundle, and/or another surface of the transmission medium that is adjacent to or exposed to another type of medium having different properties (e.g., dielectric properties). Indeed, in an example embodiment, a surface of the transmission medium that guides a surface wave can represent a transitional surface between two different types of media. For example, in the case of a bare wire or uninsulated wire, the surface of the wire can be the outer or exterior conductive surface of the bare wire or uninsulated wire that is exposed to air or free space. As another example, in the case of insulated wire, the surface of the wire can be the conductive portion of the wire that meets an inner surface of the insulator portion of the wire. A surface of the transmission medium can be any one of an inner surface of an insulator surface of a wire or a conductive surface of the wire that is separated by a gap composed of, for example, air or free space. A surface of a transmission medium can otherwise be any material region of the transmission medium. For example, the surface of the transmission medium can be an inner portion of an insulator disposed on a conductive portion of the wire that meets the insulator portion of the wire. The surface that guides an electromagnetic wave can depend upon the relative differences in the properties (e.g., dielectric properties) of the insulator, air, and/or the conductor and further dependent on the frequency and propagation mode or modes of the guided wave.

According to an example embodiment, the term "about" a wire or other transmission medium used in conjunction with a guided wave can include fundamental guided wave propagation modes such as a guided waves having a circular or substantially circular field pattern/distribution, a symmetrical electromagnetic field pattern/distribution (e.g., electric field or magnetic field) or other fundamental mode pattern at least partially around a wire or other transmission medium. Unlike Zenneck waves that propagate along a single planar surface of a planar transmission medium, the guided electromagnetic waves of the subject disclosure that are bound to a transmission medium can have electromagnetic field patterns that surround or circumscribe, at least in part, a non-planar surface of the transmission medium with electromagnetic energy in all directions, or in all but a finite number of azimuthal null directions characterized by field strengths that approach zero field strength for infinitesimally small azimuthal widths.

For example, such non-circular field distributions can be unilateral or multi-lateral with one or more axial lobes characterized by relatively higher field strength and/or one or more nulls directions of zero field strength or substantially zero-field strength or null regions characterized by relatively low-field strength, zero-field strength and/or substantially zero-field strength. Further, the field distribution can otherwise vary as a function of azimuthal orientation around a transmission medium such that one or more angular regions around the transmission medium have an electric or magnetic field strength (or combination thereof) that is higher than one or more other angular regions of azimuthal orientation, according to an example embodiment. It will be appreciated that the relative orientations or positions of the guided wave higher order modes, particularly asymmetrical modes, can vary as the guided wave travels along the wire.

In addition, when a guided wave propagates "about" a wire or other type of transmission medium, it can do so according to a guided wave propagation mode that includes not only the fundamental wave propagation modes (e.g., zero order modes), but additionally or alternatively, non-fundamental wave propagation modes such as higher-order guided wave modes (e.g., $1^{st}$ order modes, $2^{nd}$ order modes, etc.). Higher-order modes include symmetrical modes that have a circular or substantially circular electric or magnetic field distribution and/or a symmetrical electric or magnetic field distribution, or asymmetrical modes and/or other guided (e.g., surface) waves that have non-circular and/or asymmetrical field distributions around the wire or other transmission medium. For example, the guided electromagnetic waves of the subject disclosure can propagate along a transmission medium from the sending device to the receiving device or along a coupling device via one or more guided wave modes such as a fundamental transverse magnetic (TM) TM00 mode (or Goubau mode), a fundamental hybrid mode (EH or HE) "EH00" mode or "HE00" mode, a transverse electromagnetic "TEMnm" mode, a total internal reflection (TIR) mode or any other mode such as EHnm, HEnm or TMnm, where n and/or m have integer values greater than or equal to 0, and other fundamental, hybrid and non-fundamental wave modes.

As used herein, the term "guided wave mode" refers to a guided wave propagation mode of a transmission medium, coupling device or other system component of a guided wave communication system that propagates for non-trivial distances along the length of the transmission medium, coupling device or other system component.

As used herein, the term "millimeter-wave" can refer to electromagnetic waves/signals that fall within the "millimeter-wave frequency band" of 30 GHz to 300 GHz. The term "microwave" can refer to electromagnetic waves/signals that fall within a "microwave frequency band" of 300 MHz to 300 GHz. The term "radio frequency" or "RF" can refer to electromagnetic waves/signals that fall within the "radio frequency band" of 10 kHz to 1 THz. It is appreciated that wireless signals, electrical signals, and guided electromagnetic waves as described in the subject disclosure can be configured to operate at any desirable frequency range, such as, for example, at frequencies within, above or below millimeter-wave and/or microwave frequency bands. In particular, when a coupling device or transmission medium includes a conductive element, the frequency of the guided electromagnetic waves that are carried by the coupling device and/or propagate along the transmission medium can be below the mean collision frequency of the electrons in the conductive element. Further, the frequency of the guided electromagnetic waves that are carried by the coupling device and/or propagate along the transmission medium can be a non-optical frequency, e.g., a radio frequency below the range of optical frequencies that begins at 1 THz.

It is further appreciated that a transmission medium as described in the subject disclosure can be configured to be opaque or otherwise resistant to (or at least substantially reduce) a propagation of electromagnetic waves operating at optical frequencies (e.g., greater than 1 THz).

As used herein, the term "antenna" can refer to a device that is part of a transmitting or receiving system to transmit/radiate or receive free space wireless signals.

In accordance with one or more embodiments, a waveguide system of the subject disclosure can include an optical power converter; a coupler; a processing system including a processor; and a memory that stores executable instructions that, when executed by the processing system, facilitate performance of operations. The waveguide system can receive, via an optical fiber, first optical power signals, where the optical fiber is connected with a light source of a network device. The waveguide system can convert, by the optical power converter, the first optical power signals to electrical energy, where the electrical energy is utilized as power by the waveguide system. The waveguide system can receive, via the optical fiber, second optical communication signals from the network device, where the second optical communication signals convey data. The waveguide system can transmit, via the coupler, electromagnetic waves that are generated according to the second optical communication signals, wherein the electromagnetic waves propagate along a transmission medium without requiring an electrical return path, and where the electromagnetic waves convey the data.

In accordance with one or more embodiments, a waveguide system of the subject disclosure can include an optical power converter; a coupler; a processing system including a processor; and a memory that stores executable instructions that, when executed by the processing system, facilitate performance of operations. The waveguide system can receive, via an optical fiber, first optical power signals, where the optical fiber is connected with a light source of a network device. The waveguide system can convert, by the optical power converter, the first optical power signals to electrical energy, where the electrical energy is utilized as power by the waveguide system. The waveguide system can receive, via the coupler, electromagnetic waves that convey data, wherein the electromagnetic waves propagate along a transmission medium without requiring an electrical return path. The waveguide system can transmit communication signals to the network device, where the communication signals convey the data.

In accordance with one or more embodiments, a method of the subject disclosure can include transmitting, by a network device via a first optical fiber, first optical power signals to a first waveguide system, where the first optical fiber is connected with a light source of the network device, where the first waveguide system converts the first optical power signals to electrical energy to be utilized as power by the first waveguide system. The method can include transmitting, by the network device via the first optical fiber, second optical communication signals to the first waveguide system, where the second optical communication signals convey first data, where the first waveguide system generates first electromagnetic waves according to the second optical communication signals, where the first electromagnetic waves propagate along a transmission medium without requiring an electrical return path, and where the first electromagnetic waves convey the first data.

In accordance with one or more embodiments, a method of the subject disclosure can include receiving, by a waveguide system via an optical fiber, optical power signals, where the optical fiber is connected with a light source, where the waveguide system and the light source are separate devices. The method can include converting, by an optical power converter of the waveguide system, the optical power signals to electrical energy, where the electrical energy is utilized as power by the waveguide system. The method can include transmitting, via a coupler of the waveguide system, electromagnetic waves that convey data, where the electromagnetic waves propagate along a transmission medium without requiring an electrical return path.

In accordance with one or more embodiments, a waveguide system of the subject disclosure can include an optical power converter; a coupler; a processing system including a processor; and a memory that stores executable instructions that, when executed by the processing system, facilitate performance of operations. The waveguide system can receive, via an optical fiber, optical power signals, where the optical fiber is connected with a light source, where the waveguide system and the light source are separate devices. The waveguide system can convert, by the optical power converter, the optical power signals to electrical energy, where the electrical energy is utilized as power by the waveguide system. The waveguide system can transmit or receive, via the coupler, electromagnetic waves that convey data, where the electromagnetic waves propagate along a transmission medium without requiring an electrical return path.

In accordance with one or more embodiments, a first waveguide system of the subject disclosure can include a light source; a coupler; a processing system including a processor; and a memory that stores executable instructions that, when executed by the processing system, facilitate performance of operations. The first waveguide system can generate, by the light source, optical power signals. The first waveguide system can transmit, via an optical fiber, optical power signals to a second waveguide system, where the first and second waveguide systems are separate devices, where the second waveguide system converts, by an optical power converter of the second waveguide system, the optical power signals to electrical energy, where the electrical energy is utilized as power by the second waveguide system. The first waveguide system can transmit or receive, via the coupler, electromagnetic waves that convey data, where the electromagnetic waves propagate along a transmission medium without requiring an electrical return path.

In accordance with one or more embodiments, a waveguide system of the subject disclosure can include an inductive coupler; a processing system including a processor; and a memory that stores executable instructions that, when executed by the processing system, facilitate performance of operations. The waveguide system can receive signals that convey data. The waveguide system can obtain, by the inductive coupler, energy via an inductive coupling with a telecommunication line of a telecommunications network, where Alternating Current (AC) power signal is injected into the telecommunication line, where at least a portion of the energy is utilized by at least a subset of components of the waveguide system The waveguide system can transmit electromagnetic waves that convey the data, where the electromagnetic waves propagate along the telecommunication line without requiring an electrical return path.

In accordance with one or more embodiments, a waveguide system of the subject disclosure can include a processing system including a processor; and a memory that stores executable instructions that, when executed by the processing system, facilitate performance of operations. The waveguide system can receive signals that convey data. The waveguide system can obtain Direct Current (DC) power from a telecommunication line of a telecommunications network, where the DC power is utilized by at least a subset of components of the waveguide system. The waveguide system can transmit electromagnetic waves that convey the data, where the electromagnetic waves propagate along the telecommunication line without requiring an electrical return path.

In accordance with one or more embodiments, a method of the subject disclosure can include receiving, by a waveguide system, signals that convey data. The method can include obtaining, by the waveguide system, energy from a telecommunication line of a telecommunications network, where the energy is utilized by at least a subset of components of the waveguide system. The method can include transmitting, by the waveguide system, electromagnetic waves that convey the data, where the electromagnetic waves propagate along the telecommunication line without requiring an electrical return path.

In accordance with one or more embodiments, a waveguide system of the subject disclosure can include an inductive coupler; a processing system including a processor; and a memory that stores executable instructions that, when executed by the processing system, facilitate performance of operations. The waveguide system can receive signals that convey data. The waveguide system can obtain, by the inductive coupler, energy via an inductive coupling with a telecommunication line of a telecommunications network, where an Alternating Current power signal is injected into the telecommunication line, where the energy is utilized by at least a subset of components of the waveguide system. The waveguide system can transmit electromagnetic waves that convey the data, where the electromagnetic waves propagate along a power line of a power grid without requiring an electrical return path.

In accordance with one or more embodiments, a waveguide system of the subject disclosure can include a processing system including a processor; and a memory that stores executable instructions that, when executed by the processing system, facilitate performance of operations. The waveguide system can receive signals that convey data. The waveguide system can obtain Direct Current power from a telecommunication line of a telecommunications network, where the DC power is utilized by at least a subset of components of the waveguide system. The waveguide system can transmit electromagnetic waves that convey the data, where the electromagnetic waves propagate along a power line of a power grid without requiring an electrical return path.

In accordance with one or more embodiments, a method of the subject disclosure can include receiving, by a waveguide system, signals that convey data. The method can include obtaining, by the waveguide system, energy from a telecommunication line of a telecommunications network, where the energy is utilized by at least a subset of components of the waveguide system. The method can include transmitting, by the waveguide system, electromagnetic waves that convey the data, wherein the electromagnetic waves propagate along a power line of a power grid without requiring an electrical return path.

In accordance with one or more embodiments, a method of the subject disclosure can include receiving, by a first waveguide system, first electromagnetic waves that propagate along a transmission medium, wherein the transmission medium comprises an external surface, wherein the first electromagnetic waves propagate along the transmission medium without requiring an electrical return path, and wherein the first electromagnetic waves convey first data, generating, by the first waveguide system, according to the first electromagnetic waves, first signals wherein the first signals convey the first data, and providing, by the first waveguide system, the first signals to a switch that facilitates generating, according to the first signals and routing information conveyed by the first signals, second signals to an access point, third signals to a second waveguide system, or a combination thereof, wherein the second signals convey at least a first portion of the first data, and wherein the third signals convey at least a second portion of the first data.

In accordance with one or more embodiments, a first waveguide system of the subject disclosure can include a processing system including a processor, and a memory that stores executable instructions that, when executed by the processing system, facilitate performance of operations. The operations can include receiving first electromagnetic waves that propagate along a transmission medium, wherein the transmission medium comprises an external surface, wherein the first electromagnetic waves propagate along the transmission medium without requiring an electrical return path, generating, according to first electromagnetic waves, first signals, and providing the first signals to a switch that facilitates generating, according to the first signals, second signals to an access point, third signals to a second waveguide system, or a combination thereof.

In accordance with one or more embodiments, a machine-readable medium, can include executable instructions that, when executed by a processing system including a processor, facilitate performance of operations. The operations can include receiving electromagnetic waves that propagate along a transmission medium, wherein the transmission medium comprises an external surface, wherein the electromagnetic waves propagate along the transmission medium without requiring an electrical return path, generating, according to the electromagnetic waves, signals that convey data and routing information, and providing the signals to a switch that facilitates routing, according to the routing information, a first portion of the data conveyed by the signals to an access point, a second portion of the data conveyed by the signals to a second waveguide system, or a combination thereof.

In accordance with one or more embodiments, a method of the subject disclosure can include receiving, by an access point from a switch, first baseband signals, wherein the first baseband signals convey first data, wherein the first data is supplied by first signals received by the switch from a first waveguide system, wherein the first waveguide system facilitates generating the first signals responsive to receiving first electromagnetic waves that propagate along a transmission medium, wherein the transmission medium comprises an external surface, and wherein the first electromagnetic waves propagate along the transmission medium without requiring an electrical return path, selecting, by the access point, a communication device according to routing information, and transmitting, by the access point, a first wireless signal directed to the communication device, wherein the first wireless signal conveys the first data.

In accordance with one or more embodiments, an access point of the subject disclosure can include a processing system including a processor, and a memory that stores executable instructions that, when executed by the processing system, facilitate performance of operations. The operations can include receiving second signals from a switch, wherein the second signals are generated responsive to first signals received by the switch from a first waveguide system, wherein the first waveguide system facilitates generating the first signals responsive to receiving first electromagnetic waves that propagate along a transmission medium, wherein the transmission medium comprises an external surface, and wherein the first electromagnetic waves propagate along the transmission medium without requiring an electrical return path, obtaining routing information from the second signals, selecting a communication device according to the routing information, and transmitting a first wireless signal directed to the communication device, wherein the first wireless signal conveys first data supplied by the second signals.

In accordance with one or more embodiments, a machine-readable medium of the subject disclosure can include executable instructions that, when executed by a processing system including a processor, facilitate performance of operations. The operations can include receiving second signals from a switch responsive to the switch receiving first signals a first waveguide system, wherein the first waveguide system facilitates generating the first signals responsive to receiving first electromagnetic waves that propagate along a transmission medium, wherein the transmission medium comprises an external surface, and wherein the first electromagnetic waves propagate along the transmission medium without requiring an electrical return path, selecting a communication device according to the second signals, and transmitting a first wireless signal directed to the communication device, wherein the first wireless signal conveys first data supplied by the second signals.

In accordance with one or more embodiments, a method of the subject disclosure can include receiving, by a first waveguide system, configuration instructions, wherein the first waveguide system is reconfigurable according to the configuration instructions to generate repeated electromagnetic waves, regenerated electromagnetic waves, first signals, or any combinations thereof, wherein the repeated electromagnetic waves correspond to a retransmission of first electromagnetic waves, wherein the regenerated electromagnetic waves correspond to a regeneration of the first electromagnetic waves, and wherein the first signals correspond to a signal conversion of the first electromagnetic waves, receiving, by the first waveguide system, the first electromagnetic waves propagating along a transmission medium without requiring an electrical return path, wherein the transmission medium comprises an external surface, and wherein the first electromagnetic waves convey first data, and generating, by the first waveguide system according to the configuration instructions, the repeated electromagnetic waves for delivery to a second waveguide system, the regenerated electromagnetic waves for delivery to the second waveguide system, the first signals for delivery to a routing device, or any combinations thereof.

In accordance with one or more embodiments, a first waveguide system of the subject disclosure can include a processing system including a processor, and a memory that stores executable instructions that, when executed by the processing system, facilitate performance of operations. The operations can include receiving instructions to configure the first waveguide system to generate repeated electromagnetic waves, regenerated electromagnetic waves, first signals, or any combinations thereof, wherein the repeated electromagnetic waves correspond to a retransmission of first electromagnetic waves, wherein the regenerated electromagnetic waves correspond to a regeneration of the first electromagnetic waves, and wherein the first signals correspond to a signal conversion of the first electromagnetic waves, receiving the first electromagnetic waves propagating along a transmission medium without requiring an electrical return path, wherein the transmission medium comprises an external surface, and wherein the first electromagnetic waves convey first data, and processing the first electromagnetic waves, according to the instructions, to generate the repeated electromagnetic waves for delivery to a second waveguide system, the regenerated electromagnetic waves for delivery to the second waveguide system, the first signals for delivery to a routing device, or any combinations thereof.

In accordance with one or more embodiments, a machine-readable medium of the subject disclosure can include executable instructions that, when executed by a processing system of a first waveguide system that includes a processor, facilitate performance of operations. The operations can include obtaining instructions that reconfigures operations of the first waveguide system, receiving first electromagnetic waves propagating along a transmission medium without requiring an electrical return path, wherein the transmission medium comprises an external surface, and wherein the first electromagnetic waves convey first data, and processing the first electromagnetic waves, according to the instructions, to selectively generate repeated electromagnetic waves for delivery to a second waveguide system, regenerated electromagnetic waves for delivery to the second waveguide system, first signals for delivery to a routing device, or any combinations thereof, wherein the repeated electromagnetic waves correspond to a retransmission of first electromagnetic waves, wherein the regenerated electromagnetic waves correspond to a regeneration of the first electromagnetic waves, and wherein the first signals correspond to a signal conversion of the first electromagnetic waves.

In accordance with one or more embodiments, a method of the subject disclosure can include receiving, by a waveguide system, electromagnetic waves that propagate along a transmission medium, wherein the electromagnetic waves propagate along the transmission medium without requiring an electrical return path, and wherein the electromagnetic waves convey data, determining, by the waveguide system, a signal-to-noise ratio of the electromagnetic waves, and responsive to the signal-to-noise ratio of the electromagnetic waves satisfying a threshold: generating updated electromagnetic waves by conditioning the electromagnetic waves without modifying digital signals conveyed by the electromagnetic waves, and inducing propagation of the updated electromagnetic waves along the transmission medium.

In accordance with one or more embodiments, a waveguide system of the subject disclosure can include a processing system including a processor, and a memory that stores executable instructions that, when executed by the processing system, facilitate performance of operations. The operations can include receiving electromagnetic waves that propagate along a transmission medium, measuring a signal quality of the electromagnetic waves, and responsive to the signal quality of the electromagnetic waves satisfying a threshold: generating updated electromagnetic waves by conditioning the electromagnetic waves without modifying digital signals conveyed by the electromagnetic waves, and inducing propagation of the updated electromagnetic waves along the transmission medium.

In accordance with one or more embodiments, a machine-readable medium of the subject disclosure can include executable instructions that, when executed by a processing system of a waveguide system that includes a processor, facilitate performance of operations. The operations can include receiving electromagnetic waves that propagate along a transmission medium, responsive to a signal quality of the electromagnetic waves satisfying a threshold: generating updated electromagnetic waves by conditioning the electromagnetic waves without modifying digital signals conveyed by the electromagnetic waves and inducing propagation of the updated electromagnetic waves along the transmission medium.

Referring now to FIG. 1, a block diagram 100 illustrating an example, non-limiting embodiment of a guided wave communications system is shown. In operation, a transmission device 101 receives one or more communication signals 110 from a communication network or other communications device that includes data and generates guided waves 120 to convey the data via the transmission medium 125 to the transmission device 102. The transmission device 102 receives the guided waves 120 and converts them to communication signals 112 that include the data for transmission to a communications network or other communications device. The guided waves 120 can be modulated to convey data via a modulation technique such as phase shift keying, frequency shift keying, quadrature amplitude modulation, amplitude modulation, multi-carrier modulation such as orthogonal frequency division multiplexing and via multiple access techniques such as frequency division multiplexing, time division multiplexing, code division multiplexing, multiplexing via differing wave propagation modes and via other modulation and access strategies.

The communication network or networks can include a wireless communication network such as a mobile data network, a cellular voice and data network, a wireless local area network (e.g., WiFi or an IEEE 802.xx network), a satellite communications network, a personal area network or other wireless network. The communication network or networks can also include a wired communication network such as a telephone network, an Ethernet network, a local area network, a wide area network such as the Internet, a broadband access network, a cable network, a fiber optic network, or other wired network. The communication devices can include a network edge device, bridge device or home gateway, a set-top box, broadband modem, telephone adapter, access point, base station, or other fixed communication device, a mobile communication device such as an automotive gateway or automobile, laptop computer, tablet, smartphone, cellular telephone, or other communication device.

In an example embodiment, the guided wave communication system 100 can operate in a bi-directional fashion where transmission device 102 receives one or more communication signals 112 from a communication network or device that includes other data and generates guided waves 122 to convey the other data via the transmission medium 125 to the transmission device 101. In this mode of operation, the transmission device 101 receives the guided waves 122 and converts them to communication signals 110 that include the other data for transmission to a communications network or device. The guided waves 122 can be modulated to convey data via a modulation technique such as phase shift keying, frequency shift keying, quadrature amplitude modulation, amplitude modulation, multi-carrier modulation such as orthogonal frequency division multiplexing and via multiple access techniques such as frequency division multiplexing, time division multiplexing, code division multiplexing, multiplexing via differing wave propagation modes and via other modulation and access strategies.

The transmission medium 125 can include a cable having at least one inner portion surrounded by a dielectric material such as an insulator or other dielectric cover, coating or other dielectric material, the dielectric material having an outer surface and a corresponding circumference. In an example embodiment, the transmission medium 125 operates as a single-wire transmission line to guide the transmission of an electromagnetic wave. When the transmission medium 125 is implemented as a single wire transmission system, it can include a wire. The wire can be insulated or uninsulated, and single-stranded or multi-stranded (e.g., braided). In other embodiments, the transmission medium 125 can contain conductors of other shapes or configurations including wire bundles, cables, rods, rails, pipes. In addition, the transmission medium 125 can include non-conductors such as dielectric pipes, rods, rails, or other dielectric members; combinations of conductors and dielectric materials, conductors without dielectric materials or other guided wave transmission media and/or consist essentially of non-conductors such as dielectric pipes, rods, rails, or other dielectric members that operate without a continuous conductor such as an inner conductor or a conductive shield. It should be noted that the transmission medium 125 can otherwise include any of the transmission media previously discussed.

Further, as previously discussed, the guided waves 120 and 122 can be contrasted with radio transmissions over free space/air or conventional propagation of electrical power or signals through the conductor of a wire via an electrical circuit. In addition to the propagation of guided waves 120 and 122, the transmission medium 125 may optionally contain one or more wires that propagate electrical power or other communication signals in a conventional manner as a part of one or more electrical circuits.

Figure 2:
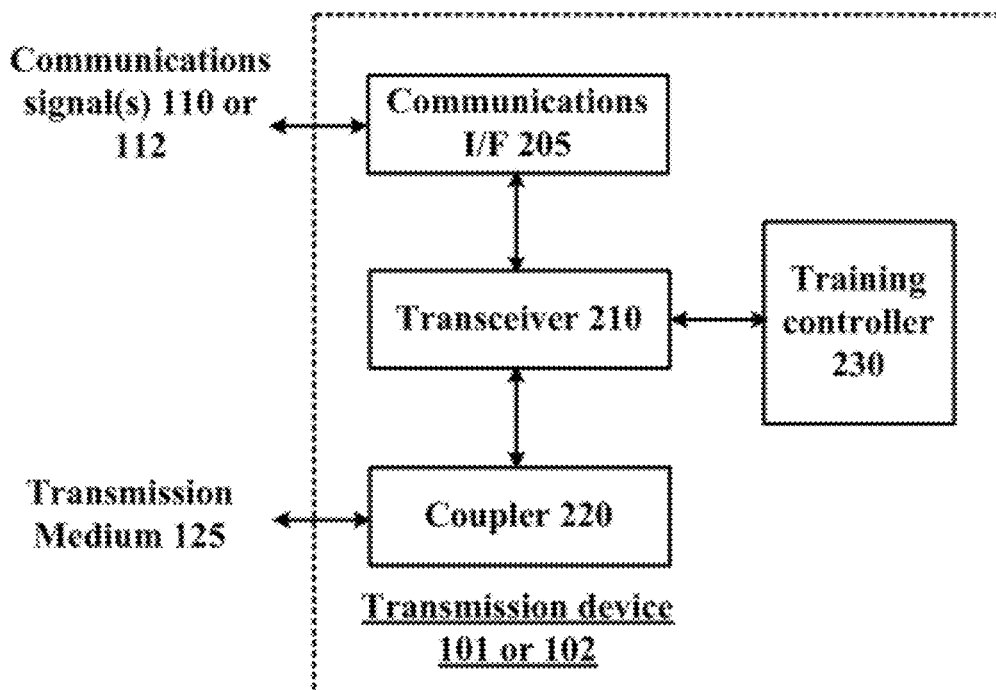
FIG. 2 is a block diagram illustrating an example, non-limiting embodiment of a transmission device in accordance with various aspects described herein.

Referring now to FIG. 2, a block diagram 200 illustrating an example, non-limiting embodiment of a transmission device is shown. The transmission device 101 or 102 includes a communications interface (I/F) 205, a transceiver 210 and a coupler 220.

In an example of operation, the communications interface 205 receives a communication signal 110 or 112 that includes data. In various embodiments, the communications interface 205 can include a wireless interface for receiving a wireless communication signal in accordance with a wireless standard protocol such as LTE or other cellular voice and data protocol, WiFi or an 802.11 protocol, WIMAX protocol, Ultra Wideband protocol, Bluetooth® protocol, Zigbee® protocol, a direct broadcast satellite (DBS) or other satellite communication protocol or other wireless protocol. In addition or in the alternative, the communications interface 205 includes a wired interface that operates in accordance with an Ethernet protocol, universal serial bus (USB) protocol, a data over cable service interface specification (DOCSIS) protocol, a digital subscriber line (DSL) protocol, a Firewire (IEEE 1394) protocol, or other wired protocol. In additional to standards-based protocols, the communications interface 205 can operate in conjunction with other wired or wireless protocol. In addition, the communications interface 205 can optionally operate in conjunction with a protocol stack that includes multiple protocol layers including a MAC protocol, transport protocol, application protocol, etc.

In an example of operation, the transceiver 210 generates an electromagnetic wave based on the communication signal 110 or 112 to convey the data. The electromagnetic wave has at least one carrier frequency and at least one corresponding wavelength. The carrier frequency can be within a millimeter-wave frequency band of 30 GHz-300 GHz, such as 60 GHz or a carrier frequency in the range of 30-40 GHz or a lower frequency band of 300 MHz-30 GHz in the microwave frequency range such as 26-30 GHz, 11 GHz, or 3-6 GHz, but it will be appreciated that other carrier frequencies are possible in other embodiments. In one mode of operation, the transceiver 210 merely upconverts the communications signal or signals 110 or 112 for transmission of the electromagnetic signal in the microwave or millimeter-wave band as a guided electromagnetic wave that is guided by or bound to the transmission medium 125. In another mode of operation, the communications interface 205 either converts the communication signal 110 or 112 to a baseband or near baseband signal or extracts the data from the communication signal 110 or 112 and the transceiver 210 modulates a high-frequency carrier with the data, the baseband or near baseband signal for transmission. It should be appreciated that the transceiver 210 can modulate the data received via the communication signal 110 or 112 to preserve one or more data communication protocols of the communication signal 110 or 112 either by encapsulation in the payload of a different protocol or by simple frequency shifting. In the alternative, the transceiver 210 can otherwise translate the data received via the communication signal 110 or 112 to a protocol that is different from the data communication protocol or protocols of the communication signal 110 or 112.

In an example of operation, the coupler 220 couples the electromagnetic wave to the transmission medium 125 as a guided electromagnetic wave to convey the communications signal or signals 110 or 112. While the prior description has focused on the operation of the transceiver 210 as a transmitter, the transceiver 210 can also operate to receive electromagnetic waves that convey other data from the single wire transmission medium via the coupler 220 and to generate communications signals 110 or 112, via communications interface 205 that includes the other data. Consider embodiments where an additional guided electromagnetic wave conveys other data that also propagates along the transmission medium 125. The coupler 220 can also couple this additional electromagnetic wave from the transmission medium 125 to the transceiver 210 for reception.

The transmission device 101 or 102 includes an optional training controller 230. In an example embodiment, the training controller 230 is implemented by a standalone processor or a processor that is shared with one or more other components of the transmission device 101 or 102. The training controller 230 selects the carrier frequencies, modulation schemes and/or guided wave modes for the guided electromagnetic waves based on testing of the transmission medium 125, environmental conditions and/or feedback data received by the transceiver 210 from at least one remote transmission device coupled to receive the guided electromagnetic wave.

In an example embodiment, a guided electromagnetic wave transmitted by a remote transmission device 101 or 102 conveys data that also propagates along the transmission medium 125. The data from the remote transmission device 101 or 102 can be generated to include the feedback data. In operation, the coupler 220 also couples the guided electromagnetic wave from the transmission medium 125 and the transceiver receives the electromagnetic wave and processes the electromagnetic wave to extract the feedback data.

In an example embodiment, the training controller 230 operates based on the feedback data to evaluate a plurality of candidate frequencies, modulation schemes and/or transmission modes to select a carrier frequency, modulation scheme and/or transmission mode to enhance performance, such as throughput, signal strength, reduce propagation loss, etc.

Consider the following example: a transmission device 101 begins operation under control of the training controller 230 by sending a plurality of guided waves as test signals such as pilot waves or other test signals at a corresponding plurality of candidate frequencies and/or candidate modes directed to a remote transmission device 102 coupled to the transmission medium 125. The guided waves can include, in addition or in the alternative, test data. The test data can indicate the particular candidate frequency and/or guide-wave mode of the signal. In an embodiment, the training controller 230 at the remote transmission device 102 receives the test signals and/or test data from any of the guided waves that were properly received and determines the best candidate frequency and/or guided wave mode, a set of acceptable candidate frequencies and/or guided wave modes, or a rank ordering of candidate frequencies and/or guided wave modes. This selection of candidate frequenc(ies) or/and guided-mode(s) are generated by the training controller 230 based on one or more optimizing criteria such as received signal strength, bit error rate, packet error rate, signal to noise ratio, propagation loss, etc. The training controller 230 generates feedback data that indicates the selection of candidate frequenc(ies) or/and guided wave mode(s) and sends the feedback data to the transceiver 210 for transmission to the transmission device 101. The transmission device 101 and 102 can then communicate data with one another based on the selection of candidate frequenc(ies) or/and guided wave mode(s).

In other embodiments, the guided electromagnetic waves that contain the test signals and/or test data are reflected back, repeated back or otherwise looped back by the remote transmission device 102 to the transmission device 101 for reception and analysis by the training controller 230 of the transmission device 101 that initiated these waves. For example, the transmission device 101 can send a signal to the remote transmission device 102 to initiate a test mode where a physical reflector is switched on the line, a termination impedance is changed to cause reflections, a loop back mode is switched on to couple electromagnetic waves back to the source transmission device 102, and/or a repeater mode is enabled to amplify and retransmit the electromagnetic waves back to the source transmission device 102. The training controller 230 at the source transmission device 102 receives the test signals and/or test data from any of the guided waves that were properly received and determines selection of candidate frequenc(ies) or/and guided wave mode(s).

While the procedure above has been described in a start-up or initialization mode of operation, each transmission device 101 or 102 can send test signals, evaluate candidate frequencies or guided wave modes via non-test conditions such as normal transmissions or otherwise evaluate candidate frequencies or guided wave modes at other times or continuously as well. In an example embodiment, the communication protocol between the transmission devices 101 and 102 can include an on-request or periodic test mode where either full testing or more limited testing of a subset of candidate frequencies and guided wave modes are tested and evaluated. In other modes of operation, the re-entry into such a test mode can be triggered by a degradation of performance due to a disturbance, weather conditions, etc. In an example embodiment, the receiver bandwidth of the transceiver 210 is either sufficiently wide or swept to receive all candidate frequencies or can be selectively adjusted by the training controller 230 to a training mode where the receiver bandwidth of the transceiver 210 is sufficiently wide or swept to receive all candidate frequencies.

Figure 3:
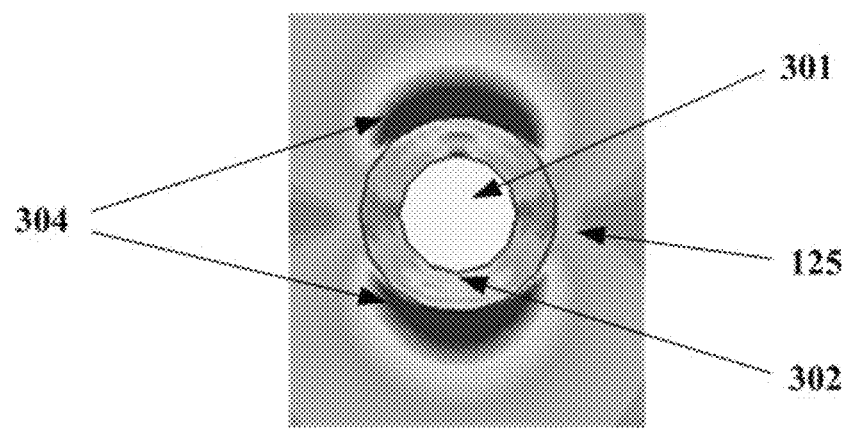
FIG. 3 is a graphical diagram illustrating an example, non-limiting embodiment of an electromagnetic field distribution in accordance with various aspects described herein.

Referring now to FIG. 3, a graphical diagram 300 illustrating an example, non-limiting embodiment of an electromagnetic field distribution is shown. In this embodiment, a transmission medium 125 in air includes an inner conductor 301 and an insulating jacket 302 of dielectric material, as shown in cross section. The diagram 300 includes different gray-scales that represent differing electromagnetic field strengths generated by the propagation of the guided wave having a non-circular and non-fundamental guided wave mode.

In particular, the electromagnetic field distribution corresponds to a modal "sweet spot" that enhances guided electromagnetic wave propagation along an insulated transmission medium and reduces end-to-end transmission loss. In this particular mode, electromagnetic waves are guided by the transmission medium 125 to propagate along an outer surface of the transmission medium—in this case, the outer surface of the insulating jacket 302. Electromagnetic waves are partially embedded in the insulator and partially radiating on the outer surface of the insulator. In this fashion, electromagnetic waves are "lightly" coupled to the insulator so as to enable electromagnetic wave propagation at long distances with low propagation loss.

As shown, the guided wave has a field structure that lies primarily or substantially outside of the transmission medium 125 that serves to guide the electromagnetic waves. The regions inside the conductor 301 have little or no field. Likewise regions inside the insulating jacket 302 have low field strength. The majority of the electromagnetic field strength is distributed in the lobes 304 at the outer surface of the insulating jacket 302 and in close proximity thereof. The presence of a non-circular and non-fundamental guided wave mode is shown by the high electromagnetic field strengths at the top and bottom of the outer surface of the insulating jacket 302 (in the orientation of the diagram)—as opposed to very small field strengths on the other sides of the insulating jacket 302.

The example shown corresponds to a 38 GHz electromagnetic wave guided by a wire with a diameter of 1.1 cm and a dielectric insulation of thickness of 0.36 cm. Because the electromagnetic wave is guided by the transmission medium 125 and the majority of the field strength is concentrated in the air outside of the insulating jacket 302 within a limited distance of the outer surface, the guided wave can propagate longitudinally down the transmission medium 125 with very low loss. In the example shown, this "limited distance" corresponds to a distance from the outer surface that is less than half the largest cross sectional dimension of the transmission medium 125. In this case, the largest cross sectional dimension of the wire corresponds to the overall diameter of 1.82 cm, however, this value can vary with the size and shape of the transmission medium 125. For example, should the transmission medium 125 be of a rectangular shape with a height of 0.3 cm and a width of 0.4 cm, the largest cross sectional dimension would be the diagonal of 0.5 cm and the corresponding limited distance would be 0.25 cm. The dimensions of the area containing the majority of the field strength also vary with the frequency, and in general, increase as carrier frequencies decrease.

It should also be noted that the components of a guided wave communication system, such as couplers and transmission media can have their own cut-off frequencies for each guided wave mode. The cut-off frequency generally sets forth the lowest frequency that a particular guided wave mode is designed to be supported by that particular component. In an example embodiment, the particular non-circular and non-fundamental mode of propagation shown is induced on the transmission medium 125 by an electromagnetic wave having a frequency that falls within a limited range (such as Fc to 2Fc) of the cut-off frequency Fc for this particular non-fundamental mode. The cut-off frequency Fc is particular to the characteristics of transmission medium 125. For embodiments as shown that include an inner conductor 301 surrounded by an insulating jacket 302, this cutoff frequency can vary based on the dimensions and properties of the insulating jacket 302 and potentially the dimensions and properties of the inner conductor 301 and can be determined experimentally to have a desired mode pattern. It should be noted however, that similar effects can be found for a hollow dielectric or insulator without an inner conductor or conductive shield. In this case, the cutoff frequency can vary based on the dimensions and properties of the hollow dielectric or insulator.

At frequencies lower than the cut-off frequency, the non-circular mode is difficult to induce in the transmission medium 125 and fails to propagate for all but trivial distances. As the frequency increases above the limited range of frequencies about the cut-off frequency, the non-circular mode shifts more and more inward of the insulating jacket 302. At frequencies much larger than the cut-off frequency, the field strength is no longer concentrated outside of the insulating jacket, but primarily inside of the insulating jacket 302. While the transmission medium 125 provides strong guidance to the electromagnetic wave and propagation is still possible, ranges are more limited by increased losses due to propagation within the insulating jacket 302—as opposed to the surrounding air.

Figure 4:
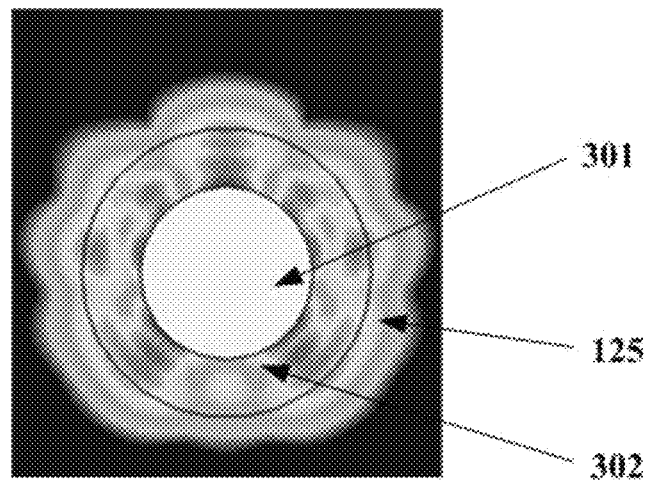
FIG. 4 is a graphical diagram illustrating an example, non-limiting embodiment of an electromagnetic field distribution in accordance with various aspects described herein.

Referring now to FIG. 4, a graphical diagram 400 illustrating an example, non-limiting embodiment of an electromagnetic field distribution is shown. In particular, a cross section diagram 400, similar to FIG. 3 is shown with common reference numerals used to refer to similar elements. The example shown corresponds to a 60 GHz wave guided by a wire with a diameter of 1.1 cm and a dielectric insulation of thickness of 0.36 cm. Because the frequency of the guided wave is above the limited range of the cut-off frequency of this particular non-fundamental mode, much of the field strength has shifted inward of the insulating jacket 302. In particular, the field strength is concentrated primarily inside of the insulating jacket 302. While the transmission medium 125 provides strong guidance to the electromagnetic wave and propagation is still possible, ranges are more limited when compared with the embodiment of FIG. 3, by increased losses due to propagation within the insulating jacket 302.

Figure 5A:
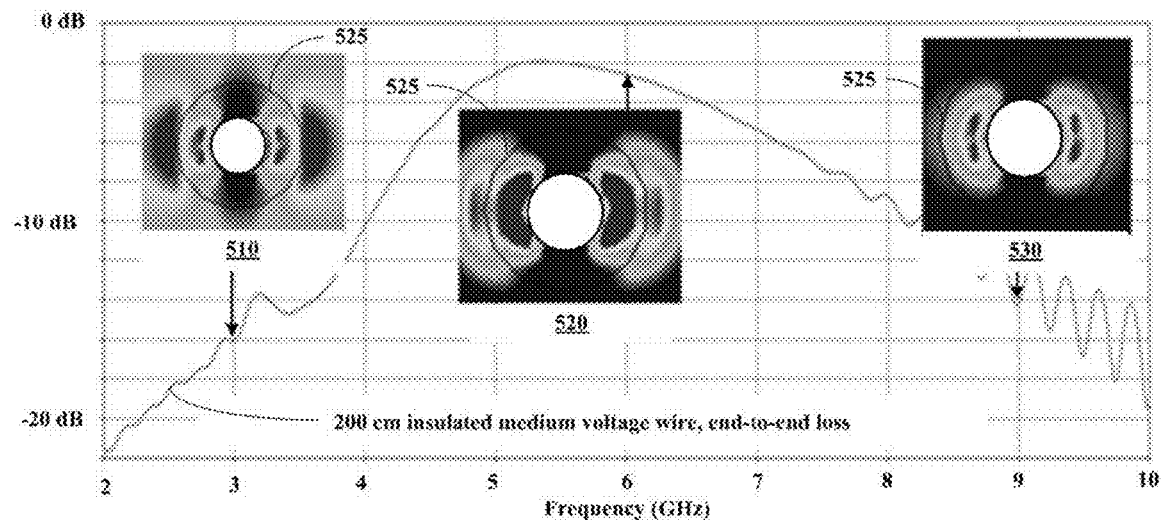
FIG. 5A is a graphical diagram illustrating an example, non-limiting embodiment of a frequency response in accordance with various aspects described herein.

Referring now to FIG. 5A, a graphical diagram illustrating an example, non-limiting embodiment of a frequency response is shown. In particular, diagram 500 presents a graph of end-to-end loss (in dB) as a function of frequency, overlaid with electromagnetic field distributions 510, 520 and 530 at three points for a 200 cm insulated medium voltage wire. The boundary between the insulator and the surrounding air is represented by reference numeral 525 in each electromagnetic field distribution.

As discussed in conjunction with FIG. 3, an example of a desired non-circular mode of propagation shown is induced on the transmission medium 125 by an electromagnetic wave having a frequency that falls within a limited range (such as Fc to 2Fc) of the lower cut-off frequency Fc of the transmission medium for this particular non-circular mode. In particular, the electromagnetic field distribution 520 at 6 GHz falls within this modal "sweet spot" that enhances electromagnetic wave propagation along an insulated transmission medium and reduces end-to-end transmission loss. In this particular mode, guided waves are partially embedded in the insulator and partially radiating on the outer surface of the insulator. In this fashion, the electromagnetic waves are "lightly" coupled to the insulator so as to enable guided electromagnetic wave propagation at long distances with low propagation loss.

At lower frequencies represented by the electromagnetic field distribution 510 at 3 GHz, the non-circular mode radiates more heavily generating higher propagation losses. At higher frequencies represented by the electromagnetic field distribution 530 at 9 GHz, the non-circular mode shifts more and more inward of the insulating jacket providing too much absorption, again generating higher propagation losses.

Figure 5B:
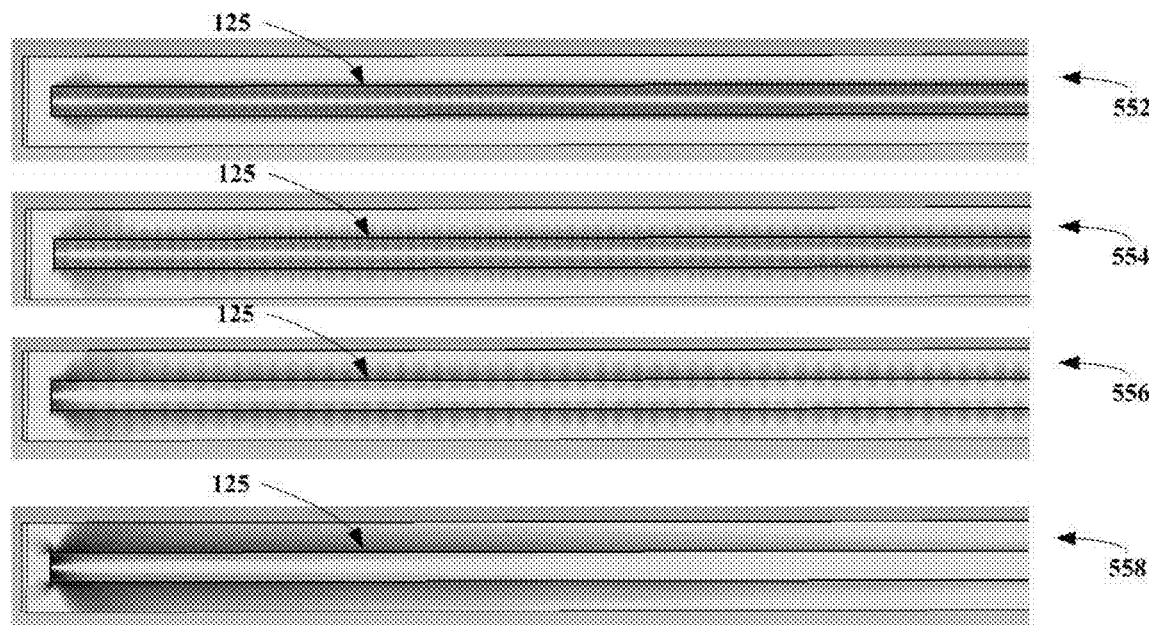
FIG. 5B is a graphical diagram illustrating example, non-limiting embodiments of a longitudinal cross-section of an insulated wire depicting fields of guided electromagnetic waves at various operating frequencies in accordance with various aspects described herein.

Referring now to FIG. 5B, a graphical diagram 550 illustrating example, non-limiting embodiments of a longitudinal cross-section of a transmission medium 125, such as an insulated wire, depicting fields of guided electromagnetic waves at various operating frequencies is shown. As shown in diagram 556, when the guided electromagnetic waves are at approximately the cutoff frequency ($f_c$) corresponding to the modal "sweet spot", the guided electromagnetic waves are loosely coupled to the insulated wire so that absorption is reduced, and the fields of the guided electromagnetic waves are bound sufficiently to reduce the amount radiated into the environment (e.g., air). Because absorption and radiation of the fields of the guided electromagnetic waves is low, propagation losses are consequently low, enabling the guided electromagnetic waves to propagate for longer distances.

As shown in diagram 554, propagation losses increase when an operating frequency of the guide electromagnetic waves increases above about two-times the cutoff frequency ($f_c$)—or as referred to, above the range of the "sweet spot". More of the field strength of the electromagnetic wave is driven inside the insulating layer, increasing propagation losses. At frequencies much higher than the cutoff frequency ($f_c$) the guided electromagnetic waves are strongly bound to the insulated wire as a result of the fields emitted by the guided electromagnetic waves being concentrated in the insulation layer of the wire, as shown in diagram 552. This in turn raises propagation losses further due to absorption of the guided electromagnetic waves by the insulation layer. Similarly, propagation losses increase when the operating frequency of the guided electromagnetic waves is substantially below the cutoff frequency ($f_c$), as shown in diagram 558. At frequencies much lower than the cutoff frequency ($f_c$) the guided electromagnetic waves are weakly (or nominally) bound to the insulated wire and thereby tend to radiate into the environment (e.g., air), which in turn, raises propagation losses due to radiation of the guided electromagnetic waves.

Figure 6:
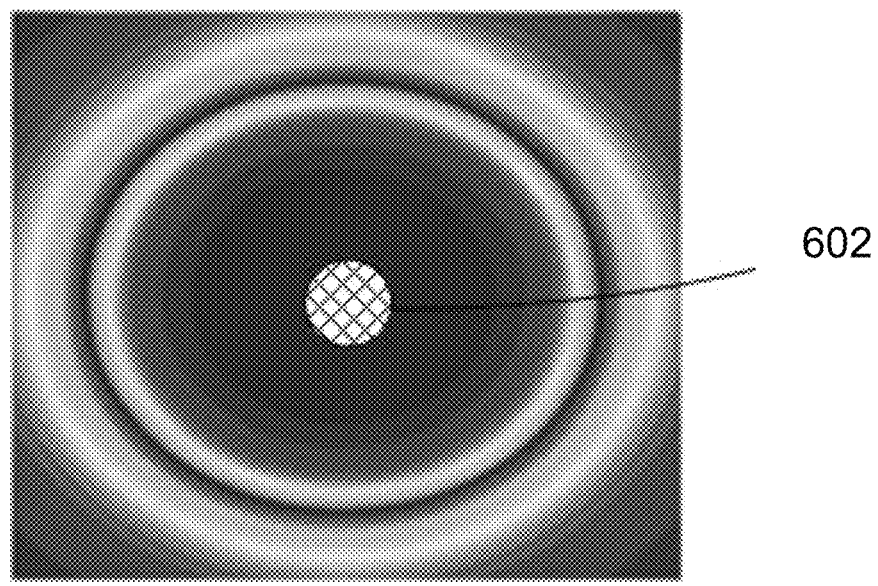
FIG. 6 is a graphical diagram illustrating an example, non-limiting embodiment of an electromagnetic field distribution in accordance with various aspects described herein.

Referring now to FIG. 6, a graphical diagram 600 illustrating an example, non-limiting embodiment of an electromagnetic field distribution is shown. In this embodiment, a transmission medium 602 is a bare wire, as shown in cross section. The diagram 600 includes different gray-scales that represent differing electromagnetic field strengths generated by the propagation of a guided wave having a symmetrical and fundamental TM00 guided wave mode at a single carrier frequency.

In this particular mode, electromagnetic waves are guided by the transmission medium 602 to propagate along an outer surface of the transmission medium—in this case, the outer surface of the bare wire. Electromagnetic waves are "lightly" coupled to the wire so as to enable electromagnetic wave propagation at long distances with low propagation loss. As shown, the guided wave has a field structure that lies substantially outside of the transmission medium 602 that serves to guide the electromagnetic waves. The regions inside the conductor of the transmission medium 602 have little or no field strength.

Figure 7:
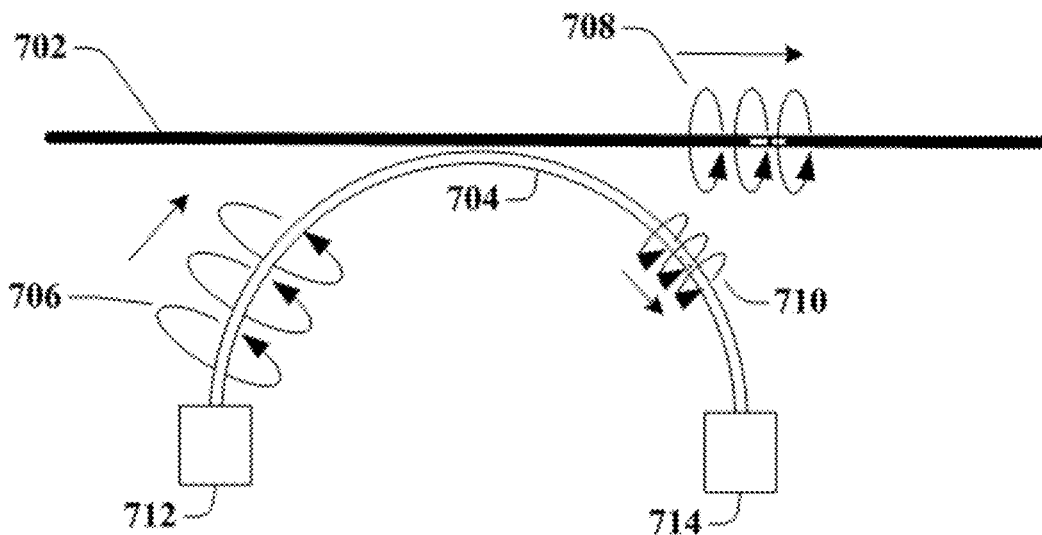
FIG. 7 is a block diagram illustrating an example, non-limiting embodiment of an arc coupler in accordance with various aspects described herein.

Referring now to FIG. 7, a block diagram 700 illustrating an example, non-limiting embodiment of an arc coupler is shown. In particular a coupling device is presented for use in a transmission device, such as transmission device 101 or 102 presented in conjunction with FIG. 1. The coupling device includes an arc coupler 704 coupled to a transmitter circuit 712 and termination or damper 714. The arc coupler 704 can be made of a dielectric material, or other low-loss insulator (e.g., Teflon, polyethylene, etc.), or made of a conducting (e.g., metallic, non-metallic, etc.) material, or any combination of the foregoing materials. As shown, the arc coupler 704 operates as a waveguide and has a wave 706 propagating as a guided wave, within and about a waveguide surface of the arc coupler 704. In the embodiment shown, at least a portion of the arc coupler 704 can be placed near a wire 702 or other transmission medium, (such as transmission medium 125), in order to facilitate coupling between the arc coupler 704 and the wire 702 or other transmission medium, as described herein to launch the guided wave 708 on the wire. The arc coupler 704 can be placed such that a portion of the curved arc coupler 704 is tangential to, and parallel or substantially parallel to the wire 702. The portion of the arc coupler 704 that is parallel to the wire can be an apex of the curve, or any point where a tangent of the curve is parallel to the wire 702. When the arc coupler 704 is positioned or placed thusly, the wave 706 travelling along the arc coupler 704 couples, at least in part, to the wire 702, and propagates as guided wave 708 around or about the wire surface of the wire 702 and longitudinally along the wire 702. The guided wave 708 can be characterized as a surface wave or other electromagnetic wave that is guided by or bound to the wire 702 or other transmission medium.

A portion of the wave 706 that does not couple to the wire 702 propagates as a wave 710 along the arc coupler 704. It will be appreciated that the arc coupler 704 can be configured and arranged in a variety of positions in relation to the wire 702 to achieve a desired level of coupling or non-coupling of the wave 706 to the wire 702. For example, the curvature and/or length of the arc coupler 704 that is parallel or substantially parallel, as well as its separation distance (which can include zero separation distance in an embodiment), to the wire 702 can be varied without departing from example embodiments. Likewise, the arrangement of arc coupler 704 in relation to the wire 702 may be varied based upon considerations of the respective intrinsic characteristics (e.g., thickness, composition, electromagnetic properties, etc.) of the wire 702 and the arc coupler 704, as well as the characteristics (e.g., frequency, energy level, etc.) of the waves 706 and 708.

The guided wave 708 stays parallel or substantially parallel to the wire 702, even as the wire 702 bends and flexes. Bends in the wire 702 can increase transmission losses, which are also dependent on wire diameters, frequency, and materials. If the dimensions of the arc coupler 704 are chosen for efficient power transfer, most of the power in the wave 706 is transferred to the wire 702, with little power remaining in wave 710. It will be appreciated that the guided wave 708 can still be multi-modal in nature (discussed herein), including having modes that are non-circular, non-fundamental and/or asymmetric, while traveling along a path that is parallel or substantially parallel to the wire 702, with or without a fundamental transmission mode. In an embodiment, non-circular, non-fundamental and/or asymmetric modes can be utilized to minimize transmission losses and/or obtain increased propagation distances.

It is noted that the term "parallel" is generally a geometric construct which often is not exactly achievable in real systems. Accordingly, the term "parallel" as utilized in the subject disclosure represents an approximation rather than an exact configuration when used to describe embodiments disclosed in the subject disclosure. In an embodiment, "substantially parallel" can include approximations that are within 30 degrees of true parallel in all dimensions.

In an embodiment, the wave 706 can exhibit one or more wave propagation modes. The arc coupler modes can be dependent on the shape and/or design of the coupler 704. The one or more arc coupler modes of wave 706 can generate, influence, or impact one or more wave propagation modes of the guided wave 708 propagating along wire 702. It should be particularly noted however that the guided wave modes present in the guided wave 706 may be the same or different from the guided wave modes of the guided wave 708. In this fashion, one or more guided wave modes of the guided wave 706 may not be transferred to the guided wave 708, and further one or more guided wave modes of guided wave 708 may not have been present in guided wave 706. It should also be noted that the cut-off frequency of the arc coupler 704 for a particular guided wave mode may be different than the cutoff frequency of the wire 702 or other transmission medium for that same mode. For example, while the wire 702 or other transmission medium may be operated slightly above its cutoff frequency for a particular guided wave mode, the arc coupler 704 may be operated well above its cut-off frequency for that same mode for low loss, slightly below its cut-off frequency for that same mode to, for example, induce greater coupling and power transfer, or some other point in relation to the arc coupler's cutoff frequency for that mode.

In an embodiment, the wave propagation modes on the wire 702 can be similar to the arc coupler modes since both waves 706 and 708 propagate about the outside of the arc coupler 704 and wire 702 respectively. In some embodiments, as the wave 706 couples to the wire 702, the modes can change form, or new modes can be created or generated, due to the coupling between the arc coupler 704 and the wire 702. For example, differences in size, material, and/or impedances of the arc coupler 704 and wire 702 may create additional modes not present in the arc coupler modes and/or suppress some of the arc coupler modes. The wave propagation modes can comprise the fundamental transverse magnetic mode ($TM_{00}$), where only small magnetic fields extend in the direction of propagation, and the electric field extends radially outwards and then longitudinally while the guided wave propagates along the wire. This guided wave mode can be donut shaped, where only a portion of the electromagnetic fields exist within the arc coupler 704 or wire 702.

While the waves 706 and 708 can comprise a fundamental TM mode, the waves 706 and 708, also or in the alternative, can comprise non-fundamental TM modes. While particular wave propagation modes are discussed above, other wave propagation modes in or along the coupler and/or along the wire are likewise possible such as transverse electric (TE) and hybrid (EH or HE) modes, based on the frequencies employed, the design of the arc coupler 704, the dimensions and composition of the wire 702, as well as its surface characteristics, its insulation if present, the electromagnetic properties of the surrounding environment, etc. It should be noted that, depending on the frequency, the electrical and physical characteristics of the wire 702 and the particular wave propagation modes that are generated, guided wave 708 can travel along the conductive surface of an oxidized uninsulated wire, an unoxidized uninsulated wire, an insulated wire and/or along the insulating surface of an insulated wire.

In an embodiment, a diameter of the arc coupler 704 is smaller than the diameter of the wire 702. For the millimeter-band wavelength being used, the arc coupler 704 supports a single waveguide mode that makes up wave 706. This single waveguide mode can change as it couples to the wire 702 as guided wave 708. If the arc coupler 704 were larger, more than one waveguide mode can be supported, but these additional waveguide modes may not couple to the wire 702 as efficiently, and higher coupling losses can result. However, in some alternative embodiments, the diameter of the arc coupler 704 can be equal to or larger than the diameter of the wire 702, for example, where higher coupling losses are desirable or when used in conjunction with other techniques to otherwise reduce coupling losses (e.g., impedance matching with tapering, etc.).

In an embodiment, the wavelength of the waves 706 and 708 are comparable in size, or smaller than a circumference of the arc coupler 704 and the wire 702. In an example, if the wire 702 has a diameter of 0.5 cm, and a corresponding circumference of around 1.5 cm, the wavelength of the transmission is around 1.5 cm or less, corresponding to a frequency of 70 GHz or greater. In another embodiment, a suitable frequency of the transmission and the carrier-wave signal is in the range of 30-100 GHz, perhaps around 30-60 GHz, and around 38 GHz in one example. In an embodiment, when the circumference of the arc coupler 704 and wire 702 is comparable in size to, or greater than a wavelength of the transmission, the waves 706 and 708 can exhibit multiple wave propagation modes including fundamental and/or non-fundamental (symmetric and/or asymmetric, circular and/or non-circular) modes that propagate over sufficient distances to support various communication systems described herein. The waves 706 and 708 can therefore comprise more than one type of electric and magnetic field configuration. In an embodiment, as the guided wave 708 propagates down the wire 702, the electrical and magnetic field configurations will remain the same from end to end of the wire 702. In other embodiments, as the guided wave 708 encounters interference (distortion or obstructions) or loses energy due to transmission losses or scattering, the electric and magnetic field configurations can change as the guided wave 708 propagates down wire 702.

In an embodiment, the arc coupler 704 can be composed of nylon, Teflon, polyethylene, a polyamide, or other plastics. In other embodiments, other dielectric materials can be employed. The wire surface of wire 702 can be metallic with either a bare metallic surface, or can be insulated using plastic, dielectric, insulator or other coating, jacket or sheathing. In an embodiment, a dielectric or otherwise non-conducting/insulated waveguide can be paired with either a bare/metallic wire or insulated wire. In other embodiments, a metallic and/or conductive waveguide can be paired with a bare/metallic wire or insulated wire. In an embodiment, an oxidation layer on the bare metallic surface of the wire 702 (e.g., resulting from exposure of the bare metallic surface to oxygen/air) can also provide insulating or dielectric properties similar to those provided by some insulators or sheathings.

It is noted that the graphical representations of waves 706, 708 and 710 are presented merely to illustrate the principles that wave 706 induces or otherwise launches a guided wave 708 on a wire 702 that operates, for example, as a single wire transmission line. Wave 710 represents the portion of wave 706 that remains on the arc coupler 704 after the generation of guided wave 708. The actual electric and magnetic fields generated as a result of such wave propagation may vary depending on the frequencies employed, the particular wave propagation mode or modes, the design of the arc coupler 704, the dimensions and composition of the wire 702, as well as its surface characteristics, its optional insulation, the electromagnetic properties of the surrounding environment, etc.

It is noted that arc coupler 704 can include a termination circuit or damper 714 at the end of the arc coupler 704 that can absorb leftover radiation or energy from wave 710. The termination circuit or damper 714 can prevent and/or minimize the leftover radiation or energy from wave 710 reflecting back toward transmitter circuit 712. In an embodiment, the termination circuit or damper 714 can include termination resistors, absorbing materials and/or other components that perform impedance matching to attenuate reflection. In some embodiments, if the coupling efficiencies are high enough, and/or wave 710 is sufficiently small, it may not be necessary to use a termination circuit or damper 714. For the sake of simplicity, these transmitter 712 and termination circuits or dampers 714 may not be depicted in the other figures, but in those embodiments, transmitter and termination circuits or dampers may possibly be used.

Further, while a single arc coupler 704 is presented that generates a single guided wave 708, multiple arc couplers 704 placed at different points along the wire 702 and/or at different azimuthal orientations about the wire can be employed to generate and receive multiple guided waves 708 at the same or different frequencies, at the same or different phases, at the same or different wave propagation modes.

Figure 8:
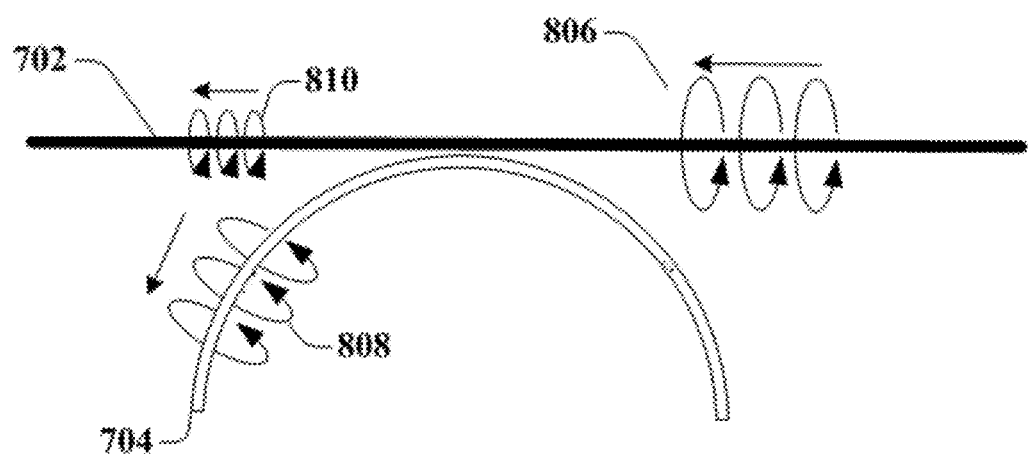
FIG. 8 is a block diagram illustrating an example, non-limiting embodiment of an arc coupler in accordance with various aspects described herein.

FIG. 8, a block diagram 800 illustrating an example, non-limiting embodiment of an arc coupler is shown. In the embodiment shown, at least a portion of the coupler 704 can be placed near a wire 702 or other transmission medium, (such as transmission medium 125), in order to facilitate coupling between the arc coupler 704 and the wire 702 or other transmission medium, to extract a portion of the guided wave 806 as a guided wave 808 as described herein. The arc coupler 704 can be placed such that a portion of the curved arc coupler 704 is tangential to, and parallel or substantially parallel to the wire 702. The portion of the arc coupler 704 that is parallel to the wire can be an apex of the curve, or any point where a tangent of the curve is parallel to the wire 702. When the arc coupler 704 is positioned or placed thusly, the wave 806 travelling along the wire 702 couples, at least in part, to the arc coupler 704, and propagates as guided wave 808 along the arc coupler 704 to a receiving device (not expressly shown). A portion of the wave 806 that does not couple to the arc coupler propagates as wave 810 along the wire 702 or other transmission medium.

In an embodiment, the wave 806 can exhibit one or more wave propagation modes. The arc coupler modes can be dependent on the shape and/or design of the coupler 704. The one or more modes of guided wave 806 can generate, influence, or impact one or more guide-wave modes of the guided wave 808 propagating along the arc coupler 704. It should be particularly noted however that the guided wave modes present in the guided wave 806 may be the same or different from the guided wave modes of the guided wave 808. In this fashion, one or more guided wave modes of the guided wave 806 may not be transferred to the guided wave 808, and further one or more guided wave modes of guided wave 808 may not have been present in guided wave 806.

Figure 9A:
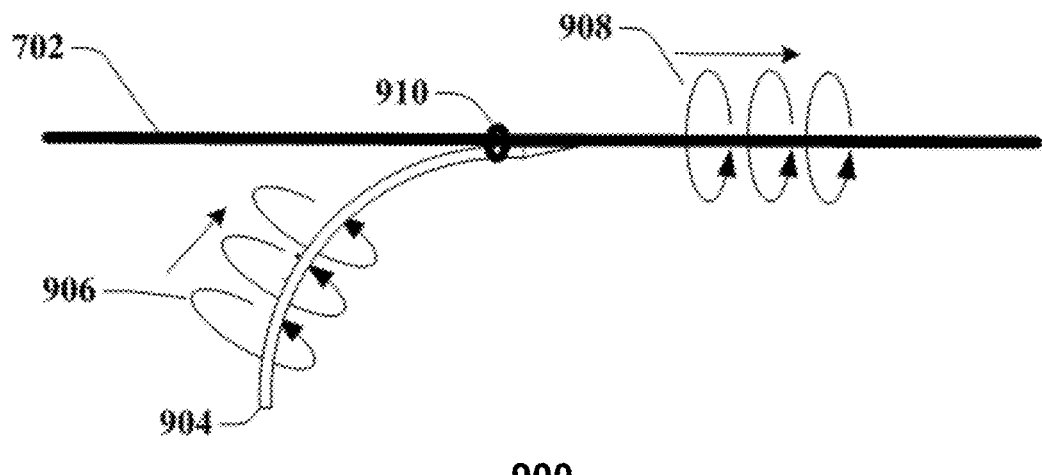
FIG. 9A is a block diagram illustrating an example, non-limiting embodiment of a stub coupler in accordance with various aspects described herein.

Referring now to FIG. 9A, a block diagram 900 illustrating an example, non-limiting embodiment of a stub coupler is shown. In particular a coupling device that includes stub coupler 904 is presented for use in a transmission device, such as transmission device 101 or 102 presented in conjunction with FIG. 1. The stub coupler 904 can be made of a dielectric material, or other low-loss insulator (e.g., Teflon, polyethylene and etc.), or made of a conducting (e.g., metallic, non-metallic, etc.) material, or any combination of the foregoing materials. As shown, the stub coupler 904 operates as a waveguide and has a wave 906 propagating as a guided wave within and about a waveguide surface of the stub coupler 904. In the embodiment shown, at least a portion of the stub coupler 904 can be placed near a wire 702 or other transmission medium, (such as transmission medium 125), in order to facilitate coupling between the stub coupler 904 and the wire 702 or other transmission medium, as described herein to launch the guided wave 908 on the wire.

In an embodiment, the stub coupler 904 is curved, and an end of the stub coupler 904 can be tied, fastened, or otherwise mechanically coupled to a wire 702. When the end of the stub coupler 904 is fastened to the wire 702, the end of the stub coupler 904 is parallel or substantially parallel to the wire 702. Alternatively, another portion of the dielectric waveguide beyond an end can be fastened or coupled to wire 702 such that the fastened or coupled portion is parallel or substantially parallel to the wire 702. The fastener 910 can be a nylon cable tie or other type of non-conducting/dielectric material that is either separate from the stub coupler 904 or constructed as an integrated component of the stub coupler 904. The stub coupler 904 can be adjacent to the wire 702 without surrounding the wire 702.

Like the arc coupler 704 described in conjunction with FIG. 7, when the stub coupler 904 is placed with the end parallel to the wire 702, the guided wave 906 travelling along the stub coupler 904 couples to the wire 702, and propagates as guided wave 908 about the wire surface of the wire 702. In an example embodiment, the guided wave 908 can be characterized as a surface wave or other electromagnetic wave.

It is noted that the graphical representations of waves 906 and 908 are presented merely to illustrate the principles that wave 906 induces or otherwise launches a guided wave 908 on a wire 702 that operates, for example, as a single wire transmission line. The actual electric and magnetic fields generated as a result of such wave propagation may vary depending on one or more of the shape and/or design of the coupler, the relative position of the dielectric waveguide to the wire, the frequencies employed, the design of the stub coupler 904, the dimensions and composition of the wire 702, as well as its surface characteristics, its optional insulation, the electromagnetic properties of the surrounding environment, etc.

In an embodiment, an end of stub coupler 904 can taper towards the wire 702 in order to increase coupling efficiencies. Indeed, the tapering of the end of the stub coupler 904 can provide impedance matching to the wire 702 and reduce reflections, according to an example embodiment of the subject disclosure. For example, an end of the stub coupler 904 can be gradually tapered in order to obtain a desired level of coupling between waves 906 and 908 as illustrated in FIG. 9A.

In an embodiment, the fastener 910 can be placed such that there is a short length of the stub coupler 904 between the fastener 910 and an end of the stub coupler 904. Maximum coupling efficiencies are realized in this embodiment when the length of the end of the stub coupler 904 that is beyond the fastener 910 is at least several wavelengths long for whatever frequency is being transmitted.

Figure 9B:
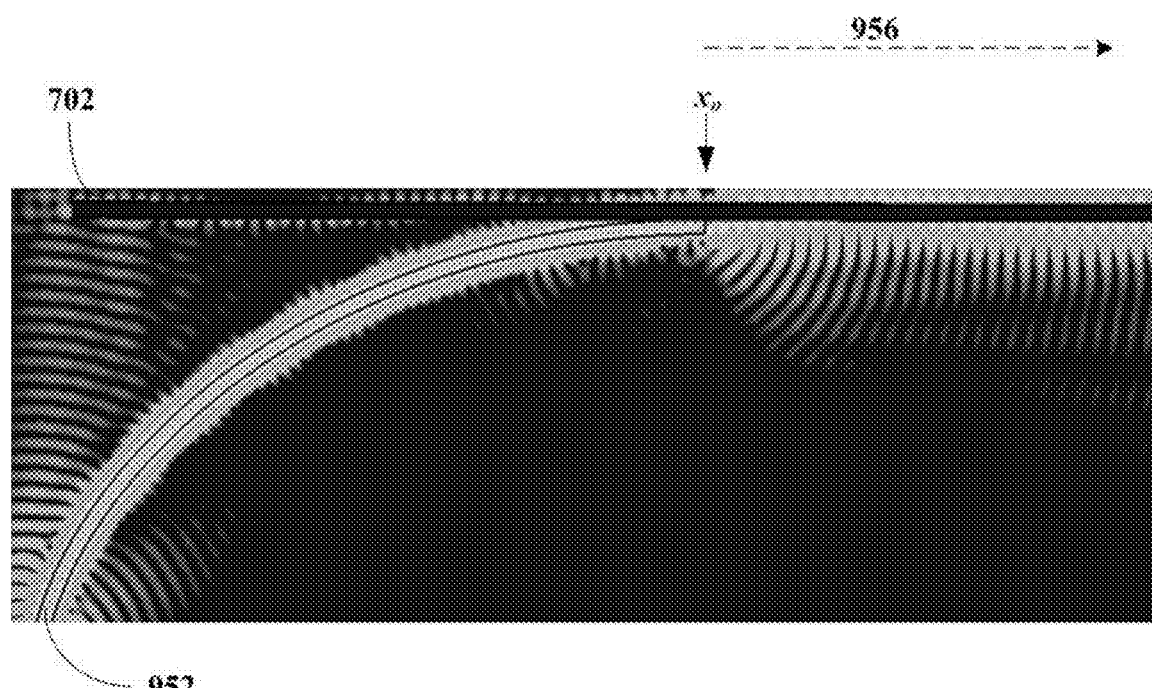
FIG. 9B is a diagram illustrating an example, non-limiting embodiment of an electromagnetic distribution in accordance with various aspects described herein.

Turning now to FIG. 9B, a diagram 950 illustrating an example, non-limiting embodiment of an electromagnetic distribution in accordance with various aspects described herein is shown. In particular, an electromagnetic distribution is presented in two dimensions for a transmission device that includes coupler 952, shown in an example stub coupler constructed of a dielectric material. The coupler 952 couples an electromagnetic wave for propagation as a guided wave along an outer surface of a wire 702 or other transmission medium.

The coupler 952 guides the electromagnetic wave to a junction at $x_0$ via a symmetrical guided wave mode. While some of the energy of the electromagnetic wave that propagates along the coupler 952 is outside of the coupler 952, the majority of the energy of this electromagnetic wave is contained within the coupler 952. The junction at $x_0$ couples the electromagnetic wave to the wire 702 or other transmission medium at an azimuthal angle corresponding to the bottom of the transmission medium. This coupling induces an electromagnetic wave that is guided to propagate along the outer surface of the wire 702 or other transmission medium via at least one guided wave mode in direction 956. The majority of the energy of the guided electromagnetic wave is outside or, but in close proximity to the outer surface of the wire 702 or other transmission medium. In the example shown, the junction at $x_0$ forms an electromagnetic wave that propagates via both a fundamental TM00 mode and at least one non-fundamental mode, such as the first order mode presented in conjunction with FIG. 3, that skims the surface of the wire 702 or other transmission medium.

It is noted that the graphical representations of guided waves are presented merely to illustrate an example of guided wave coupling and propagation. The actual electric and magnetic fields generated as a result of such wave propagation may vary depending on the frequencies employed, the design and/or configuration of the coupler 952, the dimensions and composition of the wire 702 or other transmission medium, as well as its surface characteristics, its insulation if present, the electromagnetic properties of the surrounding environment, etc.

Figure 10:
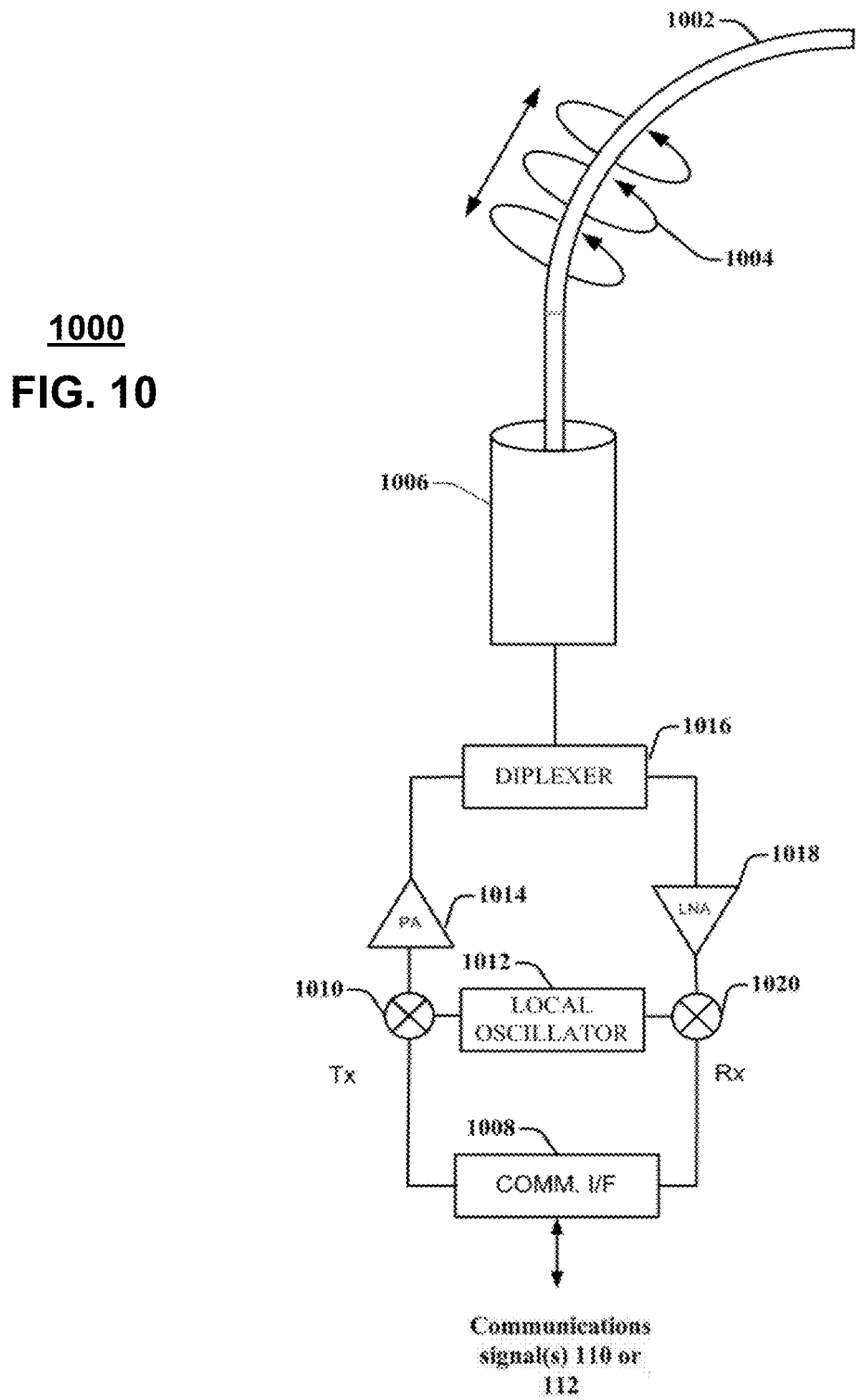
FIG. 10 is a block diagram illustrating an example, non-limiting embodiment of a coupler and transceiver in accordance with various aspects described herein.

Turning now to FIG. 10, illustrated is a block diagram 1000 of an example, non-limiting embodiment of a coupler and transceiver system in accordance with various aspects described herein. The system is an example of transmission device 101 or 102. In particular, the communications interface 1008 is an example of communications interface 205, the stub coupler 1002 is an example of coupler 220, and the transmitter/receiver device 1006, diplexer 1016, power amplifier 1014, low noise amplifier 1018, frequency mixers 1010 and 1020 and local oscillator 1012 collectively form an example of transceiver 210.

In operation, the transmitter/receiver device 1006 launches and receives waves (e.g., guided wave 1004 onto stub coupler 1002). The guided waves 1004 can be used to transport signals received from and sent to a host device, base station, mobile devices, a building or other device by way of a communications interface 1008. The communications interface 1008 can be an integral part of system 1000. Alternatively, the communications interface 1008 can be tethered to system 1000. The communications interface 1008 can comprise a wireless interface for interfacing to the host device, base station, mobile devices, a building or other device utilizing any of various present or future wireless signaling protocols (e.g., LTE, WiFi, WiMAX, IEEE 802.xx, 5G, etc.) including an infrared protocol such as an infrared data association (IrDA) protocol or other line of sight optical protocol. The communications interface 1008 can also comprise a wired interface such as a fiber optic line, coaxial cable, twisted pair, category 5 (CAT-5) cable or other suitable wired or optical mediums for communicating with the host device, base station, mobile devices, a building or other device via a protocol such as an Ethernet protocol, universal serial bus (USB) protocol, a data over cable service interface specification (DOCSIS) protocol, a digital subscriber line (DSL) protocol, a Firewire (IEEE 1394) protocol, or other wired or optical protocol. For embodiments where system 1000 functions as a repeater, the communications interface 1008 may not be necessary.

The output signals (e.g., Tx) of the communications interface 1008 can be combined with a carrier wave (e.g., millimeter-wave carrier wave) generated by a local oscillator 1012 at frequency mixer 1010. Frequency mixer 1010 can use heterodyning techniques or other frequency shifting techniques to frequency shift the output signals from communications interface 1008. For example, signals sent to and from the communications interface 1008 can be modulated signals such as orthogonal frequency division multiplexed (OFDM) signals formatted in accordance with a Long-Term Evolution (LTE) wireless protocol or other wireless 3G, 4G, 5G or higher voice and data protocol, a Zigbee®, WIMAX, UltraWideband or IEEE 802.11 wireless protocol; a wired protocol such as an Ethernet protocol, universal serial bus (USB) protocol, a data over cable service interface specification (DOCSIS) protocol, a digital subscriber line (DSL) protocol, a Firewire (IEEE 1394) protocol or other wired or wireless protocol. In an example embodiment, this frequency conversion can be done in the analog domain, and as a result, the frequency shifting can be done without regard to the type of communications protocol used by a base station, mobile devices, or in-building devices. As new communications technologies are developed, the communications interface 1008 can be upgraded (e.g., updated with software, firmware, and/or hardware) or replaced and the frequency shifting and transmission apparatus can remain, simplifying upgrades. The carrier wave can then be sent to a power amplifier ("PA") 1014 and can be transmitted via the transmitter receiver device 1006 via the diplexer 1016.

Signals received from the transmitter/receiver device 1006 that are directed towards the communications interface 1008 can be separated from other signals via diplexer 1016. The received signal can then be sent to low noise amplifier ("LNA") 1018 for amplification. A frequency mixer 1020, with help from local oscillator 1012 can downshift the received signal (which is in the millimeter-wave band or around 38 GHz in some embodiments) to the native frequency. The communications interface 1008 can then receive the transmission at an input port (Rx).

In an embodiment, transmitter/receiver device 1006 can include a cylindrical or non-cylindrical metal (which, for example, can be hollow in an embodiment, but not necessarily drawn to scale) or other conducting or non-conducting waveguide and an end of the stub coupler 1002 can be placed in or in proximity to the waveguide or the transmitter/receiver device 1006 such that when the transmitter/receiver device 1006 generates a transmission, the guided wave couples to stub coupler 1002 and propagates as a guided wave 1004 about the waveguide surface of the stub coupler 1002. In some embodiments, the guided wave 1004 can propagate in part on the outer surface of the stub coupler 1002 and in part inside the stub coupler 1002. In other embodiments, the guided wave 1004 can propagate substantially or completely on the outer surface of the stub coupler 1002. In yet other embodiments, the guided wave 1004 can propagate substantially or completely inside the stub coupler 1002. In this latter embodiment, the guided wave 1004 can radiate at an end of the stub coupler 1002 (such as the tapered end shown in FIG. 4) for coupling to a transmission medium such as a wire 702 of FIG. 7. Similarly, if guided wave 1004 is incoming (coupled to the stub coupler 1002 from a wire 702), guided wave 1004 then enters the transmitter/receiver device 1006 and couples to the cylindrical waveguide or conducting waveguide. While transmitter/receiver device 1006 is shown to include a separate waveguide—an antenna, cavity resonator, klystron, magnetron, travelling wave tube, or other radiating element can be employed to induce a guided wave on the coupler 1002, with or without the separate waveguide.

In an embodiment, stub coupler 1002 can be wholly constructed of a dielectric material (or another suitable insulating material), without any metallic or otherwise conducting materials therein. Stub coupler 1002 can be composed of nylon, Teflon, polyethylene, a polyamide, other plastics, or other materials that are non-conducting and suitable for facilitating transmission of electromagnetic waves at least in part on an outer surface of such materials. In another embodiment, stub coupler 1002 can include a core that is conducting/metallic, and have an exterior dielectric surface. Similarly, a transmission medium that couples to the stub coupler 1002 for propagating electromagnetic waves induced by the stub coupler 1002 or for supplying electromagnetic waves to the stub coupler 1002 can, in addition to being a bare or insulated wire, be wholly constructed of a dielectric material (or another suitable insulating material), without any metallic or otherwise conducting materials therein.

It is noted that although FIG. 10 shows that the opening of transmitter receiver device 1006 is much wider than the stub coupler 1002, this is not to scale, and that in other embodiments the width of the stub coupler 1002 is comparable or slightly smaller than the opening of the hollow waveguide. It is also not shown, but in an embodiment, an end of the coupler 1002 that is inserted into the transmitter/receiver device 1006 tapers down in order to reduce reflection and increase coupling efficiencies. The stub coupler 1002 can be representative of the arch coupler 704 of FIGS. 7 and 8, the stub coupler 904 of FIG. 9A, the coupler 952, or any other couplers described in the subject disclosure.

Before coupling to the stub coupler 1002, the one or more waveguide modes of the guided wave generated by the transmitter/receiver device 1006 can couple to the stub coupler 1002 to induce one or more wave propagation modes of the guided wave 1004. The wave propagation modes of the guided wave 1004 can be different than the hollow metal waveguide modes due to the different characteristics of the hollow metal waveguide and the dielectric waveguide. For instance, wave propagation modes of the guided wave 1004 can comprise the fundamental transverse magnetic mode ($TM_{00}$), where only small magnetic fields extend in the direction of propagation, HE11 or other modes supported by the stub coupler 1002 that generate one or more desired wave modes on the transmission medium. The fundamental transverse electromagnetic mode wave propagation mode may or may not exist inside a waveguide that is hollow. Therefore, the hollow metal waveguide modes that are used by transmitter/receiver device 1006 are waveguide modes, such as TE01 or TE11, that can propagate inside a circular, rectangular or other hollow metallic waveguide and couple effectively and efficiently to wave propagation modes of stub coupler 1002.

It will be appreciated that other constructs or combinations of the transmitter/receiver device 1006 and stub coupler 1002 are possible.

Figure 11:
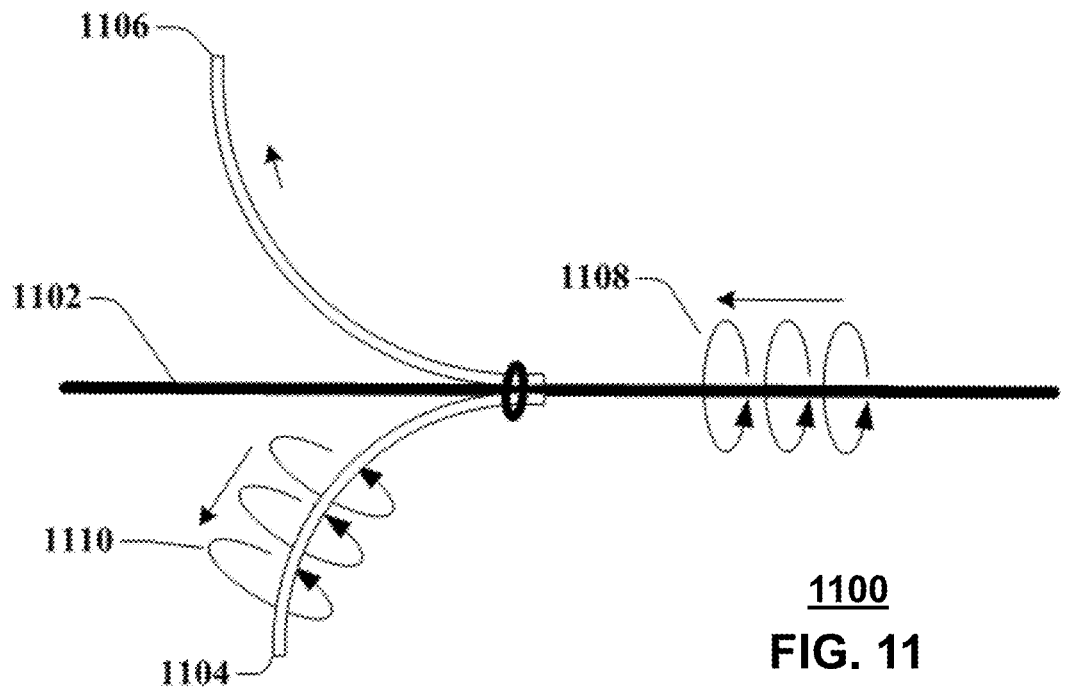
FIG. 11 is a block diagram illustrating an example, non-limiting embodiment of a dual stub coupler in accordance with various aspects described herein.

Referring now to FIG. 11, a block diagram 1100 illustrating an example, non-limiting embodiment of a dual stub coupler is shown. In particular, a dual coupler design is presented for use in a transmission device, such as transmission device 101 or 102 presented in conjunction with FIG. 1. In an embodiment, two or more couplers (such as the stub couplers 1104 and 1106) can be positioned around a wire 1102 in order to receive guided wave 1108. In an embodiment, one coupler is enough to receive the guided wave 1108. In that case, guided wave 1108 couples to coupler 1104 and propagates as guided wave 1110. If the field structure of the guided wave 1108 oscillates or undulates around the wire 1102 due to the particular guided wave mode(s) or various outside factors, then coupler 1106 can be placed such that guided wave 1108 couples to coupler 1106. In some embodiments, four or more couplers can be placed around a portion of the wire 1102, e.g., at 90 degrees or another spacing with respect to each other, in order to receive guided waves that may oscillate or rotate around the wire 1102, that have been induced at different azimuthal orientations or that have non-fundamental or higher order modes that, for example, have lobes and/or nulls or other asymmetries that are orientation dependent. However, it will be appreciated that there may be less than or more than four couplers placed around a portion of the wire 1102 without departing from example embodiments.

It should be noted that while couplers 1106 and 1104 are illustrated as stub couplers, any other of the coupler designs described herein including arc couplers, antenna or horn couplers, magnetic couplers, etc., could likewise be used. It will also be appreciated that while some example embodiments have presented a plurality of couplers around at least a portion of a wire 1102, this plurality of couplers can also be considered as part of a single coupler system having multiple coupler subcomponents. For example, two or more couplers can be manufactured as single system that can be installed around a wire in a single installation such that the couplers are either pre-positioned or adjustable relative to each other (either manually or automatically with a controllable mechanism such as a motor or other actuator) in accordance with the single system.

Receivers coupled to couplers 1106 and 1104 can use diversity combining to combine signals received from both couplers 1106 and 1104 in order to maximize the signal quality. In other embodiments, if one or the other of the couplers 1104 and 1106 receive a transmission that is above a predetermined threshold, receivers can use selection diversity when deciding which signal to use. Further, while reception by a plurality of couplers 1106 and 1104 is illustrated, transmission by couplers 1106 and 1104 in the same configuration can likewise take place. In particular, a wide range of multi-input multi-output (MIMO) transmission and reception techniques can be employed for transmissions where a transmission device, such as transmission device 101 or 102 presented in conjunction with FIG. 1 includes multiple transceivers and multiple couplers. For example, such MIMO transmission and reception techniques include precoding, spatial multiplexing, diversity coding and guided wave mode division multiplexing applied to transmission and reception by multiple couplers/launchers that operate on a transmission medium with one or more surfaces that support guided wave communications.

It is noted that the graphical representations of waves 1108 and 1110 are presented merely to illustrate the principles that guided wave 1108 induces or otherwise launches a wave 1110 on a coupler 1104. The actual electric and magnetic fields generated as a result of such wave propagation may vary depending on the frequencies employed, the design of the coupler 1104, the dimensions and composition of the wire 1102, as well as its surface characteristics, its insulation if any, the electromagnetic properties of the surrounding environment, etc.

Figure 12:
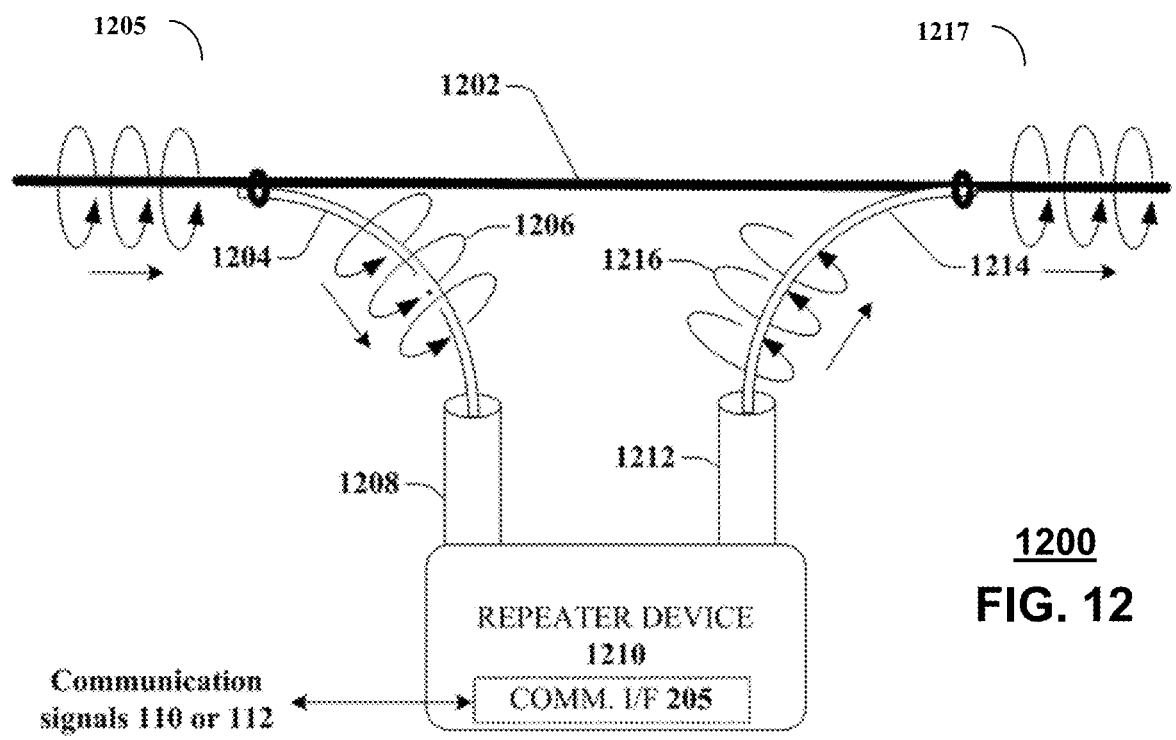
FIG. 12 is a block diagram illustrating an example, non-limiting embodiment of a repeater system in accordance with various aspects described herein.

Referring now to FIG. 12, a block diagram 1200 illustrating an example, non-limiting embodiment of a repeater system is shown. In particular, a repeater device 1210 is presented for use in a transmission device, such as transmission device 101 or 102 presented in conjunction with FIG. 1. In this system, two couplers 1204 and 1214 can be placed near a wire 1202 or other transmission medium such that guided waves 1205 propagating along the wire 1202 are extracted by coupler 1204 as wave 1206 (e.g. as a guided wave), and then are boosted or repeated by repeater device 1210 and launched as a wave 1216 (e.g. as a guided wave) onto coupler 1214. The wave 1216 can then be launched on the wire 1202 and continue to propagate along the wire 1202 as a guided wave 1217. In an embodiment, the repeater device 1210 can receive at least a portion of the power utilized for boosting or repeating through magnetic coupling with the wire 1202, for example, when the wire 1202 is a power line or otherwise contains a power-carrying conductor. It should be noted that while couplers 1204 and 1214 are illustrated as stub couplers, any other of the coupler designs described herein including arc couplers, antenna or horn couplers, magnetic couplers, or the like, could likewise be used.

In some embodiments, repeater device 1210 can repeat the transmission associated with wave 1206, and in other embodiments, repeater device 1210 can include a communications interface 205 that extracts data or other signals from the wave 1206 for supplying such data or signals to another network and/or one or more other devices as communication signals 110 or 112 and/or receiving communication signals 110 or 112 from another network and/or one or more other devices and launch guided wave 1216 having embedded therein the received communication signals 110 or 112. In a repeater configuration, receiver waveguide 1208 can receive the wave 1206 from the coupler 1204 and transmitter waveguide 1212 can launch guided wave 1216 onto coupler 1214 as guided wave 1217. Between receiver waveguide 1208 and transmitter waveguide 1212, the signal embedded in guided wave 1206 and/or the guided wave 1216 itself can be amplified to correct for signal loss and other inefficiencies associated with guided wave communications or the signal can be received and processed to extract the data contained therein and regenerated for transmission. In an embodiment, the receiver waveguide 1208 can be configured to extract data from the signal, process the data to correct for data errors utilizing for example error correcting codes, and regenerate an updated signal with the corrected data. The transmitter waveguide 1212 can then transmit guided wave 1216 with the updated signal embedded therein. In an embodiment, a signal embedded in guided wave 1206 can be extracted from the transmission and processed for communication with another network and/or one or more other devices via communications interface 205 as communication signals 110 or 112. Similarly, communication signals 110 or 112 received by the communications interface 205 can be inserted into a transmission of guided wave 1216 that is generated and launched onto coupler 1214 by transmitter waveguide 1212.

It is noted that although FIG. 12 shows guided wave transmissions 1206 and 1216 entering from the left and exiting to the right respectively, this is merely a simplification and is not intended to be limiting. In other embodiments, receiver waveguide 1208 and transmitter waveguide 1212 can also function as transmitters and receivers respectively, allowing the repeater device 1210 to be bi-directional.

In an embodiment, repeater device 1210 can be placed at locations where there are discontinuities or obstacles on the wire 1202 or other transmission medium. In the case where the wire 1202 is a power line, these obstacles can include transformers, connections, utility poles, and other such power line devices. The repeater device 1210 can help the guided (e.g., surface) waves jump over these obstacles on the line and boost the transmission power at the same time. In other embodiments, a coupler can be used to jump over the obstacle without the use of a repeater device. In that embodiment, both ends of the coupler can be tied or fastened to the wire, thus providing a path for the guided wave to travel without being blocked by the obstacle.

Figure 13:
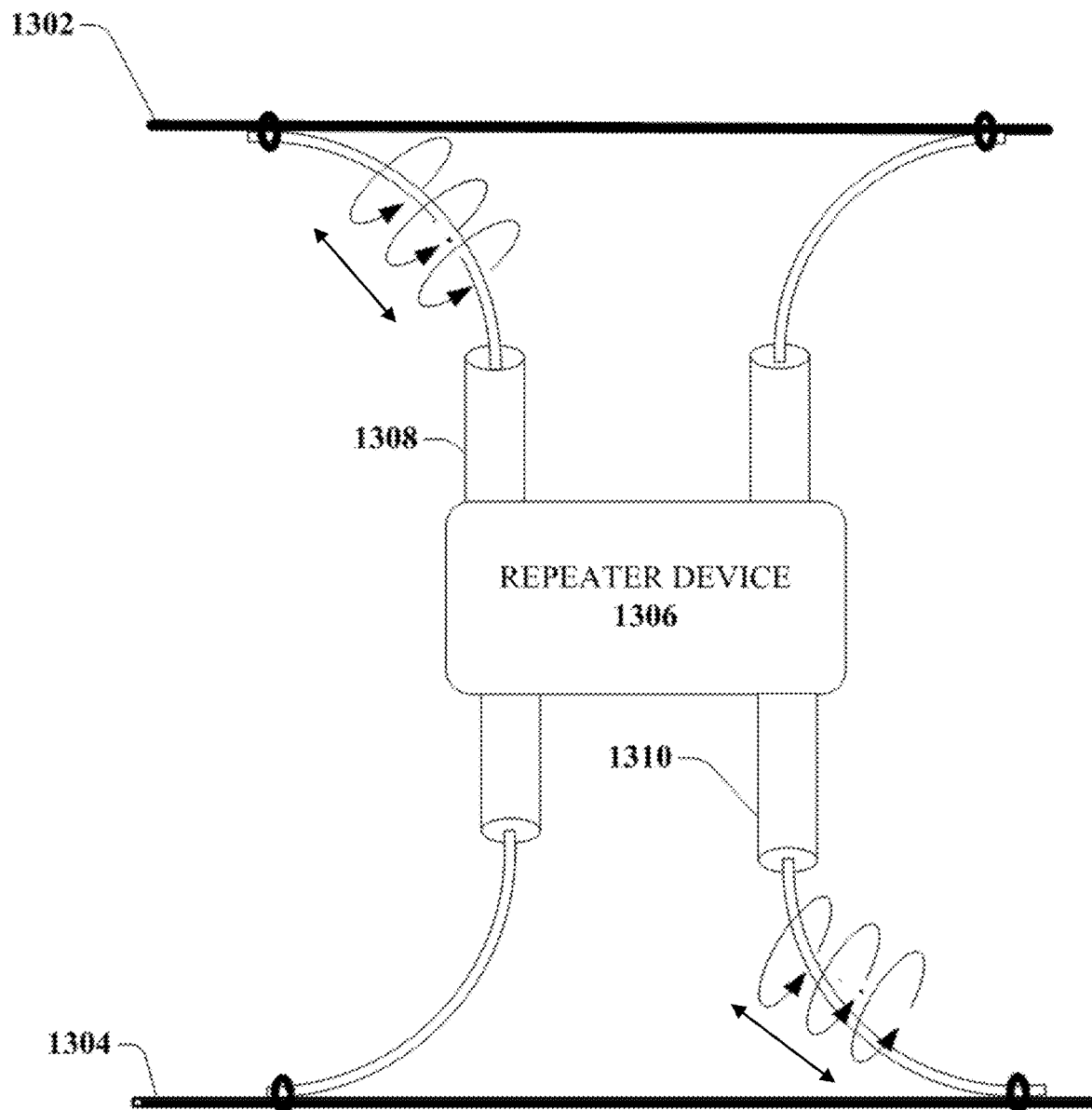
FIG. 13 illustrates a block diagram illustrating an example, non-limiting embodiment of a bidirectional repeater in accordance with various aspects described herein.

Turning now to FIG. 13, illustrated is a block diagram 1300 of an example, non-limiting embodiment of a bidirectional repeater in accordance with various aspects described herein. In particular, a bidirectional repeater device 1306 is presented for use in a transmission device, such as transmission device 101 or 102 presented in conjunction with FIG. 1. It should be noted that while the couplers are illustrated as stub couplers, any other of the coupler designs described herein including arc couplers, antenna or horn couplers, magnetic couplers, or the like, could likewise be used. The bidirectional repeater 1306 can employ diversity paths in the case of when two or more wires or other transmission media are present. Since guided wave transmissions have different transmission efficiencies and coupling efficiencies for transmission medium of different types such as insulated wires, un-insulated wires or other types of transmission media and further, if exposed to the elements, can be affected by weather, and other atmospheric conditions, it can be advantageous to selectively transmit on different transmission media at certain times. In various embodiments, the various transmission media can be designated as a primary, secondary, tertiary, etc. whether or not such designation indicates a preference of one transmission medium over another.

In the embodiment shown, the transmission media include an insulated or uninsulated wire 1302 and an insulated or uninsulated wire 1304 (referred to herein as wires 1302 and 1304, respectively). The repeater device 1306 uses a receiver coupler 1308 to receive a guided wave traveling along wire 1302 and repeats the transmission using transmitter waveguide 1310 as a guided wave along wire 1304. In other embodiments, repeater device 1306 can switch from the wire 1304 to the wire 1302, or can repeat the transmissions along the same paths. Repeater device 1306 can include sensors, or be in communication with sensors (or a network management system 1601 depicted in FIG. 16A) that indicate conditions that can affect the transmission. Based on the feedback received from the sensors, the repeater device 1306 can make the determination about whether to keep the transmission along the same wire, or transfer the transmission to the other wire.

Figure 14:
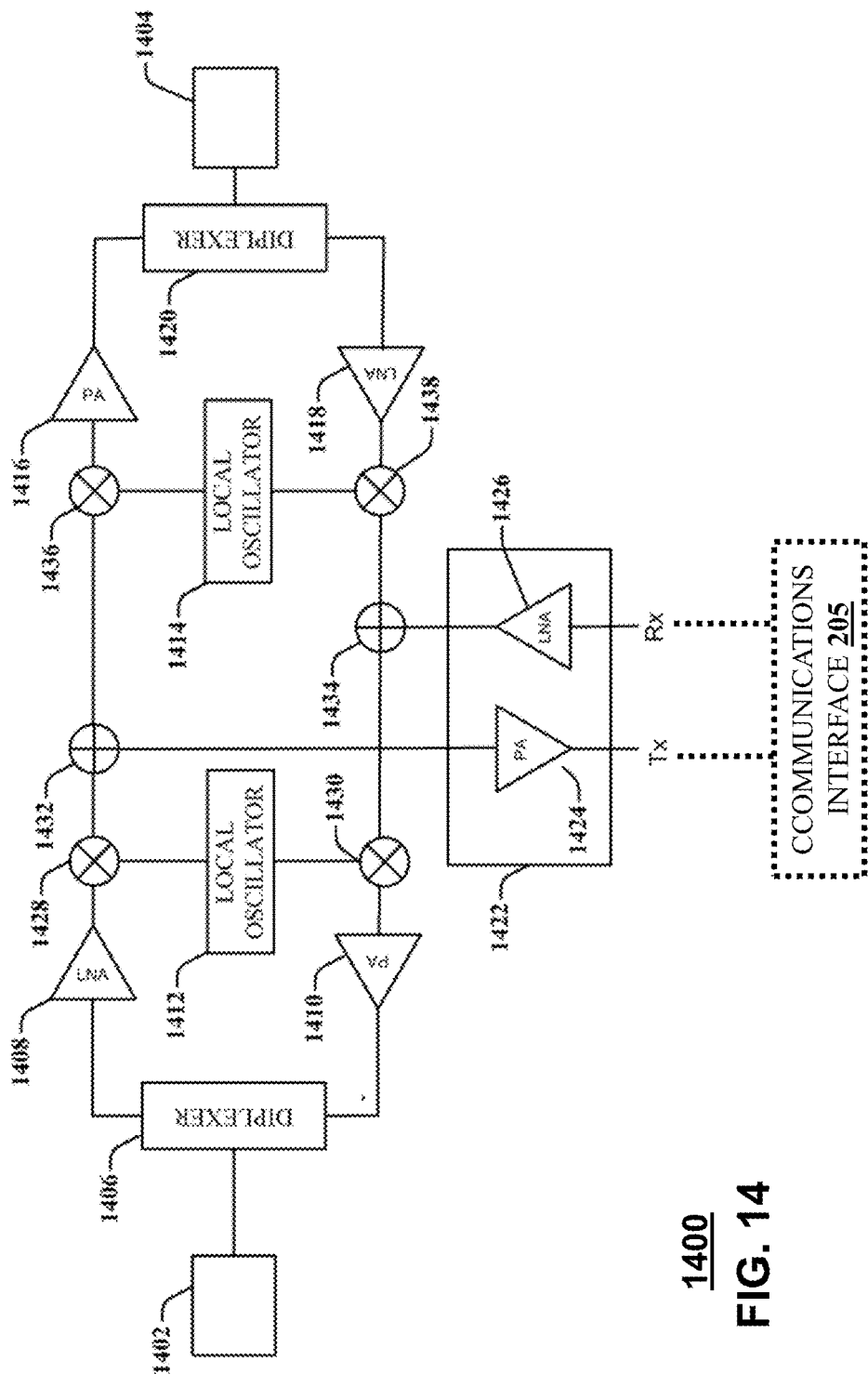
FIG. 14 is a block diagram illustrating an example, non-limiting embodiment of a waveguide system in accordance with various aspects described herein.

Turning now to FIG. 14, illustrated is a block diagram 1400 illustrating an example, non-limiting embodiment of a bidirectional repeater system. In particular, a bidirectional repeater system is presented for use in a transmission device, such as transmission device 101 or 102 presented in conjunction with FIG. 1. The bidirectional repeater system includes waveguide coupling devices 1402 and 1404 that receive and transmit transmissions from other coupling devices located in a distributed antenna system or backhaul system.

In various embodiments, waveguide coupling device 1402 can receive a transmission from another waveguide coupling device, wherein the transmission has a plurality of subcarriers. Diplexer 1406 can separate the transmission from other transmissions, and direct the transmission to low-noise amplifier ("LNA") 1408. A frequency mixer 1428, with help from a local oscillator 1412, can downshift the transmission (which is in the millimeter-wave band or around 38 GHz in some embodiments) to a lower frequency, such as a cellular band (~1.9 GHz) for a distributed antenna system, a native frequency, or other frequency for a backhaul system. An extractor (or demultiplexer) 1432 can extract the signal on a subcarrier and direct the signal to an output component 1422 for optional amplification, buffering or isolation by power amplifier 1424 for coupling to communications interface 205. The communications interface 205 can further process the signals received from the power amplifier 1424 or otherwise transmit such signals over a wireless or wired interface to other devices such as a base station, mobile devices, a building, etc. For the signals that are not being extracted at this location, extractor 1432 can redirect them to another frequency mixer 1436, where the signals are used to modulate a carrier wave generated by local oscillator 1414. The carrier wave, with its subcarriers, is directed to a power amplifier ("PA") 1416 and is retransmitted by waveguide coupling device 1404 to another system, via diplexer 1420.

An LNA 1426 can be used to amplify, buffer or isolate signals that are received by the communication interface 205 and then send the signal to a multiplexer 1434 which merges the signal with signals that have been received from waveguide coupling device 1404. The signals received from coupling device 1404 have been split by diplexer 1420, and then passed through LNA 1418, and downshifted in frequency by frequency mixer 1438. When the signals are combined by multiplexer 1434, they are upshifted in frequency by frequency mixer 1430, and then boosted by PA 1410, and transmitted to another system by waveguide coupling device 1402. In an embodiment bidirectional repeater system can be merely a repeater without the output device 1422. In this embodiment, the multiplexer 1434 would not be utilized and signals from LNA 1418 would be directed to mixer 1430 as previously described. It will be appreciated that in some embodiments, the bidirectional repeater system could also be implemented using two distinct and separate unidirectional repeaters. In an alternative embodiment, a bidirectional repeater system could also be a booster or otherwise perform retransmissions without downshifting and upshifting. Indeed in example embodiment, the retransmissions can be based upon receiving a signal or guided wave and performing some signal or guided wave processing or reshaping, filtering, and/or amplification, prior to retransmission of the signal or guided wave.

Figure 15:
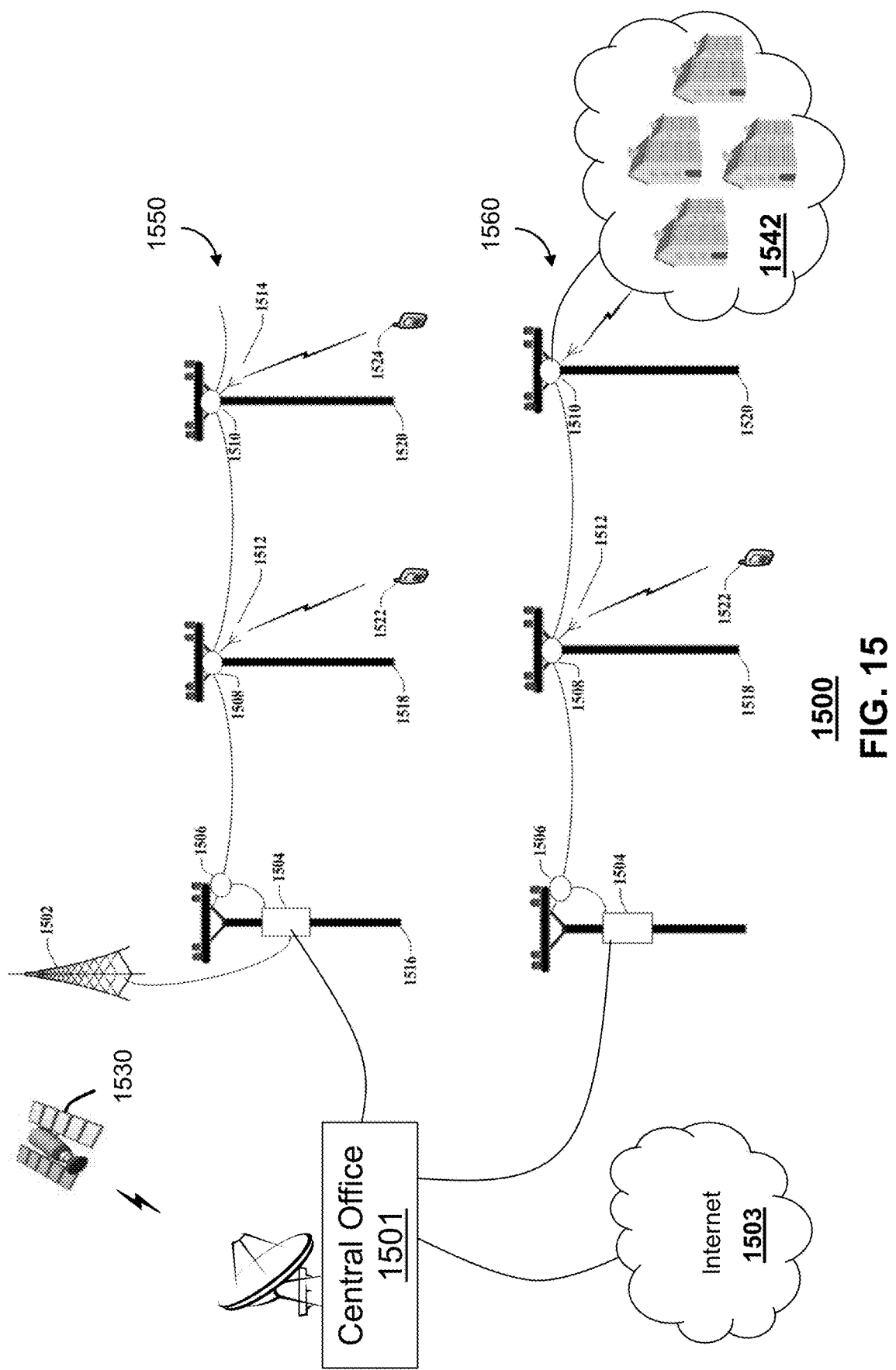
FIG. 15 is a block diagram illustrating an example, non-limiting embodiment of a guided-wave communications system in accordance with various aspects described herein.

Referring now to FIG. 15, a block diagram 1500 illustrating an example, non-limiting embodiment of a guided wave communications system is shown. This diagram depicts an exemplary environment in which a guided wave communication system, such as the guided wave communication system presented in conjunction with FIG. 1, can be used.

To provide network connectivity to additional base station devices, a backhaul network that links the communication cells (e.g., macrocells and macrocells) to network devices of a core network correspondingly expands. Similarly, to provide network connectivity to a distributed antenna system, an extended communication system that links base station devices and their distributed antennas is desirable. A guided wave communication system 1500 such as shown in FIG. 15 can be provided to enable alternative, increased or additional network connectivity and a waveguide coupling system can be provided to transmit and/or receive guided wave (e.g., surface wave) communications on a transmission medium such as a wire that operates as a single-wire transmission line (e.g., a utility line), and that can be used as a waveguide and/or that otherwise operates to guide the transmission of an electromagnetic wave.

The guided wave communication system 1500 can comprise a first instance of a distribution system 1550 that includes one or more base station devices (e.g., base station device 1504) that are communicably coupled to a central office 1501 and/or a macrocell site 1502. Base station device 1504 can be connected by a wired (e.g., fiber and/or cable), or by a wireless (e.g., microwave wireless) connection to the macrocell site 1502 and the central office 1501. A second instance of the distribution system 1560 can be used to provide wireless voice and data services to mobile device 1522 and to residential and/or commercial establishments 1542 (herein referred to as establishments 1542). System 1500 can have additional instances of the distribution systems 1550 and 1560 for providing voice and/or data services to mobile devices 1522-1524 and establishments 1542 as shown in FIG. 15.

Macrocells such as macrocell site 1502 can have dedicated connections to a mobile network and base station device 1504 or can share and/or otherwise use another connection. Central office 1501 can be used to distribute media content and/or provide internet service provider (ISP) services to mobile devices 1522-1524 and establishments 1542. The central office 1501 can receive media content from a constellation of satellites 1530 (one of which is shown in FIG. 15) or other sources of content, and distribute such content to mobile devices 1522-1524 and establishments 1542 via the first and second instances of the distribution system 1550 and 1560. The central office 1501 can also be communicatively coupled to the Internet 1503 for providing internet data services to mobile devices 1522-1524 and establishments 1542.

Base station device 1504 can be mounted on, or attached to, utility pole 1516. In other embodiments, base station device 1504 can be near transformers and/or other locations situated nearby a power line. Base station device 1504 can facilitate connectivity to a mobile network for mobile devices 1522 and 1524. Antennas 1512 and 1514, mounted on or near utility poles 1518 and 1520, respectively, can receive signals from base station device 1504 and transmit those signals to mobile devices 1522 and 1524 over a much wider area than if the antennas 1512 and 1514 were located at or near base station device 1504.

It is noted that FIG. 15 displays three utility poles, in each instance of the distribution systems 1550 and 1560, with one base station device, for purposes of simplicity. In other embodiments, utility pole 1516 can have more base station devices, and more utility poles with distributed antennas and/or tethered connections to establishments 1542.

A transmission device 1506, such as transmission device 101 or 102 presented in conjunction with FIG. 1, can transmit a signal from base station device 1504 to antennas 1512 and 1514 via utility or power line(s) that connect the utility poles 1516, 1518, and 1520. To transmit the signal, radio source and/or transmission device 1506 upconverts the signal (e.g., via frequency mixing) from base station device 1504 or otherwise converts the signal from the base station device 1504 to a microwave band signal and the transmission device 1506 launches a microwave band wave that propagates as a guided wave traveling along the utility line or other wire as described in previous embodiments. At utility pole 1518, another transmission device 1508 receives the guided wave (and optionally can amplify it as needed or desired or operate as a repeater to receive it and regenerate it) and sends it forward as a guided wave on the utility line or other wire. The transmission device 1508 can also extract a signal from the microwave band guided wave and shift it down in frequency or otherwise convert it to its original cellular band frequency (e.g., 1.9 GHz or other defined cellular frequency) or another cellular (or non-cellular) band frequency. An antenna 1512 can wireless transmit the down-shifted signal to mobile device 1522. The process can be repeated by transmission device 1510, antenna 1514 and mobile device 1524, as necessary or desirable.

Transmissions from mobile devices 1522 and 1524 can also be received by antennas 1512 and 1514 respectively. The transmission devices 1508 and 1510 can upshift or otherwise convert the cellular band signals to microwave band and transmit the signals as guided wave (e.g., surface wave or other electromagnetic wave) transmissions over the power line(s) to base station device 1504.

Media content received by the central office 1501 can be supplied to the second instance of the distribution system 1560 via the base station device 1504 for distribution to mobile devices 1522 and establishments 1542. The transmission device 1510 can be tethered to the establishments 1542 by one or more wired connections or a wireless interface. The one or more wired connections may include without limitation, a power line, a coaxial cable, a fiber cable, a twisted pair cable, a guided wave transmission medium or other suitable wired mediums for distribution of media content and/or for providing internet services. In an example embodiment, the wired connections from the transmission device 1510 can be communicatively coupled to one or more very high bit rate digital subscriber line (VDSL) modems located at one or more corresponding service area interfaces (SAIs—not shown) or pedestals, each SAI or pedestal providing services to a portion of the establishments 1542. The VDSL modems can be used to selectively distribute media content and/or provide internet services to gateways (not shown) located in the establishments 1542. The SAIs or pedestals can also be communicatively coupled to the establishments 1542 over a wired medium such as a power line, a coaxial cable, a fiber cable, a twisted pair cable, a guided wave transmission medium or other suitable wired mediums. In other example embodiments, the transmission device 1510 can be communicatively coupled directly to establishments 1542 without intermediate interfaces such as the SAIs or pedestals.

In another example embodiment, system 1500 can employ diversity paths, where two or more utility lines or other wires are strung between the utility poles 1516, 1518, and 1520 (e.g., for example, two or more wires between poles 1516 and 1520) and redundant transmissions from base station/macrocell site 1502 are transmitted as guided waves down the surface of the utility lines or other wires. The utility lines or other wires can be either insulated or uninsulated, and depending on the environmental conditions that cause transmission losses, the coupling devices can selectively receive signals from the insulated or uninsulated utility lines or other wires. The selection can be based on measurements of the signal-to-noise ratio of the wires, or based on determined weather/environmental conditions (e.g., moisture detectors, weather forecasts, etc.). The use of diversity paths with system 1500 can enable alternate routing capabilities, load balancing, increased load handling, concurrent bi-directional or synchronous communications, spread spectrum communications, etc.

It is noted that the use of the transmission devices 1506, 1508, and 1510 in FIG. 15 are by way of example only, and that in other embodiments, other uses are possible. For instance, transmission devices can be used in a backhaul communication system, providing network connectivity to base station devices. Transmission devices 1506, 1508, and 1510 can be used in many circumstances where it is desirable to transmit guided wave communications over a wire, whether insulated or not insulated. Transmission devices 1506, 1508, and 1510 are improvements over other coupling devices due to no contact or limited physical and/or electrical contact with the wires that may carry high voltages. The transmission device can be located away from the wire (e.g., spaced apart from the wire) and/or located on the wire so long as it is not electrically in contact with the wire, as the dielectric acts as an insulator, allowing for cheap, easy, and/or less complex installation. However, as previously noted conducting or non-dielectric couplers can be employed, for example in configurations where the wires correspond to a telephone network, cable television network, broadband data service, fiber optic communications system or other network employing low voltages or having insulated transmission lines.

It is further noted, that while base station device 1504 and macrocell site 1502 are illustrated in an embodiment, other network configurations are likewise possible. For example, devices such as access points or other wireless gateways can be employed in a similar fashion to extend the reach of other networks such as a wireless local area network, a wireless personal area network or other wireless network that operates in accordance with a communication protocol such as a 802.11 protocol, WIMAX protocol, UltraWideband protocol, Bluetooth® protocol, Zigbee® protocol or other wireless protocol.

Figure 16A:
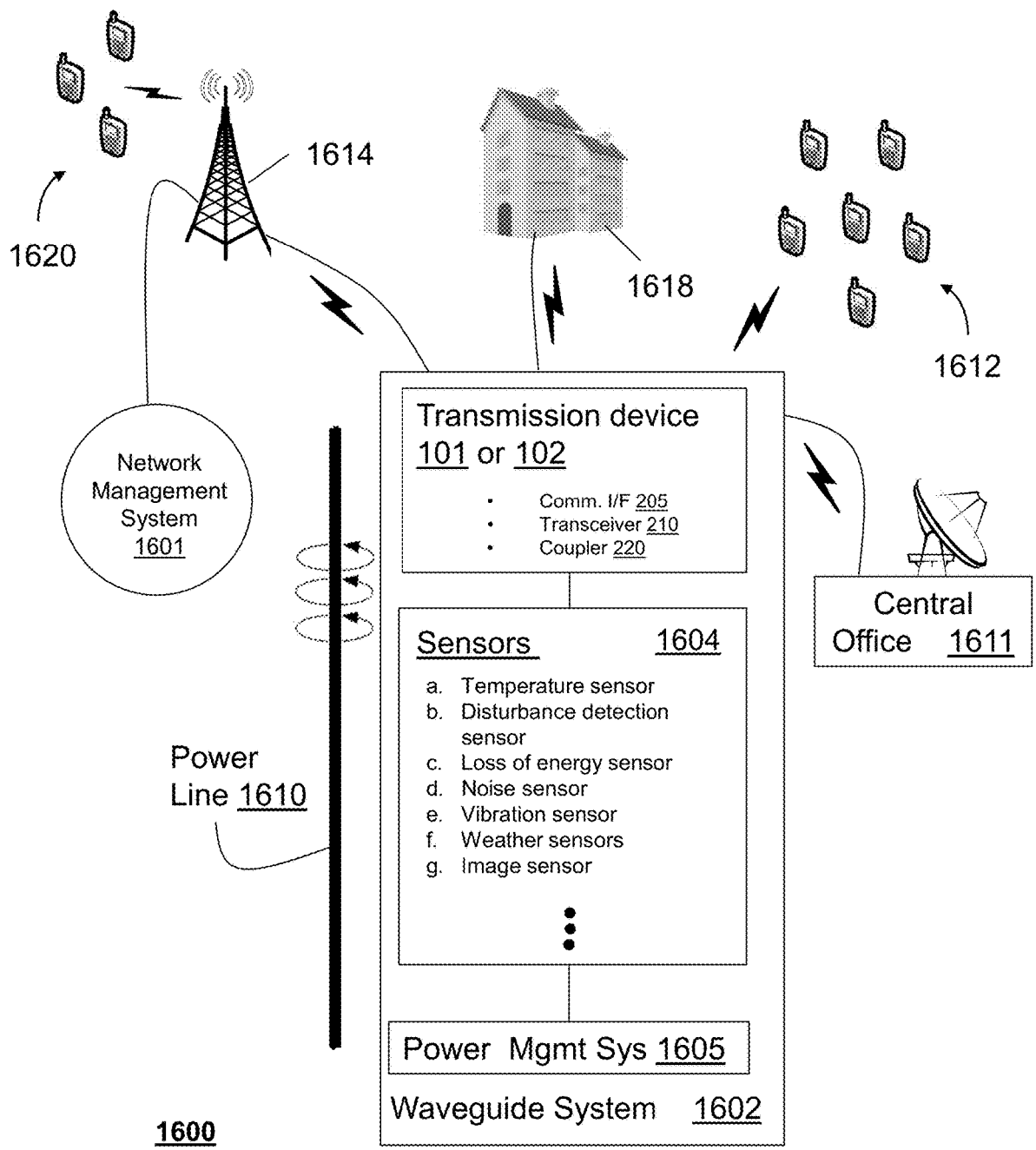
FIGS. 16A & 16B are block diagrams illustrating an example, non-limiting embodiment of a system for managing a power grid communication system in accordance with various aspects described herein.
Figure 16B:
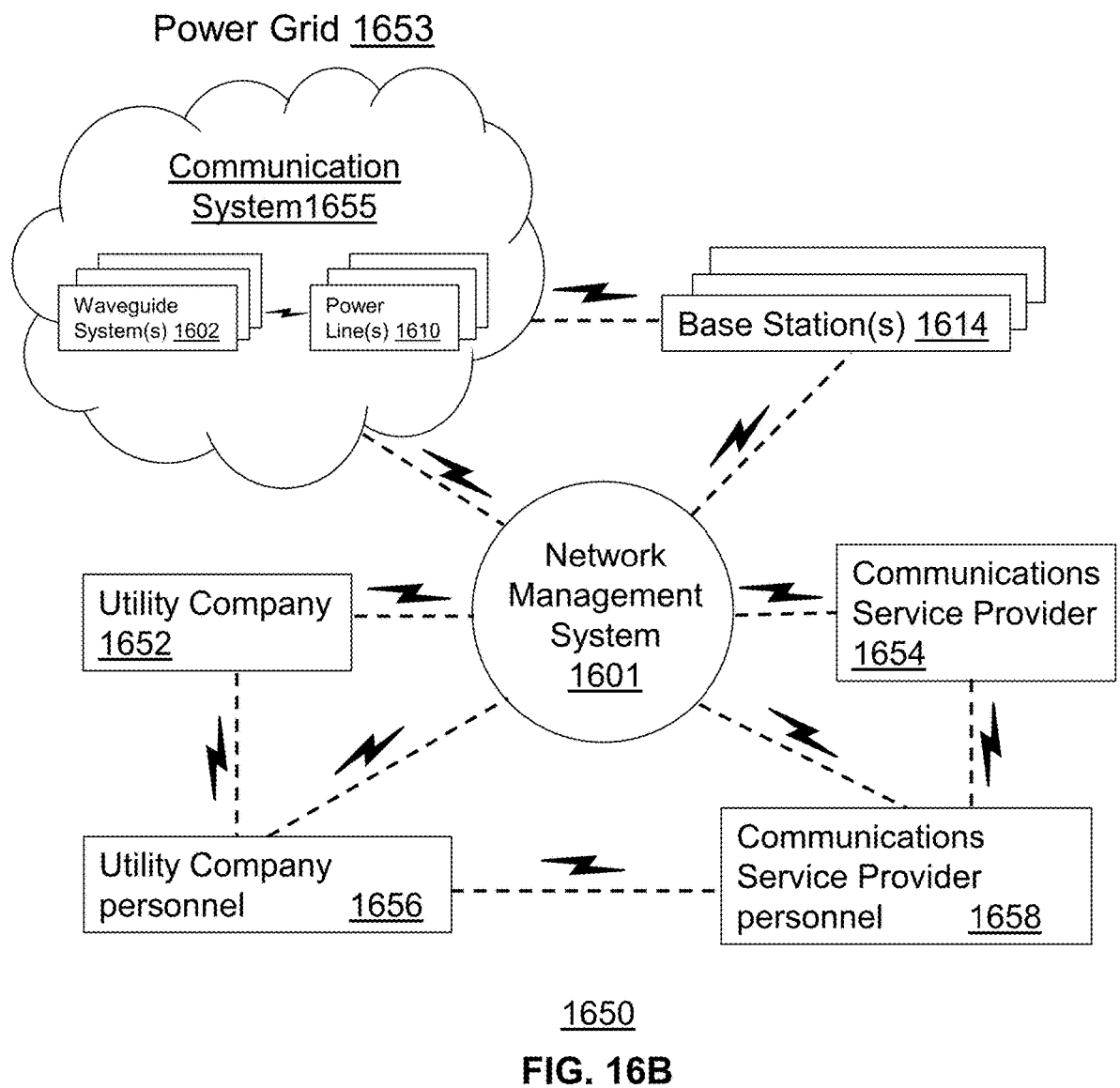

Referring now to FIGS. 16A & 16B, block diagrams illustrating an example, non-limiting embodiment of a system for managing a power grid communication system are shown. Considering FIG. 16A, a waveguide system 1602 is presented for use in a guided wave communications system 1600, such as the system presented in conjunction with FIG. 15. The waveguide system 1602 can comprise sensors 1604, a power management system 1605, a transmission device 101 or 102 that includes at least one communication interface 205, transceiver 210 and coupler 220.

The waveguide system 1602 can be coupled to a power line 1610 for facilitating guided wave communications in accordance with embodiments described in the subject disclosure. In an example embodiment, the transmission device 101 or 102 includes coupler 220 for inducing electromagnetic waves on a surface of the power line 1610 that longitudinally propagate along the surface of the power line 1610 as described in the subject disclosure. The transmission device 101 or 102 can also serve as a repeater for retransmitting electromagnetic waves on the same power line 1610 or for routing electromagnetic waves between power lines 1610 as shown in FIGS. 12-13.

The transmission device 101 or 102 includes transceiver 210 configured to, for example, up-convert a signal operating at an original frequency range to electromagnetic waves operating at, exhibiting, or associated with a carrier frequency that propagate along a coupler to induce corresponding guided electromagnetic waves that propagate along a surface of the power line 1610. A carrier frequency can be represented by a center frequency having upper and lower cutoff frequencies that define the bandwidth of the electromagnetic waves. The power line 1610 can be a wire (e.g., single stranded or multi-stranded) having a conducting surface or insulated surface. The transceiver 210 can also receive signals from the coupler 220 and down-convert the electromagnetic waves operating at a carrier frequency to signals at their original frequency.

Signals received by the communications interface 205 of transmission device 101 or 102 for up-conversion can include without limitation signals supplied by a central office 1611 over a wired or wireless interface of the communications interface 205, a base station 1614 over a wired or wireless interface of the communications interface 205, wireless signals transmitted by mobile devices 1620 to the base station 1614 for delivery over the wired or wireless interface of the communications interface 205, signals supplied by in-building communication devices 1618 over the wired or wireless interface of the communications interface 205, and/or wireless signals supplied to the communications interface 205 by mobile devices 1612 roaming in a wireless communication range of the communications interface 205. In embodiments where the waveguide system 1602 functions as a repeater, such as shown in FIGS. 12-13, the communications interface 205 may or may not be included in the waveguide system 1602.

The electromagnetic waves propagating along the surface of the power line 1610 can be modulated and formatted to include packets or frames of data that include a data payload and further include networking information (such as header information for identifying one or more destination waveguide systems 1602). The networking information may be provided by the waveguide system 1602 or an originating device such as the central office 1611, the base station 1614, mobile devices 1620, or in-building devices 1618, or a combination thereof. Additionally, the modulated electromagnetic waves can include error correction data for mitigating signal disturbances. The networking information and error correction data can be used by a destination waveguide system 1602 for detecting transmissions directed to it, and for down-converting and processing with error correction data transmissions that include voice and/or data signals directed to recipient communication devices communicatively coupled to the destination waveguide system 1602.

Referring now to the sensors 1604 of the waveguide system 1602, the sensors 1604 can comprise one or more of a temperature sensor 1604a, a disturbance detection sensor 1604b, a loss of energy sensor 1604c, a noise sensor 1604d, a vibration sensor 1604e, an environmental (e.g., weather) sensor 1604f, and/or an image sensor 1604g. The temperature sensor 1604a can be used to measure ambient temperature, a temperature of the transmission device 101 or 102, a temperature of the power line 1610, temperature differentials (e.g., compared to a setpoint or baseline, between transmission device 101 or 102 and 1610, etc.), or any combination thereof. In one embodiment, temperature metrics can be collected and reported periodically to a network management system 1601 by way of the base station 1614.

The disturbance detection sensor 1604b can perform measurements on the power line 1610 to detect disturbances such as signal reflections, which may indicate a presence of a downstream disturbance that may impede the propagation of electromagnetic waves on the power line 1610. A signal reflection can represent a distortion resulting from, for example, an electromagnetic wave transmitted on the power line 1610 by the transmission device 101 or 102 that reflects in whole or in part back to the transmission device 101 or 102 from a disturbance in the power line 1610 located downstream from the transmission device 101 or 102.

Signal reflections can be caused by obstructions on the power line 1610. For example, a tree limb may cause electromagnetic wave reflections when the tree limb is lying on the power line 1610, or is in close proximity to the power line 1610 which may cause a corona discharge. Other obstructions that can cause electromagnetic wave reflections can include without limitation an object that has been entangled on the power line 1610 (e.g., clothing, a shoe wrapped around a power line 1610 with a shoe string, etc.), a corroded build-up on the power line 1610 or an ice build-up. Power grid components may also impede or obstruct with the propagation of electromagnetic waves on the surface of power lines 1610. Illustrations of power grid components that may cause signal reflections include without limitation a transformer and a joint for connecting spliced power lines. A sharp angle on the power line 1610 may also cause electromagnetic wave reflections.

The disturbance detection sensor 1604b can comprise a circuit to compare magnitudes of electromagnetic wave reflections to magnitudes of original electromagnetic waves transmitted by the transmission device 101 or 102 to determine how much a downstream disturbance in the power line 1610 attenuates transmissions. The disturbance detection sensor 1604b can further comprise a spectral analyzer circuit for performing spectral analysis on the reflected waves. The spectral data generated by the spectral analyzer circuit can be compared with spectral profiles via pattern recognition, an expert system, curve fitting, matched filtering or other artificial intelligence, classification or comparison technique to identify a type of disturbance based on, for example, the spectral profile that most closely matches the spectral data. The spectral profiles can be stored in a memory of the disturbance detection sensor 1604b or may be remotely accessible by the disturbance detection sensor 1604b. The profiles can comprise spectral data that models different disturbances that may be encountered on power lines 1610 to enable the disturbance detection sensor 1604b to identify disturbances locally. An identification of the disturbance if known can be reported to the network management system 1601 by way of the base station 1614. The disturbance detection sensor 1604b can also utilize the transmission device 101 or 102 to transmit electromagnetic waves as test signals to determine a roundtrip time for an electromagnetic wave reflection. The round trip time measured by the disturbance detection sensor 1604b can be used to calculate a distance traveled by the electromagnetic wave up to a point where the reflection takes place, which enables the disturbance detection sensor 1604b to calculate a distance from the transmission device 101 or 102 to the downstream disturbance on the power line 1610.

The distance calculated can be reported to the network management system 1601 by way of the base station 1614. In one embodiment, the location of the waveguide system 1602 on the power line 1610 may be known to the network management system 1601, which the network management system 1601 can use to determine a location of the disturbance on the power line 1610 based on a known topology of the power grid. In another embodiment, the waveguide system 1602 can provide its location to the network management system 1601 to assist in the determination of the location of the disturbance on the power line 1610. The location of the waveguide system 1602 can be obtained by the waveguide system 1602 from a pre-programmed location of the waveguide system 1602 stored in a memory of the waveguide system 1602, or the waveguide system 1602 can determine its location using a GPS receiver (not shown) included in the waveguide system 1602.

The power management system 1605 provides energy to the aforementioned components of the waveguide system 1602. The power management system 1605 can receive energy from solar cells, or from a transformer (not shown) coupled to the power line 1610, or by inductive coupling to the power line 1610 or another nearby power line. The power management system 1605 can also include a backup battery and/or a super capacitor or other capacitor circuit for providing the waveguide system 1602 with temporary power. The loss of energy sensor 1604c can be used to detect when the waveguide system 1602 has a loss of power condition and/or the occurrence of some other malfunction. For example, the loss of energy sensor 1604c can detect when there is a loss of power due to defective solar cells, an obstruction on the solar cells that causes them to malfunction, loss of power on the power line 1610, and/or when the backup power system malfunctions due to expiration of a backup battery, or a detectable defect in a super capacitor. When a malfunction and/or loss of power occurs, the loss of energy sensor 1604c can notify the network management system 1601 by way of the base station 1614.

The noise sensor 1604d can be used to measure noise on the power line 1610 that may adversely affect transmission of electromagnetic waves on the power line 1610. The noise sensor 1604d can sense unexpected electromagnetic interference, noise bursts, or other sources of disturbances that may interrupt reception of modulated electromagnetic waves on a surface of a power line 1610. A noise burst can be caused by, for example, a corona discharge, or other source of noise. The noise sensor 1604d can compare the measured noise to a noise profile obtained by the waveguide system 1602 from an internal database of noise profiles or from a remotely located database that stores noise profiles via pattern recognition, an expert system, curve fitting, matched filtering or other artificial intelligence, classification or comparison technique. From the comparison, the noise sensor 1604d may identify a noise source (e.g., corona discharge or otherwise) based on, for example, the noise profile that provides the closest match to the measured noise. The noise sensor 1604d can also detect how noise affects transmissions by measuring transmission metrics such as bit error rate, packet loss rate, jitter, packet retransmission requests, etc. The noise sensor 1604d can report to the network management system 1601 by way of the base station 1614 the identity of noise sources, their time of occurrence, and transmission metrics, among other things.

The vibration sensor 1604e can include accelerometers and/or gyroscopes to detect 2D or 3D vibrations on the power line 1610. The vibrations can be compared to vibration profiles that can be stored locally in the waveguide system 1602, or obtained by the waveguide system 1602 from a remote database via pattern recognition, an expert system, curve fitting, matched filtering or other artificial intelligence, classification or comparison technique. Vibration profiles can be used, for example, to distinguish fallen trees from wind gusts based on, for example, the vibration profile that provides the closest match to the measured vibrations. The results of this analysis can be reported by the vibration sensor 1604e to the network management system 1601 by way of the base station 1614.

The environmental sensor 1604f can include a barometer for measuring atmospheric pressure, ambient temperature (which can be provided by the temperature sensor 1604a), wind speed, humidity, wind direction, and rainfall, among other things. The environmental sensor 1604f can collect raw information and process this information by comparing it to environmental profiles that can be obtained from a memory of the waveguide system 1602 or a remote database to predict weather conditions before they arise via pattern recognition, an expert system, knowledge-based system or other artificial intelligence, classification or other weather modeling and prediction technique. The environmental sensor 1604f can report raw data as well as its analysis to the network management system 1601.

The image sensor 1604g can be a digital camera (e.g., a charged coupled device or CCD imager, infrared camera, etc.) for capturing images in a vicinity of the waveguide system 1602. The image sensor 1604g can include an electromechanical mechanism to control movement (e.g., actual position or focal points/zooms) of the camera for inspecting the power line 1610 from multiple perspectives (e.g., top surface, bottom surface, left surface, right surface and so on). Alternatively, the image sensor 1604g can be designed such that no electromechanical mechanism is needed in order to obtain the multiple perspectives. The collection and retrieval of imaging data generated by the image sensor 1604g can be controlled by the network management system 1601, or can be autonomously collected and reported by the image sensor 1604g to the network management system 1601.

Other sensors that may be suitable for collecting telemetry information associated with the waveguide system 1602 and/or the power lines 1610 for purposes of detecting, predicting and/or mitigating disturbances that can impede the propagation of electromagnetic wave transmissions on power lines 1610 (or any other form of a transmission medium of electromagnetic waves) may be utilized by the waveguide system 1602.

Referring now to FIG. 16B, block diagram 1650 illustrates an example, non-limiting embodiment of a system for managing a power grid 1653 and a communication system 1655 embedded therein or associated therewith in accordance with various aspects described herein. The communication system 1655 comprises a plurality of waveguide systems 1602 coupled to power lines 1610 of the power grid 1653. At least a portion of the waveguide systems 1602 used in the communication system 1655 can be in direct communication with a base station 1614 and/or the network management system 1601. Waveguide systems 1602 not directly connected to a base station 1614 or the network management system 1601 can engage in communication sessions with either a base station 1614 or the network management system 1601 by way of other downstream waveguide systems 1602 connected to a base station 1614 or the network management system 1601.

The network management system 1601 can be communicatively coupled to equipment of a utility company 1652 and equipment of a communications service provider 1654 for providing each entity, status information associated with the power grid 1653 and the communication system 1655, respectively. The network management system 1601, the equipment of the utility company 1652, and the communications service provider 1654 can access communication devices utilized by utility company personnel 1656 and/or communication devices utilized by communications service provider personnel 1658 for purposes of providing status information and/or for directing such personnel in the management of the power grid 1653 and/or communication system 1655.

Figure 17A:
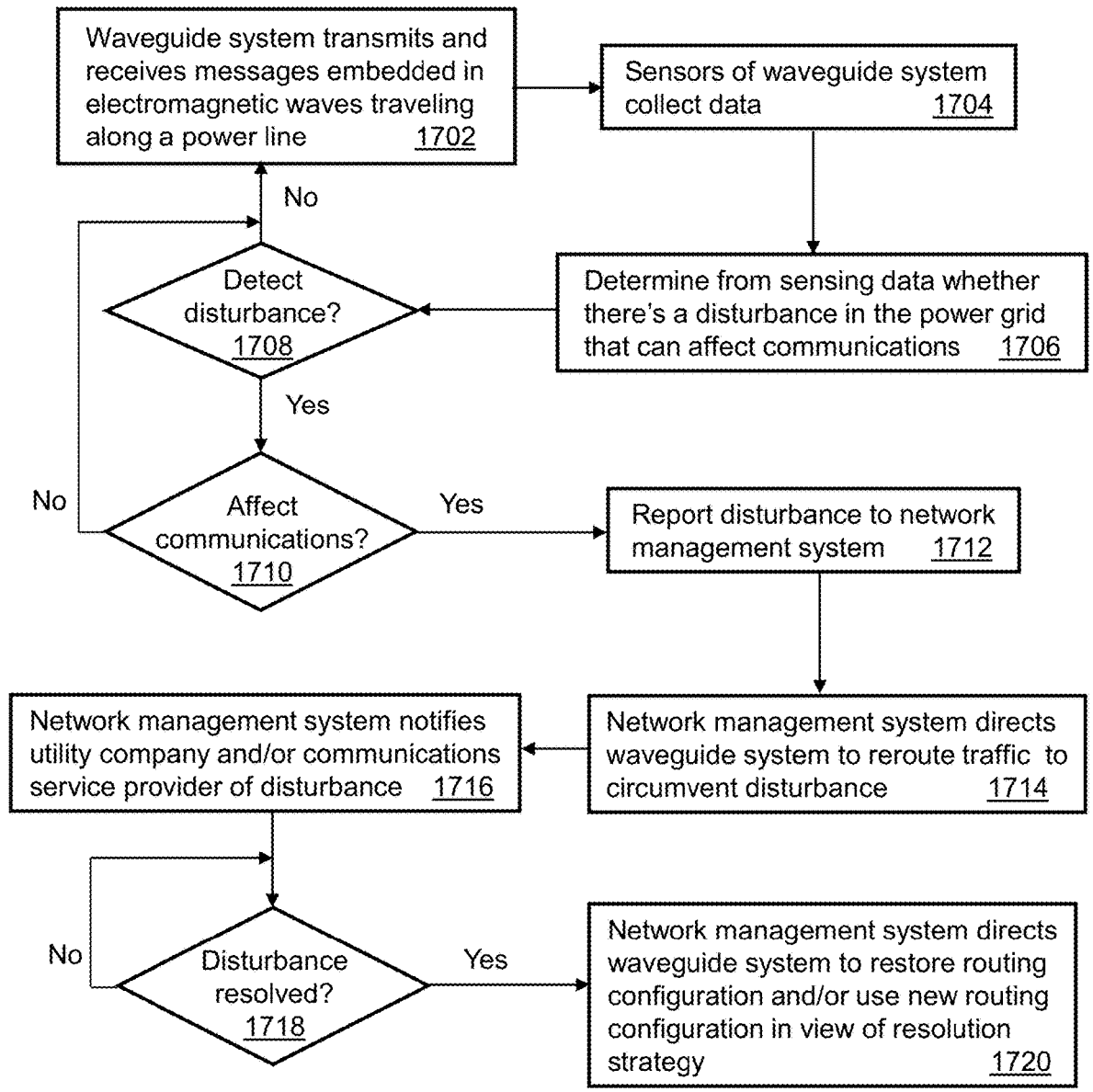
FIG. 17A illustrates a flow diagram of an example, non-limiting embodiment of a method for detecting and mitigating disturbances occurring in a communication network of the system of FIGS. 16A and 16B.

FIG. 17A illustrates a flow diagram of an example, non-limiting embodiment of a method 1700 for detecting and mitigating disturbances occurring in a communication network of the systems of FIGS. 16A & 16B. Method 1700 can begin with step 1702 where a waveguide system 1602 transmits and receives messages embedded in, or forming part of, modulated electromagnetic waves or another type of electromagnetic waves traveling along a surface of a power line 1610. The messages can be voice messages, streaming video, and/or other data/information exchanged between communication devices communicatively coupled to the communication system 1655. At step 1704 the sensors 1604 of the waveguide system 1602 can collect sensing data. In an embodiment, the sensing data can be collected in step 1704 prior to, during, or after the transmission and/or receipt of messages in step 1702. At step 1706 the waveguide system 1602 (or the sensors 1604 themselves) can determine from the sensing data an actual or predicted occurrence of a disturbance in the communication system 1655 that can affect communications originating from (e.g., transmitted by) or received by the waveguide system 1602. The waveguide system 1602 (or the sensors 1604) can process temperature data, signal reflection data, loss of energy data, noise data, vibration data, environmental data, or any combination thereof to make this determination. The waveguide system 1602 (or the sensors 1604) may also detect, identify, estimate, or predict the source of the disturbance and/or its location in the communication system 1655. If a disturbance is neither detected/identified nor predicted/estimated at step 1708, the waveguide system 1602 can proceed to step 1702 where it continues to transmit and receive messages embedded in, or forming part of, modulated electromagnetic waves traveling along a surface of the power line 1610.

If at step 1708 a disturbance is detected/identified or predicted/estimated to occur, the waveguide system 1602 proceeds to step 1710 to determine if the disturbance adversely affects (or alternatively, is likely to adversely affect or the extent to which it may adversely affect) transmission or reception of messages in the communication system 1655. In one embodiment, a duration threshold and a frequency of occurrence threshold can be used at step 1710 to determine when a disturbance adversely affects communications in the communication system 1655. For illustration purposes only, assume a duration threshold is set to 500 ms, while a frequency of occurrence threshold is set to 5 disturbances occurring in an observation period of 10 sec. Thus, a disturbance having a duration greater than 500 ms will trigger the duration threshold. Additionally, any disturbance occurring more than 5 times in a 10 sec time interval will trigger the frequency of occurrence threshold.

In one embodiment, a disturbance may be considered to adversely affect signal integrity in the communication systems 1655 when the duration threshold alone is exceeded. In another embodiment, a disturbance may be considered as adversely affecting signal integrity in the communication systems 1655 when both the duration threshold and the frequency of occurrence threshold are exceeded. The latter embodiment is thus more conservative than the former embodiment for classifying disturbances that adversely affect signal integrity in the communication system 1655. It will be appreciated that many other algorithms and associated parameters and thresholds can be utilized for step 1710 in accordance with example embodiments.

Referring back to method 1700, if at step 1710 the disturbance detected at step 1708 does not meet the condition for adversely affected communications (e.g., neither exceeds the duration threshold nor the frequency of occurrence threshold), the waveguide system 1602 may proceed to step 1702 and continue processing messages. For instance, if the disturbance detected in step 1708 has a duration of 1 msec with a single occurrence in a 10 sec time period, then neither threshold will be exceeded. Consequently, such a disturbance may be considered as having a nominal effect on signal integrity in the communication system 1655 and thus would not be flagged as a disturbance requiring mitigation. Although not flagged, the occurrence of the disturbance, its time of occurrence, its frequency of occurrence, spectral data, and/or other useful information, may be reported to the network management system 1601 as telemetry data for monitoring purposes.

Referring back to step 1710, if on the other hand the disturbance satisfies the condition for adversely affected communications (e.g., exceeds either or both thresholds), the waveguide system 1602 can proceed to step 1712 and report the incident to the network management system 1601. The report can include raw sensing data collected by the sensors 1604, a description of the disturbance if known by the waveguide system 1602, a time of occurrence of the disturbance, a frequency of occurrence of the disturbance, a location associated with the disturbance, parameters readings such as bit error rate, packet loss rate, retransmission requests, jitter, latency and so on. If the disturbance is based on a prediction by one or more sensors of the waveguide system 1602, the report can include a type of disturbance expected, and if predictable, an expected time occurrence of the disturbance, and an expected frequency of occurrence of the predicted disturbance when the prediction is based on historical sensing data collected by the sensors 1604 of the waveguide system 1602.

At step 1714, the network management system 1601 can determine a mitigation, circumvention, or correction technique, which may include directing the waveguide system 1602 to reroute traffic to circumvent the disturbance if the location of the disturbance can be determined. In one embodiment, the waveguide coupling device 1402 detecting the disturbance may direct a repeater such as the one shown in FIGS. 13-14 to connect the waveguide system 1602 from a primary power line affected by the disturbance to a secondary power line to enable the waveguide system 1602 to reroute traffic to a different transmission medium and avoid the disturbance. In an embodiment where the waveguide system 1602 is configured as a repeater the waveguide system 1602 can itself perform the rerouting of traffic from the primary power line to the secondary power line. It is further noted that for bidirectional communications (e.g., full or half-duplex communications), the repeater can be configured to reroute traffic from the secondary power line back to the primary power line for processing by the waveguide system 1602.

In another embodiment, the waveguide system 1602 can redirect traffic by instructing a first repeater situated upstream of the disturbance and a second repeater situated downstream of the disturbance to redirect traffic from a primary power line temporarily to a secondary power line and back to the primary power line in a manner that avoids the disturbance. It is further noted that for bidirectional communications (e.g., full or half-duplex communications), repeaters can be configured to reroute traffic from the secondary power line back to the primary power line.

To avoid interrupting existing communication sessions occurring on a secondary power line, the network management system 1601 may direct the waveguide system 1602 to instruct repeater(s) to utilize unused time slot(s) and/or frequency band(s) of the secondary power line for redirecting data and/or voice traffic away from the primary power line to circumvent the disturbance.

At step 1716, while traffic is being rerouted to avoid the disturbance, the network management system 1601 can notify equipment of the utility company 1652 and/or equipment of the communications service provider 1654, which in turn may notify personnel of the utility company 1656 and/or personnel of the communications service provider 1658 of the detected disturbance and its location if known. Field personnel from either party can attend to resolving the disturbance at a determined location of the disturbance. Once the disturbance is removed or otherwise mitigated by personnel of the utility company and/or personnel of the communications service provider, such personnel can notify their respective companies and/or the network management system 1601 utilizing field equipment (e.g., a laptop computer, smartphone, etc.) communicatively coupled to network management system 1601, and/or equipment of the utility company and/or the communications service provider. The notification can include a description of how the disturbance was mitigated and any changes to the power lines 1610 that may change a topology of the communication system 1655.

Once the disturbance has been resolved (as determined in decision 1718), the network management system 1601 can direct the waveguide system 1602 at step 1720 to restore the previous routing configuration used by the waveguide system 1602 or route traffic according to a new routing configuration if the restoration strategy used to mitigate the disturbance resulted in a new network topology of the communication system 1655. In another embodiment, the waveguide system 1602 can be configured to monitor mitigation of the disturbance by transmitting test signals on the power line 1610 to determine when the disturbance has been removed. Once the waveguide system 1602 detects an absence of the disturbance it can autonomously restore its routing configuration without assistance by the network management system 1601 if it determines the network topology of the communication system 1655 has not changed, or it can utilize a new routing configuration that adapts to a detected new network topology.

Figure 17B:
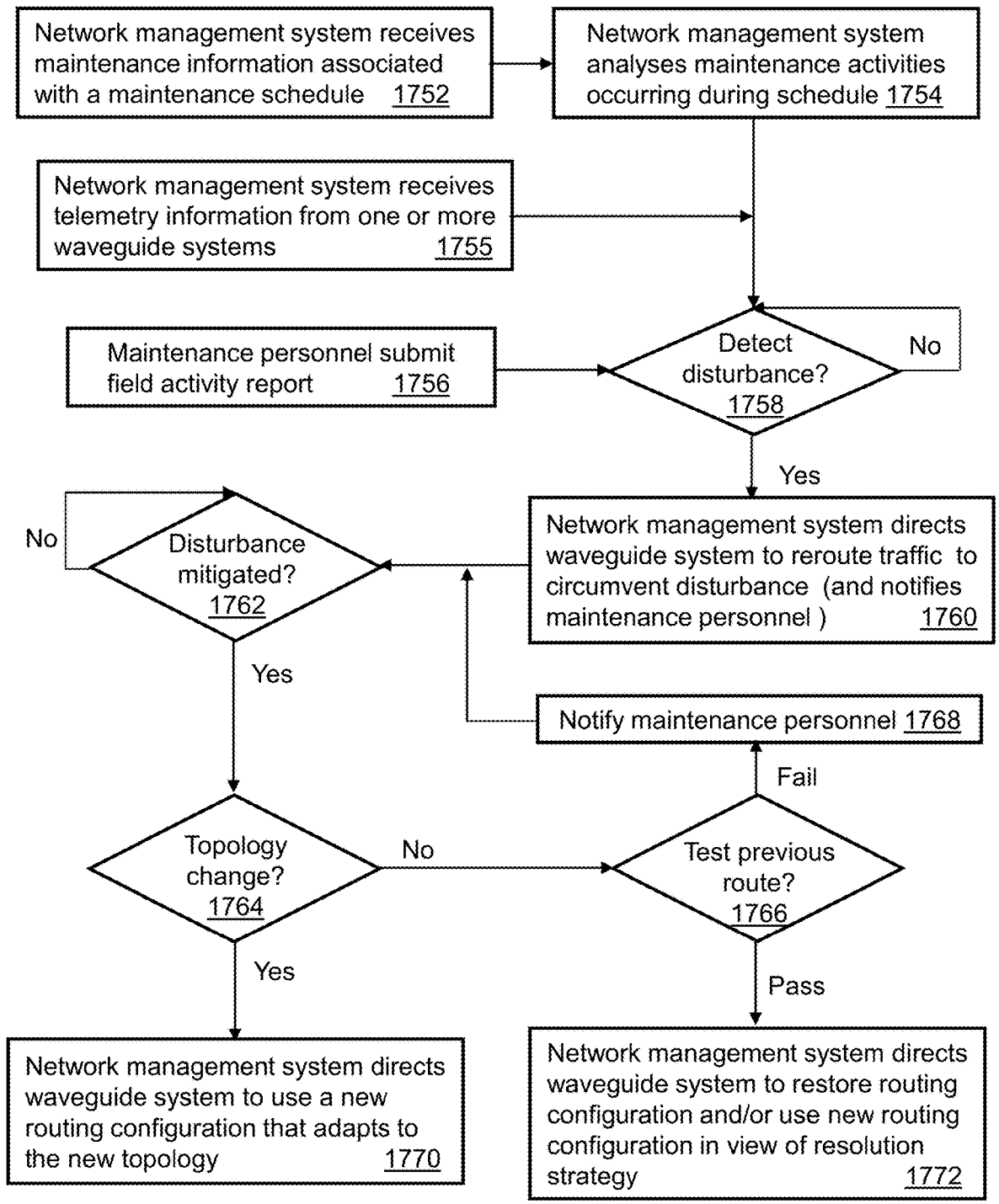
FIG. 17B illustrates a flow diagram of an example, non-limiting embodiment of a method for detecting and mitigating disturbances occurring in a communication network of the system of FIGS. 16A and 16B.

FIG. 17B illustrates a flow diagram of an example, non-limiting embodiment of a method 1750 for detecting and mitigating disturbances occurring in a communication network of the system of FIGS. 16A and 16B. In one embodiment, method 1750 can begin with step 1752 where a network management system 1601 receives from equipment of the utility company 1652 or equipment of the communications service provider 1654 maintenance information associated with a maintenance schedule. The network management system 1601 can at step 1754 identify from the maintenance information, maintenance activities to be performed during the maintenance schedule. From these activities, the network management system 1601 can detect a disturbance resulting from the maintenance (e.g., scheduled replacement of a power line 1610, scheduled replacement of a waveguide system 1602 on the power line 1610, scheduled reconfiguration of power lines 1610 in the power grid 1653, etc.).

In another embodiment, the network management system 1601 can receive at step 1755 telemetry information from one or more waveguide systems 1602. The telemetry information can include among other things an identity of each waveguide system 1602 submitting the telemetry information, measurements taken by sensors 1604 of each waveguide system 1602, information relating to predicted, estimated, or actual disturbances detected by the sensors 1604 of each waveguide system 1602, location information associated with each waveguide system 1602, an estimated location of a detected disturbance, an identification of the disturbance, and so on. The network management system 1601 can determine from the telemetry information a type of disturbance that may be adverse to operations of the waveguide, transmission of the electromagnetic waves along the wire surface, or both. The network management system 1601 can also use telemetry information from multiple waveguide systems 1602 to isolate and identify the disturbance. Additionally, the network management system 1601 can request telemetry information from waveguide systems 1602 in a vicinity of an affected waveguide system 1602 to triangulate a location of the disturbance and/or validate an identification of the disturbance by receiving similar telemetry information from other waveguide systems 1602.

In yet another embodiment, the network management system 1601 can receive at step 1756 an unscheduled activity report from maintenance field personnel. Unscheduled maintenance may occur as result of field calls that are unplanned or as a result of unexpected field issues discovered during field calls or scheduled maintenance activities. The activity report can identify changes to a topology configuration of the power grid 1653 resulting from field personnel addressing discovered issues in the communication system 1655 and/or power grid 1653, changes to one or more waveguide systems 1602 (such as replacement or repair thereof), mitigation of disturbances performed if any, and so on.

At step 1758, the network management system 1601 can determine from reports received according to steps 1752 through 1756 if a disturbance will occur based on a maintenance schedule, or if a disturbance has occurred or is predicted to occur based on telemetry data, or if a disturbance has occurred due to an unplanned maintenance identified in a field activity report. From any of these reports, the network management system 1601 can determine whether a detected or predicted disturbance requires rerouting of traffic by the affected waveguide systems 1602 or other waveguide systems 1602 of the communication system 1655.

When a disturbance is detected or predicted at step 1758, the network management system 1601 can proceed to step 1760 where it can direct one or more waveguide systems 1602 to reroute traffic to circumvent the disturbance. When the disturbance is permanent due to a permanent topology change of the power grid 1653, the network management system 1601 can proceed to step 1770 and skip steps 1762, 1764, 1766, and 1772. At step 1770, the network management system 1601 can direct one or more waveguide systems 1602 to use a new routing configuration that adapts to the new topology. However, when the disturbance has been detected from telemetry information supplied by one or more waveguide systems 1602, the network management system 1601 can notify maintenance personnel of the utility company 1656 or the communications service provider 1658 of a location of the disturbance, a type of disturbance if known, and related information that may be helpful to such personnel to mitigate the disturbance. When a disturbance is expected due to maintenance activities, the network management system 1601 can direct one or more waveguide systems 1602 to reconfigure traffic routes at a given schedule (consistent with the maintenance schedule) to avoid disturbances caused by the maintenance activities during the maintenance schedule.

Returning back to step 1760 and upon its completion, the process can continue with step 1762. At step 1762, the network management system 1601 can monitor when the disturbance(s) have been mitigated by field personnel. Mitigation of a disturbance can be detected at step 1762 by analyzing field reports submitted to the network management system 1601 by field personnel over a communications network (e.g., cellular communication system) utilizing field equipment (e.g., a laptop computer or handheld computer/device). If field personnel have reported that a disturbance has been mitigated, the network management system 1601 can proceed to step 1764 to determine from the field report whether a topology change was required to mitigate the disturbance. A topology change can include rerouting a power line 1610, reconfiguring a waveguide system 1602 to utilize a different power line 1610, otherwise utilizing an alternative link to bypass the disturbance and so on. If a topology change has taken place, the network management system 1601 can direct at step 1770 one or more waveguide systems 1602 to use a new routing configuration that adapts to the new topology.

If, however, a topology change has not been reported by field personnel, the network management system 1601 can proceed to step 1766 where it can direct one or more waveguide systems 1602 to send test signals to test a routing configuration that had been used prior to the detected disturbance(s). Test signals can be sent to affected waveguide systems 1602 in a vicinity of the disturbance. The test signals can be used to determine if signal disturbances (e.g., electromagnetic wave reflections) are detected by any of the waveguide systems 1602. If the test signals confirm that a prior routing configuration is no longer subject to previously detected disturbance(s), then the network management system 1601 can at step 1772 direct the affected waveguide systems 1602 to restore a previous routing configuration. If, however, test signals analyzed by one or more waveguide coupling device 1402 and reported to the network management system 1601 indicate that the disturbance(s) or new disturbance(s) are present, then the network management system 1601 will proceed to step 1768 and report this information to field personnel to further address field issues. The network management system 1601 can in this situation continue to monitor mitigation of the disturbance(s) at step 1762.

In the aforementioned embodiments, the waveguide systems 1602 can be configured to be self-adapting to changes in the power grid 1653 and/or to mitigation of disturbances. That is, one or more affected waveguide systems 1602 can be configured to self-monitor mitigation of disturbances and reconfigure traffic routes without requiring instructions to be sent to them by the network management system 1601. In this embodiment, the one or more waveguide systems 1602 that are self-configurable can inform the network management system 1601 of its routing choices so that the network management system 1601 can maintain a macro-level view of the communication topology of the communication system 1655.

While for purposes of simplicity of explanation, the respective processes are shown and described as a series of blocks in FIGS. 17A and 17B, respectively, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

Figure 18A:
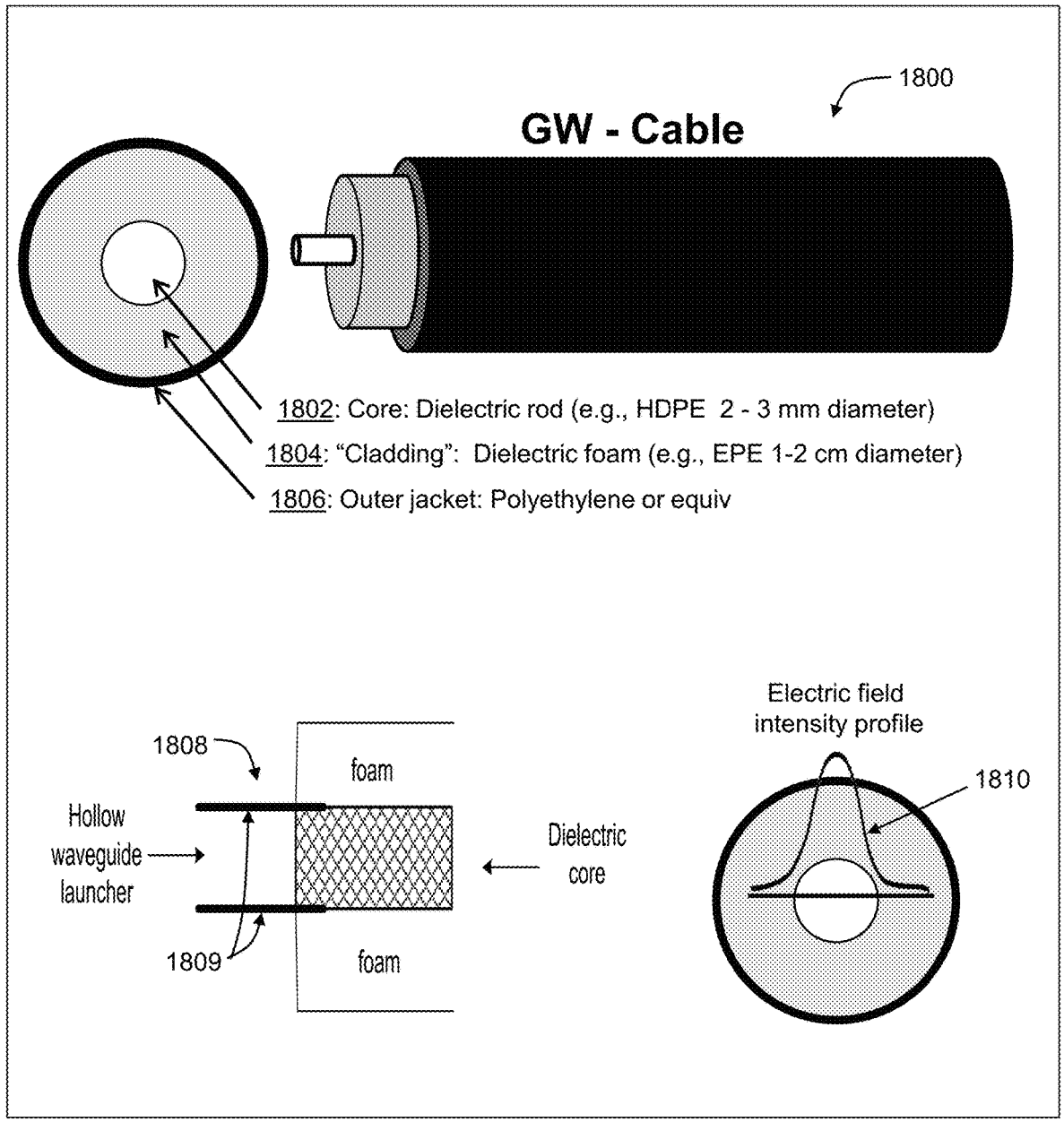
FIG. 18A is a block diagram illustrating an example, non-limiting embodiment of a transmission medium for propagating guided electromagnetic waves.

Turning now to FIG. 18A, a block diagram illustrating an example, non-limiting embodiment of a transmission medium 1800 for propagating guided electromagnetic waves is shown. In particular, a further example of transmission medium 125 presented in conjunction with FIG. 1 is presented. In an embodiment, the transmission medium 1800 can comprise a first dielectric material 1802 and a second dielectric material 1804 disposed thereon. In an embodiment, the first dielectric material 1802 can comprise a dielectric core (referred to herein as dielectric core 1802) and the second dielectric material 1804 can comprise a cladding or shell such as a dielectric foam that surrounds in whole or in part the dielectric core (referred to herein as dielectric foam 1804). In an embodiment, the dielectric core 1802 and dielectric foam 1804 can be coaxially aligned to each other (although not necessary). In an embodiment, the combination of the dielectric core 1802 and the dielectric foam 1804 can be flexed or bent at least by 45 degrees without damaging the materials of the dielectric core 1802 and the dielectric foam 1804. In an embodiment, an outer surface of the dielectric foam 1804 can be further surrounded in whole or in part by a third dielectric material 1806, which can serve as an outer jacket (referred to herein as jacket 1806). The jacket 1806 can prevent exposure of the dielectric core 1802 and the dielectric foam 1804 to an environment that can adversely affect the propagation of electromagnetic waves (e.g., water, soil, etc.).

The dielectric core 1802 can comprise, for example, a high density polyethylene material, a high density polyurethane material, or other suitable dielectric material(s). The dielectric foam 1804 can comprise, for example, a cellular plastic material such an expanded polyethylene material, or other suitable dielectric material(s). The jacket 1806 can comprise, for example, a polyethylene material or equivalent. In an embodiment, the dielectric constant of the dielectric foam 1804 can be (or substantially) lower than the dielectric constant of the dielectric core 1802. For example, the dielectric constant of the dielectric core 1802 can be approximately 2.3 while the dielectric constant of the dielectric foam 1804 can be approximately 1.15 (slightly higher than the dielectric constant of air).

The dielectric core 1802 can be used for receiving signals in the form of electromagnetic waves from a launcher or other coupling device described herein which can be configured to launch guided electromagnetic waves on the transmission medium 1800. In one embodiment, the transmission 1800 can be coupled to a hollow waveguide 1808 structured as, for example, a circular waveguide 1809, which can receive electromagnetic waves from a radiating device such as a stub antenna (not shown). The hollow waveguide 1808 can in turn induce guided electromagnetic waves in the dielectric core 1802. In this configuration, the guided electromagnetic waves are guided by or bound to the dielectric core 1802 and propagate longitudinally along the dielectric core 1802. By adjusting electronics of the launcher, an operating frequency of the electromagnetic waves can be chosen such that a field intensity profile 1810 of the guided electromagnetic waves extends nominally (or not at all) outside of the jacket 1806.

By maintaining most (if not all) of the field strength of the guided electromagnetic waves within portions of the dielectric core 1802, the dielectric foam 1804 and/or the jacket 1806, the transmission medium 1800 can be used in hostile environments without adversely affecting the propagation of the electromagnetic waves propagating therein. For example, the transmission medium 1800 can be buried in soil with no (or nearly no) adverse effect to the guided electromagnetic waves propagating in the transmission medium 1800. Similarly, the transmission medium 1800 can be exposed to water (e.g., rain or placed underwater) with no (or nearly no) adverse effect to the guided electromagnetic waves propagating in the transmission medium 1800. In an embodiment, the propagation loss of guided electromagnetic waves in the foregoing embodiments can be 1 to 2 dB per meter or better at an operating frequency of 60 GHz. Depending on the operating frequency of the guided electromagnetic waves and/or the materials used for the transmission medium 1800 other propagation losses may be possible. Additionally, depending on the materials used to construct the transmission medium 1800, the transmission medium 1800 can in some embodiments be flexed laterally with no (or nearly no) adverse effect to the guided electromagnetic waves propagating through the dielectric core 1802 and the dielectric foam 1804.

Other configurations of the transmission medium 1800 are possible including, a transmission medium that comprises a conductive core with or without an insulation layer surrounding the conductive core in whole or in part that is, in turn, covered in whole or in part by a dielectric foam 1804 and jacket 1806, which can be constructed from the materials previously described.

It should be noted that the hollow launcher 1808 used with the transmission medium 1800 can be replaced with other launchers, couplers or coupling devices described in the subject disclosure. Additionally, the propagation mode(s) of the electromagnetic waves for any of the foregoing embodiments can be fundamental mode(s), non-fundamental mode(s), or combinations thereof.

Figure 18B:
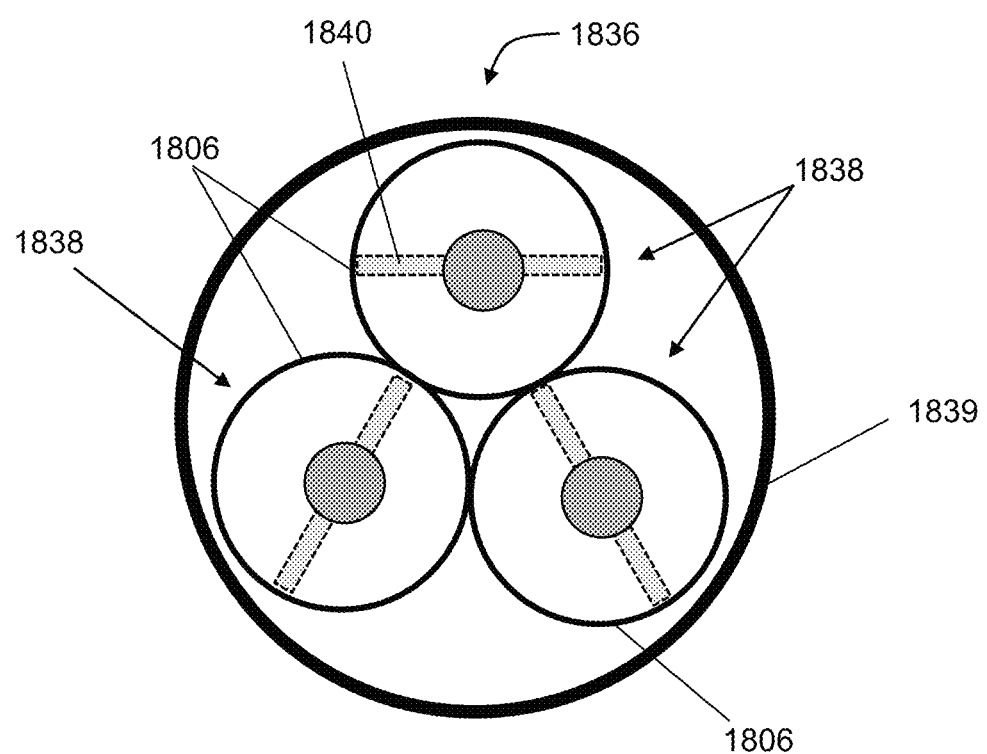
FIG. 18B is a block diagram illustrating an example, non-limiting embodiment of bundled transmission media in accordance with various aspects described herein.

FIG. 18B is a block diagram illustrating an example, non-limiting embodiment of bundled transmission media 1836 in accordance with various aspects described herein. The bundled transmission media 1836 can comprise a plurality of cables 1838 held in place by a flexible sleeve 1839. The plurality of cables 1838 can comprise multiple instances of cable 1800 of FIG. 18A. The sleeve 1839 can comprise a dielectric material that prevents soil, water or other external materials from making contact with the plurality of cables 1838. In an embodiment, a plurality of launchers, each utilizing a transceiver similar to the one depicted in FIG. 10 or other coupling devices described herein, can be adapted to selectively induce a guided electromagnetic wave in each cable, each guided electromagnetic wave conveys different data (e.g., voice, video, messaging, content, etc.). In an embodiment, by adjusting operational parameters of each launcher or other coupling device, the electric field intensity profile of each guided electromagnetic wave can be fully or substantially confined within layers of a corresponding cable 1838 to reduce cross-talk between cables 1838.

In situations where the electric field intensity profile of each guided electromagnetic wave is not fully or substantially confined within a corresponding cable 1838, cross-talk of electromagnetic signals can occur between cables 1838.

Several mitigation options can be used to reduce cross-talk between the cables 1838 of FIG. 18B. In an embodiment, an absorption material 1840 that can absorb electromagnetic fields, such as carbon, can be applied to the cables 1838 as shown in FIG. 18B to polarize each guided electromagnetic wave at various polarization states to reduce cross-talk between cables 1838. In another embodiment (not shown), carbon beads can be added to gaps between the cables 1838 to reduce cross-talk.

In yet another embodiment (not shown), a diameter of cable 1838 can be configured differently to vary a speed of propagation of guided electromagnetic waves between the cables 1838 in order to reduce cross-talk between cables 1838. In an embodiment (not shown), a shape of each cable 1838 can be made asymmetric (e.g., elliptical) to direct the guided electromagnetic fields of each cable 1838 away from each other to reduce cross-talk. In an embodiment (not shown), a filler material such as dielectric foam can be added between cables 1838 to sufficiently separate the cables 1838 to reduce cross-talk therebetween. In an embodiment (not shown), longitudinal carbon strips or swirls can be applied to on an outer surface of the jacket 1806 of each cable 1838 to reduce radiation of guided electromagnetic waves outside of the jacket 1806 and thereby reduce cross-talk between cables 1838. In yet another embodiment, each launcher can be configured to launch a guided electromagnetic wave having a different frequency, modulation, wave propagation mode, such as an orthogonal frequency, modulation or mode, to reduce cross-talk between the cables 1838.

In yet another embodiment (not shown), pairs of cables 1838 can be twisted in a helix to reduce cross-talk between the pairs and other cables 1838 in a vicinity of the pairs. In some embodiments, certain cables 1838 can be twisted while other cables 1838 are not twisted to reduce cross-talk between the cables 1838. Additionally, each twisted pair cable 1838 can have different pitches (i.e., different twist rates, such as twists per meter) to further reduce cross-talk between the pairs and other cables 1838 in a vicinity of the pairs. In another embodiment (not shown), launchers or other coupling devices can be configured to induce guided electromagnetic waves in the cables 1838 having electromagnetic fields that extend beyond the jacket 1806 into gaps between the cables to reduce cross-talk between the cables 1838. It is submitted that any one of the foregoing embodiments for mitigating cross-talk between cables 1838 can be combined to further reduce cross-talk therebetween.

Figure 18C:
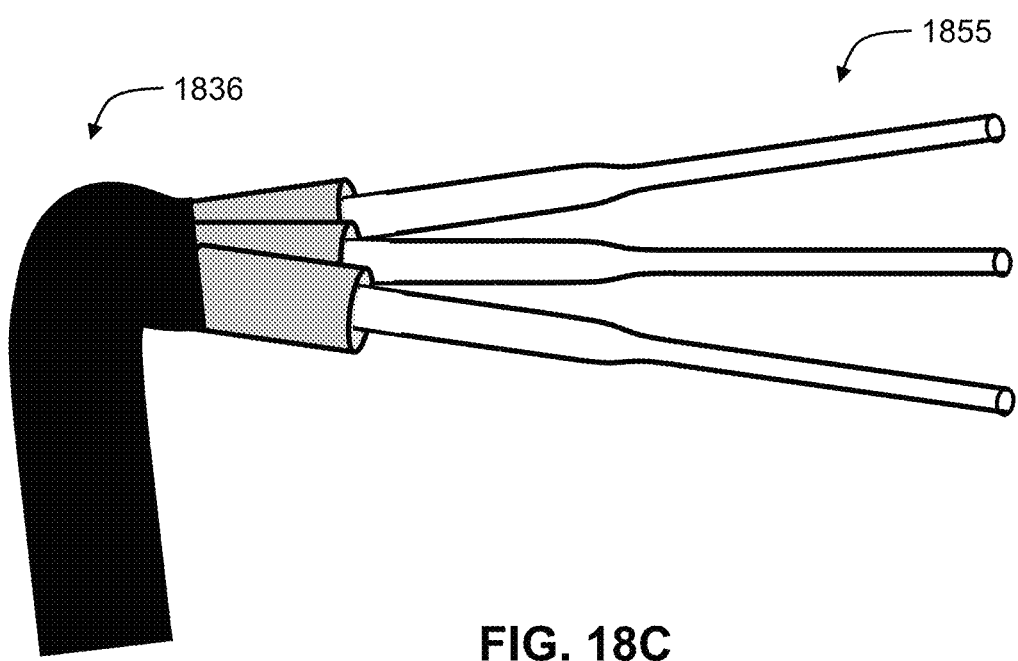
FIG. 18C is a block diagram illustrating an example, non-limiting embodiment of exposed stubs from the bundled transmission media for use as antennas in accordance with various aspects described herein.

Turning now to FIG. 18C, a block diagram illustrating an example, non-limiting embodiment of exposed tapered stubs from the bundled transmission media 1836 for use as antennas 1855 is shown. Each antenna 1855 can serve as a directional antenna for radiating wireless signals directed to wireless communication devices or for inducing electromagnetic wave propagation on a surface of a transmission medium (e.g., a power line). In an embodiment, the wireless signals radiated by the antennas 1855 can be beam steered by adapting the phase and/or other characteristics of the wireless signals generated by each antenna 1855. In an embodiment, the antennas 1855 can individually be placed in a pie-pan antenna assembly for directing wireless signals in various directions.

It is further noted that the terms "core", "cladding", "shell", and "foam" as utilized in the subject disclosure can comprise any types of materials (or combinations of materials) that enable electromagnetic waves to remain bound to the core while propagating longitudinally along the core. For example, a strip of dielectric foam 1804" described earlier can be replaced with a strip of an ordinary dielectric material (e.g., polyethylene) for wrapping around the dielectric core 1802 (referred to herein for illustration purposes only as a "wrap"). In this configuration an average density of the wrap can be small as a result of air space between sections of the wrap. Consequently, an effective dielectric constant of the wrap can be less than the dielectric constant of the dielectric core 1802, thereby enabling guided electromagnetic waves to remain bound to the core. Accordingly, any of the embodiments of the subject disclosure relating to materials used for core(s) and wrappings about the core(s) can be structurally adapted and/or modified with other dielectric materials that achieve the result of maintaining electromagnetic waves bound to the core(s) while they propagate along the core(s). Additionally, a core in whole or in part as described in any of the embodiments of the subject disclosure can comprise an opaque material (e.g., polyethylene) that is resistant to propagation of electromagnetic waves having an optical operating frequency. Accordingly, electromagnetic waves guided and bound to the core will have a non-optical frequency range (e.g., less than the lowest frequency of visible light).

Figure 18D:
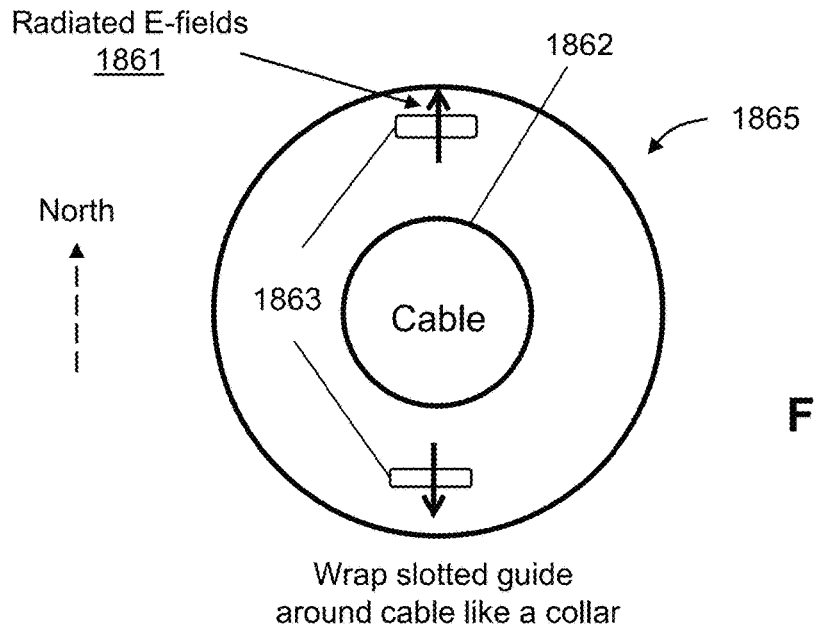
FIGS. 18D, 18E, 18F, 18G, 18H, 18I, 18J and 18K are block diagrams illustrating example, non-limiting embodiments of a waveguide device for transmitting or receiving electromagnetic waves in accordance with various aspects described herein.

FIGS. 18D, 18E, 18F, 18G, 18H, and 18I and 18J are block diagrams illustrating example, non-limiting embodiments of a waveguide device for transmitting or receiving electromagnetic waves in accordance with various aspects described herein. In an embodiment, FIG. 18D illustrates a front view of a waveguide device 1865 having a plurality of slots 1863 (e.g., openings or apertures) for emitting electromagnetic waves having radiated electric fields (e-fields) 1861. In an embodiment, the radiated e-fields 1861 of pairs of symmetrically positioned slots 1863 (e.g., north and south slots of the waveguide 1865) can be directed away from each other (i.e., polar opposite radial orientations about the cable 1862). While the slots 1863 are shown as having a rectangular shape, other shapes such as other polygons, sector and arc shapes, ellipsoid shapes and other shapes are likewise possible. For illustration purposes only, the term north will refer to a relative azimuthal direction/orientation as shown in the figures. All references in the subject disclosure to other directions/orientations (e.g., south, east, west, northwest, and so forth) will be relative to northern illustration. In an embodiment, to achieve e-fields with opposing orientations at the north and south slots 1863, for example, the north and south slots 1863 can be arranged to have a circumferential distance between each other that is approximately one wavelength of electromagnetic waves signals supplied to these slots. The waveguide 1865 can have a cylindrical cavity in a center of the waveguide 1865 to enable placement of a cable 1862. In one embodiment, the cable 1862 can comprise an insulated conductor. In another embodiment, the cable 1862 can comprise an uninsulated conductor. In yet other embodiments, the cable 1862 can comprise any of the embodiments of a transmission core 1852 of cable 1850 previously described.

In one embodiment, the cable 1862 can slide into the cylindrical cavity of the waveguide 1865. In another embodiment, the waveguide 1865 can utilize an assembly mechanism (not shown). The assembly mechanism (e.g., a hinge or other suitable mechanism that provides a way to open the waveguide 1865 at one or more locations) can be used to enable placement of the waveguide 1865 on an outer surface of the cable 1862 or otherwise to assemble separate pieces together to form the waveguide 1865 as shown. According to these and other suitable embodiments, the waveguide 1865 can be configured to wrap around the cable 1862 like a collar.

Figure 18E:
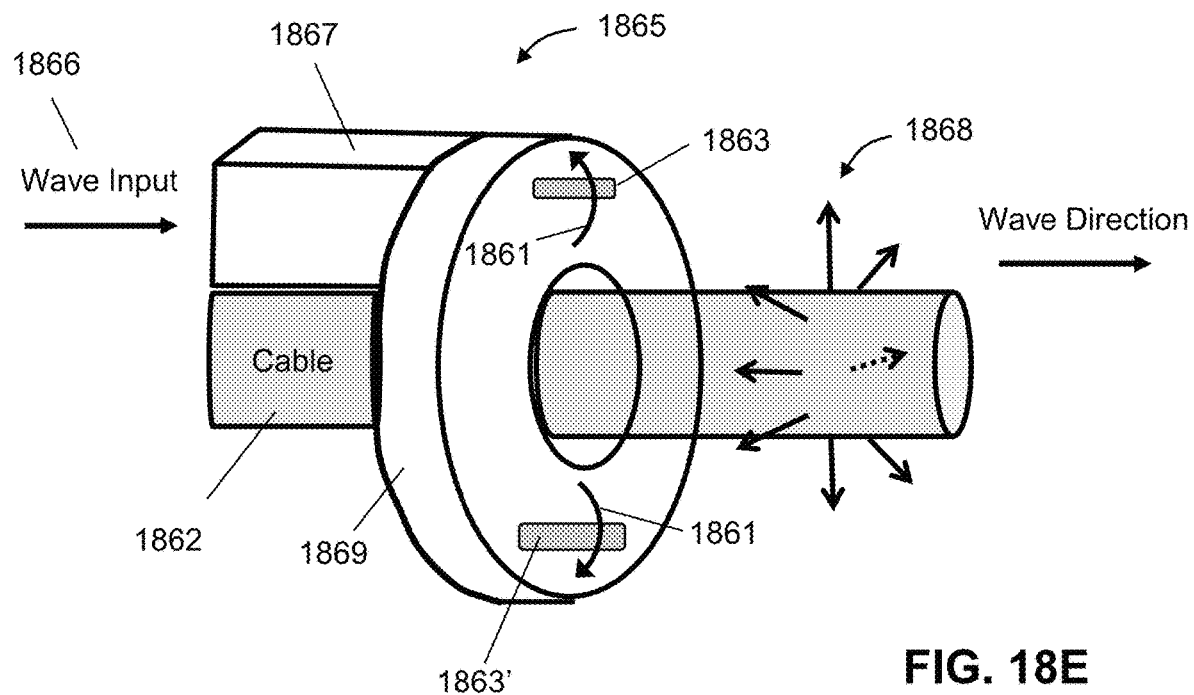

FIG. 18E illustrates a side view of an embodiment of the waveguide 1865. The waveguide 1865 can be adapted to have a hollow rectangular waveguide portion 1867 that receives electromagnetic waves 1866 generated by a transmitter circuit as previously described in the subject disclosure (e.g., see FIGS. 1 and 10). The electromagnetic waves 1866 can be distributed by the hollow rectangular waveguide portion 1867 into in a hollow collar 1869 of the waveguide 1865. The rectangular waveguide portion 1867 and the hollow collar 1869 can be constructed of materials suitable for maintaining the electromagnetic waves within the hollow chambers of these assemblies (e.g., carbon fiber materials). It should be noted that while the waveguide portion 1867 is shown and described in a hollow rectangular configuration, other shapes and/or other non-hollow configurations can be employed. In particular, the waveguide portion 1867 can have a square or other polygonal cross section, an arc or sector cross section that is truncated to conform to the outer surface of the cable 1862, a circular or ellipsoid cross section or cross sectional shape. In addition, the waveguide portion 1867 can be configured as, or otherwise include, a solid dielectric material.

As previously described, the hollow collar 1869 can be configured to emit electromagnetic waves from each slot 1863 with opposite e-fields 1861 at pairs of symmetrically positioned slots 1863 and 1863'. In an embodiment, the electromagnetic waves emitted by the combination of slots 1863 and 1863' can in turn induce electromagnetic waves 1868 on that are bound to the cable 1862 for propagation according to a fundamental wave mode without other wave modes present—such as non-fundamental wave modes. In this configuration, the electromagnetic waves 1868 can propagate longitudinally along the cable 1862 to other downstream waveguide systems coupled to the cable 1862.

It should be noted that since the hollow rectangular waveguide portion 1867 of FIG. 18E is closer to slot 1863 (at the northern position of the waveguide 1865), slot 1863 can emit electromagnetic waves having a stronger magnitude than electromagnetic waves emitted by slot 1863' (at the southern position). To reduce magnitude differences between these slots, slot 1863' can be made larger than slot 1863. The technique of utilizing different slot sizes to balance signal magnitudes between slots can be applied to any of the embodiments of the subject disclosure relating to FIGS. 18D, 18E, 18G, and 18I—some of which are described below.

Figure 18F:
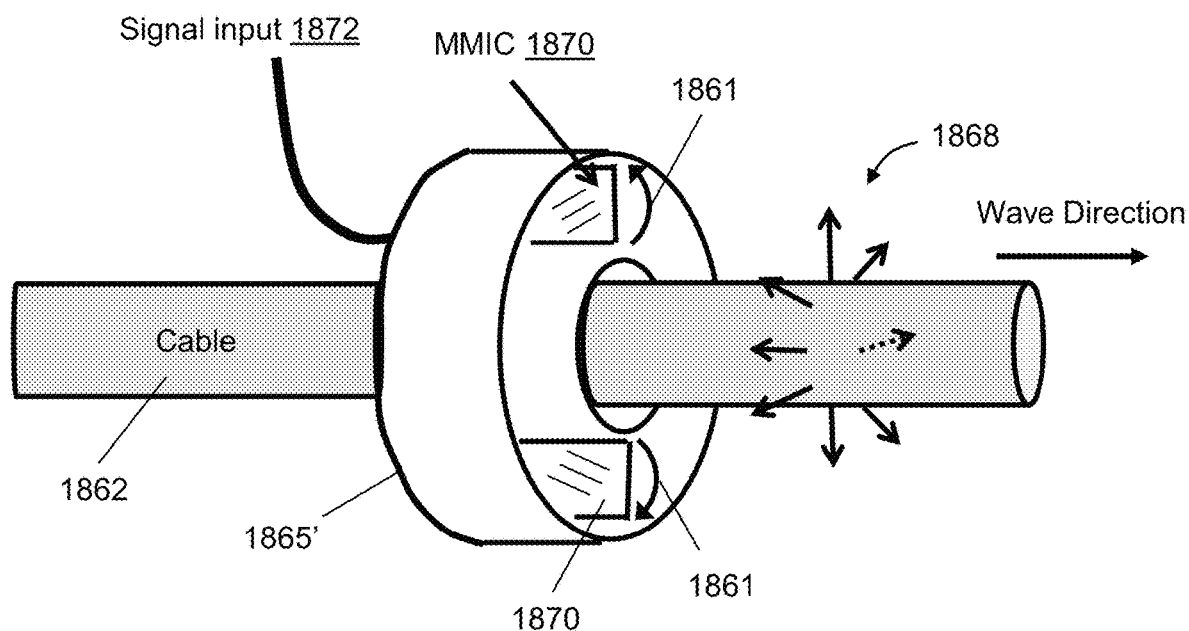

In another embodiment, FIG. 18F depicts a waveguide 1865' that can be configured to utilize circuitry such as monolithic microwave integrated circuits (MMICs) 1870 each coupled to a signal input 1872 (e.g., coaxial cable that provides a communication signal). The signal input 1872 can be generated by a transmitter circuit as previously described in the subject disclosure (e.g., see reference 101, 1000 of FIGS. 1 and 10) adapted to provide electrical signals to the MMICs 1870. Each MMIC 1870 can be configured to receive signal 1872 which the MMIC 1870 can modulate and transmit with a radiating element (e.g., an antenna) to emit electromagnetic waves having radiated e-fields 1861. In one embodiment, the MMICs 1870 can be configured to receive the same signal 1872, but transmit electromagnetic waves having e-fields 1861 of opposing orientation. This can be accomplished by configuring one of the MMICs 1870 to transmit electromagnetic waves that are 180 degrees out of phase with the electromagnetic waves transmitted by the other MMIC 1870. In an embodiment, the combination of the electromagnetic waves emitted by the MMICs 1870 can together induce electromagnetic waves 1868 that are bound to the cable 1862 for propagation according to a fundamental wave mode without other wave modes present—such as non-fundamental wave modes. In this configuration, the electromagnetic waves 1868 can propagate longitudinally along the cable 1862 to other downstream waveguide systems coupled to the cable 1862.

Figure 18G:
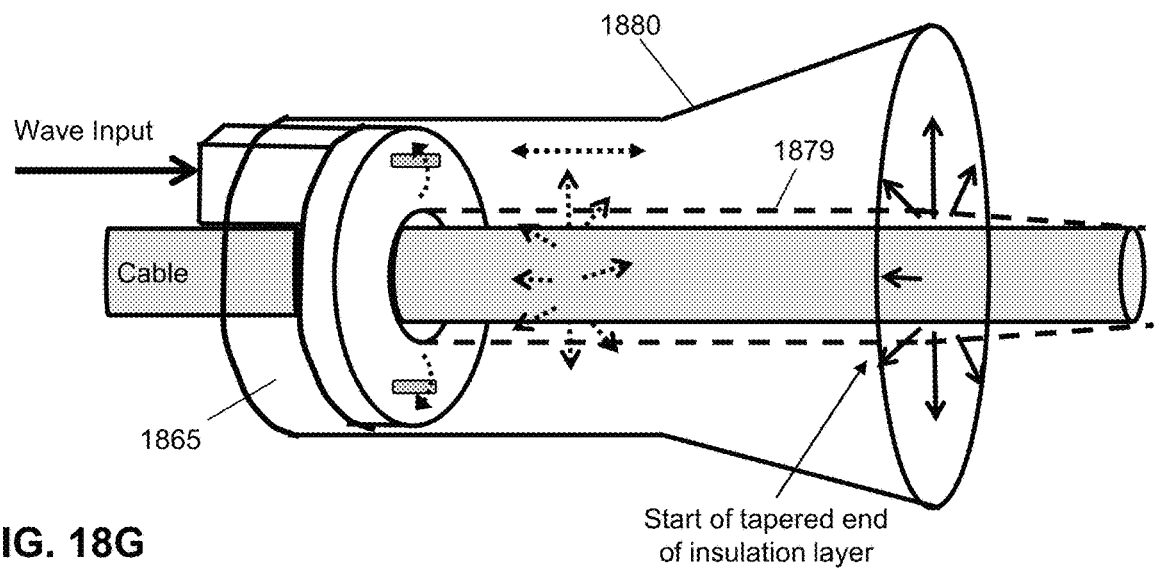
Figure 18H:
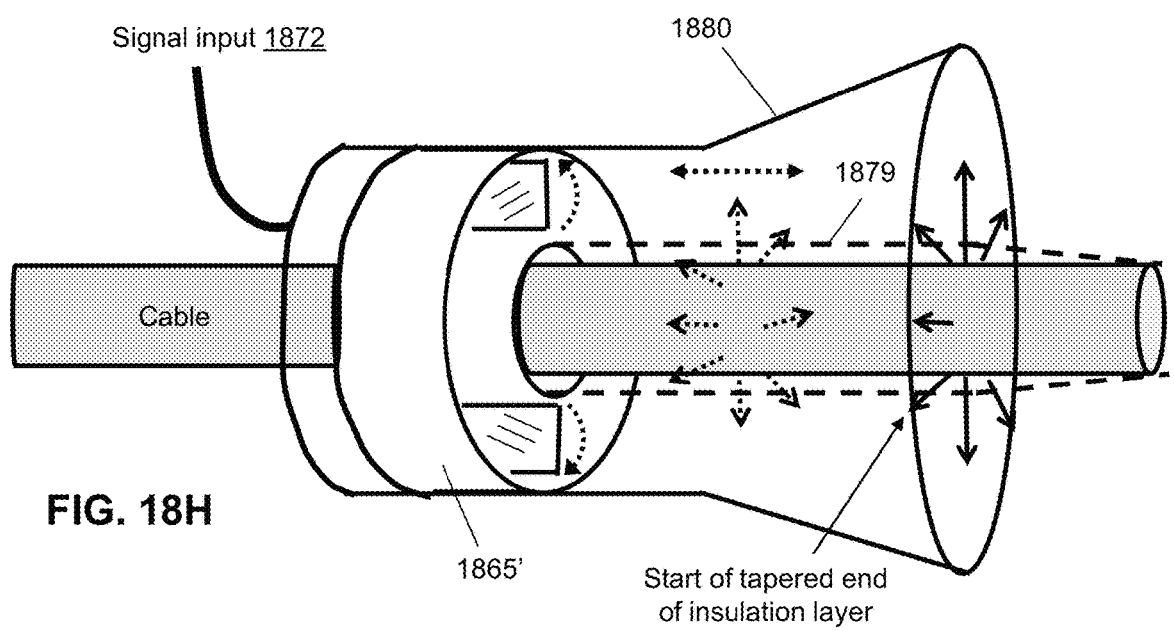

A tapered horn 1880 can be added to the embodiments of FIGS. 18E and 18F to assist in the inducement of the electromagnetic waves 1868 on cable 1862 as depicted in FIGS. 18G and 18H. In an embodiment where the cable 1862 is an uninsulated conductor, the electromagnetic waves induced on the cable 1862 can have a large radial dimension (e.g., 1 meter). To enable use of a smaller tapered horn 1880, an insulation layer 1879 can be applied on a portion of the cable 1862 at or near the cavity as depicted with hash lines in FIGS. 18G and 18H. The insulation layer 1879 can have a tapered end facing away from the waveguide 1865. The added insulation enables the electromagnetic waves 1868 initially launched by the waveguide 1865 (or 1865') to be tightly bound to the insulation, which in turn reduces the radial dimension of the electromagnetic fields 1868 (e.g., centimeters). As the electromagnetic waves 1868 propagate away from the waveguide 1865 (1865') and reach the tapered end of the insulation layer 1879, the radial dimension of the electromagnetic waves 1868 begin to increase eventually achieving the radial dimension they would have had had the electromagnetic waves 1868 been induced on the uninsulated conductor without an insulation layer. In the illustration of FIGS. 18G and 18H the tapered end begins at an end of the tapered horn 1880. In other embodiments, the tapered end of the insulation layer 1879 can begin before or after the end of the tapered horn 1880. The tapered horn can be metallic or constructed of other conductive material or constructed of a plastic or other non-conductive material that is coated or clad with a dielectric layer or doped with a conductive material to provide reflective properties similar to a metallic horn.

Figure 18I:
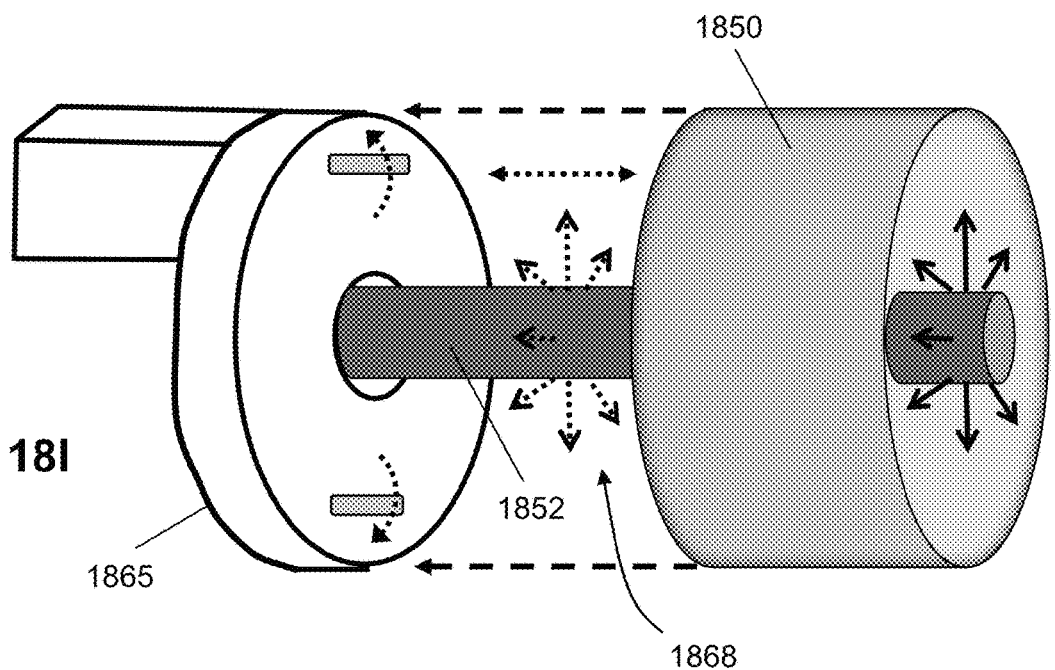
Figure 18J:
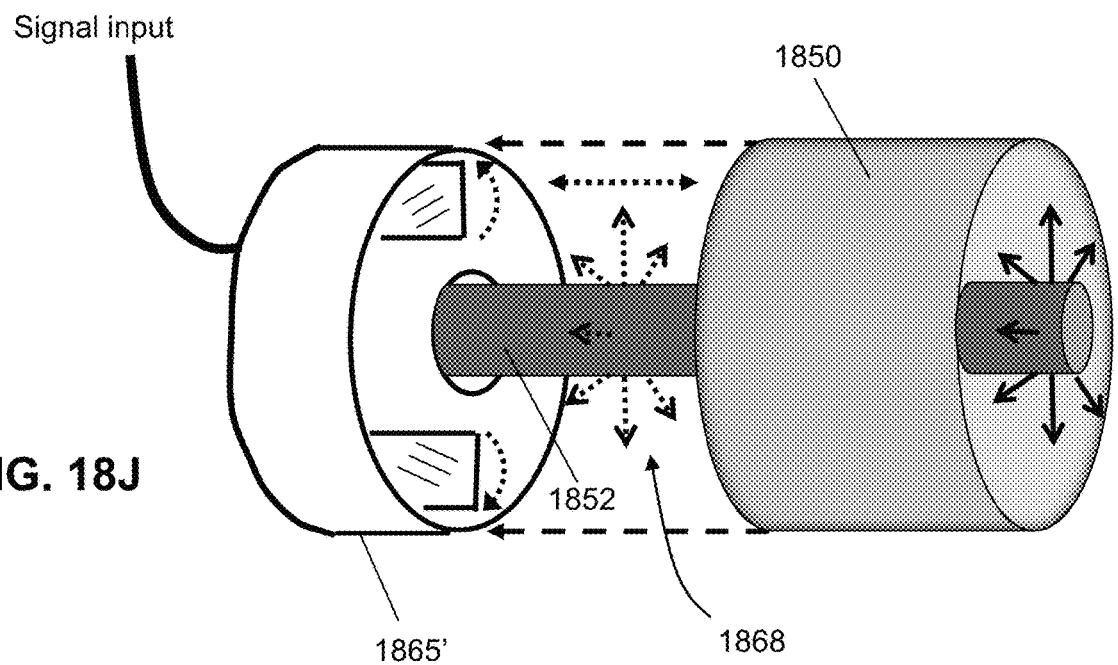

In an embodiment, cable 1862 can comprise any of the embodiments of cable 1850 described earlier. In this embodiment, waveguides 1865 and 1865' can be coupled to a transmission core 1852 of cable 1850 as depicted in FIGS. 18I and 18J. The waveguides 1865 and 1865' can induce, as previously described, electromagnetic waves 1868 on the transmission core 1852 for propagation entirely or partially within inner layers of cable 1850.

It is noted that for the foregoing embodiments of FIGS. 18G, 18H, 18I and 18J, electromagnetic waves 1868 can be bidirectional. For example, electromagnetic waves 1868 of a different operating frequency can be received by slots 1863 or MMICs 1870 of the waveguides 1865 and 1865', respectively. Once received, the electromagnetic waves can be converted by a receiver circuit (e.g., see reference 101, 1000 of FIGS. 1 and 10) for generating a communication signal for processing.

Although not shown, it is further noted that the waveguides 1865 and 1865' can be adapted so that the waveguides 1865 and 1865' can direct electromagnetic waves 1868 upstream or downstream longitudinally. For example, a first tapered horn 1880 coupled to a first instance of a waveguide 1865 or 1865' can be directed westerly on cable 1862, while a second tapered horn 1880 coupled to a second instance of a waveguide 1865 or 1865' can be directed easterly on cable 1862. The first and second instances of the waveguides 1865 or 1865' can be coupled so that in a repeater configuration, signals received by the first waveguide 1865 or 1865' can be provided to the second waveguide 1865 or 1865' for retransmission in an easterly direction on cable 1862. The repeater configuration just described can also be applied from an easterly to westerly direction on cable 1862.

Figure 18K:
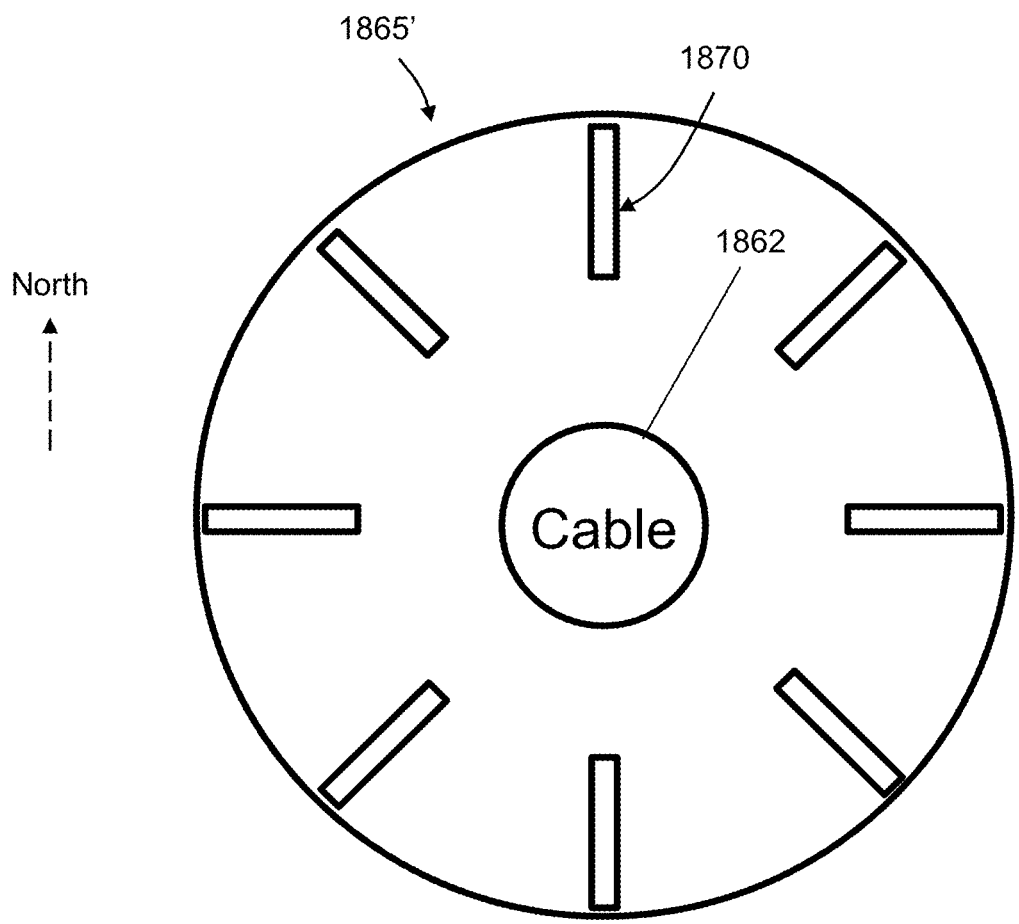

In another embodiment, the waveguide 1865' of FIGS. 18G, 18H, 18I and 18J can also be configured to generate electromagnetic waves having non-fundamental wave modes. This can be accomplished by adding more MMICs 1870 as depicted in FIG. 18K. Each MMIC 1870 can be configured to receive the same signal input 1872. However, MMICs 1870 can selectively be configured to emit electromagnetic waves having differing phases using controllable phase-shifting circuitry in each MMIC 1870. For example, the northerly and southerly MMICs 1870 can be configured to emit electromagnetic waves having a 180 degree phase difference, thereby aligning the e-fields either in a northerly or southerly direction. Any combination of pairs of MMICs 1870 (e.g., westerly and easterly MMICs 1870, northwesterly and southeasterly MMICs 1870, northeasterly and southwesterly MMICs 1870) can be configured with opposing or aligned e-fields. Consequently, waveguide 1865' can be configured to generate electromagnetic waves with one or more non-fundamental wave modes such as TMnm, HEnm or EHnm modes where n and m are non-negative integers and either n or m is non-zero, electromagnetic waves with one or more fundamental wave modes such as TM00, or any combinations thereof.

It is submitted that it is not necessary to select slots 1863 in pairs to generate electromagnetic waves having a non-fundamental wave mode. For example, electromagnetic waves having a non-fundamental wave mode can be generated by enabling a single slot from a plurality of slots and disabling all other slots. In particular, a single MMIC 1870 of the MMICs 1870 shown in FIG. 18K can be configured to generate electromagnetic waves having a non-fundamental wave mode while all other MMICs 1870 are not in use or disabled. Likewise, other wave modes and wave mode combinations can be induced by enabling other non-null proper subsets of waveguide slots 1863 or the MMICs 1870.

It is further noted that in some embodiments, the waveguide systems 1865 and 1865' may generate combinations of fundamental and non-fundamental wave modes where one wave mode is dominant over the other. For example, in one embodiment electromagnetic waves generated by the waveguide systems 1865 and 1865' may have a weak signal component that has a non-fundamental wave mode, and a substantially strong signal component that has a fundamental wave mode. Accordingly, in this embodiment, the electromagnetic waves have a substantially fundamental wave mode. In another embodiment electromagnetic waves generated by the waveguide systems 1865 and 1865' may have a weak signal component that has a fundamental wave mode, and a substantially strong signal component that has a non-fundamental wave mode. Accordingly, in this embodiment, the electromagnetic waves have a substantially non-fundamental wave mode. Further, a non-dominant wave mode may be generated that propagates only trivial distances along the length of the transmission medium.

It is also noted that the waveguide systems 1865 and 1865' can be configured to generate instances of electromagnetic waves that have wave modes that can differ from a resulting wave mode or modes of the combined electromagnetic wave. It is further noted that each MMIC 1870 of the waveguide system 1865' of FIG. 18K can be configured to generate an instance of electromagnetic waves having wave characteristics that differ from the wave characteristics of another instance of electromagnetic waves generated by another MMIC 1870. One MMIC 1870, for example, can generate an instance of an electromagnetic wave having a spatial orientation and a phase, frequency, magnitude, electric field orientation, and/or magnetic field orientation that differs from the spatial orientation and phase, frequency, magnitude, electric field orientation, and/or magnetic field orientation of a different instance of another electromagnetic wave generated by another MMIC 1870. The waveguide system 1865' can thus be configured to generate instances of electromagnetic waves having different wave and spatial characteristics, which when combined achieve resulting electromagnetic waves having one or more desirable wave modes.

From these illustrations, it is submitted that the waveguide systems 1865 and 1865' can be adapted to generate electromagnetic waves with one or more selectable wave modes. In one embodiment, for example, the waveguide systems 1865 and 1865' can be adapted to select one or more wave modes and generate electromagnetic waves having a single wave mode or multiple wave modes selected and produced from a process of combining instances of electromagnetic waves having one or more configurable wave and spatial characteristics. In an embodiment, for example, parametric information can be stored in a look-up table. Each entry in the look-up table can represent a selectable wave mode. A selectable wave mode can represent a single wave mode, or a combination of wave modes. The combination of wave modes can have one or dominant wave modes. The parametric information can provide configuration information for generating instances of electromagnetic waves for producing resultant electromagnetic waves that have the desired wave mode.

For example, once a wave mode or modes is selected, the parametric information obtained from the look-up table from the entry associated with the selected wave mode(s) can be used to identify which of one or more MMICs 1870 to utilize, and/or their corresponding configurations to achieve electromagnetic waves having the desired wave mode(s). The parametric information may identify the selection of the one or more MMICs 1870 based on the spatial orientations of the MMICs 1870, which may be required for producing electromagnetic waves with the desired wave mode. The parametric information can also provide information to configure each of the one or more MMICs 1870 with a particular phase, frequency, magnitude, electric field orientation, and/or magnetic field orientation which may or may not be the same for each of the selected MMICs 1870. A look-up table with selectable wave modes and corresponding parametric information can be adapted for configuring the slotted waveguide system 1865.

In some embodiments, a guided electromagnetic wave can be considered to have a desired wave mode if the corresponding wave mode propagates non-trivial distances on a transmission medium and has a field strength that is substantially greater in magnitude (e.g., 20 dB higher in magnitude) than other wave modes that may or may not be desirable. Such a desired wave mode or modes can be referred to as dominant wave mode(s) with the other wave modes being referred to as non-dominant wave modes. In a similar fashion, a guided electromagnetic wave that is said to be substantially without the fundamental wave mode has either no fundamental wave mode or a non-dominant fundamental wave mode. A guided electromagnetic wave that is said to be substantially without a non-fundamental wave mode has either no non-fundamental wave mode(s) or only non-dominant non-fundamental wave mode(s). In some embodiments, a guided electromagnetic wave that is said to have only a single wave mode or a selected wave mode may have only one corresponding dominant wave mode.

Figure 19A:
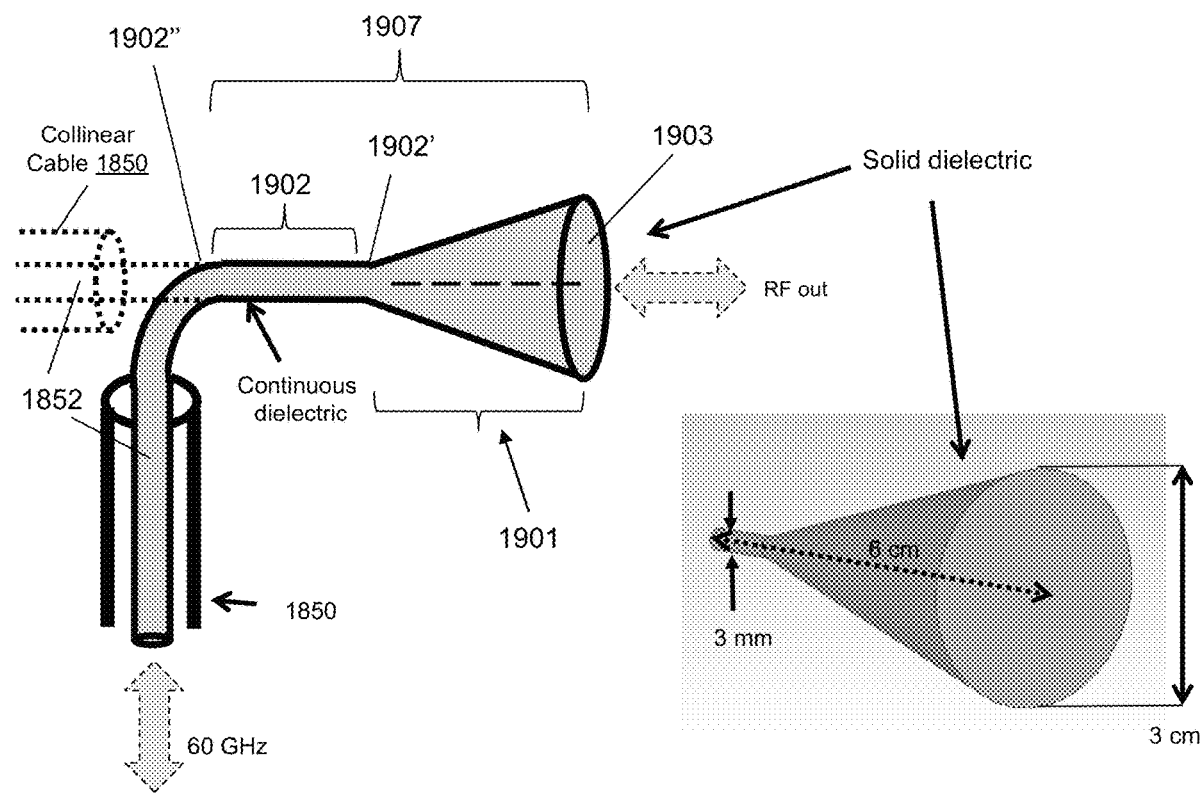
FIGS. 19A and 19B are block diagrams illustrating example, non-limiting embodiments of a dielectric antenna and corresponding gain and field intensity plots in accordance with various aspects described herein.
Figure 19B:
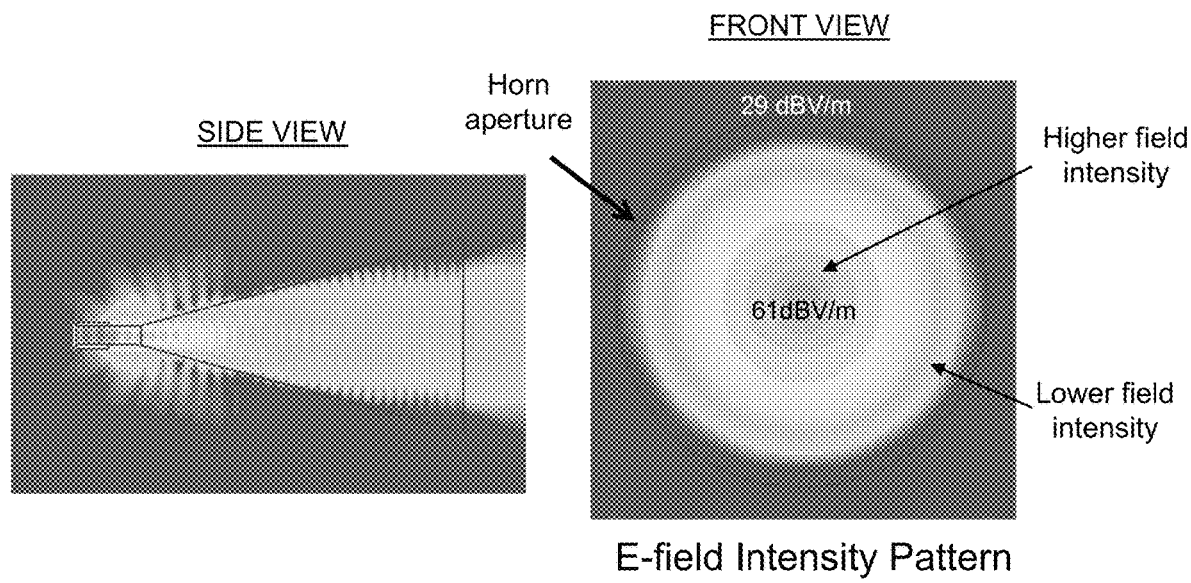
Figure 19B:
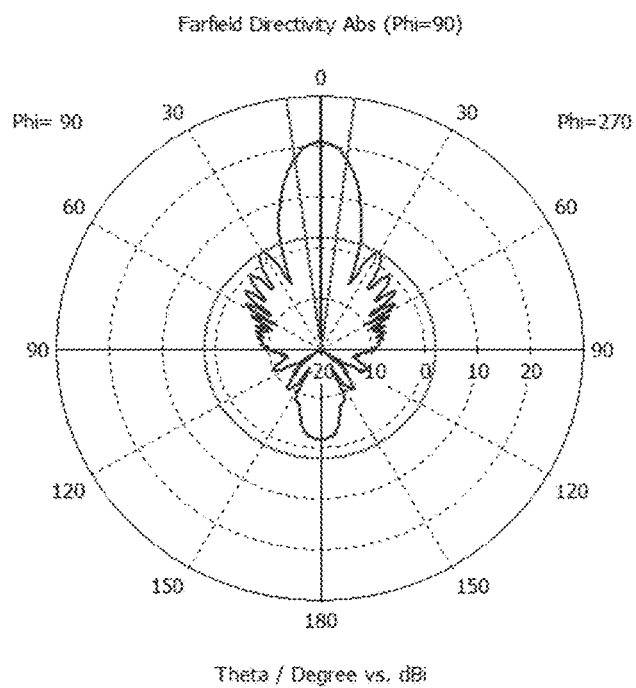

Turning now to FIGS. 19A and 19B, block diagrams illustrating example, non-limiting embodiments of a dielectric antenna and corresponding gain and field intensity plots in accordance with various aspects described herein are shown. FIG. 19A depicts a dielectric horn antenna 1901 having a conical structure. The dielectric horn antenna 1901 is coupled to one end 1902' of a feedline 1902 having a feed point 1902" at an opposite end of the feedline 1902. The dielectric horn antenna 1901 and the feedline 1902 (as well as other embodiments of the dielectric antenna described below in the subject disclosure) can be constructed of dielectric materials such as a polyethylene material, a polyurethane material or other suitable dielectric material (e.g., a synthetic resin, other plastics, etc.). The dielectric horn antenna 1901 and the feedline 1902 (as well as other embodiments of the dielectric antenna described below in the subject disclosure) can be conductorless and/or be substantially or entirely devoid of any conductive materials.

For example, the external surfaces 1907 of the dielectric horn antenna 1901 and the feedline 1902 can be non-conductive or substantially non-conductive with at least 95% of the external surface area being non-conductive and the dielectric materials used to construct the dielectric horn antenna 1901 and the feedline 1902 can be such that they substantially do not contain impurities that may be conductive (e.g., such as less than 1 part per thousand) or result in imparting conductive properties. In other embodiments, however, a limited number of conductive components can be used such as a metallic connector component used for coupling to the feed point 1902" of the feedline 1902 with one or more screws, rivets or other coupling elements used to bind components to one another, and/or one or more structural elements that do not significantly alter the radiation pattern of the dielectric antenna.

The feed point 1902" can be adapted to couple to a core 1852 such as core 1802 previously described by way of illustration in FIG. 18A. In one embodiment, the feed point 1902" can be coupled to the core 1852 utilizing a joint (not shown in FIG. 19A). Other embodiments for coupling the feed point 1902" to the core 1852 can be used. In an embodiment, the joint can be configured to cause the feed point 1902" to touch an endpoint of the core 1852. In another embodiment, the joint can create a gap between the feed point 1902" and an end of the core 1852. In yet another embodiment, the joint can cause the feed point 1902" and the core 1852 to be coaxially aligned or partially misaligned. Notwithstanding any combination of the foregoing embodiments, electromagnetic waves can in whole or at least in part propagate between the junction of the feed point 1902" and the core 1852.

The cable 1850 can be coupled to the waveguide system 1865 or the waveguide system 1865'. For illustration purposes only, reference will be made to the waveguide system 1865'. It is understood, however, that the waveguide system 1865 or other waveguide systems can also be utilized in accordance with the discussions that follow. The waveguide system 1865' can be configured to select a wave mode (e.g., non-fundamental wave mode, fundamental wave mode, a hybrid wave mode, or combinations thereof as described earlier) and transmit instances of electromagnetic waves having a non-optical operating frequency (e.g., 60 GHz). The electromagnetic waves can be directed to an interface of the cable 1850.

The instances of electromagnetic waves generated by the waveguide system 1865' can induce a combined electromagnetic wave having the selected wave mode that propagates from the core 1852 to the feed point 1902". The combined electromagnetic wave can propagate partly inside the core 1852 and partly on an outer surface of the core 1852. Once the combined electromagnetic wave has propagated through the junction between the core 1852 and the feed point 1902", the combined electromagnetic wave can continue to propagate partly inside the feedline 1902 and partly on an outer surface of the feedline 1902. In some embodiments, the portion of the combined electromagnetic wave that propagates on the outer surface of the core 1852 and the feedline 1902 is small. In these embodiments, the combined electromagnetic wave can be said to be guided by and tightly coupled to the core 1852 and the feedline 1902 while propagating longitudinally towards the dielectric antenna 1901.

When the combined electromagnetic wave reaches a proximal portion of the dielectric antenna 1901 (at a junction 1902' between the feedline 1902 and the dielectric antenna 1901), the combined electromagnetic wave enters the proximal portion of the dielectric antenna 1901 and propagates longitudinally along an axis of the dielectric antenna 1901 (shown as a hashed line). By the time the combined electromagnetic wave reaches the aperture 1903, the combined electromagnetic wave has an intensity pattern similar to the one shown by the side view and front view depicted in FIG. 19B. The electric field intensity pattern of FIG. 19B shows that the electric fields of the combined electromagnetic waves are strongest in a center region of the aperture 1903 and weaker in the outer regions. In an embodiment, where the wave mode of the electromagnetic waves propagating in the dielectric antenna 1901 is a hybrid wave mode (e.g., HE11), the leakage of the electromagnetic waves at the external surfaces 1907 is reduced or in some instances eliminated. It is further noted that while the dielectric antenna 1901 is constructed of a solid dielectric material having no physical opening, the front or operating face of the dielectric antenna 1901 from which free space wireless signals are radiated or received will be referred to as the aperture 1903 of the dielectric antenna 1901 even though in some prior art systems the term aperture may be used to describe an opening of an antenna that radiates or receives free space wireless signals. Methods for launching a hybrid wave mode on cable 1850 is discussed below.

In an embodiment, the far-field antenna gain pattern depicted in FIG. 19B can be widened by decreasing the operating frequency of the combined electromagnetic wave from a nominal frequency. Similarly, the gain pattern can be narrowed by increasing the operating frequency of the combined electromagnetic wave from the nominal frequency. Accordingly, a width of a beam of wireless signals emitted by the aperture 1903 can be controlled by configuring the waveguide system 1865' to increase or decrease the operating frequency of the combined electromagnetic wave.

The dielectric antenna 1901 of FIG. 19A can also be used for receiving wireless signals, such as free space wireless signals transmitted by either a similar antenna or conventional antenna design. Wireless signals received by the dielectric antenna 1901 at the aperture 1903 induce electromagnetic waves in the dielectric antenna 1901 that propagate towards the feedline 1902. The electromagnetic waves continue to propagate from the feedline 1902 to the junction between the feed point 1902" and an endpoint of the core 1852, and are thereby delivered to the waveguide system 1865' coupled to the cable 1850. In this configuration, the waveguide system 1865' can perform bidirectional communications utilizing the dielectric antenna 1901. It is further noted that in some embodiments the core 1852 of the cable 1850 (shown with dashed lines) can be configured to be collinear with the feed point 1902" to avoid a bend shown in FIG. 19A. In some embodiments, a collinear configuration can reduce an alteration in the propagation of the electromagnetic due to the bend in cable 1850.

Figure 19C:
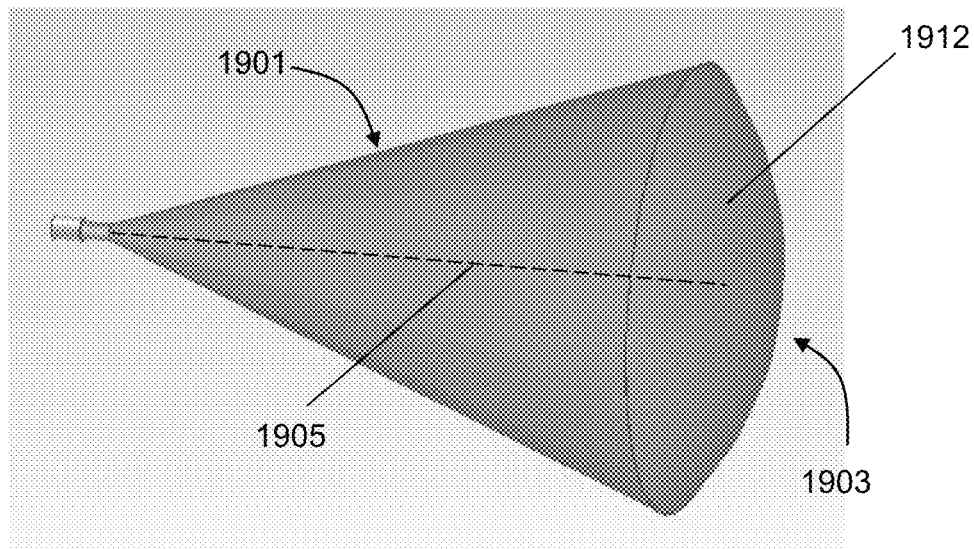
FIG. 19C is a block diagram illustrating an example, non-limiting embodiments of a dielectric antenna coupled to a lens in accordance with various aspects described herein.
Figure 19C:
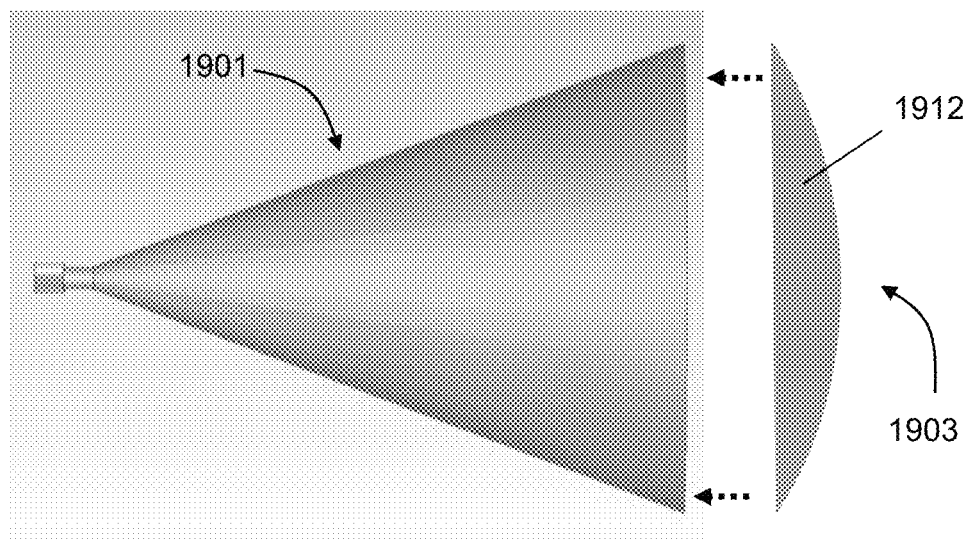

Turning now to FIG. 19C, a block diagram is shown illustrating an example, non-limiting embodiment of a dielectric antenna 1901 coupled to or integrally constructed with a lens 1912 in accordance with various aspects described herein. In one embodiment, the lens 1912 can comprise a dielectric material having a first dielectric constant that is substantially similar or equal to a second dielectric constant of the dielectric antenna 1901. In other embodiments, the lens 1912 can comprise a dielectric material having a first dielectric constant that differs from a second dielectric constant of the dielectric antenna 1901. In either of these embodiments, the shape of the lens 1912 can be chosen or formed so as to equalize the delays of the various electromagnetic waves propagating at different points in the dielectric antenna 1901. In one embodiment, the lens 1912 can be an integral part of the dielectric antenna 1901 as depicted in the top diagram of FIG. 19C and in particular, the lens and dielectric antenna 1901 can be molded, machined or otherwise formed from a single piece of dielectric material. Alternatively, the lens 1912 can be an assembly component of the dielectric antenna 1901 as depicted in the bottom diagram of FIG. 19C, which can be attached by way of an adhesive material, brackets on the outer edges, or other suitable attachment techniques. The lens 1912 can have a convex structure as shown in FIG. 19C which is adapted to adjust a propagation of electromagnetic waves in the dielectric antenna 1901. While a round lens and conical dielectric antenna configuration is shown, other shapes include pyramidal shapes, elliptical shapes and other geometric shapes can likewise be implemented.

In particular, the curvature of the lens 1912 can be chosen in manner that reduces phase differences between near-field wireless signals generated by the aperture 1903 of the dielectric antenna 1901. The lens 1912 accomplishes this by applying location-dependent delays to propagating electromagnetic waves. Because of the curvature of the lens 1912, the delays differ depending on where the electromagnetic waves emanate from at the aperture 1903. For example, electromagnetic waves propagating by way of a center axis 1905 of the dielectric antenna 1901 will experience more delay through the lens 1912 than electromagnetic waves propagating radially away from the center axis 1905. Electromagnetic waves propagating towards, for example, the outer edges of the aperture 1903 will experience minimal or no delay through the lens. Propagation delay increases as the electromagnetic waves get close to the center axis 1905. Accordingly, a curvature of the lens 1912 can be configured so that near-field wireless signals have substantially similar phases. By reducing differences between phases of the near-field wireless signals, a width of far-field signals generated by the dielectric antenna 1901 is reduced, which in turn increases the intensity of the far-field wireless signals within the width of the main lobe, producing a relatively narrow beam pattern with high gain.

It should be noted that the lens 1912 can be configured in other lens configurations. For example, the lens 1912 can comprise concentric ridges 1914 configured to have a depth representative of a select wavelength factor. For example, a ridge can be configured to have a depth of one-quarter a wavelength of the electromagnetic waves propagating in the dielectric antenna 1901. Such a configuration causes the electromagnetic wave reflected from one ridge to have a phase difference of 180 degrees relative to the electromagnetic wave reflected from an adjacent ridge. Consequently, the out of phase electromagnetic waves reflected from the adjacent risers 1916 substantially cancel, thereby reducing reflection and distortion caused thereby.

Figure 19D:
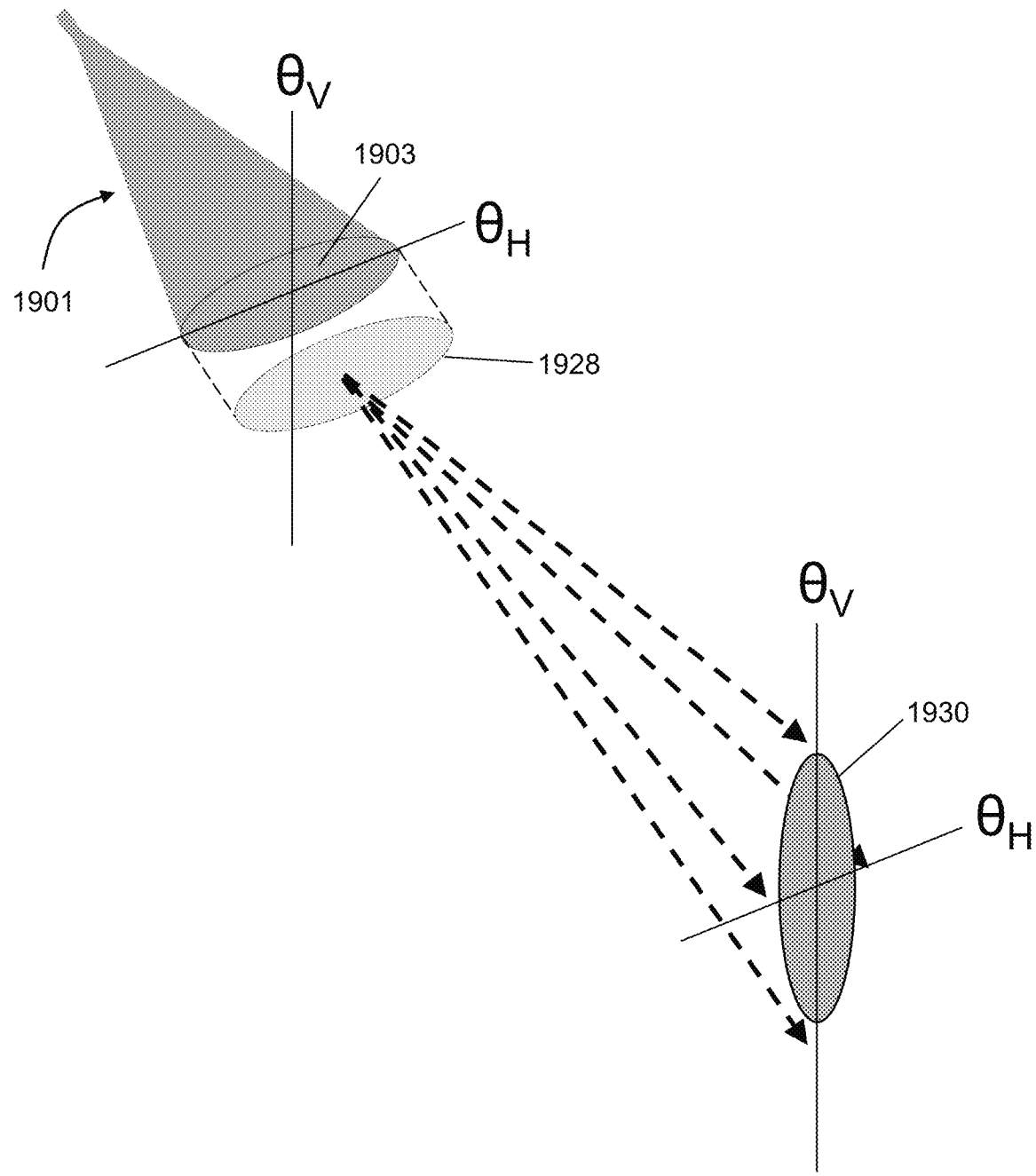
FIG. 19D is a block diagram illustrating an example, non-limiting embodiment of near-field and far-field signals emitted by the dielectric antenna of FIG. 19G in accordance with various aspects described herein.

Turning now to FIG. 19D, a block diagram illustrating an example, non-limiting embodiment of near-field signals 1928 and far-field signals 1930 emitted by the dielectric antenna 1901 having an elliptical aperture in accordance with various aspects described herein is shown. The cross section of the near-field beam pattern 1928 mimics the elliptical shape of the aperture 1903 of the dielectric antenna 1901. The cross section of the far-field beam pattern 1930 have a rotational offset (approximately 90 degrees) that results from the elliptical shape of the near-field signals 1928. The offset can be determined by applying a Fourier Transform to the near-field signals 1928. While the cross section of the near-field beam pattern 1928 and the cross section of the far-field beam pattern 1930 are shown as nearly the same size in order to demonstrate the rotational effect, the actual size of the far-field beam pattern 1930 may increase with the distance from the dielectric antenna 1901.

The elongated shape of the far-field signals 1930 and its orientation can prove useful when aligning a dielectric antenna 1901 in relation to a remotely located receiver configured to receive the far-field signals 1930. The receiver can comprise one or more dielectric antennas coupled to a waveguide system such as described by the subject disclosure. The elongated far-field signals 1930 can increase the likelihood that the remotely located receiver will detect the far-field signals 1930. In addition, the elongated far-field signals 1930 can be useful in situations where a dielectric antenna 1901 coupled to a gimbal assembly, or other actuated antenna mount (not shown) In particular, the elongated far-field signals 1930 can be useful in situations where such as gimbal mount only has two degrees of freedom for aligning the dielectric antenna 1901 in the direction of the receiver (e.g., yaw and pitch is adjustable but roll is fixed).

Although not shown, it will be appreciated that the dielectric antenna 1901 can have an integrated or attachable lens 1912 as previously described to increase an intensity of the far-fields signals 1930 by reducing phase differences in the near-field signals.

Figure 19E:
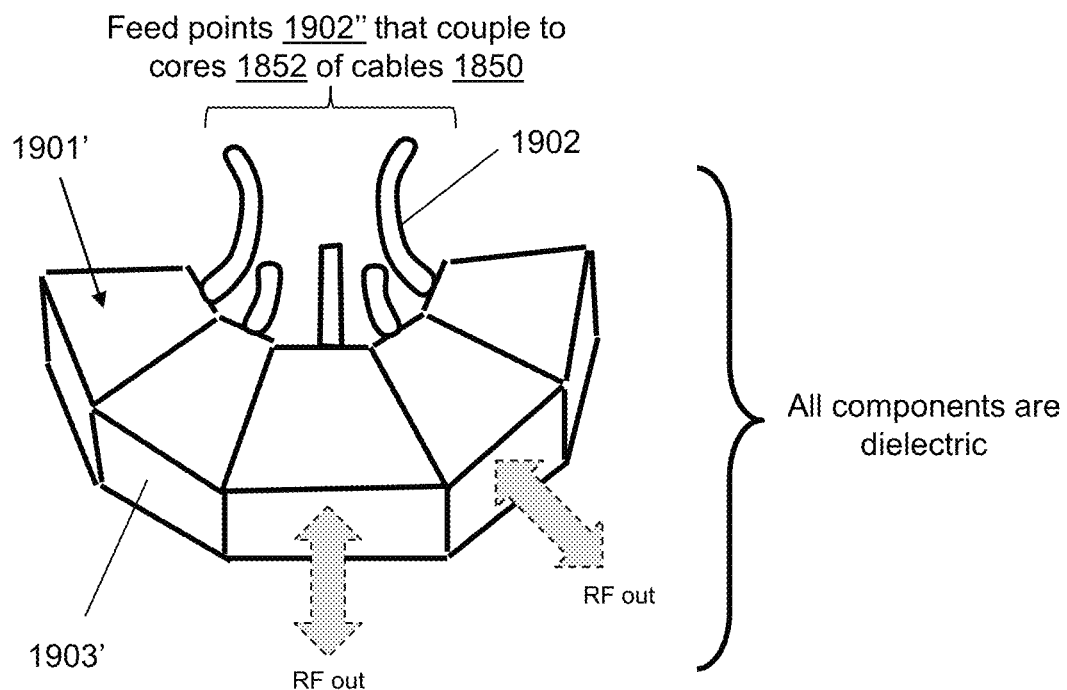
FIG. 19E is a block diagram of an example, non-limiting embodiment of a dielectric antenna in accordance with various aspects described herein.

Turning now to FIG. 19E, a block diagram of an example, non-limiting embodiment of a dielectric antenna 1901' in accordance with various aspects described herein is shown. FIG. 19E depicts an array of pyramidal-shaped dielectric horn antennas 1901', each having a corresponding aperture 1903'. Each antenna of the array of pyramidal-shaped dielectric horn antennas 1901' can have a feedline 1902 with a corresponding feed point 1902" that couples to each corresponding core 1852 of a plurality of cables 1850. Each cable 1850 can be coupled to a different (or a same) waveguide system 1865'. The array of pyramidal-shaped dielectric horn antennas 1901' can be used to transmit wireless signals having a plurality of spatial orientations. An array of pyramidal-shaped dielectric horn antennas 1901' covering 360 degrees can enable a one or more waveguide systems 1865' coupled to the antennas to perform omnidirectional communications with other communication devices or antennas of similar type.

The bidirectional propagation properties of electromagnetic waves previously described for the dielectric antenna 1901 of FIG. 19A are also applicable for electromagnetic waves propagating from the core 1852 to the feed point 1902" guided by the feedline 1902 to the aperture 1903' of the pyramidal-shaped dielectric horn antennas 1901', and in the reverse direction. Similarly, the array of pyramidal-shaped dielectric horn antennas 1901' can be substantially or entirely devoid of conductive external surfaces and internal conductive materials as discussed above. For example, in some embodiments, the array of pyramidal-shaped dielectric horn antennas 1901' and their corresponding feed points 1902' can be constructed of dielectric-only materials such as polyethylene or polyurethane materials or with only trivial amounts of conductive material that does not significantly alter the radiation pattern of the antenna.

It is further noted that each antenna of the array of pyramidal-shaped dielectric horn antennas 1901' can have similar gain and electric field intensity maps as shown for the dielectric antenna 1901 in FIG. 19B. Each antenna of the array of pyramidal-shaped dielectric horn antennas 1901' can also be used for receiving wireless signals as previously described for the dielectric antenna 1901 of FIG. 19A. In some embodiments, a single instance of a pyramidal-shaped dielectric horn antenna can be used. Similarly, multiple instances of the dielectric antenna 1901 of FIG. 19A can be used in an array configuration similar to the one shown in FIG. 19E.

Figure 19F:
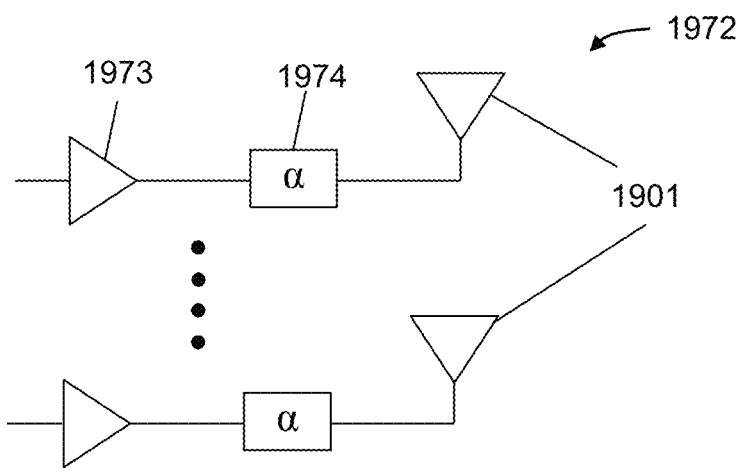
FIG. 19F is a block diagram of an example, non-limiting embodiment of an array of dielectric antennas configurable for steering wireless signals in accordance with various aspects described herein.
Figure 19F:
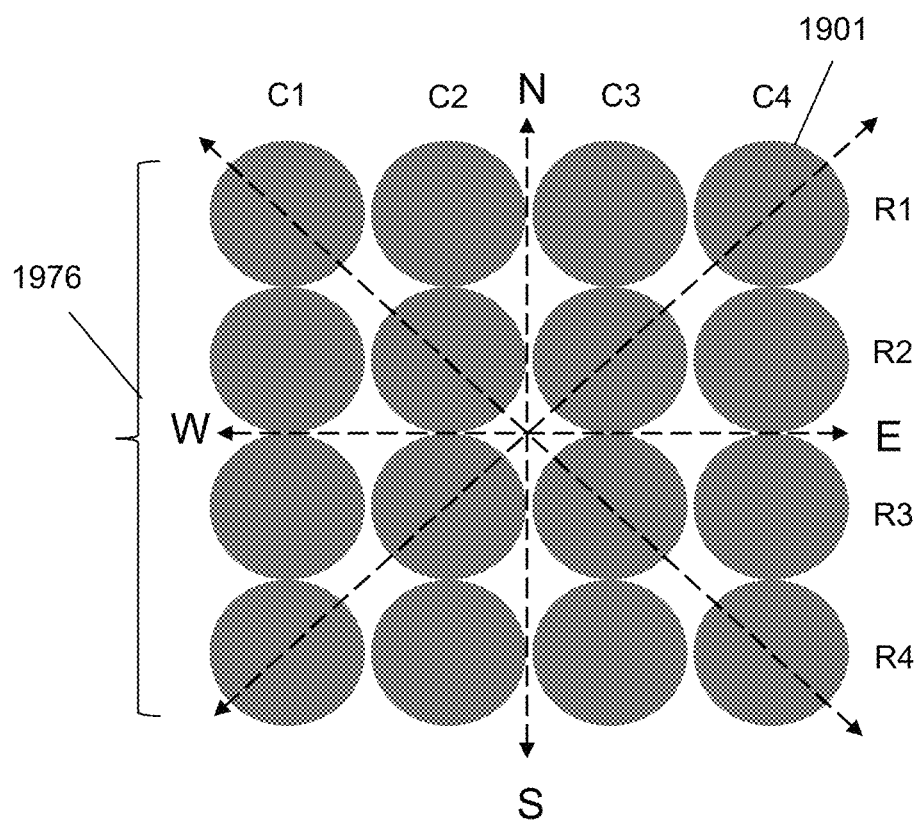

Turning now to FIG. 19F, block diagrams of example, non-limiting embodiments of an array 1976 of dielectric antennas 1901 configurable for steering wireless signals in accordance with various aspects described herein is shown. The array 1976 of dielectric antennas 1901 can be conical shaped antennas 1901 or pyramidal-shaped dielectric antennas 1901'. To perform beam steering, a waveguide system coupled to the array 1976 of dielectric antennas 1901 can be adapted to utilize a circuit 1972 comprising amplifiers 1973 and phase shifters 1974, each pair coupled to one of the dielectric antennas 1901 in the array 1976. The waveguide system can steer far-field wireless signals from left to right (west to east) by incrementally increasing a phase delay of signals supplied to the dielectric antennas 1901.

For example, the waveguide system can provide a first signal to the dielectric antennas of column 1 ("C1") having no phase delay. The waveguide system can further provide a second signal to column 2 ("C2"), the second signal comprising the first signal having a first phase delay. The waveguide system can further provide a third signal to the dielectric antennas of column 3 ("C3"), the third signal comprising the second signal having a second phase delay. Lastly, the waveguide system can provide a fourth signal to the dielectric antennas of column 4 ("C4"), the fourth signal comprising the third signal having a third phase delay. These phase shifted signals will cause far-field wireless signals generated by the array to shift from left to right. Similarly, far-field signals can be steered from right to left (east to west) ("C4" to "C1"), north to south ("R1" to "R4"), south to north ("R4" to "R1"), and southwest to northeast ("C1-R4" to "C4-R1").

Utilizing similar techniques beam steering can also be performed in other directions such as southwest to northeast by configuring the waveguide system to incrementally increase the phase of signals transmitted by the following sequence of antennas: "C1-R4", "C1-R3/C2-R4", "C1-R2/C2-R3/C3-R4", "C1-R1/C2-R2/C3- R3/C4-R4", "C2-R1/C3-R2/C4-R3", "C3-R1/C4-R2", "C4-R1". In a similar way, beam steering can be performed northeast to southwest, northwest to southeast, southeast to northwest, as well in other directions in three-dimensional space. Beam steering can be used, among other things, for aligning the array 1976 of dielectric antennas 1901 with a remote receiver and/or for directivity of signals to mobile communication devices. In some embodiments, a phased array 1976 of dielectric antennas 1901 can also be used to circumvent the use of the gimbal assembly or other actuated mount. While the foregoing has described beam steering controlled by phase delays, gain and phase adjustment can likewise be applied to the dielectric antennas 1901 of the phased array 1976 in a similar fashion to provide additional control and versatility in the formation of a desired beam pattern.

Figure 20A:
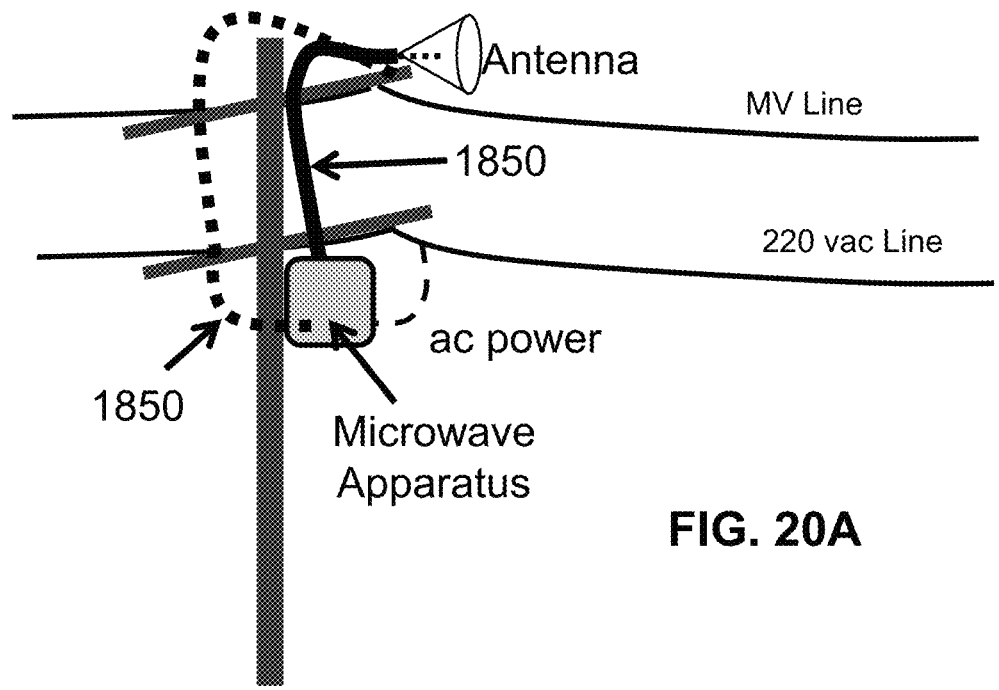
FIGS. 20A and 20B are block diagrams illustrating example, non-limiting embodiments of the transmission medium of FIG. 18A used for inducing guided electromagnetic waves on power lines supported by utility poles.
Figure 20B:
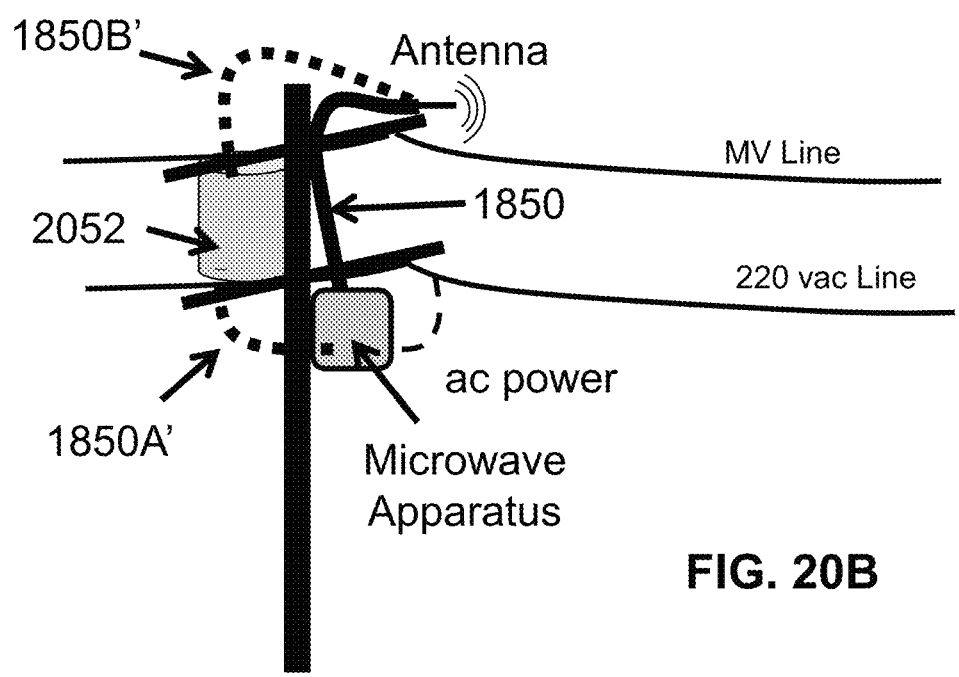

Turning now to FIGS. 20A and 20B, block diagrams illustrating example, non-limiting embodiments of the cable 1850 of FIG. 18A used for inducing guided electromagnetic waves on power lines supported by utility poles. In one embodiment, as depicted in FIG. 20A, a cable 1850 can be coupled at one end to a microwave apparatus that launches guided electromagnetic waves within one or more inner layers of cable 1850 utilizing, for example, the hollow waveguide 1808 shown in FIG. 18A. The microwave apparatus can utilize a microwave transceiver such as shown in FIG. 10 for transmitting or receiving signals from cable 1850. The guided electromagnetic waves induced in the one or more inner layers of cable 1850 can propagate to an exposed stub of the cable 1850 located inside a horn antenna (shown as a dotted line in FIG. 20A) for radiating the electromagnetic waves via the horn antenna. The radiated signals from the horn antenna in turn can induce guided electromagnetic waves that propagate longitudinally on power line such as a medium voltage (MV) power line. In one embodiment, the microwave apparatus can receive AC power from a low voltage (e.g., 220V) power line. Alternatively, the horn antenna can be replaced with a stub antenna as shown in FIG. 20B to induce guided electromagnetic waves that propagate longitudinally on a power line such as the MV power line or to transmit wireless signals to other antenna system(s).

Figure 20C:
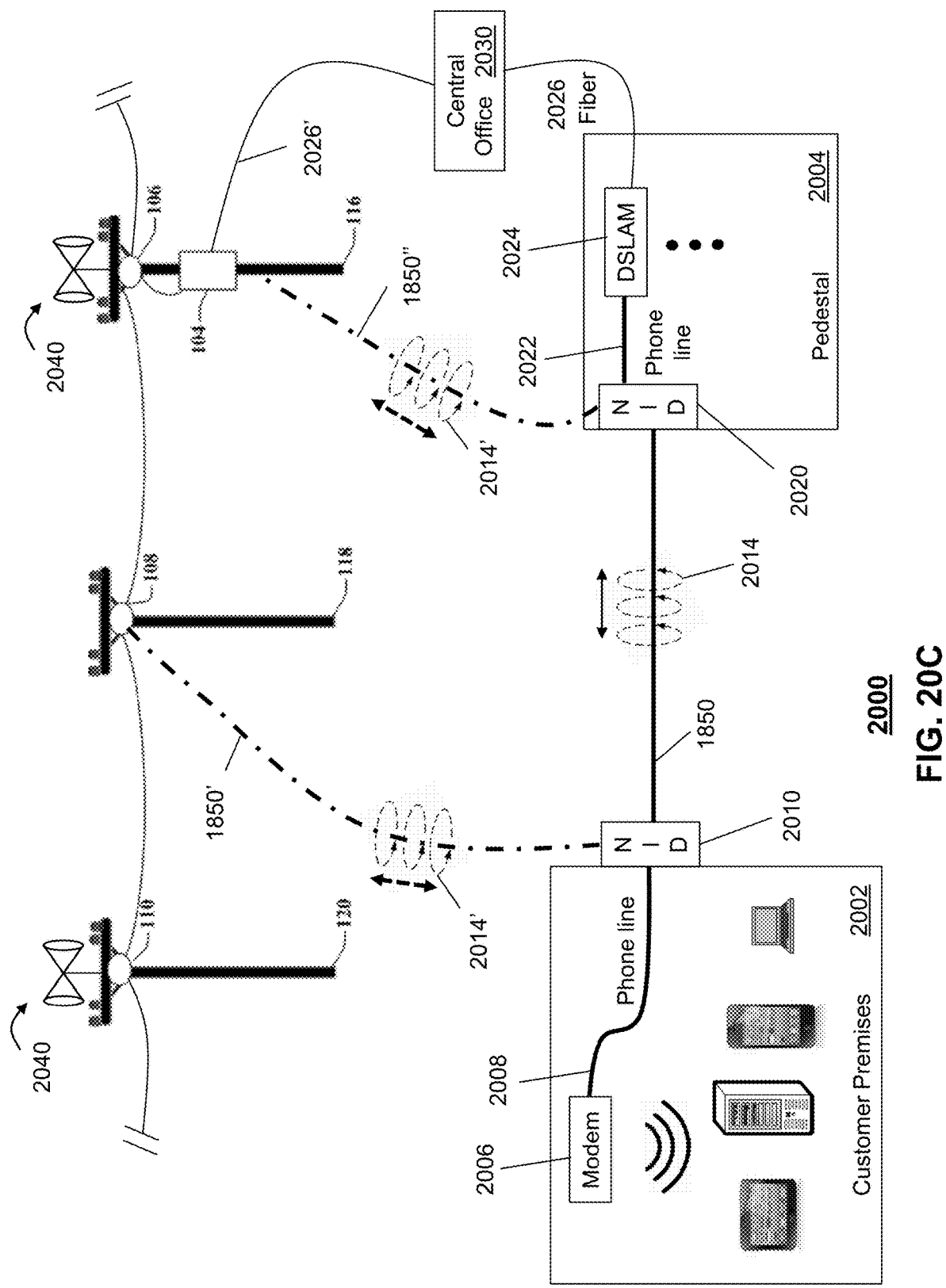
FIG. 20C is a block diagram of an example, non-limiting embodiment of a communication network in accordance with various aspects described herein.

In an alternative embodiment, the hollow horn antenna shown in FIG. 20A can be replaced with a solid dielectric antenna such as the dielectric antenna 1901 of FIG. 19A, or the pyramidal-shaped horn antenna 1901' of FIG. 19E. In this embodiment the horn antenna can radiate wireless signals directed to another horn antenna such as the bidirectional horn antennas 2040 shown in FIG. 20C. In this embodiment, each horn antenna 2040 can transmit wireless signals to another horn antenna 2040 or receive wireless signals from the other horn antenna 2040 as shown in FIG. 20C. Such an arrangement can be used for performing bidirectional wireless communications between antennas. Although not shown, the horn antennas 2040 can be configured with an electromechanical device to steer a direction of the horn antennas 2040.

In alternate embodiments, first and second cables 1850A' and 1850B' can be coupled to the microwave apparatus and to a transformer 2052, respectively, as shown in FIGS. 20A and 20B. The first and second cables 1850A' and 1850B' can be represented by, for example, cable 1800 each modified to have a conductive core. A first end of the conductive core of the first cable 1850A' can be coupled to the microwave apparatus for propagating guided electromagnetic waves launched therein. A second end of the conductive core of the first cable 1850A' can be coupled to a first end of a conductive coil of the transformer 2052 for receiving the guided electromagnetic waves propagating in the first cable 1850A' and for supplying signals associated therewith to a first end of a second cable 1850B' by way of a second end of the conductive coil of the transformer 2052. A second end of the second cable 1850B' can be coupled to the horn antenna of FIG. 20A or can be exposed as a stub antenna of FIG. 20B for inducing guided electromagnetic waves that propagate longitudinally on the MV power line.

In an embodiment where cable 1850, 1850A' and 1850B' each comprise multiple instances of transmission mediums 1800, a poly-rod structure of antennas 1855 can be formed such as shown in FIG. 18C. Each antenna 1855 can be coupled, for example, to a horn antenna assembly as shown in FIG. 20A or a pie-pan antenna assembly (not shown) for radiating multiple wireless signals. Alternatively, the antennas 1855 can be used as stub antennas in FIG. 20B. The microwave apparatus of FIGS. 20A-20B can be configured to adjust the guided electromagnetic waves to beam steer the wireless signals emitted by the antennas 1855. One or more of the antennas 1855 can also be used for inducing guided electromagnetic waves on a power line.

Turning now to FIG. 20C, a block diagram of an example, non-limiting embodiment of a communication network 2000 in accordance with various aspects described herein is shown. In one embodiment, for example, the waveguide system 1602 of FIG. 16A can be incorporated into network interface devices (NIDs) such as NIDs 2010 and 2020 of FIG. 20C. A NID having the functionality of waveguide system 1602 can be used to enhance transmission capabilities between customer premises 2002 (enterprise or residential) and a pedestal 2004 (sometimes referred to as a service area interface or SAI).

In one embodiment, a central office 2030 can supply one or more fiber cables 2026 to the pedestal 2004. The fiber cables 2026 can provide high-speed full-duplex data services (e.g., 1-100 Gbps or higher) to mini-DSLAMs 2024 located in the pedestal 2004. The data services can be used for transport of voice, internet traffic, media content services (e.g., streaming video services, broadcast TV), and so on. In prior art systems, mini-DSLAMs 2024 typically connect to twisted pair phone lines (e.g., twisted pairs included in category 5e or Cat. 5e unshielded twisted-pair (UTP) cables that include an unshielded bundle of twisted pair cables, such as 24 gauge insulated solid wires, surrounded by an outer insulating sheath), which in turn connect to the customer premises 2002 directly. In such systems, DSL data rates taper off at 100 Mbps or less due in part to the length of legacy twisted pair cables to the customer premises 2002 among other factors.

The embodiments of FIG. 20C, however, are distinct from prior art DSL systems. In the illustration of FIG. 20C, a mini-DSLAM 2024, for example, can be configured to connect to NID 2020 via cable 1850 (which can represent in whole or in part any of the cable embodiments described in relation to FIGS. 18A and 18B singly or in combination). Utilizing cable 1850 between customer premises 2002 and a pedestal 2004, enables NIDs 2010 and 2020 to transmit and receive guide electromagnetic waves for uplink and downlink communications. Based on embodiments previously described, cable 1850 can be exposed to rain, or can be buried without adversely affecting electromagnetic wave propagation either in a downlink path or an uplink path so long as the electric field profile of such waves in either direction is confined at least in part or entirely within inner layers of cable 1850. In the present illustration, downlink communications represents a communication path from the pedestal 2004 to customer premises 2002, while uplink communications represents a communication path from customer premises 2002 to the pedestal 2004. In an embodiment where cable 1850 includes an inner conductor, cable 1850 can also serve the purpose of supplying power to the NID 2010 and 2020 and other equipment of the customer premises 2002 and the pedestal 2004.

In customer premises 2002, DSL signals can originate from a DSL modem 2006 (which may have a built-in router and which may provide wireless services such as WiFi to user equipment shown in the customer premises 2002). The DSL signals can be supplied to NID 2010 by a twisted pair phone 2008. The NID 2010 can utilize the integrated waveguide 1602 to launch within cable 1850 guided electromagnetic waves 2014 directed to the pedestal 2004 on an uplink path. In the downlink path, DSL signals generated by the mini-DSLAM 2024 can flow through a twisted pair phone line 2022 to NID 2020. The waveguide system 1602 integrated in the NID 2020 can convert the DSL signals, or a portion thereof, from electrical signals to guided electromagnetic waves 2014 that propagate within cable 1850 on the downlink path. To provide full duplex communications, the guided electromagnetic waves 2014 on the uplink can be configured to operate at a different carrier frequency and/or a different modulation approach than the guided electromagnetic waves 2014 on the downlink to reduce or avoid interference. Additionally, on the uplink and downlink paths, the guided electromagnetic waves 2014 are guided by a core section of cable 1850, as previously described, and such waves can be configured to have a field intensity profile that confines the guide electromagnetic waves in whole or in part in the inner layers of cable 1850. Although the guided electromagnetic waves 2014 are shown outside of cable 1850, the depiction of these waves is for illustration purposes only. For this reason, the guided electromagnetic waves 2014 are drawn with "hash marks" to indicate that they are guided by the inner layers of cable 1850.

On the downlink path, the integrated waveguide system 1602 of NID 2010 receives the guided electromagnetic waves 2014 generated by NID 2020 and converts them back to DSL signals conforming to the requirements of the DSL modem 2006. The DSL signals are then supplied to the DSL modem 2006 via a set of twisted pair wires of phone line 2008 for processing. Similarly, on the uplink path, the integrated waveguide system 1602 of NID 2020 receives the guided electromagnetic waves 2014 generated by NID 2010 and converts them back to DSL signals conforming to the requirements of the mini-DSLAM 2024. The DSL signals are then supplied to the mini-DSLAM 2024 via a set of twisted pair wires of phone line 2022 for processing. Because of the short length of phone lines 2008 and 2022, the DSL modem 2006 and the mini-DSLAM 2024 can send and receive DSL signals between themselves on the uplink and downlink at very high speeds (e.g., 1 Gbps to 60 Gbps or more). Consequently, the uplink and downlink paths can in most circumstances exceed the data rate limits of traditional DSL communications over twisted pair phone lines.

Typically, DSL devices are configured for asymmetric data rates because the downlink path usually supports a higher data rate than the uplink path. However, cable 1850 can provide much higher speeds both on the downlink and uplink paths. With a firmware update, a legacy DSL modem 2006 such as shown in FIG. 20C can be configured with higher speeds on both the uplink and downlink paths. Similar firmware updates can be made to the mini-DSLAM 2024 to take advantage of the higher speeds on the uplink and downlink paths. Since the interfaces to the DSL modem 2006 and mini-DSLAM 2024 remain as traditional twisted pair phone lines, no hardware change is necessary for a legacy DSL modem or legacy mini-DSLAM other than firmware changes and the addition of the NIDs 2010 and 2020 to perform the conversion from DSL signals to guided electromagnetic waves 2014 and vice-versa. The use of NIDs enables a reuse of legacy modems 2006 and mini-DSLAMs 2024, which in turn can substantially reduce installation costs and system upgrades. For new construction, updated versions of mini-DSLAMs and DSL modems can be configured with integrated waveguide systems to perform the functions described above, thereby eliminating the need for NIDs 2010 and 2020 with integrated waveguide systems. In this embodiment, an updated version of modem 2006 and updated version of mini-DSLAM 2024 would connect directly to cable 1850 and communicate via bidirectional guided electromagnetic wave transmissions, thereby averting a need for transmission or reception of DSL signals using twisted pair phone lines 2008 and 2022.

In an embodiment where use of cable 1850 between the pedestal 2004 and customer premises 2002 is logistically impractical or costly, NID 2010 can be configured instead to couple to a cable 1850' (similar to cable 1850 of the subject disclosure) that originates from a waveguide 108 on a utility pole 118, and which may be buried in soil before it reaches NID 2010 of the customer premises 2002. Cable 1850' can be used to receive and transmit guided electromagnetic waves 2014' between the NID 2010 and the waveguide 108. Waveguide 108 can connect via waveguide 106, which can be coupled to base station 104. Base station 104 can provide data communication services to customer premises 2002 by way of its connection to central office 2030 over fiber 2026'. Similarly, in situations where access from the central office 2030 to pedestal 2004 is not practical over a fiber link, but connectivity to base station 104 is possible via fiber link 2026', an alternate path can be used to connect to NID 2020 of the pedestal 2004 via cable 1850" (similar to cable 1850 of the subject disclosure) originating from pole 116. Cable 1850" can also be buried before it reaches NID 2020.

Figure 20D:
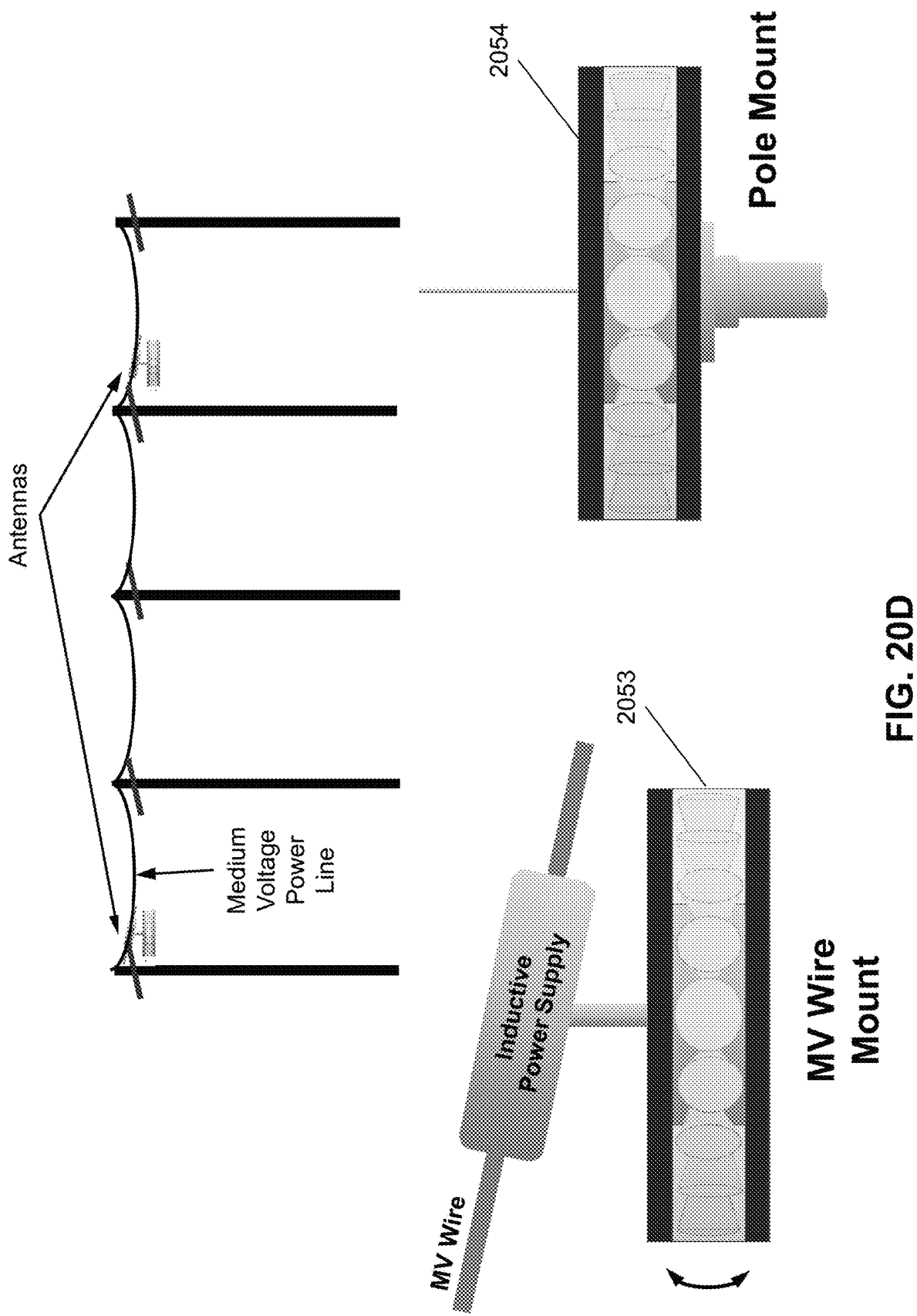
FIG. 20D is a block diagram of an example, non-limiting embodiment of an antenna mount for use in a communication network in accordance with various aspects described herein.
Figure 20E:
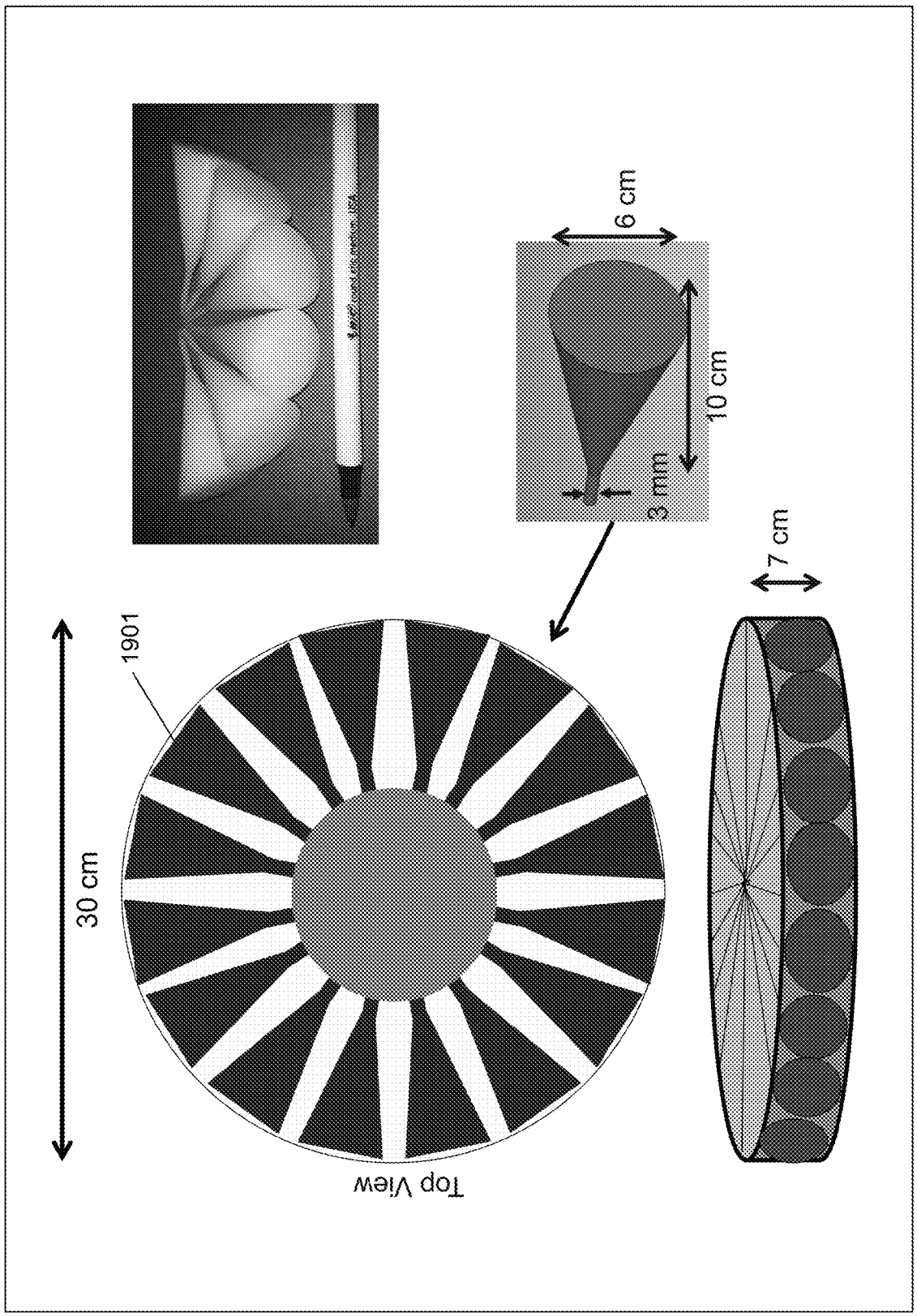
FIG. 20E is a block diagram of an example, non-limiting embodiment of an antenna mount for use in a communication network in accordance with various aspects described herein.

Turning now to FIGS. 20D and 20E, diagrams of example, non-limiting embodiments of antenna mounts that can be used in the communication network 2000 of FIG. 20C (or other suitable communication networks) in accordance with various aspects described herein are shown. In some embodiments, an antenna mount 2053 can be coupled to a medium voltage power line by way of an inductive power supply that supplies energy to one or more waveguide systems (not shown) integrated in the antenna mount 2053 as depicted in FIG. 20D. The antenna mount 2053 can include an array of dielectric antennas 1901 (e.g., 16 antennas) such as shown by the top and side views depicted in FIG. 20E. The dielectric antennas 1901 shown in FIG. 20F can be small in dimension as illustrated by a picture comparison between groups of dielectric antennas 1901 and a conventional ballpoint pen. In other embodiments, a pole mounted antenna 2054 can be used as depicted in FIG. 20D. In yet other embodiments, an antenna mount can be attached to a pole with an arm assembly. In other embodiments, an antenna mount can be placed on a top portion of a pole coupled to a cable 1800 or 1836 such as the cables as described in the subject disclosure.

The array of dielectric antennas 1901 of the antenna mount of FIG. 20D can include one or more waveguide systems as described in the subject disclosure by way of FIGS. 1-20. The waveguide systems can be configured to perform beam steering with the array of dielectric antennas 1901 (for transmission or reception of wireless signals). Alternatively, each dielectric antenna 1901 can be utilized as a separate sector for receiving and transmitting wireless signals. In other embodiments, the one or more waveguide systems integrated in the antenna mount of FIG. 20D can be configured to utilize combinations of the dielectric antennas 1901 in a wide range of multi-input multi-output (MIMO) transmission and reception techniques. The one or more waveguide systems integrated in the antenna mount of FIG. 20D can also be configured to apply communication techniques such as SISO, SIMO, MISO, SISO, signal diversity (e.g., frequency, time, space, polarization, or other forms of signal diversity techniques), and so on, with any combination of the dielectric antennas 1901 in any of the antenna mount of FIG. 20D. In yet other embodiments, the antenna mount of FIG. 20D can be adapted with two or more stacks of the antenna arrays shown in FIG. 20E.

Figure 21A:
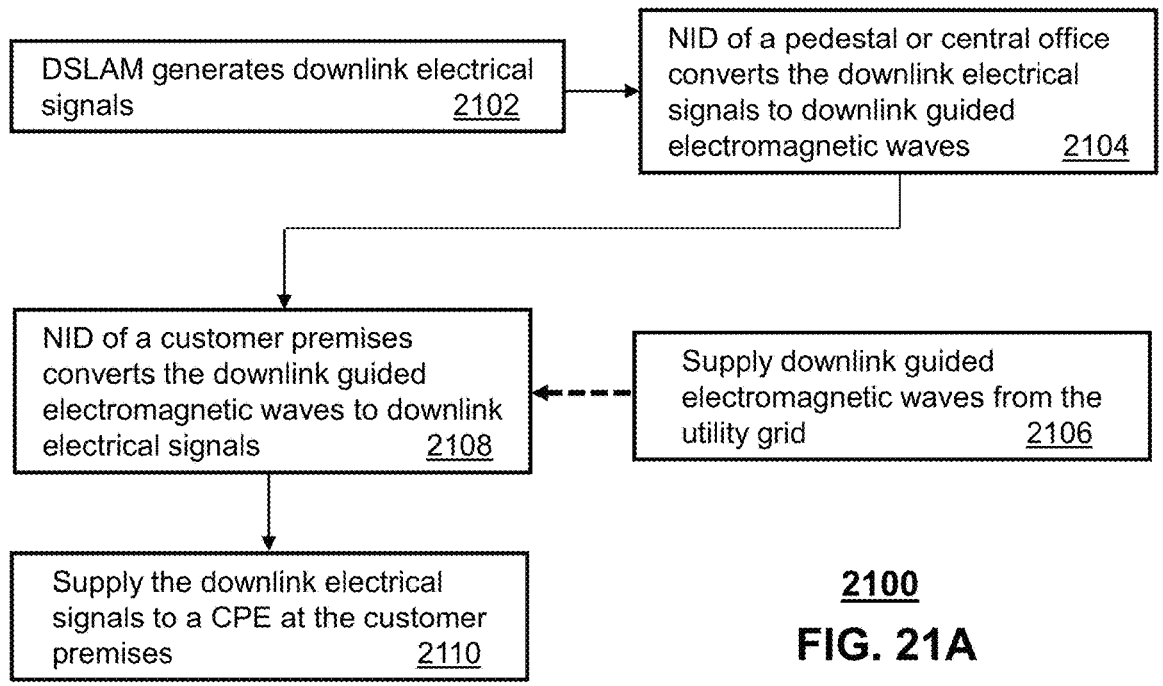
FIG. 21A illustrates a flow diagram of an example, non-limiting embodiment of a method for transmitting downlink signals.
Figure 21B:
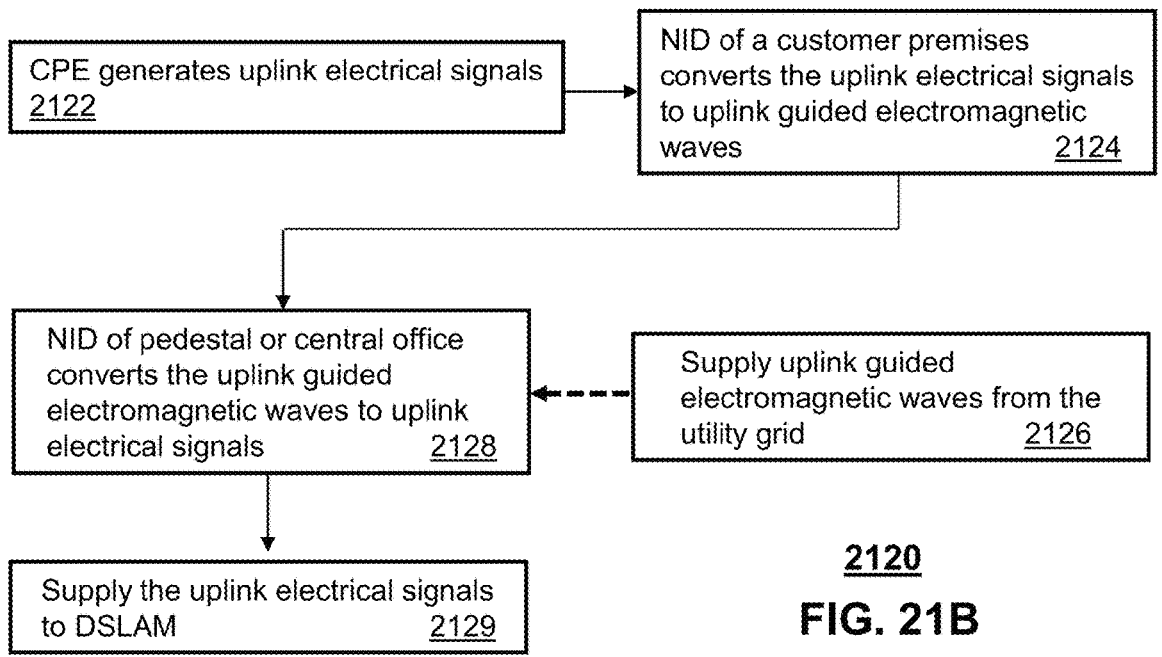
FIG. 21B illustrates a flow diagram of an example, non-limiting embodiment of a method for transmitting uplink signals.

FIGS. 21A and 21B describe embodiments for downlink and uplink communications. Method 2100 of FIG. 21A can begin with step 2102 where electrical signals (e.g., DSL signals) are generated by a DSLAM (e.g., mini-DSLAM 2024 of pedestal 2004 or from central office 2030), which are converted to guided electromagnetic waves 2014 at step 2104 by NID 2020 and which propagate on a transmission medium such as cable 1850 for providing downlink services to the customer premises 2002. At step 2108, the NID 2010 of the customer premises 2002 converts the guided electromagnetic waves 2014 back to electrical signals (e.g., DSL signals) which are supplied at step 2110 to customer premises equipment (CPE) such as DSL modem 2006 over phone line 2008. Alternatively, or in combination, power and/or guided electromagnetic waves 2014' can be supplied from a power line 1850' of a utility grid (having an inner waveguide as illustrated in FIG. 18G or 18H) to NID 2010 as an alternate or additional downlink (and/or uplink) path.

At step 2122 of method 2120 of FIG. 21B, the DSL modem 2006 can supply electrical signals (e.g., DSL signals) via phone line 2008 to NID 2010, which in turn at step 2124, converts the DSL signals to guided electromagnetic waves directed to NID 2020 by way of cable 1850. At step 2128, the NID 2020 of the pedestal 2004 (or central office 2030) converts the guided electromagnetic waves 2014 back to electrical signals (e.g., DSL signals) which are supplied at step 2129 to a DSLAM (e.g., mini-DSLAM 2024). Alternatively, or in combination, power and guided electromagnetic waves 2014' can be supplied from a power line 1850' of a utility grid (having an inner waveguide as illustrated in FIG. 18G or 18H) to NID 2020 as an alternate or additional uplink (and/or downlink) path.

Figure 21C:
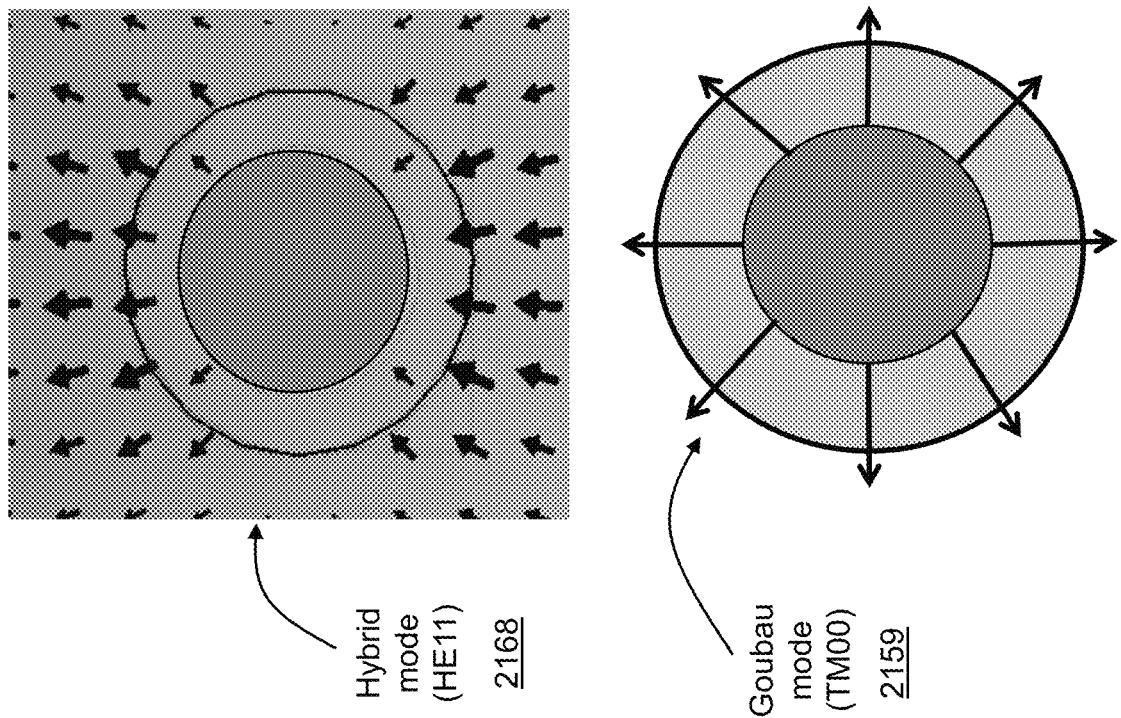
FIG. 21C is a block diagram illustrating an example, non-limiting embodiment of electric field characteristics of a hybrid wave versus a Goubau wave in accordance with various aspects described herein.
Figure 21C:
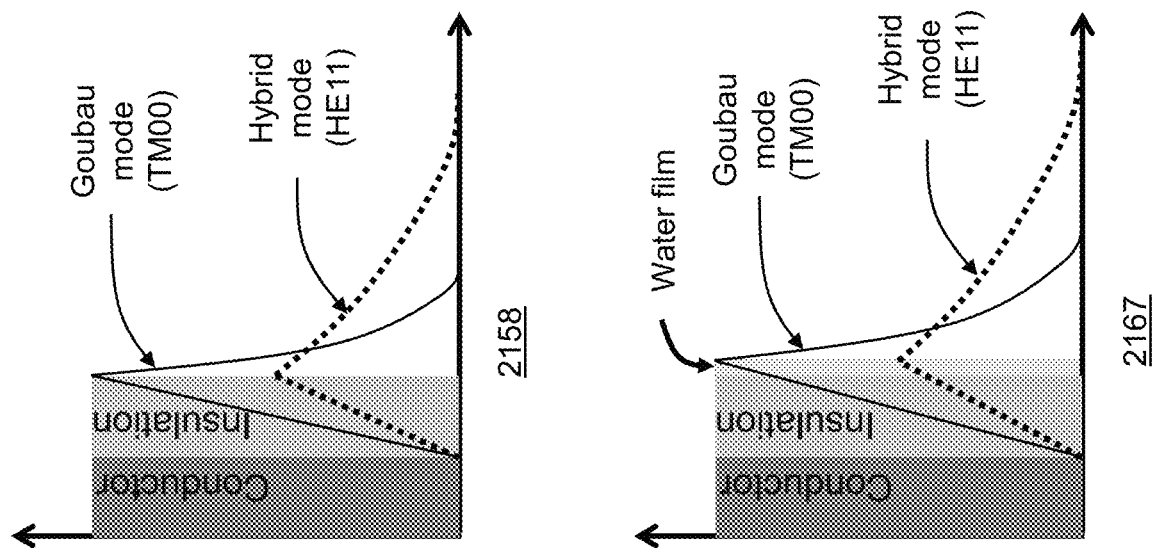

Turning now to FIG. 21C, a block diagram 2151 illustrating an example, non-limiting embodiment of electric field characteristics of a hybrid wave versus a Goubau wave in accordance with various aspects described herein is shown. Diagram 2158 shows a distribution of energy between HE11 mode waves and Goubau waves for an insulated conductor. The energy plots of diagram 2158 assume that the amount of power used to generate the Goubau waves is the same as the HE11 waves (i.e., the area under the energy curves is the same). In the illustration of diagram 2158, Goubau waves have a steep drop in power when Goubau waves extend beyond the outer surface of an insulated conductor, while HE11 waves have a substantially lower drop in power beyond the insulation layer. Consequently, Goubau waves have a higher concentration of energy near the insulation layer than HE11 waves. Diagram 2167 depicts similar Goubau and HE11 energy curves when a water film is present on the outer surface of the insulator. The difference between the energy curves of diagrams 2158 and 2167 is that the drop in power for the Goubau and the HE11 energy curves begins on an outer edge of the insulator for diagram 2158 and on an outer edge of the water film for diagram 2167. The energy curves diagrams 2158 and 2167, however, depict the same behavior. That is, the electric fields of Goubau waves are tightly bound to the insulation layer, which when exposed to water results in greater propagation losses than electric fields of HE11 waves having a higher concentration outside the insulation layer and the water film. These properties are depicted in the HE11 and Goubau diagrams 2168 and 2159, respectively.

By adjusting an operating frequency of HE11 waves, e-fields of HE11 waves can be configured to extend substantially above a thin water film as shown in block diagram 2169 of FIG. 21D having a greater accumulated field strength in areas in the air when compared to fields in the insulator and a water layer surrounding the outside of the insulator. FIG. 21D depicts a wire having a radius of 1 cm and an insulation radius of 1.5 cm with a dielectric constant of 2.25. As the operating frequency of HE11 waves is reduced, the e-fields extend outwardly expanding the size of the wave mode. At certain operating frequencies (e.g., 3 GHz) the wave mode expansion can be substantially greater than the diameter of the insulated wire and any obstructions that may be present on the insulated wire.

By having e-fields that are perpendicular to a water film and by placing most of its energy outside the water film, HE11 waves have less propagation loss than Goubau waves when a transmission medium is subjected to water or other obstructions. Although Goubau waves have radial e-fields which are desirable, the waves are tightly coupled to the insulation layer, which results in the e-fields being highly concentrated in the region of an obstruction. Consequently, Goubau waves are still subject to high propagation losses when an obstruction such as a water film is present on the outer surface of an insulated conductor.

Figure 22A:
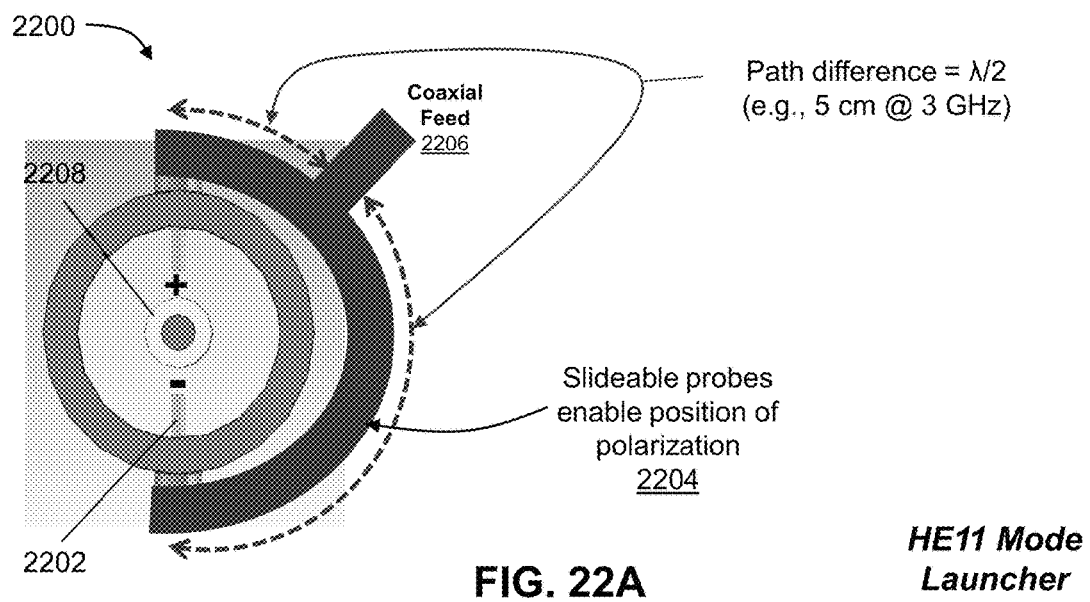
FIGS. 22A and 22B are block diagrams illustrating example, non-limiting embodiments of a waveguide device for launching hybrid waves in accordance with various aspects described herein.
Figure 22B:
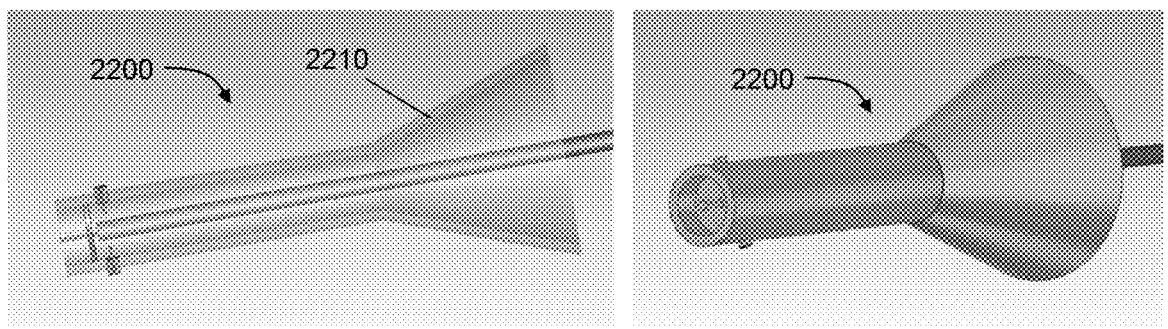

Turning now to FIGS. 22A and 22B, block diagrams illustrating example, non-limiting embodiments of a waveguide system 2200 for launching hybrid waves in accordance with various aspects described herein is shown. The waveguide system 2200 can comprise probes 2202 coupled to a slideable or rotatable mechanism 2204 that enables the probes 2202 to be placed at different positions or orientations relative to an outer surface of an insulated conductor 2208. The mechanism 2204 can comprise a coaxial feed 2206 or other coupling that enables transmission of electromagnetic waves by the probes 2202. The coaxial feed 2206 can be placed at a position on the mechanism 2204 so that the path difference between the probes 2202 is one-half a wavelength or some odd integer multiple thereof. When the probes 2202 generate electromagnetic signals of opposite phase, electromagnetic waves can be induced on the outer surface of the insulated conductor 2208 having a hybrid mode (such as an HE11 mode).

The mechanism 2204 can also be coupled to a motor or other actuator (not shown) for moving the probes 2202 to a desirable position. In one embodiment, for example, the waveguide system 2200 can comprise a controller that directs the motor to rotate the probes 2202 (assuming they are rotatable) to a different position (e.g., east and west) to generate electromagnetic waves that have a horizontally polarized HE11 mode. To guide the electromagnetic waves onto the outer surface of the insulated conductor 2208, the waveguide system 2200 can further comprise a tapered horn 2210 shown in FIG. 22B. The tapered horn 2210 can be coaxially aligned with the insulated conductor 2208. To reduce the cross-sectional dimension of the tapered horn 2210, an additional insulation layer (not shown) can placed on the insulated conductor 2208. The additional insulation layer can be similar to the tapered insulation layer 1879 shown in FIGS. 18G and 18H. The additional insulation layer can have a tapered end that points away from the tapered horn 2210. The tapered insulation layer 1879 can reduce a size of an initial electromagnetic wave launched according to an HE11 mode. As the electromagnetic waves propagate towards the tapered end of the insulation layer, the HE11 mode expands until it reaches its full size. In other embodiments, the waveguide system 2200 may not need to use the tapered insulation layer 1879.

HE11 mode waves can be used to mitigate obstructions such as rain water. For example, suppose that rain water has caused a water film to surround an outer surface of the insulated conductor 2208. Further assume that water droplets have collected at the bottom of the insulated conductor 2208. The water film occupies a small fraction of the total HE11 wave. Also, by having horizontally polarized HE11 waves, the water droplets are in a least-intense area of the HE11 waves reducing losses caused by the droplets. Consequently, the HE11 waves experience much lower propagation losses than Goubau waves or waves having a mode that is tightly coupled to the insulated conductor 2208 and thus greater energy in the areas occupied by the water.

It is submitted that the waveguide system 2200 of FIGS. 22A-22B can be replaced with other waveguide systems of the subject disclosure capable of generating electromagnetic waves having an HE mode. For example, the waveguide system 1865' of FIG. 18K can be configured to generate electromagnetic waves having an HE mode. In an embodiment, two or more MMICs 1870 of the waveguide system 1865' can be configured to generate electromagnetic waves of opposite phase to generate polarized e-fields such as those present in an HE mode. In another embodiment, different pairs of MMICs 1870 can be selected to generate HE11 waves that are polarized at different spatial positions (e.g., north and south, west and east, northwest and southeast, northeast and southeast, or other sub-fractional coordinates). Additionally, the waveguide systems of FIGS. 18D-18K can be configured to launch electromagnetic waves having an HE mode onto the core 1852 of one or more embodiments of cable 1850 suitable for propagating HE mode waves.

Although HE11 waves can have desirable characteristics for mitigating obstructions on a transmission medium, it is submitted that certain wave modes having a cutoff frequency (e.g., TE modes, TM modes or combinations thereof) may also exhibit waves that are sufficiently large and have polarized e-fields that are orthogonal (or approximately orthogonal) to a region of an obstruction enabling their use for mitigating propagation losses caused by the obstruction.

Figure 23A:
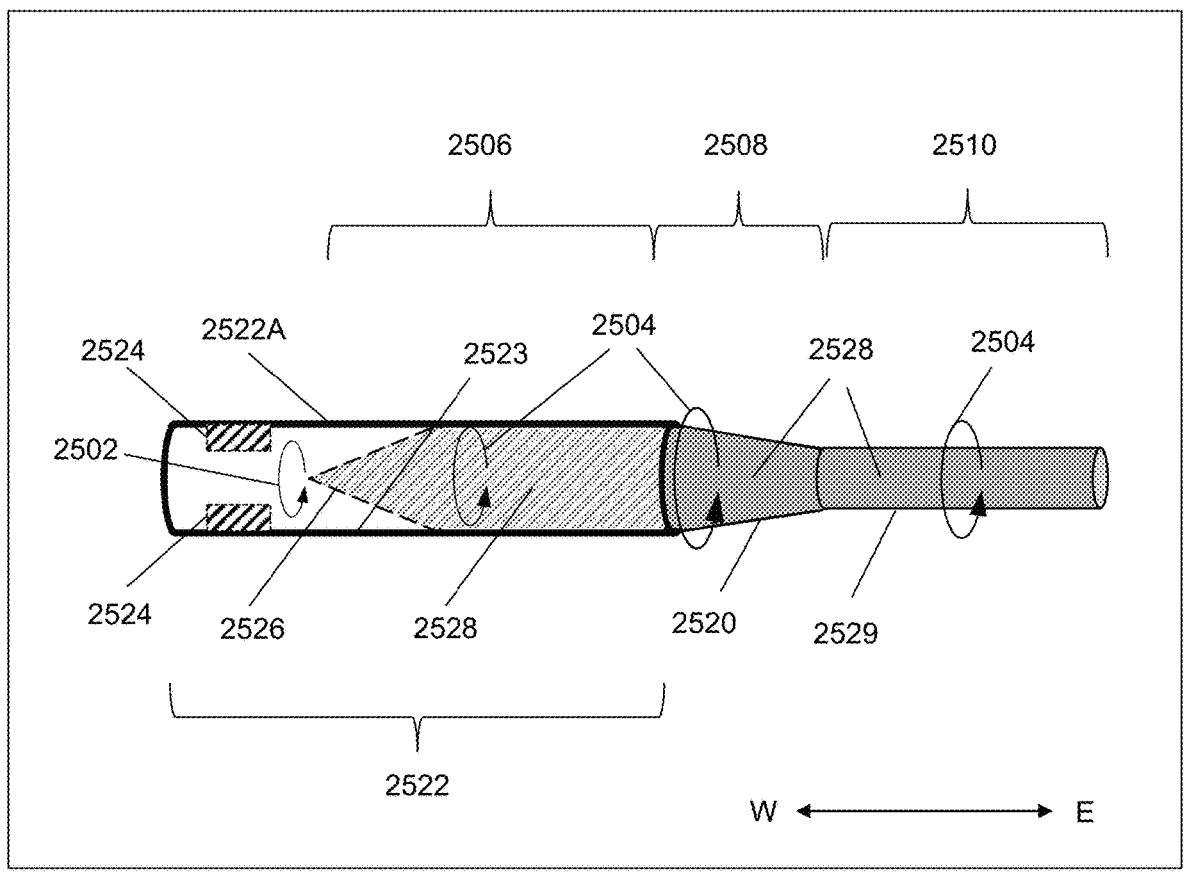
FIGS. 23A, 23B, and 23C are block diagrams illustrating example, non-limiting embodiments of a waveguide device in accordance with various aspects described herein.

Turning to the illustration of FIG. 23A, the waveguide 2522 covers a first region 2506 of a core 2528. Within the first region 2506, waveguide 2522 has an outer surface 2522A and an inner surface 2523. The inner surface 2523 of the waveguide 2522 can be constructed from a metallic material or other material that reflects electromagnetic waves and thereby enables the waveguide 2522 to be configured at step 2404 to guide the first electromagnetic wave 2502 towards the core 2528. The core 2528 can comprise a dielectric core (as described in the subject disclosure) that extends to the inner surface 2523 of the waveguide 2522. In other embodiments, the dielectric core can be surrounded by cladding (such as shown in FIG. 18A), whereby the cladding extends to the inner surface 2523 of the waveguide 2522. In yet other embodiments, the core 2528 can comprise an insulated conductor, where the insulation extends to the inner surface 2523 of the waveguide 2522. In this embodiment, the insulated conductor can be a power line, a coaxial cable, or other types of insulated conductors.

In the first region 2506, the core 2528 comprises an interface 2526 for receiving the first electromagnetic wave 2502. In one embodiment, the interface 2526 of the core 2528 can be configured to reduce reflections of the first electromagnetic wave 2502. In one embodiment, the interface 2526 can be a tapered structure to reduce reflections of the first electromagnetic wave 2502 from a surface of the core 2528. Other structures can be used for the interface 2526. For example, the interface 2526 can be partially tapered with a rounded point. Accordingly, any structure, configuration, or adaptation of the interface 2526 that can reduced reflections of the first electromagnetic wave 2502 is contemplated by the subject disclosure. The first electromagnetic wave 2502 induces (or otherwise generates) a second electromagnetic wave 2504 that propagates within the core 2528 in the first region 2506 covered by the waveguide 2522. The inner surface 2523 of the waveguide 2522 confines the second electromagnetic wave 2504 within the core 2528.

A second region 2508 of the core 2528 is not covered by the waveguide 2522, and is thereby exposed to the environment (e.g., air). In the second region 2508, the second electromagnetic wave 2504 expands outwardly beginning from the discontinuity between the edge of the waveguide 2522 and the exposed core 2528. To reduce the radiation into the environment from the second electromagnetic wave 2504, the core 2528 can be configured to have a tapered structure 2520. As the second electromagnetic wave 2504 propagates along the tapered structure 2520, the second electromagnetic wave 2504 remains substantially bound to the tapered structure 2520 thereby reducing radiation losses. The tapered structure 2520 ends at a transition from the second region 2508 to a third region 2510. In the third region, the core has a cylindrical structure 2529 having a diameter equal to the endpoint of the tapered structure 2520 at the juncture between the second region 2508 and the third region 2510. In the third region 2510 of the core 2528, the second electromagnetic wave 2504 experiences a low propagation loss. In one embodiment, this can be accomplished by selecting a diameter of the core 2528 that enables the second electromagnetic wave 2504 to be loosely bound to the outer surface of the core 2528 in the third region 2510. Alternatively, or in combination, propagation losses of the second electromagnetic wave 2504 can be reduced by configuring the MMICs 2524 to adjust a wave mode, wave length, operating frequency, or other operational parameter of the first electromagnetic wave 2502.

Figure 24:
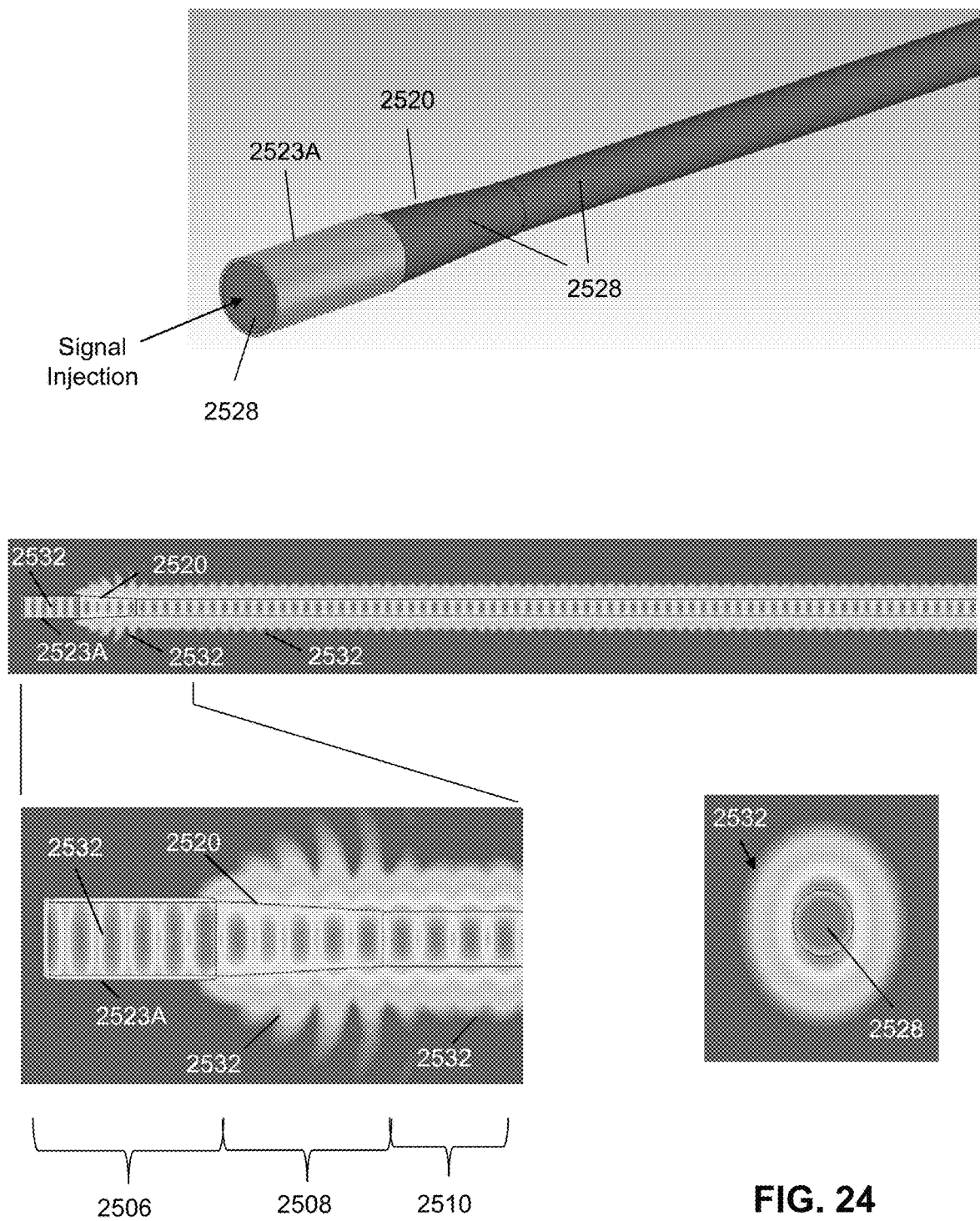
FIG. 24 is a block diagram illustrating an example, non-limiting embodiment of a waveguide device in accordance with various aspects described herein.

FIG. 24 illustrates a portion of the waveguide 2522 of FIG. 23A depicted as a cylindrical ring (that does not show the MMICs 2524 or the tapered structure 2526 of FIG. 23A). In the simulations, a first electromagnetic wave is injected at the endpoint of the core 2528 shown in FIG. 24. The simulation assumes no reflections of the first electromagnetic wave based on an assumption that a tapered structure 2526 (or other suitable structure) is used to reduce such reflections. The simulations are shown as two longitudinal cross-sectional views of the core 2528 covered in part by waveguide section 2523A, and an orthogonal cross-sectional view of the core 2528. In the case of the longitudinal cross-sectional views, one of the illustrations is a blown up view of a portion of the first illustration.

As can be seen from the simulations, electromagnetic wave fields 2532 of the second electromagnetic wave 2504 are confined within the core 2528 by the inner surface 2523 of the waveguide section 2523A. As the second electromagnetic wave 2504 enters the second region 2508 (no longer covered by the waveguide section 2523A), the tapered structure 2520 reduces radiation losses of the electromagnetic wave fields 2532 as it expands over the outer tapered surface of the core 2528. As the second electromagnetic wave 2504 enters the third region 2510, the electromagnetic wave fields 2532 stabilize and thereafter remain loosely coupled to the core 2528 (depicted in the longitudinal and orthogonal cross-sectional views), which reduces propagation losses.

Figure 23B:
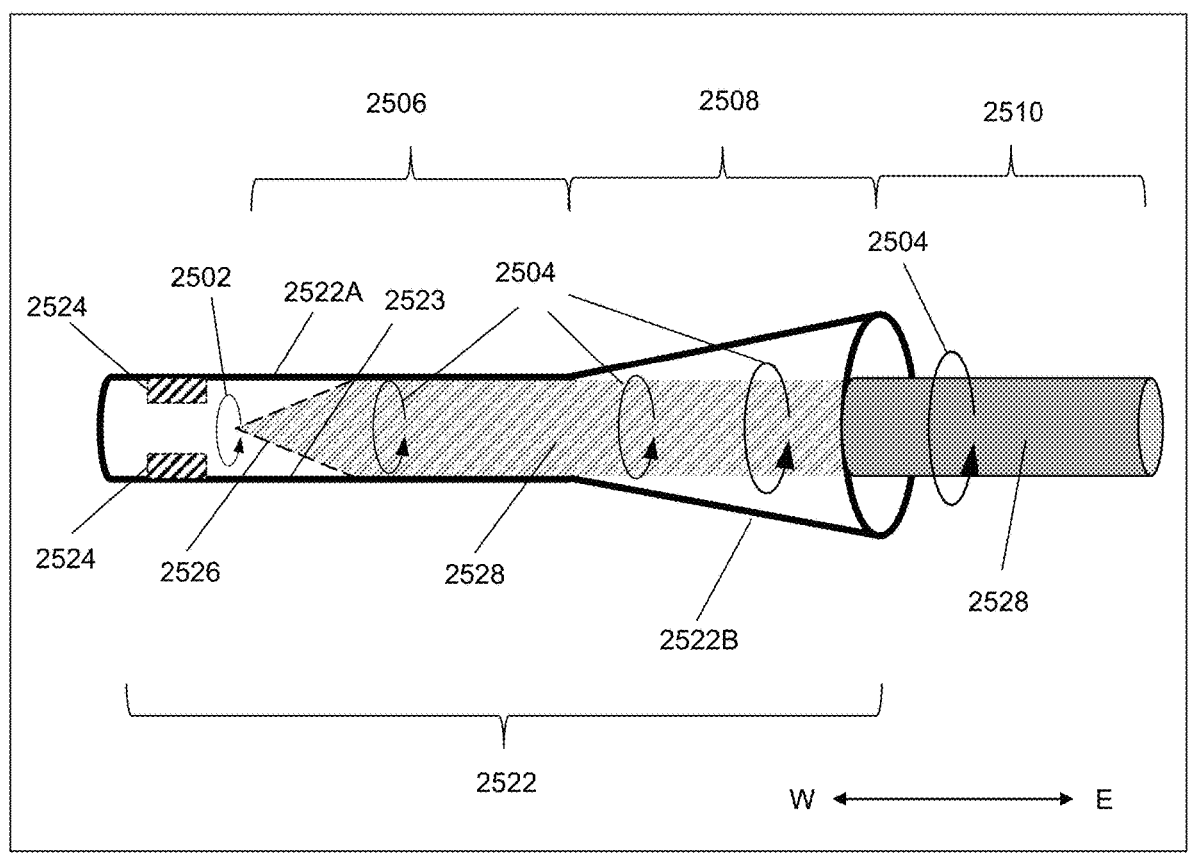

FIG. 23B provides an alternative embodiment to the tapered structure 2520 in the second region 2508. The tapered structure 2520 can be avoided by extending the waveguide 2522 into the second region 2508 with a tapered structure 2522B and maintaining the diameter of the core 2528 throughout the first, second and third regions 2506, 2508 and 2510 of the core 2528 as depicted in FIG. 23B. The horn structure 2522B can be used to reduce radiation losses of the second electromagnetic wave 2504 as the second electromagnetic wave 2504 transitions from the first region 2506 to the second region 2508. In the third region 2510, the core 2528 is exposed to the environment. As noted earlier, the core 2528 is configured in the third region 2510 to reduce propagation losses by the second electromagnetic wave 2504. In one embodiment, this can be accomplished by selecting a diameter of the core 2528 that enables the second electromagnetic wave 2504 to be loosely bound to the outer surface of the core 2528 in the third region 2510. Alternatively, or in combination, propagation losses of the second electromagnetic wave 2504 can be reduced by adjusting a wave mode, wave length, operating frequency, or other performance parameter of the first electromagnetic wave 2502.

The waveguides 2522 of FIGS. 23A and 23B can also be adapted for receiving electromagnetic waves. For example, the waveguide 2522 of FIG. 23A can be adapted to receive an electromagnetic wave at step 2412. This can be represented by an electromagnetic wave 2504 propagating in the third region 2510 from east to west (orientation shown at bottom right of FIGS. 23A-23B) towards the second region 2508. Upon reaching the second region 2508, the electromagnetic wave 2504 gradually becomes more tightly coupled to the tapered structure 2520. When it reaches the boundary between the second region 2508 and the first region 2506 (i.e., the edge of the waveguide 2522), the electromagnetic wave 2504 propagates within the core 2528 confined by the inner surface 2523 of the waveguide 2522. Eventually the electromagnetic wave 2504 reaches an endpoint of the tapered interface 2526 of the core 2528 and radiates as a new electromagnetic wave 2502 which is guided by the inner surface 2523 of the waveguide 2522.

One or more antennas of the MMICs 2524 can be configured to receive the electromagnetic wave 2502 thereby converting the electromagnetic wave 2502 to an electrical signal at step 2414 which can be processed by a processing device (e.g., a receiver circuit and microprocessor). To prevent interference between electromagnetic waves transmitted by the MMICs 2524, a remote waveguide system that transmitted the electromagnetic wave 2504 that is received by the waveguide 2522 of FIG. 23A can be adapted to transmit the electromagnetic wave 2504 at a different operating frequency, different wave mode, different phase, or other adjustable operational parameter to avoid interference. Electromagnetic waves can be received by the waveguide 2522 of FIG. 23B in a similar manner as described above.

Figure 23C:
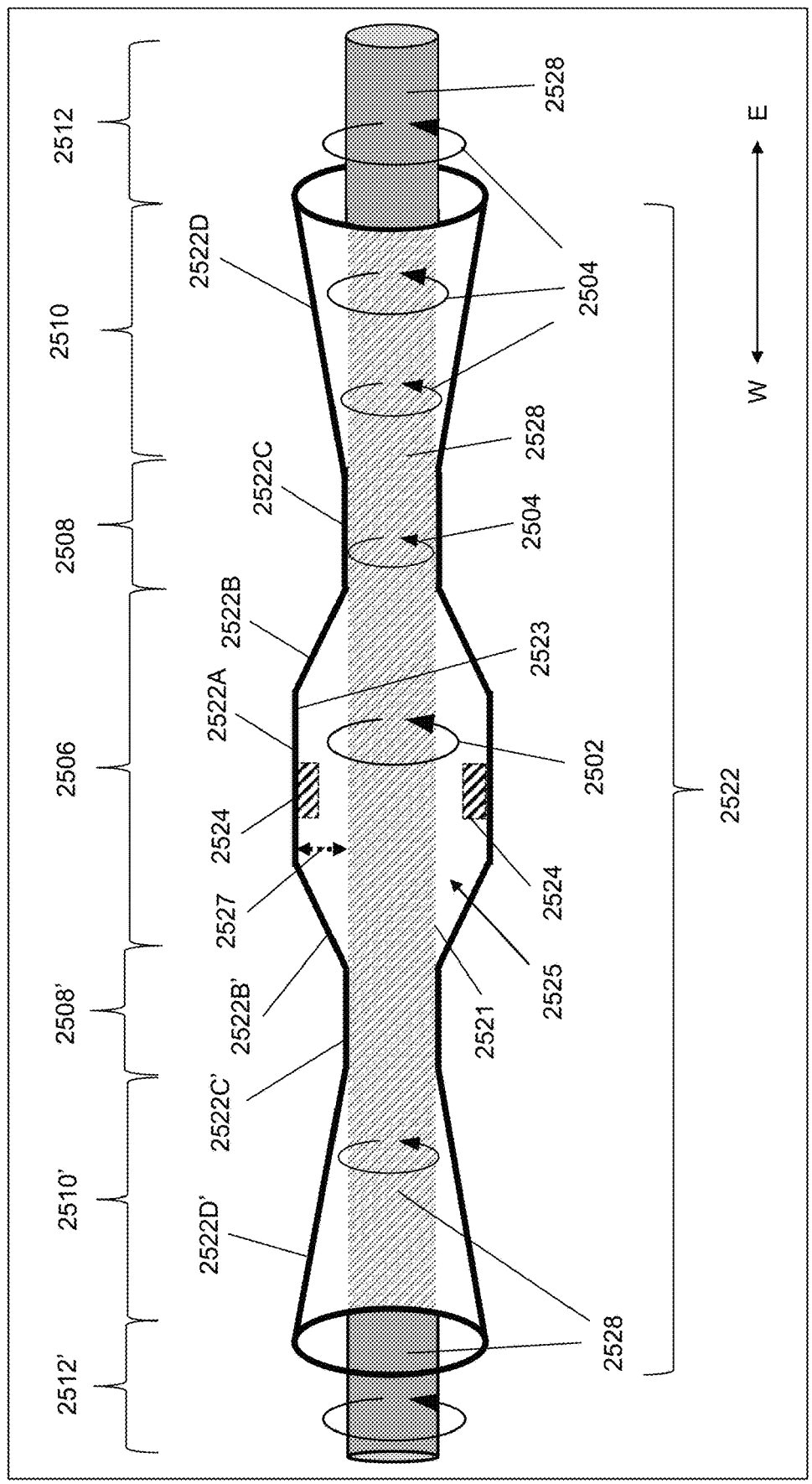

Turning now to FIG. 23C, the waveguide 2522 of FIG. 23B can be adapted to support transmission mediums 2528 that have no endpoints such as shown in FIG. 23C. In this illustration, the waveguide 2522 comprises a chamber 2525 in a first region 2506 of the core 2528. The chamber 2525 creates a gap 2527 between an outer surface 2521 of the core 2528 and the inner surface 2523 of the waveguide 2522. The gap 2527 provides sufficient room for placement of the MMICs 2524 on the inner surface 2523 of the waveguide 2522. To enable the waveguide 2522 to receive electromagnetic waves from either direction, the waveguide 2522 can be configured with symmetrical regions: 2508 and 2508', 2510 and 2510', and 2512, and 2512'. In the first region 2506, the chamber 2525 of the waveguide 2522 has two tapered structures 2522B' and 2522B". These tapered structures 2522B' and 2522B" enable an electromagnetic wave to gradually enter or exit the chamber 2525 from either direction of the core 2528. The MMICs 2524 can be configured with directional antennas to launch a first electromagnetic wave 2502 directed from east-to-west or from west-to-east in relation to the longitudinal view of the core 2528. Similarly, the directional antennas of the MMICs 2524 can be configured to receive an electromagnetic waves propagating longitudinally on the core 2528 from east-to-west or from west-to-east. The process for transmitting electromagnetic waves is similar to that described for FIG. 23B depending on whether the directional antennas of the MMICs 2524 are transmitting from east-to-west or from west-to-east.

Although not shown, the waveguide 2522 of FIG. 23C can be configured with a mechanism such as one or more hinges that enable splitting the waveguide 2522 into two parts that can be separated. The mechanism can be used to enable installation of the waveguide 2522 onto a core 2528 without endpoints. Other mechanisms for installation of the waveguide 2522 of FIG. 23C on a core 2528 are contemplated by the subject disclosure. For example, the waveguide 2522 can be configured with a slot opening that spans the entire waveguide structure longitudinally. In a slotted design of the waveguide 2522, the regions 2522C' and 2522C of the waveguide 2522 can be configured so that the inner surface 2523 of the waveguide 2522 is tightly coupled to the outer surface of the core 2528. The tight coupling between the inner surface 2523 of the waveguide 2522 the outer surface of the core 2528 prevents sliding or movement of the waveguide 2522 relative to the core 2528. A tight coupling in the regions 2522C' and 2522C can also be applied to a hinged design of the waveguide 2522.

The waveguides 2522 shown in FIGS. 23A, 23B and 23C can be adapted to perform one or more embodiments described in other figures of the subject disclosure. Accordingly, it is contemplated that such embodiments can be applied to the waveguide 2522 of FIGS. 23A, 23B and 23C. Additionally, any adaptations in the subject disclosure of a core can be applied to the waveguide 2522 of FIGS. 23A, 23B and 23C.

It is further noted that the waveguide launchers 2522 of FIGS. 23A-23C and/or other waveguide launchers described and shown in the figures of the subject disclosure (e.g., FIGS. 7-14, 18D-18K, 22A-22B, 23A-23C, 24 and other drawings) and any methods thereof can be adapted to generate along a transmission medium having an outer surface composed of, for example, a dielectric material (e.g., insulation, oxidation, or other material with dielectric properties) a single wave mode or combination of wave modes that reduce propagation losses when propagating through a substance, such as a liquid (e.g., water produced by humidity, snow, dew, sleet and/or rain), disposed on the outer surface of the transmission medium.

Figure 25A:
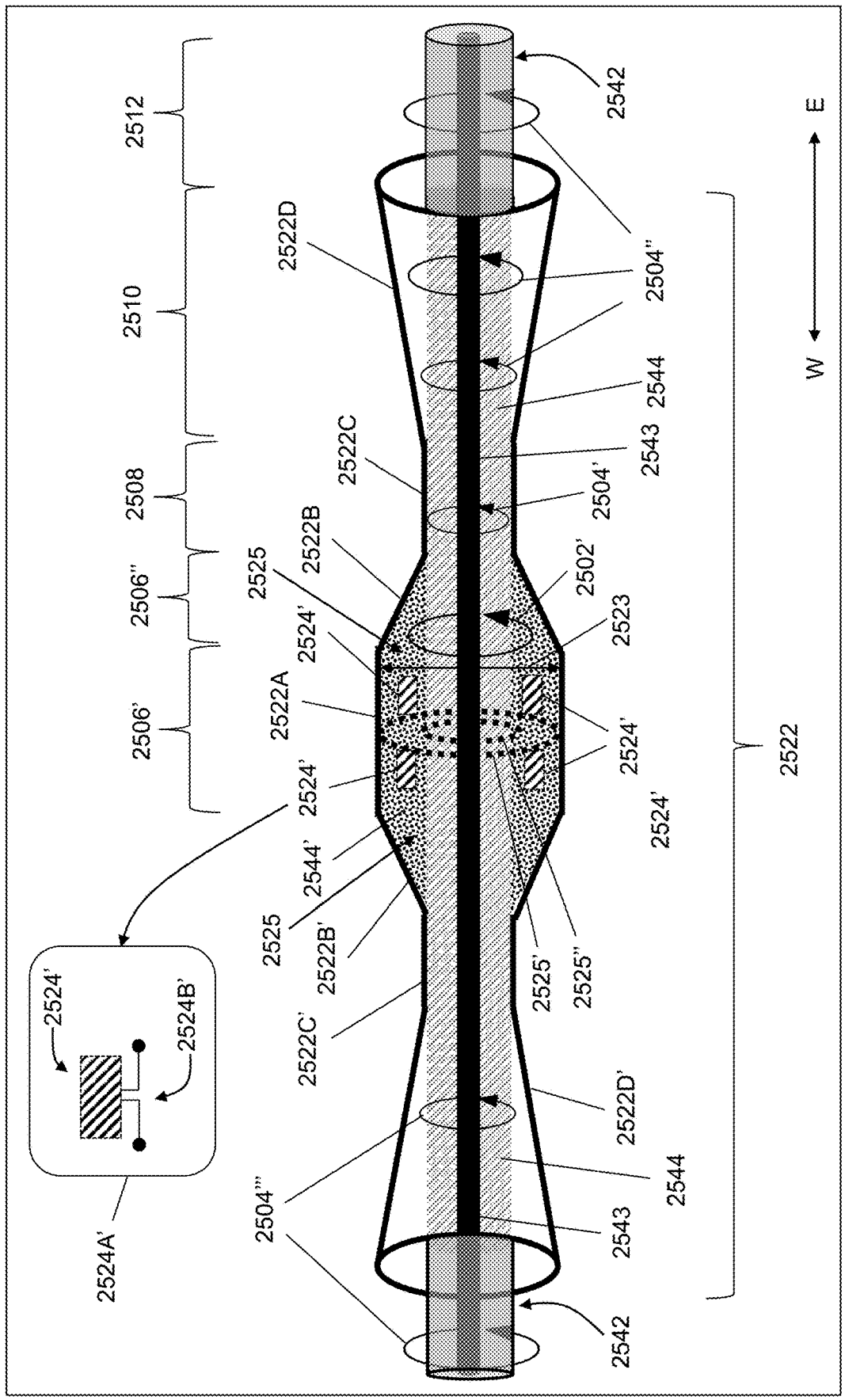
FIG. 25A is a block diagram illustrating an example, non-limiting embodiment of a waveguide device in accordance with various aspects described herein.

Referring now to FIG. 25A, there is illustrated a diagram of an example, non-limiting embodiment of a waveguide device 2522 in accordance with various aspects described herein. In the illustration of FIG. 25A, the waveguide device 2522 is coupled to a transmission medium 2542 comprising a conductor 2543 and insulation layer 2544, which together form an insulated conductor. Although not shown, the waveguide device 2522 can be constructed in two halves, which can be connected together at one longitudinal end with one or more mechanical hinges to enable opening a longitudinal edge at an opposite end of the one or more hinges for placement of the waveguide device 2522 over the transmission medium 2542. Once placed, one or more latches at the longitudinal edge opposite the one or more hinges can be used to secure the waveguide device 2522 to the transmission medium 2542. Other embodiments for coupling the waveguide device 2522 to the transmission medium 2542 can be used and are therefore contemplated by the subject disclosure.

The chamber 2525 of the waveguide device 2522 of FIG. 25A includes a dielectric material 2544'. The dielectric material 2544' in the chamber 2525 can have a dielectric constant similar to the dielectric constant of the dielectric layer 2544 of the insulated conductor. Additionally, a disk 2525' having a center-hole 2525" can be used to divide the chamber 2525 in two halves for transmission or reception of electromagnetic waves. The disk 2525' can be constructed of a material (e.g., carbon, metal or other reflective material) that does not allow electromagnetic waves to progress between the halves of the chamber 2525. The MMICs 2524' can be located inside the dielectric material 2544' of the chamber 2525 as shown in FIG. 25A. Additionally, the MMICs 2524' can be located near an outer surface of the dielectric layer 2544 of the transmission medium 2542. FIG. 25A shows an expanded view 2524A' of an MMIC 2524' that includes an antenna 2524B' (such as a monopole antenna, dipole antenna or other antenna) that can be configured to be longitudinally aligned with the outer surface of the dielectric layer 2544 of the transmission medium 2542. The antenna 2524B' can be configured to radiate signals that have a longitudinal electric field directed east or west as will be discussed shortly. It will be appreciated that other antenna structures that can radiate signals that have a longitudinal electric field can be used in place of the dipole antenna 2524B' of FIG. 25A.

It will be appreciated that although two MMICs 2524' are shown in each half of the chambers 2525 of the waveguide device 2522, more MMICs can be used. For example, FIG. 18K shows a transverse cross-sectional view of a cable (such as the transmission medium 2542) surrounded by a waveguide device with 8 MMICs located in positions: north, south, east, west, northeast, northwest, southeast, and southwest. The two MMICs 2524' shown in FIG. 25A can be viewed, for illustration purposes, as MMICs 2524' located in the north and south positions shown in FIG. 18K. The waveguide device 2522 of FIG. 25A can be further configured with MMICs 2524' at western and eastern positions as shown in FIG. 18K. Additionally, the waveguide device 2522 of FIG. 25A can be further configured with MMICs at northwestern, northeastern, southwestern and southeastern positions as shown in FIG. 18K. Accordingly, the waveguide device 2522 can be configured with more than the 2 MMICs shown in FIG. 25A.

Figure 25B:
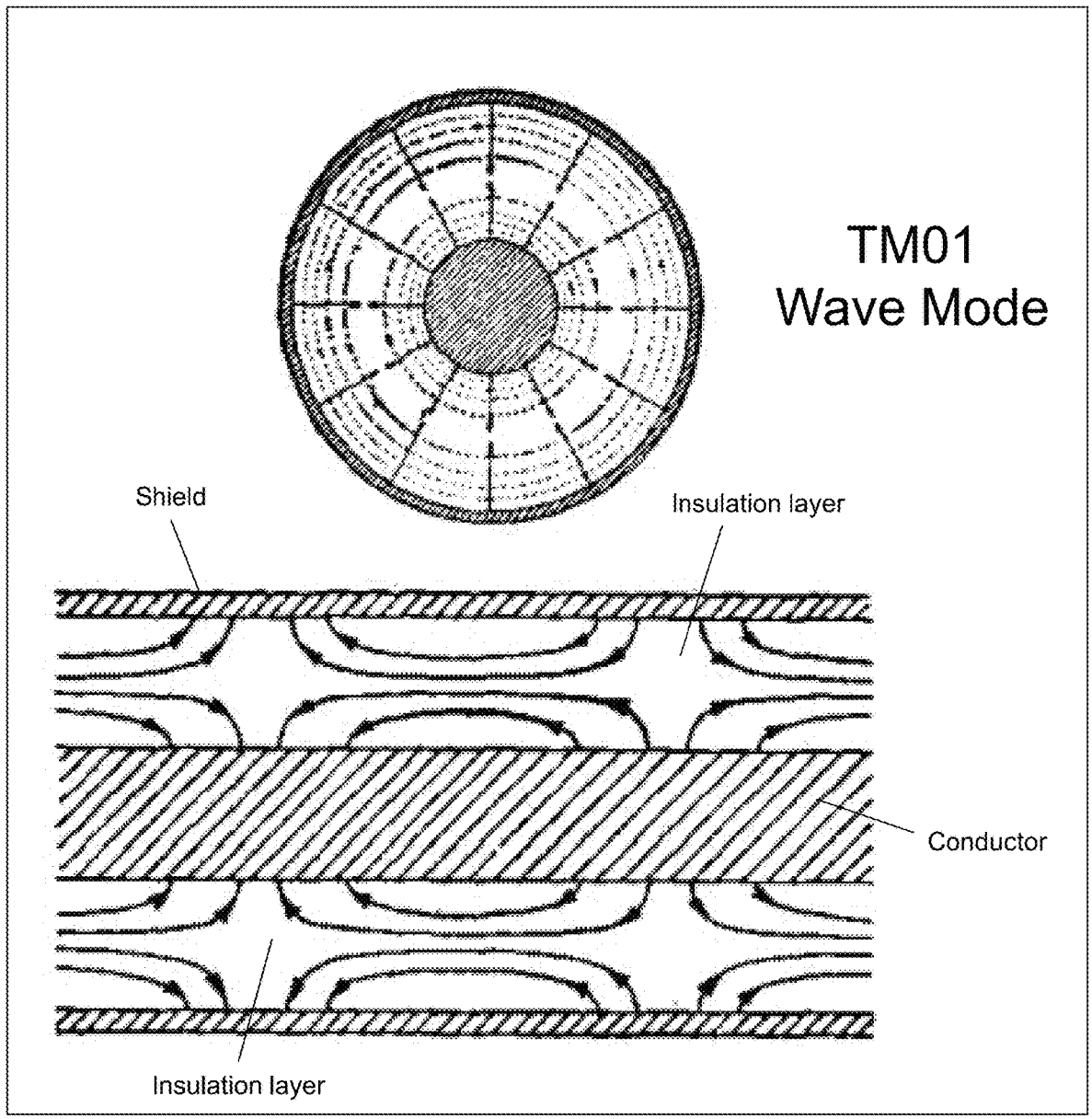
FIGS. 25B, 25C, and 25D are block diagrams illustrating example, non-limiting embodiments of wave modes and electric field plots in accordance with various aspects described herein.
Figure 25C:
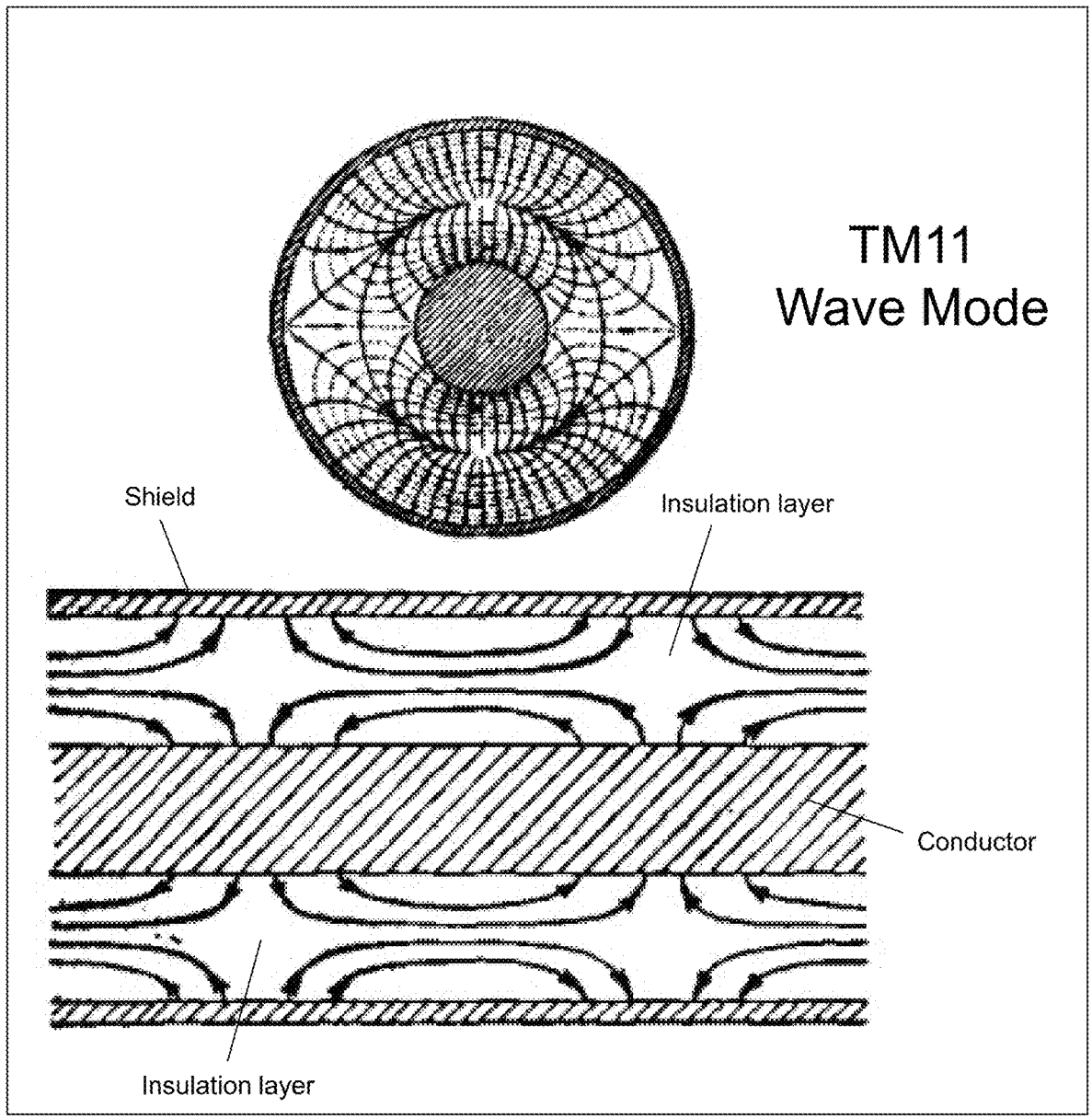
Figure 25D:
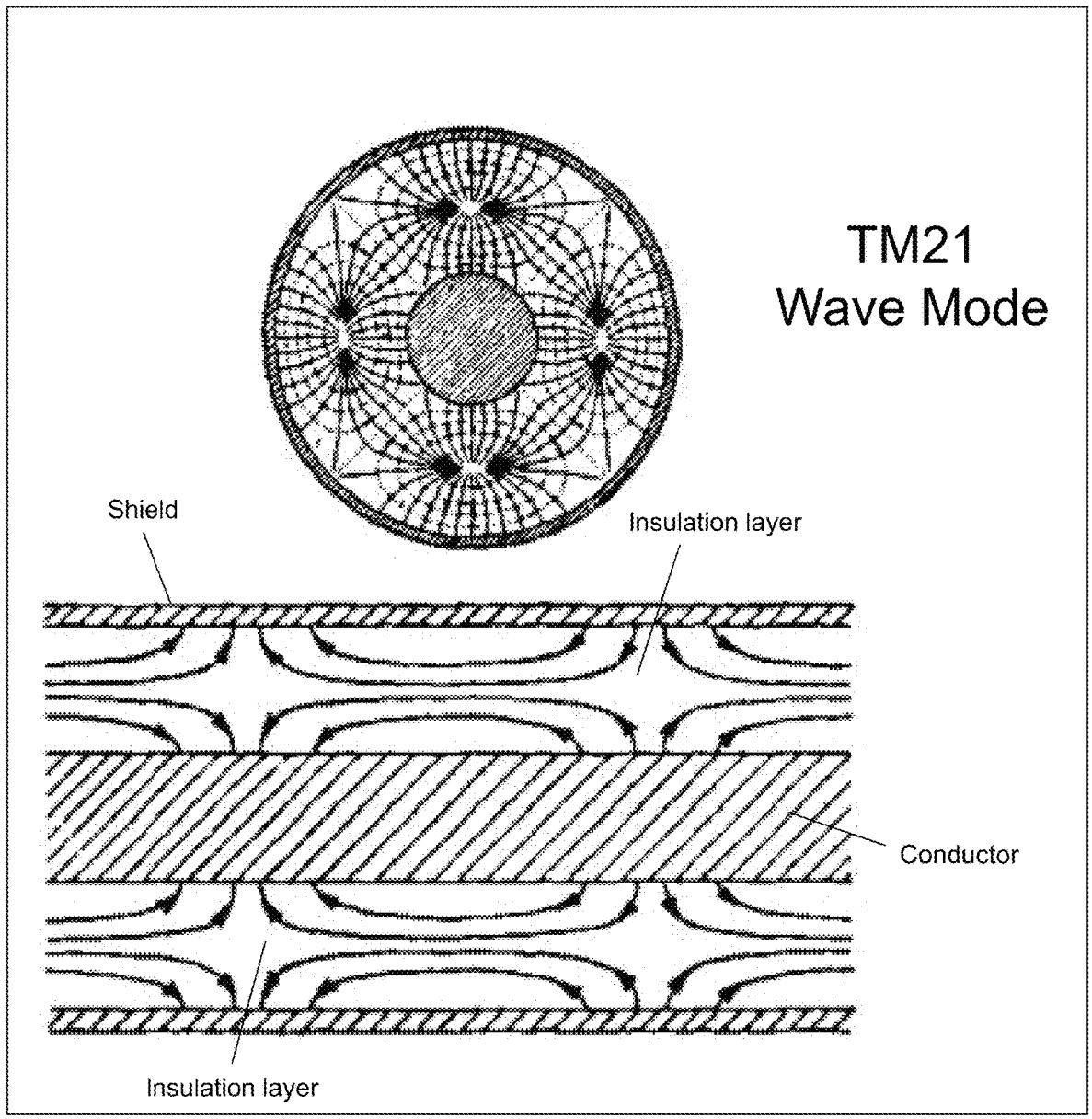

With this in mind, attention is now directed to FIGS. 25B, 25C, 25D, which illustrate diagrams of example, non-limiting embodiments of wave modes and electric field plots in accordance with various aspects described herein. FIG. 25B illustrates the electric fields of a TM01 wave mode. The electric fields are illustrated in a transverse cross-sectional view (top) and a longitudinal cross-sectional view (below) of a coaxial cable having a center conductor with an external conductive shield separated by insulation. FIG. 25C illustrates the electric fields of a TM11 wave mode. The electric fields are also illustrated in a transverse cross-sectional view and a longitudinal cross-sectional view of a coaxial cable having a center conductor with an external conductive shield separated by an insulation. FIG. 25D further illustrates the electric fields of a TM21 wave mode. The electric fields are illustrated in a transverse cross-sectional view and a longitudinal cross-sectional view of a coaxial cable having a center conductor with an external conductive shield separated by an insulation.

As shown in the transverse cross-sectional view, the TM01 wave mode has circularly symmetric electric fields (i.e., electric fields that have the same orientation and intensity at different azimuthal angles), while the transverse cross-sectional views of the TM11 and TM21 wave modes shown in FIGS. 25C-25D, respectively, have non-circularly symmetric electric fields (i.e., electric fields that have different orientations and intensities at different azimuthal angles). Although the transverse cross-sectional views of the TM11 and TM21 wave modes have non-circularly symmetric electric fields, the electric fields in the longitudinal cross-sectional views of the TM01, TM11 and TM21 wave modes are substantially similar with the exception that that the electric field structure of the TM11 wave mode has longitudinal electric fields above the conductor and below the conductor that point in opposite longitudinal directions, while the longitudinal electric fields above the conductor and below the conductor for the TM01 and TM21 wave modes point in the same longitudinal direction.

The longitudinal cross-sectional views of the coaxial cable of FIGS. 25B, 25C and 25D can be said to have a similar structural arrangement to the longitudinal cross-section of the waveguide device 2522 in region 2506' shown in FIG. 25A. Specifically, in FIGS. 25B, 25C and 25D the coaxial cable has a center conductor and a shield separated by insulation, while region 2506' of the waveguide device 2522 has a center conductor 2543, a dielectric layer 2544, covered by the dielectric material 2544' of the chamber 2525, and shielded by the reflective inner surface 2523 of the waveguide device 2522. The coaxial configuration in region 2506' of the waveguide device 2522 continues in the tapered region 2506" of the waveguide device 2522. Similarly, the coaxial configuration continues in regions 2508 and 2510 of the waveguide device 2522 with the exception that no dielectric material 2544' is present in these regions other than the dielectric layer 2544 of the transmission medium 2542. At the outer region 2512, the transmission medium 2542 is exposed to the environment (e.g., air) and thus the coaxial configuration is no longer present.

As noted earlier, the electric field structure of a TM01 wave mode is circularly symmetric in a transverse cross-sectional view of the coaxial cable shown in FIG. 25B. For illustration purposes, it will be assumed that the waveguide device 2522 of FIG. 25A has 4 MMICs located in northern, southern, western and eastern locations as depicted in FIG. 18K. In this configuration, and with an understanding of the longitudinal and transverse electric field structures of the TM01 wave mode shown in FIG. 25B, the 4 MMICs 2524' of the waveguide device 2522 in FIG. 25A can be configured to launch from a common signal source a TM01 wave mode on the transmission medium 2542. This can be accomplished by configuring the north, south, east and west MMICs 2524' to launch wireless signals with the same phase (polarity). The wireless signals generated by the 4 MMICs 2524' combine via superposition of their respective electric fields in the dielectric material 2544' of the chamber 2525 and the dielectric layer 2544 (since both dielectric materials have similar dielectric constants) to form a TM01 electromagnetic wave 2502' bound to these dielectric materials with the electric field structure shown in longitudinal and transverse views of FIG. 25B.

The electromagnetic wave 2502' having the TM01 wave mode in turn propagates toward the tapered structure 2522B of the waveguide device 2522 and thereby becomes an electromagnetic wave 2504' embedded within the dielectric layer 2544 of the transmission medium 2542' in region 2508. In the tapered horn section 2522D the electromagnetic wave 2504' having the TM01 wave mode expands in region 2510 and eventually exits the waveguide device 2522 without change to the TM01 wave mode.

In another embodiment, the waveguide device 2522 can be configured to launch a TM11 wave mode having a vertical polarity in region 2506'. This can be accomplished by configuring the MMIC 2524' in the northern position to radiate from a signal source a first wireless signal having a phase (polarity) opposite to the phase (polarity) of a second wireless signal radiated from the same signal source by the southern MMIC 2524'. These wireless signals combine via superposition of their respective electric fields to form an electromagnetic wave having a TM11 wave mode (vertically polarized) bound to the dielectric materials 2544' and 2544 with the electric field structures shown in the longitudinal and transverse cross-sectional views shown in FIG. 25C. Similarly, the waveguide device 2522 can be configured to launch a TM11 wave mode having a horizontal polarity in region 2506'. This can be accomplished by configuring the MMIC 2524' in the eastern position to radiate a first wireless signal having a phase (polarity) opposite to the phase (polarity) of a second wireless signal radiated by the western MMIC 2524'.

These wireless signals combine via superposition of their respective electric fields to form an electromagnetic wave having a TM11 wave mode (horizontally polarized) bound to the dielectric materials 2544' and 2544 with the electric field structures shown in the longitudinal and transverse cross-sectional views shown in FIG. 25C (but with a horizontal polarization). Since the TM11 wave mode with horizontal and vertical polarizations are orthogonal (i.e., a dot product of corresponding electric field vectors between any pair of these wave modes at each point of space and time produces a summation of zero), the waveguide device 2522 can be configured to launch these wave modes simultaneously without interference, thereby enabling wave mode division multiplexing. It is further noted that the TM01 wave mode is also orthogonal to the TM11 and TM21 wave modes.

While the electromagnetic wave 2502' or 2504' having the TM11 wave mode propagates within the confines of the inner surfaces 2523 of the waveguide device 2522 in regions 2506', 2506", 2508 and 2510, the TM11 wave mode remains unaltered. However, when the electromagnetic wave 2504' having the TM11 wave mode exits the waveguide device 2522 in region 2512 the inner wall 2523 is no longer present and the TM11 wave mode becomes a hybrid wave mode, specifically, an EH11 wave mode (vertically polarized, horizontally polarized, or both if two electromagnetic waves are launched in region 2506').

In yet other embodiments, the waveguide device 2522 can also be configured to launch a TM21 wave mode in region 2506'. This can be accomplished by configuring the MMIC 2524' in the northern position to radiate from a signal source a first wireless signal having a phase (polarity) that is in phase (polarity) to a second wireless signal generated from the same signal source by the southern MMIC 2524'. At the same time, the MMIC 2524' in the western position is configured to radiate from the same signal source a third wireless signal that is in phase with a fourth wireless signal radiated from the same signal source by the MMIC 2524' located in the eastern position. The north and south MMICs 2524', however, generate first and second wireless signals of opposite polarity to the polarity of the third and fourth wireless signals generated by the western and eastern MMICs 2524'. The four wireless signals of alternating polarity combine via superposition of their respective electric fields to form an electromagnetic wave having a TM21 wave mode bound to the dielectric materials 2544' and 2544 with the electric field structures shown in the longitudinal and transverse cross-sectional views shown in FIG. 25D. When the electromagnetic wave 2504' exits the waveguide device 2522 it may be transformed to a hybrid wave mode such as, for example, an HE21 wave mode, an EH21 wave mode, or a hybrid wave mode with a different radial mode (e.g., HE2m or EH2m, where m>1).

FIGS. 25A-25D illustrate several embodiments for launching TM01, EH11, and other hybrid wave modes utilizing the waveguide device 2522 of FIG. 25A. With an understanding of the electric field structures of other wave modes that propagate on a coaxial cable (e.g., TM12, TM22, and so on), the MMICs 2524' can be further configured in other ways to launch other wave modes (e.g., EH12, HE22, etc.) that have a low intensity z-field component and phi-field component in the electric field structures near the outer surface of a transmission medium 2542, which is useful for mitigating propagation losses due to a substance such as water, droplets or other substances that can cause an attenuation of the electric fields of an electromagnetic wave propagating along the outer surface of the transmission medium 2542.

Figure 26:
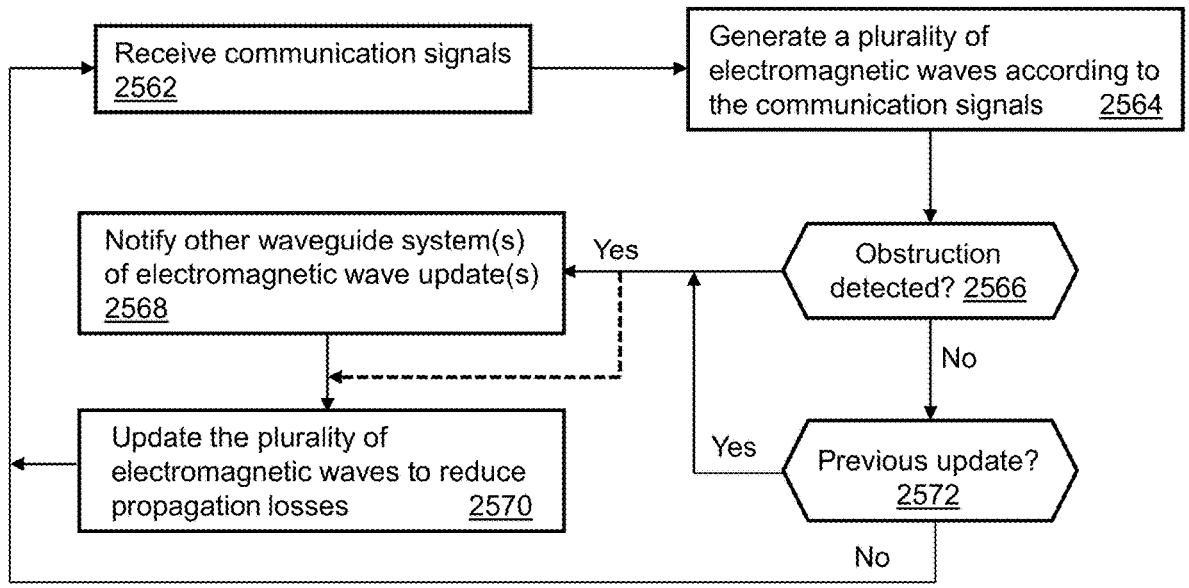
FIG. 26 illustrates a flow diagram of an example, non-limiting embodiment of a method for managing electromagnetic waves.
Figure 26:
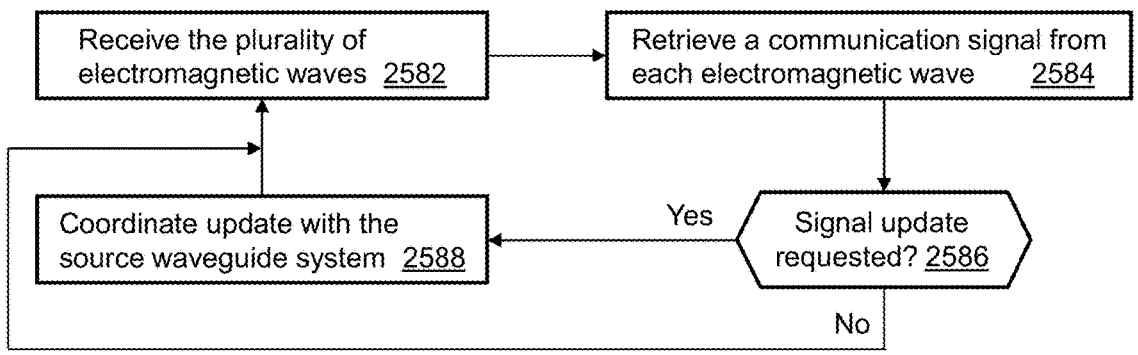
Figure 27:
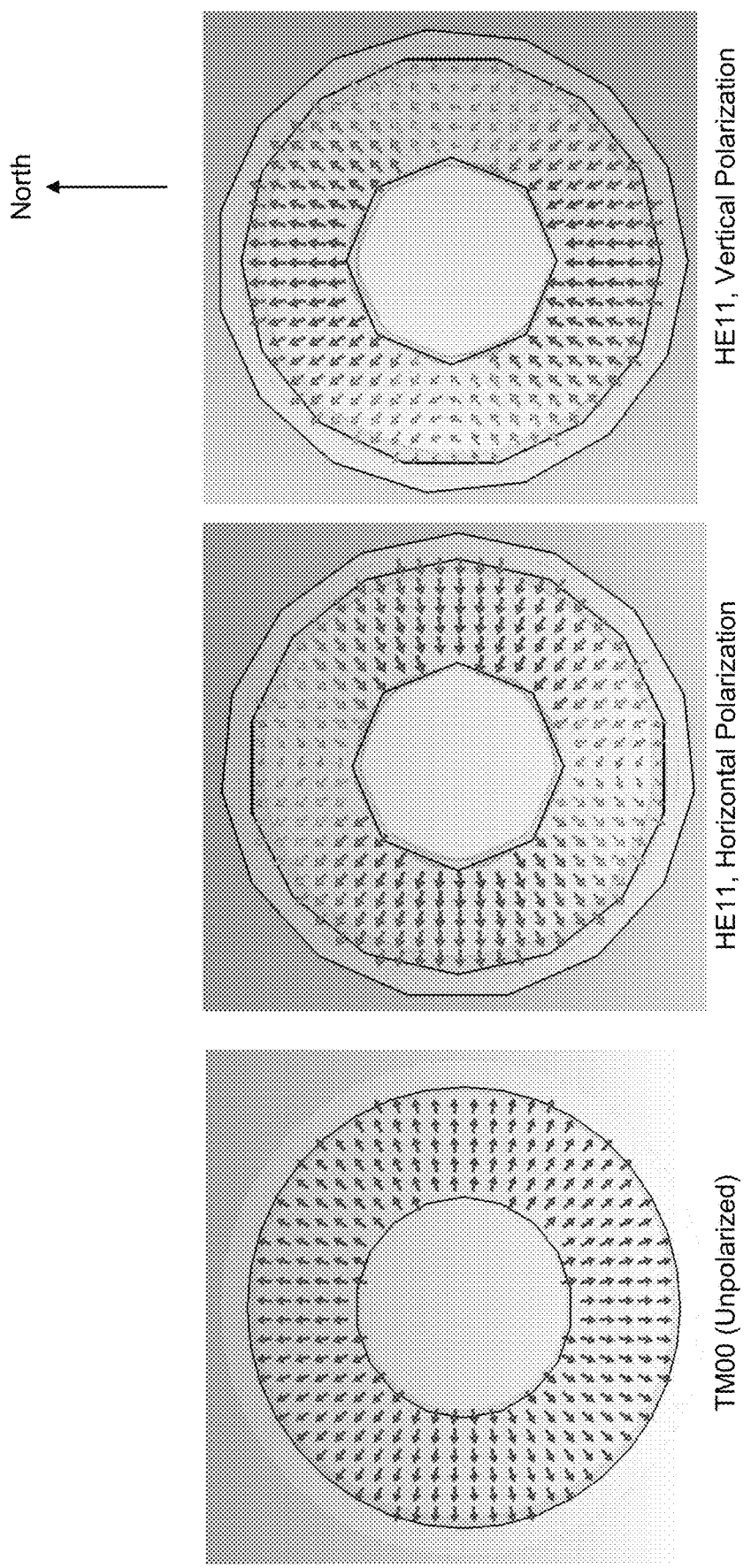
FIG. 27 is a block diagram illustrating an example, non-limiting embodiment of substantially orthogonal wave modes in accordance with various aspects described herein.

FIG. 26 illustrates a flow diagram of an example, non-limiting embodiment of a method 2560 for sending and receiving electromagnetic waves. Method 2560 can be applied to waveguides 2522 of FIGS. 23A-23C, 24 and 25A and/or other waveguide systems or launchers described and shown in the figures of the subject disclosure (e.g., FIGS. 7-14, 18D-18K, 22A-22B and other drawings) for purposes of launching or receiving substantially orthogonal wave modes such as those shown in FIG. 27. FIG. 27 depicts three cross-sectional views of an insulated conductor where a TM00 fundamental wave mode, an HE11 wave mode with horizontal polarization, and an HE11 wave mode with vertical polarization, propagates respectively. The electric field structure shown in FIG. 27 can vary over time and is therefore an illustrative representation at a certain instance or snapshot in time. The wave modes shown in FIG. 27 are orthogonal to each other. That is, a dot product of corresponding electric field vectors between any pair of the wave modes at each point of space and time produces a summation of zero. This property enables the TM00 wave mode, the HE11 wave mode with horizontal polarization, and the HE11 wave mode with vertical polarization to propagate simultaneously along a surface of the same transmission medium in the same frequency band without signal interference.

Figure 28:
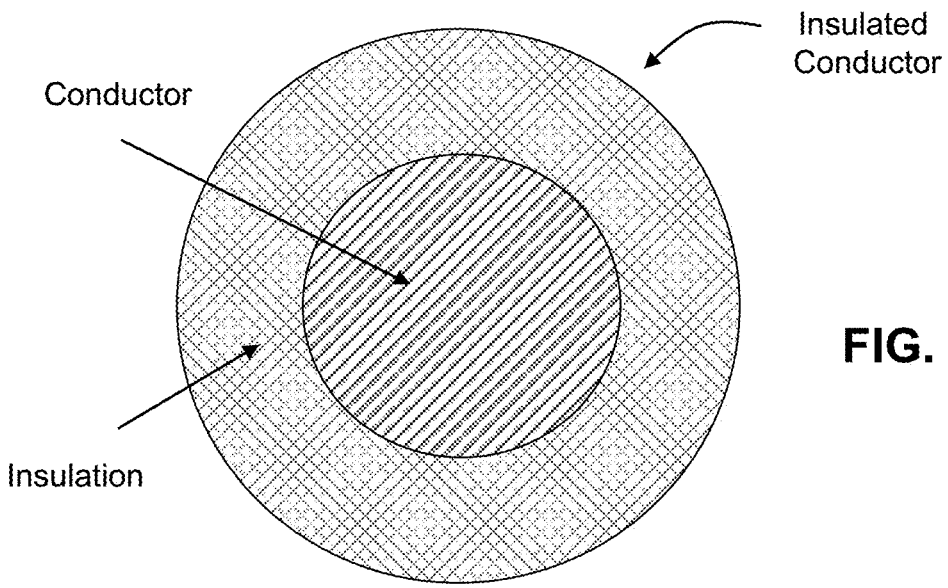
FIG. 28 is a block diagram illustrating an example, non-limiting embodiment of an insulated conductor in accordance with various aspects described herein.
Figure 29:
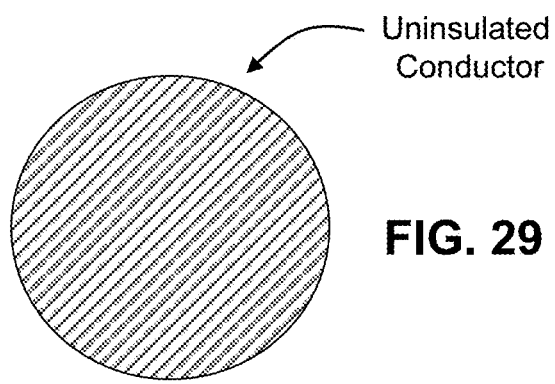
FIG. 29 is a block diagram illustrating an example, non-limiting embodiment of an uninsulated conductor in accordance with various aspects described herein.
Figure 30:
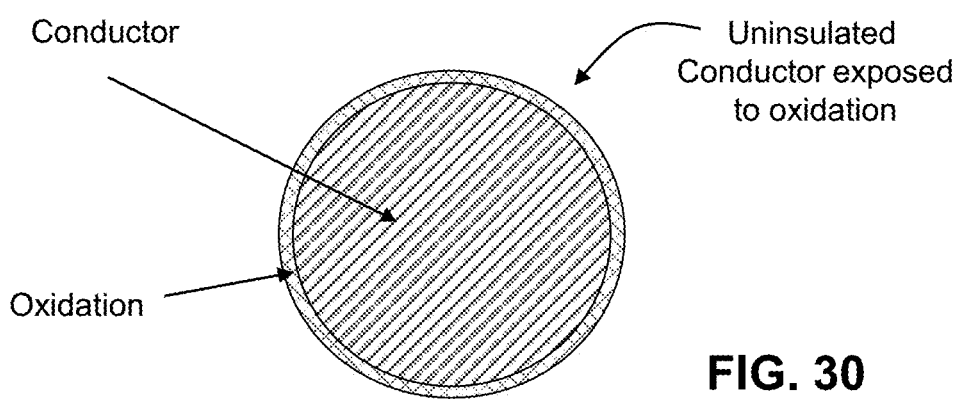
FIG. 30 is a block diagram illustrating an example, non-limiting embodiment of an oxide layer formed on the uninsulated conductor of FIG. 25A in accordance with various aspects described herein.

With this in mind, method 2560 can begin at step 2562 where a waveguide system of the subject disclosure can be adapted to receive communication signals from a source (e.g., a base station, a wireless signal transmitted by a mobile or stationary device to an antenna of the waveguide system as described in the subject disclosure, or by way of another communication source.). The communication signals can be, for example, communication signals modulated according to a specific signaling protocol (e.g., LTE, 5G, DOCSIS, DSL, etc.) operating in a native frequency band (e.g., 900 MHz, 1.9 GHz, 2.4 GHz, 5 GHz, etc.), baseband signals, analog signals, other signals, or any combinations thereof. At step 2564, the waveguide system can be adapted to generate or launch on a transmission medium a plurality of electromagnetic waves according to the communication signals by up-converting (or in some instances down-converting) such communication signals to one or more operating frequencies of the plurality of electromagnetic waves. The transmission medium can be an insulated conductor as shown in FIG. 28, or an uninsulated conductor that is subject to environmental exposure to oxidation (or other chemical reaction based on environmental exposure) as shown in FIGS. 29 and 30. In other embodiments, the transmission medium can be a dielectric material such as a dielectric core described in FIG. 18A.

To avoid interference, the waveguide system can be adapted to simultaneously launch at step 2564 a first electromagnetic wave using a TM00 wave mode, a second electromagnetic wave using an HE11 wave mode with horizontal polarization, and a third electromagnetic wave using an HE11 wave mode with vertical polarization—see FIG. 27. Since the first, second and third electromagnetic waves are orthogonal (i.e., non-interfering) they can be launched in the same frequency band without interference or with a small amount of acceptable interference. The combined transmission of three orthogonal electromagnetic wave modes in the same frequency band constitutes a form of wave mode division multiplexing, which provides a means for increasing the information bandwidth by a factor of three. By combining the principles of frequency division multiplexing with wave mode division multiplexing, bandwidth can be further increased by configuring the waveguide system to launch a fourth electromagnetic wave using a TM00 wave mode, a fifth electromagnetic wave using an HE11 wave mode with horizontal polarization, and a sixth electromagnetic wave using an HE11 wave mode with vertical polarization in a second frequency band that does not overlap with the first frequency band of the first, second and third orthogonal electromagnetic waves. It will be appreciated that other types of multiplexing could be additionally or alternatively used with wave mode division multiplexing without departing from example embodiments.

To illustrate this point, suppose each of three orthogonal electromagnetic waves in a first frequency band supports 1 GHz of transmission bandwidth. And further suppose each of three orthogonal electromagnetic waves in a second frequency band also supports 1 GHz of transmission bandwidth. With three wave modes operating in two frequency bands, 6 GHz of information bandwidth is possible for conveying communication signals by way of electromagnetic surface waves utilizing these wave modes. With more frequency bands, the bandwidth can be increased further.

Now suppose a transmission medium in the form of an insulated conductor (see FIG. 28) is used for surface wave transmissions. Further suppose the transmission medium has a dielectric layer with thickness proportional to the conductor radius (e.g., a conductor having a 4 mm radius and an insulation layer with a 4 mm thickness). With this type of transmission medium, the waveguide system can be configured to select from several options for transmitting electromagnetic waves. For example, the waveguide system can be configured at step 2564 to transmit first through third electromagnetic waves using wave mode division multiplexing at a first frequency band (e.g., at 1 GHz), third through fourth electromagnetic waves using wave mode division multiplexing at a second frequency band (e.g., at 2.1 GHz), seventh through ninth electromagnetic waves using wave mode division multiplexing at a third frequency band (e.g., at 3.2 GHz), and so on. Assuming each electromagnetic wave supports 1 GHz of bandwidth, collectively the first through ninth electromagnetic waves can support 9 GHz of bandwidth.

Alternatively, or contemporaneous with transmitting electromagnetic waves with orthogonal wave modes at step 2564, the waveguide system can be configured at step 2564 to transmit on the insulated conductor one or more high frequency electromagnetic waves (e.g., millimeter waves). In one embodiment, the one or more high frequency electromagnetic waves can be configured in non-overlapping frequencies bands according to one or more corresponding wave modes that are less susceptible to a water film such as a TM0m wave mode and EH1m wave mode (where m>0), or an HE2m wave mode (where m>1) as previously described. In other embodiments, the waveguide system can instead be configured to transmit one or more high frequency electromagnetic waves in non-overlapping frequency bands according to one or more corresponding wave modes that have longitudinal and/or azimuthal fields near the surface of the transmission medium that may be susceptible to water, but nonetheless exhibit low propagation losses when the transmission medium is dry. A waveguide system can thus be configured to transmit several combinations of wave modes on an insulated conductor (as well as a dielectric-only transmission medium such as a dielectric core) when the insulated conductor is dry.

Now suppose a transmission medium in the form of an uninsulated conductor (see FIGS. 29-30) is used for surface wave transmissions. Further consider that the uninsulated conductor or bare conductor is exposed to an environment subject to various levels of moisture and/or rain (as well as air and atmospheric gases like oxygen). Uninsulated conductors, such as overhead power lines and other uninsulated wires, are often made of aluminum which is sometimes reinforced with steel. Aluminum can react spontaneously with water and/or air to form aluminum oxide. An aluminum oxide layer can be thin (e.g., nano to micrometers in thickness). An aluminum oxide layer has dielectric properties and can therefore serve as a dielectric layer. Accordingly, uninsulated conductors can propagate not only TM00 wave modes, but also other wave modes such as an HE11 wave mode with horizontal polarization, and an HE11 wave mode with vertical polarization at high frequencies based at least in part on the thickness of the oxide layer. Accordingly, uninsulated conductors having an environmentally formed dielectric layer such as an oxide layer can be used for transmitting electromagnetic waves using wave mode division multiplexing and frequency division multiplexing. Other electromagnetic waves having a wave mode (with or without a cutoff frequency) that can propagate on an oxide layer are contemplated by the subject disclosure and can be applied to the embodiments described in the subject disclosure.

In one embodiment, the term "environmentally formed dielectric layer" can represent an uninsulated conductor that is exposed to an environment that is not artificially created in a laboratory or other controlled setting (e.g., bare conductor exposed to air, humidity, rain, etc. on a utility pole or other exposed environment). In other embodiments, an environmentally formed dielectric layer can be formed in a controlled setting such as a manufacturing facility that exposes uninsulated conductors to a controlled environment (e.g., controlled humidity, or other gaseous substance) that forms a dielectric layer on the outer surface of the uninsulated conductor. In yet another alternative embodiment, the uninsulated conductor can also be "doped" with particular substances/compounds (e.g., a reactant) that facilitate chemical reactions with other substances/compounds that are either available in a natural environment or in an artificially created laboratory or controlled setting, thereby resulting in the creation of the environmentally formed dielectric layer.

Wave mode division multiplexing and frequency division multiplexing can prove useful in mitigating obstructions such as water accumulating on an outer surface of a transmission medium. To determine if mitigating an obstruction is necessary, a waveguide system can be configured at step 2566 to determine if an obstruction is present on the transmission medium. A film of water (or water droplets) collected on an outer surface of the transmission medium due to rain, condensation, and/or excess humidity can be one form of an obstruction that can cause propagation losses in electromagnetic waves if not mitigated. A splicing of a transmission medium or other object coupled to the outer surface of the transmission medium can also serve as an obstruction.

Obstructions can be detected by a source waveguide system that transmits electromagnetic waves on a transmission medium and measures reflected electromagnetic waves based on these transmissions. Alternatively, or in combination, the source waveguide system can detect obstructions by receiving communication signals (wireless or electromagnetic waves) from a recipient waveguide system that receives and performs quality metrics on electromagnetic waves transmitted by the source waveguide system.

When an obstruction is detected at step 2566, the waveguide system can be configured to identify options to update, modify, or otherwise change the electromagnetic waves being transmitted.

Suppose, for example, that in the case of an insulated conductor, the waveguide system had launched at step 2564 a high order wave mode such as TM01 wave mode with a frequency band that starts at 30 GHz having a large bandwidth (e.g., 10 GHz) when the insulated conductor is dry. For illustration purposes, a 10 GHz bandwidth will be assumed for an electromagnetic wave having a TM01 wave mode.

Although it was noted earlier in the subject disclosure that a TM01 wave mode has a desirable electric field alignment that is not longitudinal and not azimuthal near the outer surface, it can nonetheless be subject to some signal attenuation which in turn reduces its operating bandwidth when a water film (or droplets) accumulates on the insulated conductor. An electromagnetic wave having a TM01 wave mode with a bandwidth of approximately 10 GHz (30 to 40 GHz) on a dry insulated conductor can drop to a bandwidth of approximately 1 GHz (30 to 31 GHz) when the insulated conductor is wet. To mitigate the loss in bandwidth, the waveguide system can be configured to launch electromagnetic waves at much lower frequencies (e.g., less than 6 GHz) using wave mode division multiplexing and frequency division multiplexing.

For example, the waveguide system can be configured to transmit a first set of electromagnetic waves; specifically, a first electromagnetic wave having a TM00 wave mode, a second electromagnetic wave having an HE11 wave mode with horizontal polarization, and a third electromagnetic wave having an HE11 wave mode with vertical polarization, each electromagnetic wave having a center frequency at 1 GHz. Assuming a useable frequency band from 500 MHz to 1.5 GHz to convey communication signals, each electromagnetic wave can provide 1 GHz of bandwidth, and collectively 3 GHz of system bandwidth.

Suppose also the waveguide system is configured to transmit a second set of electromagnetic waves; specifically, a fourth electromagnetic wave having a TM00 wave mode, a fifth electromagnetic wave having an HE11 wave mode with horizontal polarization, and a sixth electromagnetic wave having an HE11 wave mode with vertical polarization, each electromagnetic wave having a center frequency at 2.1 GHz. Assuming a frequency band from 1.6 GHz to 2.6 GHz, with a guard band of 100 MHz between the first and second sets of electromagnetic waves, each electromagnetic wave can provide 1 GHz of bandwidth, and collectively 3 GHz of additional bandwidth, thereby now providing up to 6 GHz of system bandwidth.

Further suppose the waveguide system is also configured to transmit a third set of electromagnetic waves; specifically, a seventh electromagnetic wave having a TM00 wave mode, an eighth electromagnetic wave having an HE11 wave mode with horizontal polarization, and a ninth electromagnetic wave having an HE11 wave mode with vertical polarization, each electromagnetic wave having a center frequency at 3.2 GHz. Assuming a frequency band from 2.7 GHz to 3.7 GHz, with a guard band of 100 MHz between the second and third sets of electromagnetic waves, each electromagnetic wave can provide 1 GHz of bandwidth, and collectively 3 GHz of additional bandwidth, thereby now providing up to 9 GHz of system bandwidth.

Figure 31:
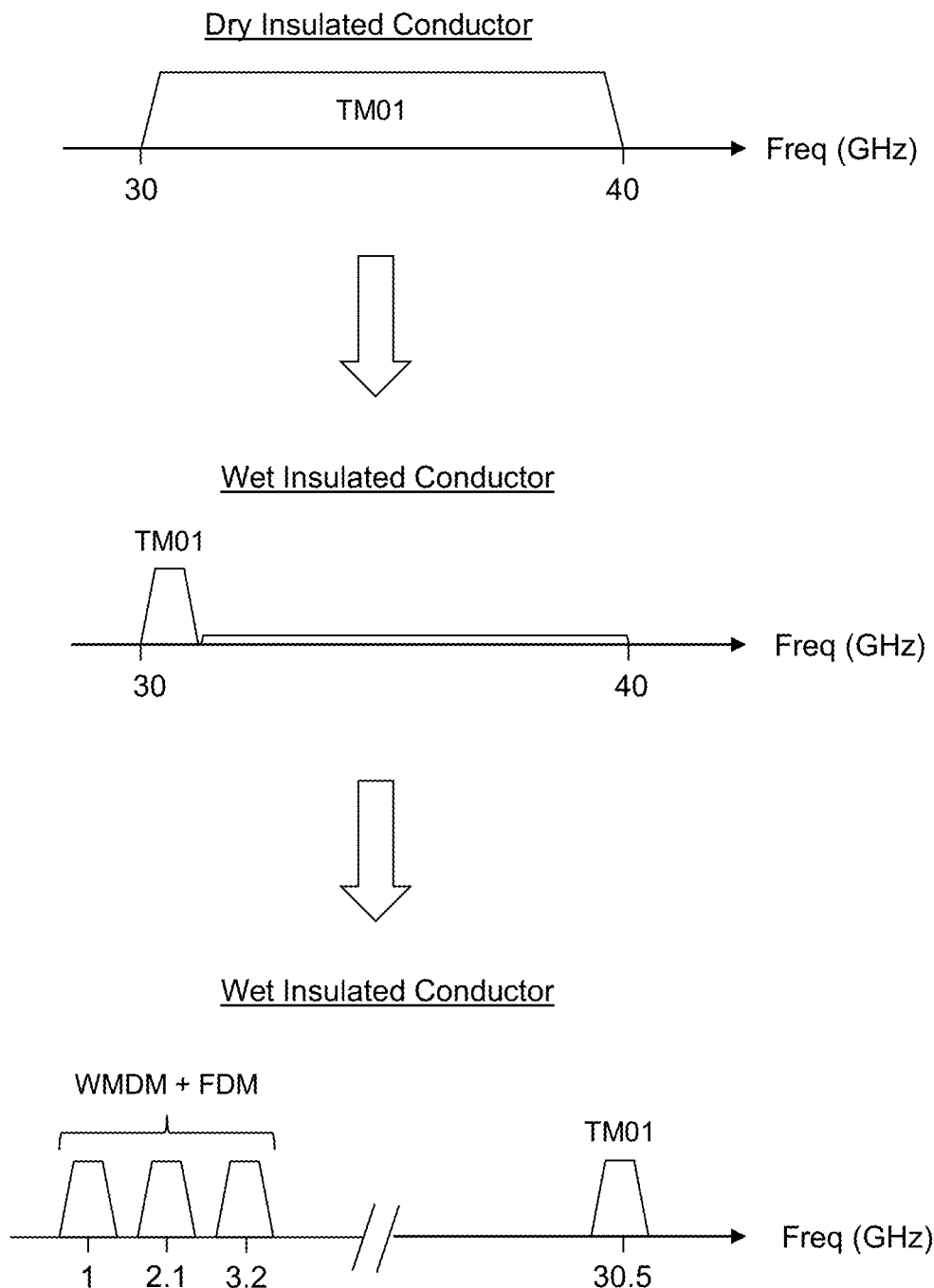
FIG. 31 is a block diagram illustrating example, non-limiting embodiments of spectral plots in accordance with various aspects described herein.

The combination of the TM01 wave mode, and the three sets of electromagnetic waves configured for wave mode division multiplexing and frequency division multiplexing, provide a total system bandwidth of 10 GHz, thereby restoring a bandwidth of 10 GHz previously available when the high frequency electromagnetic wave having the TM01 wave mode was propagating on a dry insulated conductor. FIG. 31 illustrates a process for performing mitigation of a TM01 wave mode subject to an obstruction such as a water film. FIG. 31 illustrates a transition from a dry insulated conductor that supports a high bandwidth TM01 wave mode to a wet insulated conductor that supports a lower bandwidth TM01 wave mode that is combined with low frequency TM00 and HE11 wave modes configured according to wave mode division multiplexing (WMDM) and frequency division multiplexing (FDM) schemes to restore losses in system bandwidth.

Consider now an uninsulated conductor where the waveguide system had launched at step 2564 a TM00 wave mode with a frequency band that starts at 10 GHz having a large bandwidth (e.g., 10 GHz). Suppose now that transmission medium propagating the 10 GHz TM00 wave mode is exposed to an obstruction such as water. As noted earlier, a high frequency TM00 wave mode on an insulated conductor is subject to a substantial amount of signal attenuation (e.g., 45 dB/M at 10 GHz) when a water film (or droplets) accumulates on the outer surface of the insulated conductor. Similar attenuations will be present for a 10 GHz (or greater) TM00 wave mode propagating on an "uninsulated" conductor. An environmentally exposed uninsulated conductor (e.g., aluminum), however, can have an oxide layer formed on the outer surface which can serve as a dielectric layer that supports wave modes other than TM00 (e.g., HE11 wave modes). It is further noted that at lower frequencies a TM00 wave mode propagating on an insulated conductor exhibits a much lower attenuation (e.g., 0.62 dB/M at 4 GHz). A TM00 wave mode operating at less than 6 GHz would similarly exhibit low propagation losses on an uninsulated conductor. Accordingly, to mitigate the loss in bandwidth, the waveguide system can be configured to launch electromagnetic waves having a TM00 wave mode at lower frequencies (e.g., 6 GHz or less) and electromagnetic waves having an HE11 wave mode configured for WMDM and FDM at higher frequencies.

Referring back to FIG. 26, suppose then that the waveguide system detects an obstruction such as water at step 2566 on an environmentally exposed uninsulated conductor. A waveguide system can be configured to mitigate the obstruction by transmitting a first electromagnetic wave configured with a TM00 wave mode having a center frequency at 2.75 GHz. Assuming a useable frequency band from 500 MHz to 5.5 GHz to convey communication signals, the electromagnetic waves can provide 5 GHz of system bandwidth.

Figure 32:
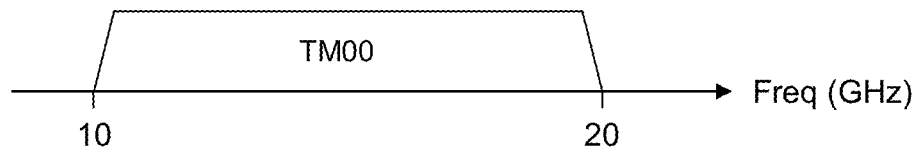
FIG. 32 is a block diagram illustrating example, non-limiting embodiments of spectral plots in accordance with various aspects described herein.
Figure 32:
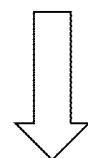
Figure 32:
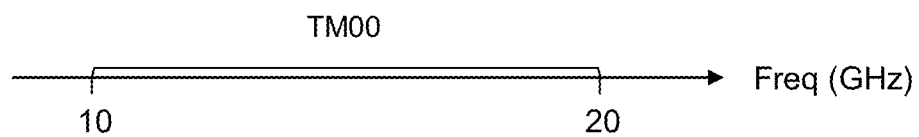
Figure 32:
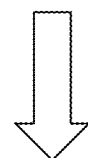
Figure 32:
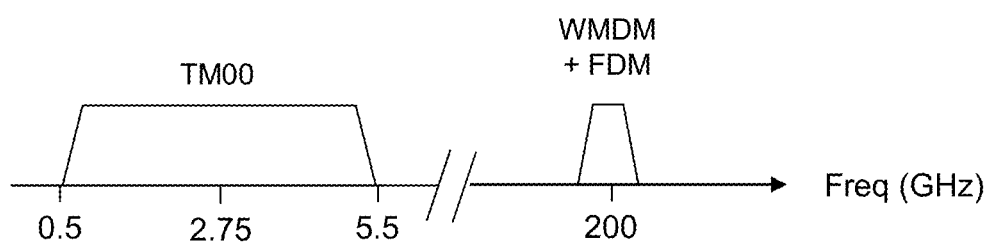

FIG. 32 illustrates a process for performing mitigation of a high frequency TM00 wave mode subject to an obstruction such as a water film detected at step 2566. FIG. 31 illustrates a transition from a dry uninsulated conductor that supports a high bandwidth TM00 wave mode to a wet uninsulated conductor that combines a low frequency TM00 wave mode and high frequency HE11 wave modes configured according to WMDM and FDM schemes to restore losses in system bandwidth.

It will be appreciated that the aforementioned mitigation techniques are non-limiting. For example, the center frequencies described above can differ between systems. Additionally, the original wave mode used before an obstruction is detected can differ from the illustrations above. For example, in the case of an insulated conductor an EH11 wave mode can be used singly or in combination with a TM01 wave mode. It is also appreciated that WMDM and FDM techniques can be used to transmit electromagnetic waves at all times and not just when an obstruction is detected at step 2566. It is further appreciated that other wave modes that can support WMDM and/or FDM techniques can be applied to and/or combined with the embodiments described in the subject disclosure, and are therefore contemplated by the subject disclosure.

Referring back to FIG. 26, once a mitigation scheme using WMDM and/or FDM has been determined in accordance with the above illustrations, the waveguide system can be configured at step 2568 to notify one or more other waveguide systems of the mitigation scheme intended to be used for updating one or more electromagnetic waves prior to executing the update at step 2570. The notification can be sent wirelessly to one or more other waveguide systems utilizing antennas if signal degradation in the electromagnetic waves is too severe. If signal attenuation is tolerable, then the notification can be sent via the affected electromagnetic waves. In other embodiments, the waveguide system can be configured to skip step 2568 and perform the mitigation scheme using WMDM and/or FDM at step 2570 without notification. This embodiment can be applied in cases where, for example, other recipient waveguide system(s) know beforehand what kind of mitigation scheme would be used, or the recipient waveguide system(s) are configured to use signal detection techniques to discover the mitigation scheme. Once the mitigation scheme using WMDM and/or FDM has been initiated at step 2570, the waveguide system can continue to process received communication signals at steps 2562 and 2564 as described earlier using the updated configuration of the electromagnetic waves.

At step 2566, the waveguide system can monitor if the obstruction is still present. This determination can be performed by sending test signals (e.g., electromagnetic surface waves in the original wave mode) to other waveguide system(s) and awaiting test results back from the waveguide systems if the situation has improved, and/or by using other obstruction detection techniques such as signal reflection testing based on the sent test signals. Once the obstruction is determined to have been removed (e.g., the transmission medium becomes dry), the waveguide system can proceed to step 2572 and determine that a signal update was performed at step 2568 using WMDM and/or FDM as a mitigation technique. The waveguide system can then be configured to notify recipient waveguide system(s) at step 2568 of the intent to restore transmissions to the original wave mode, or bypass this step and proceed to step 2570 where it restores transmissions to an original wave mode and assumes the recipient waveguide system(s) know the original wave modes and corresponding transmission parameters, or can otherwise detect this change.

A waveguide system can also be adapted to receive electromagnetic waves configured for WMDM and/or FDM. For example, suppose that an electromagnetic wave having a high bandwidth (e.g., 10 GHz) TM01 wave mode is propagating on an insulated conductor as shown in FIG. 31 and that the electromagnetic wave is generated by a source waveguide system. At step 2582, a recipient waveguide system can be configured to process the single electromagnetic wave with the TM01 wave mode under normal condition. Suppose, however, that the source waveguide system transitions to transmitting electromagnetic waves using WMDM and FDM along with a TM01 wave mode with a lower bandwidth on the insulated conductor, as previously described in FIG. 31. In this instance, the recipient waveguide system would have to process multiple electromagnetic waves of different wave modes. Specifically, the recipient waveguide system would be configured at step 2582 to selectively process each of the first through ninth electromagnetic waves using WMDM and FDM and the electromagnetic wave using the TM01 wave mode as shown in FIG. 31.

Once the one or more electromagnetic waves have been received at step 2582, the recipient waveguide can be configured to use signal processing techniques to obtain the communication signals that were conveyed by the electromagnetic wave(s) generated by the source waveguide system at step 2564 (and/or step 2570 if an update has occurred). At step 2586, the recipient waveguide system can also determine if the source waveguide system has updated the transmission scheme. The update can be detected from data provided in the electromagnetic waves transmitted by the source waveguide system, or from wireless signals transmitted by the source waveguide system. If there are no updates, the recipient waveguide system can continue to receive and process electromagnetic waves at steps 2582 and 2584 as described before. If, however, an update is detected at step 2586, the recipient waveguide system can proceed to step 2588 to coordinate the update with the source waveguide system and thereafter receive and process updated electromagnetic waves at steps 2582 and 2584 as described before.

It will be appreciated that method 2560 can be used in any communication scheme including simplex and duplex communications between waveguide systems. Accordingly, a source waveguide system that performs an update for transmitting electromagnetic waves according to other wave modes will in turn cause a recipient waveguide system to perform similar steps for return electromagnetic wave transmissions. It will also be appreciated that the aforementioned embodiments associated with method 2560 of FIG. 26 and the embodiments shown in FIGS. 27 through 32 can be combined in whole or in part with other embodiments of the subject disclosure for purposes of mitigating propagation losses caused by an obstruction at or in a vicinity of an outer surface of a transmission medium (e.g., insulated conductor, uninsulated conductor, or any transmission medium having an external dielectric layer). The obstruction can be a liquid (e.g., water), a solid object disposed on the outer surface of the transmission medium (e.g., ice, snow, a splice, a tree limb, etc.), or any other objects located at or near the outer surface of the transmission medium.

While for purposes of simplicity of explanation, the respective processes are shown and described as a series of blocks in FIG. 26, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

Figure 33:
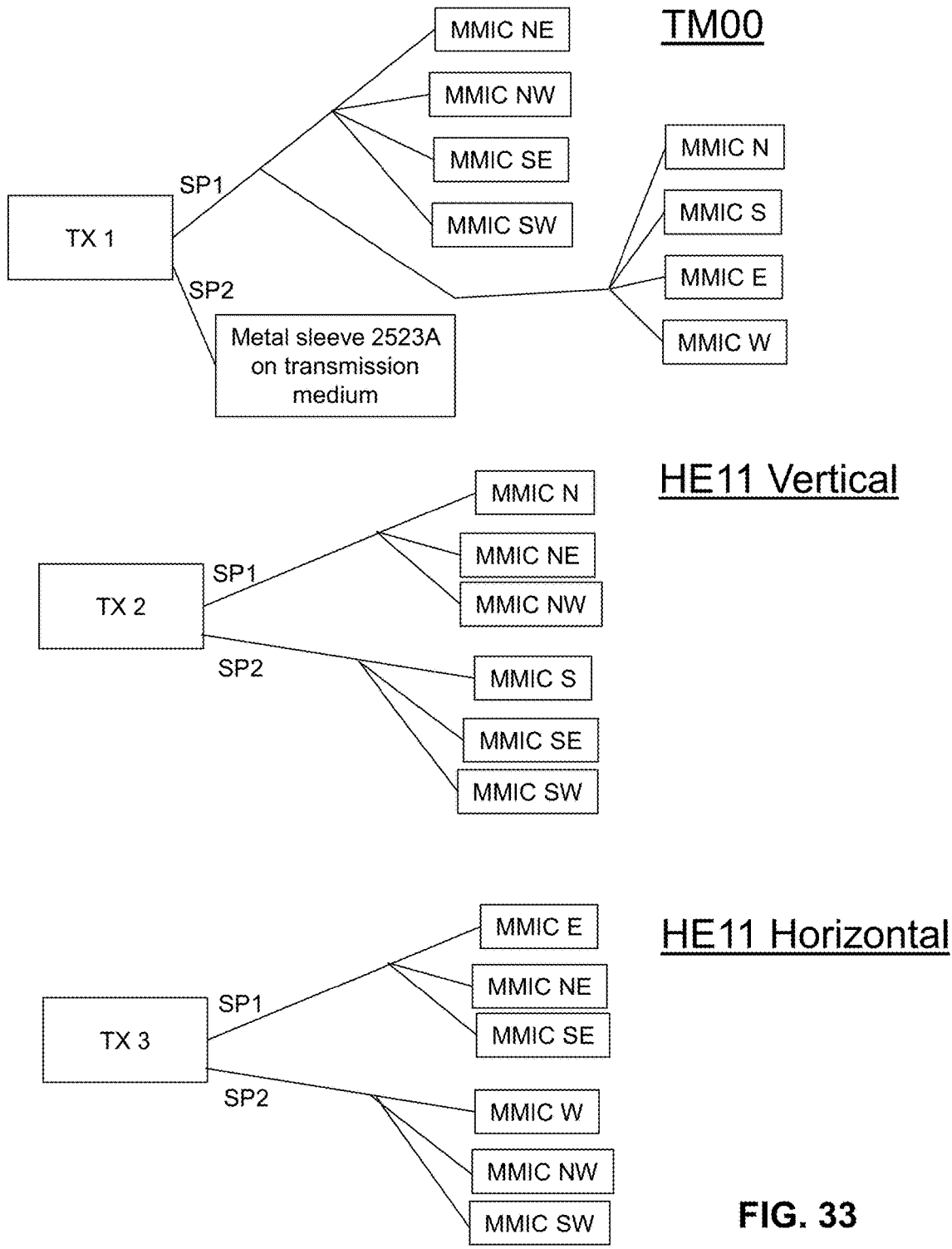
FIG. 33 is a block diagram illustrating example, non-limiting embodiments for transmitting orthogonal wave modes in accordance with various aspects described herein.
Figure 34:
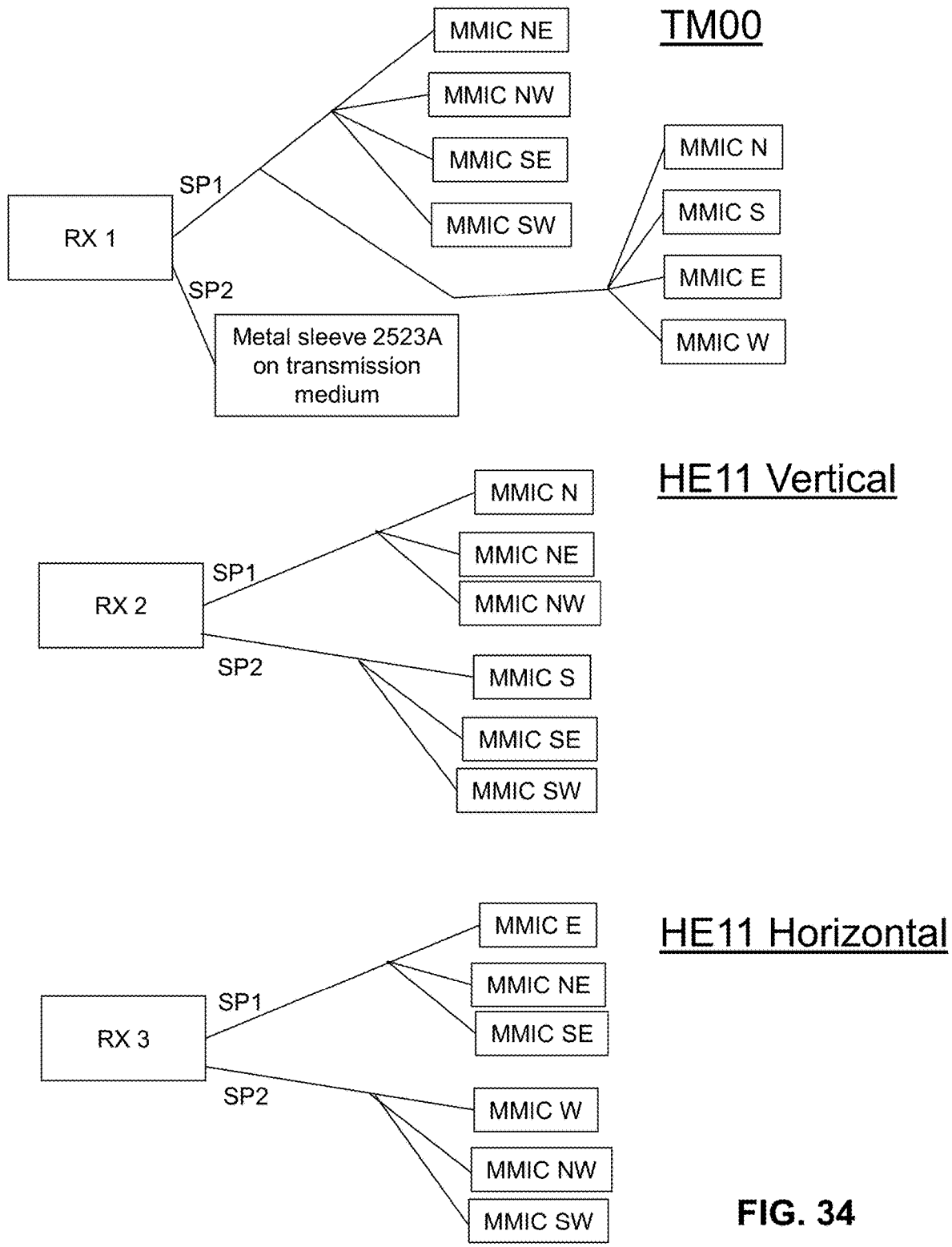
FIG. 34 is a block diagram illustrating example, non-limiting embodiments for transmitting orthogonal wave modes in accordance with various aspects described herein.

Referring now to FIGS. 33 and 34, block diagrams illustrating example, non-limiting embodiments for transmitting orthogonal wave modes according to the method 2560 of FIG. 26 are shown. FIG. 33 depicts an embodiment for simultaneously transmitting a TM00 wave mode, an HE11 wave mode with vertical polarization, and an HE11 wave mode with horizontal polarization as depicted in an instance in time in FIG. 27. In one embodiment, these orthogonal wave modes can be transmitted with a waveguide launcher having eight (8) MMICs as shown in FIG. 18K located at symmetrical locations (e.g., north, northeast, east, southeast, south, southwest, west, and northwest). The waveguide launcher of FIG. 18H (or FIG. 18J) can also be configured with these 8 MMICs. Additionally, the waveguide launcher can be configured with a cylindrical sleeve 2523A and tapered dielectric that wraps around the transmission medium (e.g., insulated conductor, uninsulated conductor, or other cable with a dielectric layer such as dielectric core). The housing assembly of the waveguide launcher (not shown) can be configured to include a mechanism (e.g., a hinge) to enable a longitudinal opening of the waveguide launcher for placement and latching around a circumference of a transmission medium.

With these configurations in mind, the waveguide launcher can include three transmitters (TX1, TX2, and TX3) coupled to MMICs having various coordinate positions (see FIG. 25AG and FIG. 18W). The interconnectivity between the transmitters (TX1, TX2, and TX3) and the MMICs can be implemented with a common printed circuit board or other suitable interconnecting technology. The first transmitter (TX1) can be configured to launch a TM00 wave mode, the second transmitter (TX2) can be configured to launch an HE11 vertical polarization wave mode, and the third transmitter (TX3) can be configured to launch an HE11 horizontal polarization wave mode.

A first signal port (shown as "SP1") of the first transmitter (TX1) can be coupled in parallel to each of the 8 MMICs. A second signal port (shown as "SP2") of the first transmitter (TX1) can be coupled to a conductive sleeve 2523A that is placed on the transmission medium by the waveguide launcher as noted above. The first transmitter (TX1) can be configured to receive a first group of the communication signals described in step 2562 of FIG. 26. The first group of communication signals can be frequency-shifted by the first transmitter (TX1) from their native frequencies (if necessary) for an orderly placement of the communication signals in channels of a first electromagnetic wave configured according to the TM00 wave mode. The 8 MMICs coupled to the first transmitter (TX1) can be configured to up-convert (or down-convert) the first group of the communication signals to the same center frequency (e.g., 1 GHz for the first electromagnetic wave as described in relation to FIG. 31). All 8 MMICs would have synchronized reference oscillators that can be phase locked using various synchronization techniques.

Since the 8 MMICs receive signals from the first signal port of the first transmitter (TX1) based on the reference provided by the second signal port, the 8 MMICs thereby receive signals with the same polarity. Consequently, once these signals have been up-converted (or down-converted) and processed for transmission by the 8 MMICs, one or more antennas of each of the 8 MMICs simultaneously radiates signals with electric fields of the same polarity. Collectively, MMICs that are opposite in location to each other (e.g., MMIC north and MMIC south) will have an electric field structure aligned towards or away from the transmission medium, thereby creating at a certain instance in time an outward field structure like the TM00 wave mode shown in FIG. 27. Due to the constant oscillatory nature of the signals radiated by the 8 MMICs, it will be appreciated that at other instances in time, the field structure shown in FIG. 27 will radiate inward. By symmetrically radiating electric fields with the same polarity the collection of opposing MMICs contribute to the inducement of a first electromagnetic wave having a TM00 wave mode that propagates on a transmission medium with a dielectric layer and can convey the first group of the communication signals to a receiving waveguide system.

Turning now to the second transmitter (TX2) in FIG. 33, this transmitter has a first signal port (SP1) coupled to MMICs located in north, northeast and northwest positions, while a second signal port (SP2) of the second transmitter (TX2) is coupled to the MMICs located in south, southeast and southwest positions (see FIG. 18K). The second transmitter (TX2) can be configured to receive a second group of the communication signals described in step 2562 of FIG. 26, which differs from the first group of the communication signals received by the first transmitter (TX1). The second group of communication signals can be frequency-shifted by the second transmitter (TX2) from their native frequencies (if necessary) for an orderly placement of the communication signals in channels of a second electromagnetic wave configured according to an HE11 wave mode with vertical polarization. The 6 MMICs coupled to the second transmitter (TX2) can be configured to up-convert (or down-conversion) the second group of the communication signals to the same center frequency as used for the TM00 wave mode (i.e., 1 GHz as described in relation to FIG. 31). Since a TM00 wave mode is orthogonal to an HE11 wave mode with vertical polarization, they can share the same center frequency in an overlapping frequency band without interference.

Referring back to FIG. 33, the first signal port (SP1) of the second transmitter (TX2) generates signals of opposite polarity to the signals of the second signal port (SP2). As a result, the electric field alignment of signals generated by one or more antennas of the northern MMIC will be of opposite polarity to the electric field alignment of signals generated by one or more antennas of the southern MMIC. Consequently, the electric fields of the north and south MMICs will have an electric field structure that is vertically aligned in the same direction, thereby creating at a certain instance in time a northern field structure like the HE11 wave mode with vertical polarization shown in FIG. 27. Due to the constant oscillatory nature of the signals radiated by the north and south MMICs, it will be appreciated that at other instances in time, the HE11 wave mode will have a southern field structure. Similarly, based on the opposite polarity of signals supplied to the northeast and southeast MMICs by the first and second signal ports, respectively, these MMICs will generate at a certain instance in time the curved electric field structure shown on the east side of the HE11 wave mode with vertical polarization depicted in FIG. 27. Also, based on the opposite polarity of signals supplied to the northwest and southwest MMICs, these MMICs will generate at a certain instance in time the curved electric field structure shown on the west side of the HE11 wave mode with vertical polarization depicted in FIG. 27.

By radiating electric fields with opposite polarity by opposing MMICs (north, northeast and northwest versus south, southeast and southwest), the collection of signals with a directionally aligned field structure contribute to the inducement of a second electromagnetic wave having the HE11 wave mode with vertical polarization shown in FIG. 27. The second electromagnetic wave propagates along the "same" transmission medium as previously described for the first transmitter (TX1). Given the orthogonality of a TM00 wave mode and an HE11 wave mode with vertical polarization, there will be ideally no interference between the first electromagnetic wave and the second electromagnetic wave. Consequently, the first and second electromagnetic waves having overlapping frequency bands propagating along the same transmission medium can successfully convey the first and second groups of the communication signals to the same (or other) receiving waveguide system.

Turning now to the third transmitter (TX3) in FIG. 33, this transmitter has a first signal port (SP1) coupled to MMICs located in east, northeast and southeast positions, while a second signal port (SP2) of the third transmitter (TX3) is coupled to the MMICs located in west, northwest and southwest positions (see FIG. 18K). The third transmitter (TX3) can be configured to receive a third group of the communication signals described in step 2562 of FIG. 26, which differs from the first and second groups of the communication signals received by the first transmitter (TX1) and the second transmitter (TX2), respectively. The third group of communication signals can be frequency-shifted by the third transmitter (TX3) from their native frequencies (if necessary) for an orderly placement of the communication signals in channels of a second electromagnetic wave configured according to an HE11 wave mode with horizontal polarization. The 6 MMICs coupled to the third transmitter (TX3) can be configured to up-convert (or down-conversion) the third group of the communication signals to the same center frequency as used for the TM00 wave mode and HE11 wave mode with vertical polarization (i.e., 1 GHz as described in relation to FIG. 31). Since a TM00 wave mode, an HE11 wave mode with vertical polarization, and an HE11 wave mode with horizontal polarization are orthogonal, they can share the same center frequency in an overlapping frequency band without interference.

Referring back to FIG. 33, the first signal port (SP1) of the third transmitter (TX3) generates signals of opposite polarity to the signals of the second signal port (SP2). As a result, the electric field alignment of signals generated by one or more antennas of the eastern MMIC will be of opposite polarity to the electric field alignment of signals generated by one or more antennas of the western MMIC. Consequently, the electric fields of the east and west MMICs will have an electric field structure that is horizontally aligned in the same direction, thereby creating at a certain instance in time a western field structure like the HE11 wave mode with horizontal polarization shown in FIG. 27. Due to the constant oscillatory nature of the signals radiated by the east and west MMICs, it will be appreciated that at other instances in time, the HE11 wave mode will have an eastern field structure. Similarly, based on the opposite polarity of signals supplied to the northeast and northwest MMICs by the first and second signal ports, respectively, these MMICs will generate at a certain instance in time the curved electric field structure shown on the north side of the HE11 wave mode with horizontal polarization depicted in FIG. 27. Also, based on the opposite polarity of signals supplied to the southeast and southwest MMICs, these MMICs will generate at a certain instance in time the curved electric field structure shown on the south side of the HE11 wave mode with horizontal polarization depicted in FIG. 27.

By radiating electric fields with opposite polarity by opposing MMICs (east, northeast and southeast versus west, northwest and southwest), the collection of signals with a directionally aligned field structure contribute to the inducement of a third electromagnetic wave having the HE11 wave mode with horizontal polarization shown in FIG. 27. The third electromagnetic wave propagates along the "same" transmission medium as previously described for the first transmitter (TX1) and the second transmitter (TX2). Given the orthogonality of a TM00 wave mode, an HE11 wave mode with vertical polarization, and an HE11 wave mode with horizontal polarization, there will be, ideally, no interference between the first electromagnetic wave, the second electromagnetic wave, and the third electromagnetic wave. Consequently, the first, second and third electromagnetic waves having overlapping frequency bands propagating along the same transmission medium can successfully convey the first, second and third groups of the communication signal to the same (or other) receiving waveguide system.

Because of the orthogonality of the electromagnetic waves described above, a recipient waveguide system can be configured to selectively retrieve the first electromagnetic wave having the TM00 wave mode, the second electromagnetic wave having the HE11 wave mode with vertical polarization, and the third electromagnetic wave having the HE11 wave mode with horizontal polarization. After processing each of these electromagnetic waves, the recipient waveguide system can be further configured to obtain the first, second and third group of the communication signals conveyed by these waves. FIG. 34 illustrates a block diagram for selectively receiving each of the first, second and third electromagnetic waves.

Figure 35:
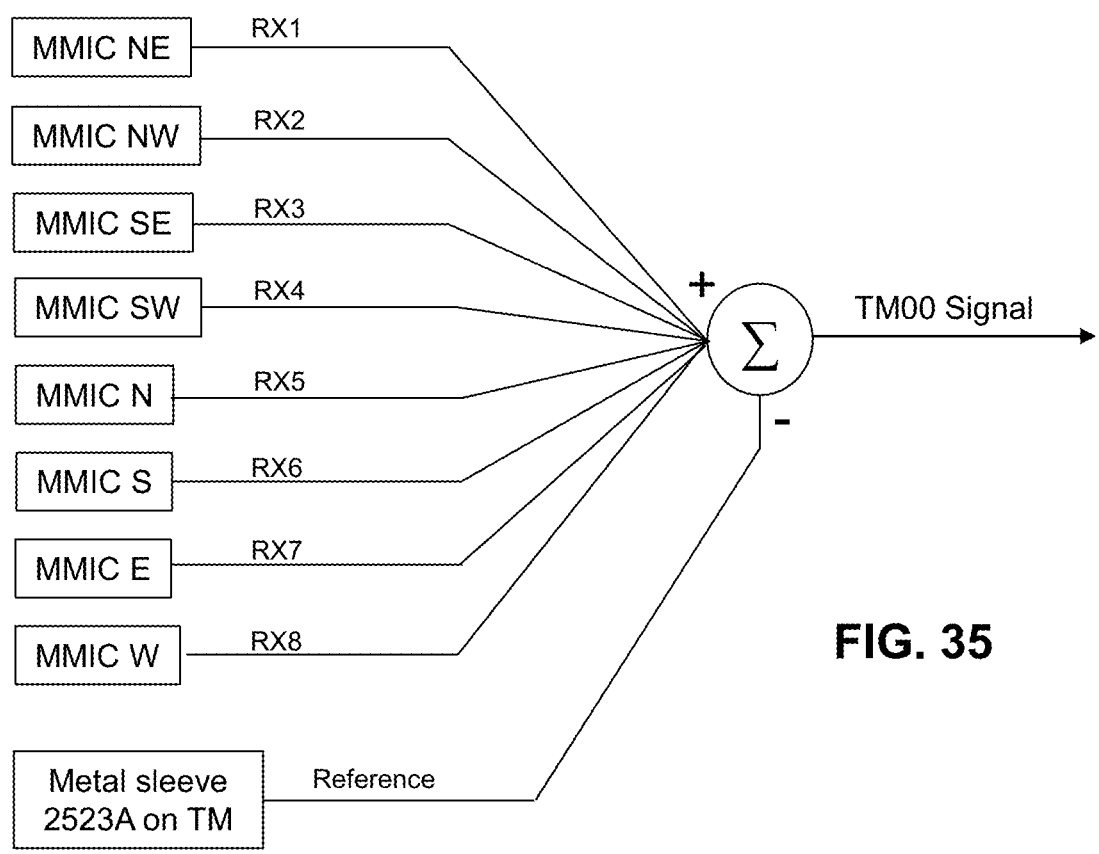
FIG. 35 is a block diagram illustrating example, non-limiting embodiments for selectively receiving a wave mode in accordance with various aspects described herein.

Specifically, the first electromagnetic wave having the TM00 wave mode can be selectively received by a first receiver (RX1) shown in FIG. 34 by taking the difference between the signals received by all 8 MMICs and the signal reference provided by the metal sleeve 2523A as depicted in the block diagram in FIG. 35. The second electromagnetic wave having the HE11 wave mode with vertical polarization can be selectively received by a second receiver (RX2) shown in FIG. 34 by taking the difference between the signals received by the MMICs located in north, northeast and northwest positions and the signals received by the MMICs located in south, southeast and southwest positions as depicted in the block diagram in FIG. 36. The third electromagnetic wave having the HE11 wave mode with horizontal polarization can be selectively received by a third receiver (RX3) shown in FIG. 34 by taking the difference between the signals received by the MMICs located in east, northeast and southeast positions and the signals received by the MMICs located in west, northwest and southwest positions as depicted in the block diagram in FIG. 37.

Figure 38:
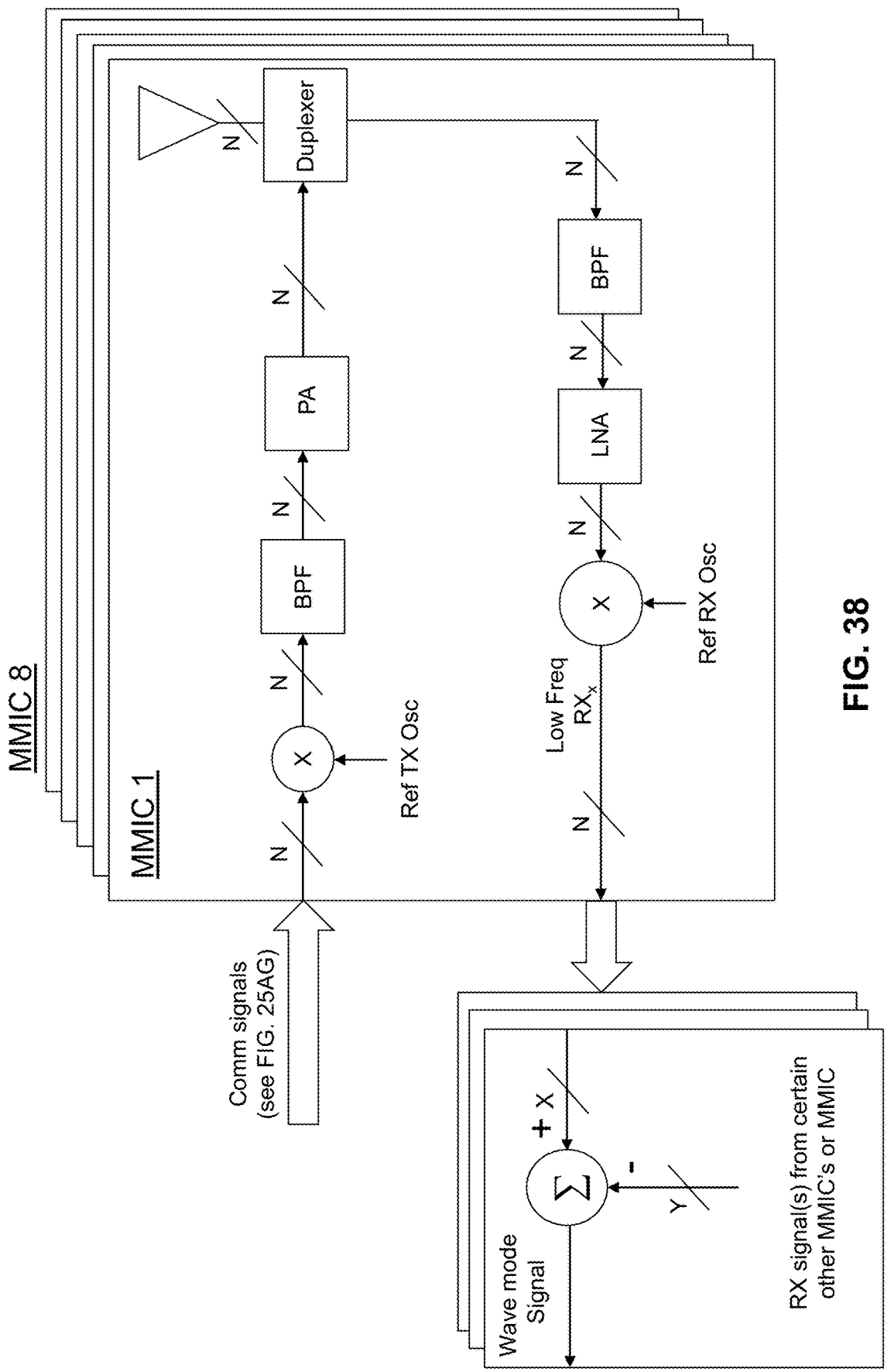
FIG. 38 is a block diagram illustrating example, non-limiting embodiments for selectively receiving a wave mode in accordance with various aspects described herein.

FIG. 38 illustrates a simplified functional block diagram of an MMIC. The MMIC can, for example, utilize a mixer coupled to a reference (TX) oscillator that shifts one of the communication signals supplied by one of the signal ports (SP1 or SP2) of one of the transmitters (TX1, TX2 or TX3) to a desired center frequency in accordance with the configurations shown in FIG. 33. For example, in the case of TX1, the communication signal from SP1 is supplied to a transmit path of each of the MMICs (i.e., NE, NW, SE, SW, N, S, E, and W). In the case of TX2, the communication signal from SP1 is supplied to another transmit path of three MMICs (i.e., N, E, and NW). Note the transmit paths used by MMICs N, E and W for the communication signal supplied by SP1 of TX2 are different from the transmit paths used by the MMICs for the communication signal supplied by SP1 of TX1. Similarly, the communication signal from SP2 of TX2 is supplied to another transmit path of three other MMICs (i.e., S, SE, and SW). Again, the transmit paths used by MMICs S, SE and SW for the communication signal supplied by SP2 of TX2 are different from the transmit paths used by the MMICs for the communication signals from SP1 of TX1, and SP1 of TX2. Lastly, in the case of TX3, the communication signal from SP1 is supplied to yet another transmit path of three MMICs (i.e., E, NE, and SE). Note the transmit paths used for MMICs E, NE, and SE for the communication signal from SP1 of TX3 are different from the transmit paths used by the MMICs for the communication signals supplied by SP1 of TX1, SP1 of TX2, and SP2 of TX2. Similarly, the communication signal from SP2 of TX3 is supplied to another transmit path of three other MMICs (i.e., W, NW, and SW). Again, the transmit paths used by MMICs W, NW, and SW for the communication signal supplied by SP2 of TX3 are different from the transmit paths used by the MMICs for the communication signals from SP1 of TX1, SP1 of TX2, and SP2 of TX2, and SP1 of TX3.

Once the communication signals have been frequency-shifted by the mixer shown in the transmit path, the frequency-shifted signal generated by the mixer can then be filtered by a bandpass filter that removes spurious signals. The output of the bandpass filter in turn can be provided to a power amplifier that couples to an antenna by way of a duplexer for radiating signals in the manner previously described. The duplexer can be used to isolate a transmit path from a receive path. The illustration of FIG. 38 is intentionally oversimplified to enable ease of illustration.

It will be appreciated that other components (not shown) such as an impedance matching circuit, phase lock loop, or other suitable components for improving the accuracy and efficiency of the transmission path (and receive path) is contemplated by the subject disclosure. Furthermore, while a single antenna can be implemented by each MMIC, other designs with multiple antennas can likewise be employed. It is further appreciated that to achieve more than one orthogonal wave mode with overlapping frequency bands (e.g., TM00, HE11 Vertical, and HE11 Horizontal wave modes described above), the transmit path can be repeated N times using the same reference oscillator. N can represent an integer associated with the number of instances the MMIC is used to generate each of the wave modes. For example, in FIG. 33, MMIC NE is used three times; hence, MMIC NE has three transmit paths (N=3), MMIC NW is used three times; hence, MMIC NW has three transmit paths (N=3), MMIC N is used twice; hence, MMIC N has two transmit paths (N=2), and so on. If frequency division multiplexing is employed to generate the same wave modes in other frequency band(s) (see FIGS. 31 and 32), the transmit path can be further repeated using different reference oscillator(s) that are centered at the other frequency band(s).

In the receive path shown in FIG. 38, N signals supplied by N antennas via the duplexer of each transmit path in the MMIC can be filtered by a corresponding N bandpass filters, which supply their output to N low-noise amplifiers. The N low-noise amplifiers in turn supply their signals to N mixers to generate N intermediate-frequency received signals. As before, N is representative of the number of instances the MMIC is used for receiving wireless signals for different wave modes. For example, in FIG. 34, MMIC NE is used in three instances; hence, MMIC NE has three receive paths (N=3), MMIC N is used in two instances; hence, MMIC N has two receive paths (N=2), and so on.

Figure 36:
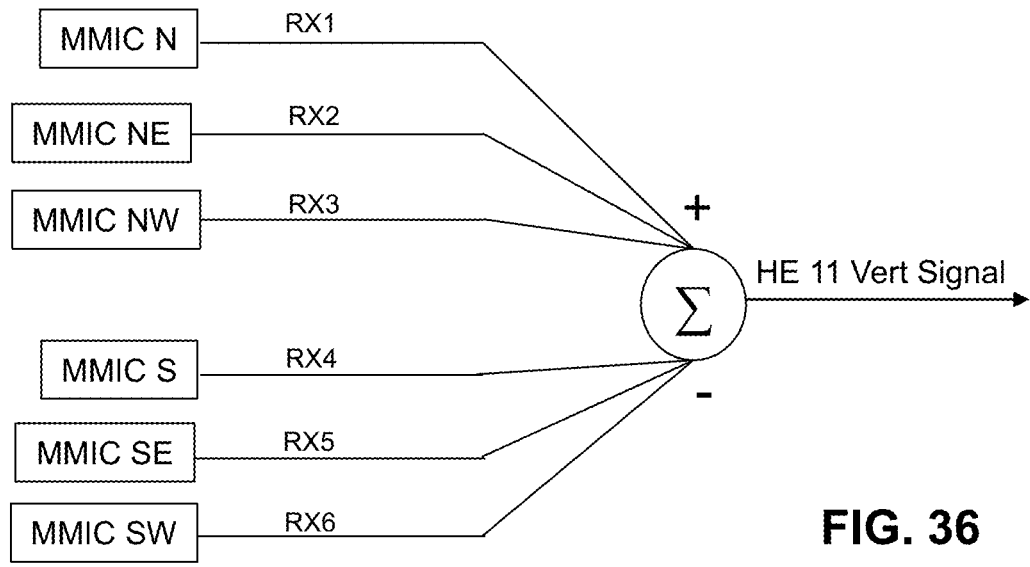
FIG. 36 is a block diagram illustrating example, non-limiting embodiments for selectively receiving a wave mode in accordance with various aspects described herein.
Figure 37:
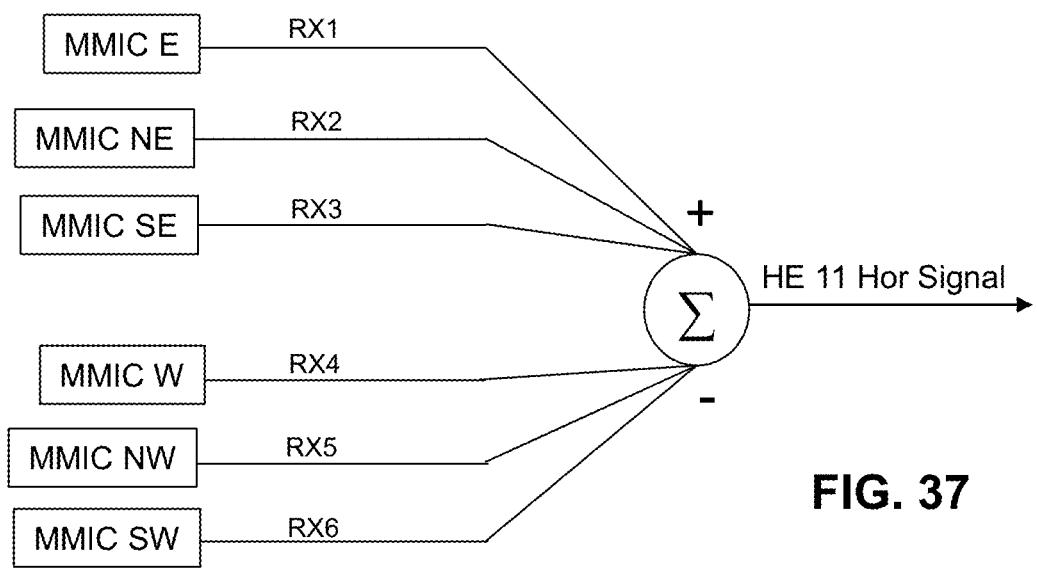
FIG. 37 is a block diagram illustrating example, non-limiting embodiments for selectively receiving a wave mode in accordance with various aspects described herein.

Referring back to FIG. 38, to reconstruct a wave mode signal, Y received signals supplied by receiver paths of certain MMICs or a reference from a metal sleeve is subtracted from X received signals supplied by other MMICs based on the configurations shown in FIGS. 35-37. For example, a TM00 signal is reconstructed by supplying the received signals of all MMICs (NE, NW, SE, SW, N, S, E, W) to the plus port of the summer (i.e., X signals), while the reference signal from the metal sleeve is supplied to the negative port of the summer (i.e., Y signal)—see FIG. 35. The difference between the X and Y signals results in the TM00 signal. To reconstruct the HE11 Vertical signal, the received signals of MMICs N, NE, and NW are supplied to the plus port of the summer (i.e., X signals), while the received signals of MMICs S, SE, and SW are supplied to the negative port of the summer (i.e., Y signals)—see FIG. 36. The difference between the X and Y signals results in the HE11 vertical signal. Lastly, to reconstruct the HE11 Horizontal signal, the received signals of MMICs E, NE, and SE are supplied to the plus port of the summer (i.e., X signals), while the received signals of MMICs W, NW, and SW are supplied to the negative port of the summer (i.e., Y signals)—see FIG. 37. The difference between the X and Y signals results in the HE11 horizontal signal. Since there are three wave mode signals being reconstructed, the block diagram of the summer with the X and Y signals is repeated three times.

Each of these reconstructed signals is at intermediate frequencies. These intermediate-frequency signals are provided to receivers (RX1, RX2 and RX3) which include circuitry (e.g., a DSP, A/D converter, etc.) for processing and to selectively obtain communication signals therefrom. Similar to the transmit paths, the reference oscillators of the three receiver paths can be configured to be synchronized with phase lock loop technology or other suitable synchronization technique. If frequency division multiplexing is employed for the same wave modes in other frequency band(s) (see FIGS. 31 and 32), the receiver paths can be further repeated using a different reference oscillator that is centered at the other frequency band(s).

It will be appreciated that other suitable designs that can serve as alternative embodiments to those shown in FIGS. 33-38 can be used for transmitting and receiving orthogonal wave modes. For example, there can be fewer or more MMICs than described above. In place of the MMICs, or in combination, slotted launchers as shown in FIGS. 18D-18E, 18G, and 18I can be used. It is further appreciated that more or fewer sophisticated functional components can be used for transmitting or receiving orthogonal wave modes. Accordingly, other suitable designs and/or functional components are contemplated by the subject disclosure for transmitting and receiving orthogonal wave modes.

Figure 39:
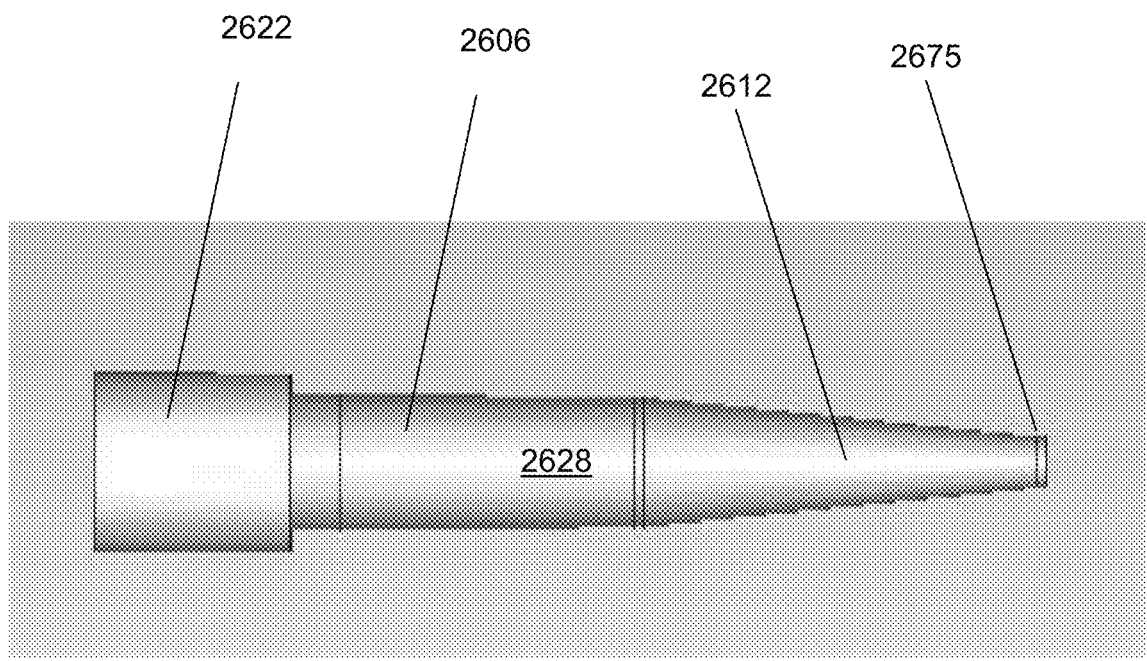
FIG. 39 is a block diagram illustrating example, non-limiting embodiments of a polyrod antenna for transmitting wireless signals in accordance with various aspects described herein.

Referring now to FIG. 39, a block diagram illustrating an example, non-limiting embodiment of a polyrod antenna 2600 for transmitting wireless signals is shown. The polyrod antenna 2600 can be one of a number of polyrod antennas that are utilized in an antenna array, such as array 1976 of FIG. 19F. The antenna array can facilitate or otherwise enable beam steering which can include beam forming. The beam steering can be associated with communication signals, including voice, video, data, messaging, testing signals.

In one or more embodiments, the polyrod antenna 2600 can include a core 2628 having a number of different regions or portions. The core 2628 can be connected with a waveguide 2622 configured to confine an electromagnetic wave at least in part within the core (e.g., in a first region of the core covered by the waveguide). In one embodiment (not shown), the waveguide 2622 can have an opening for accepting a transmission medium (e.g., a dielectric cable) or other coupling devices. In another embodiment, the waveguide 2622 can have a generator, radiating element or other components therein that generate electromagnetic waves for propagating along the core 2628.

In one embodiment, another region 2606 of the core 2628 (e.g., outside of the waveguide 2622) is configured to reduce a propagation loss of an electromagnetic wave as the electromagnetic wave propagates into that region, such as by having a non-tapered or otherwise uniform diameter of the core. The particular length and/or diameter of the region 2606 of the core 2628 can be selected to facilitate the reduction of propagation loss of the electromagnetic wave.

In one embodiment, another region 2612 of the core 2628 (e.g., the distal portion or end of the core that is outside of the waveguide 2622) can be tapered and can facilitate transmitting a wireless signal, such as based on the electromagnetic wave propagating along the core 2628. The particular length, diameter, and/or angle of taper of the region 2612 of the core 2628 can be selected to facilitate transmitting of the wireless signals. In one embodiment, the tip or end 2675 of the region 2612 can be truncated (as shown in FIG. 39) or pointed.

In one embodiment, the length and/or diameter of the core 2628 can be selected based on a wavelength of the electromagnetic wave that will be propagating along the dielectric core. For example, a diameter of greater than $\frac{1}{4}\lambda$, can be used for the region 2606.

In one embodiment, an inner surface of the waveguide 2622 can be constructed from a metallic material or other materials that reflect electromagnetic waves and thereby enables the waveguide 2622 to be configured to guide the electromagnetic wave towards the core 2628. In one embodiment, the core 2628 can comprise a dielectric core (e.g., as described herein) that extends to, or in proximity of, the inner surface of the waveguide 2622. In another embodiment, the dielectric core can be surrounded by cladding (such as shown in FIG. 18A), whereby the cladding extends to the inner surface of the waveguide 2622. In yet other embodiments, the core 2628 can comprise an insulated conductor, where the insulation extends to the inner surface of the waveguide 2622. In this embodiment, the insulated conductor can be a power line, a coaxial cable, or other types of insulated conductors. In one example, the tapered outer shape may extend to the diameter of the metallic wire. In another example, the tapered outer shape may extend to and include tapering of the metallic wire. In yet another example, the metallic wire may or may not continue beyond the tip 2675.

Figure 40:
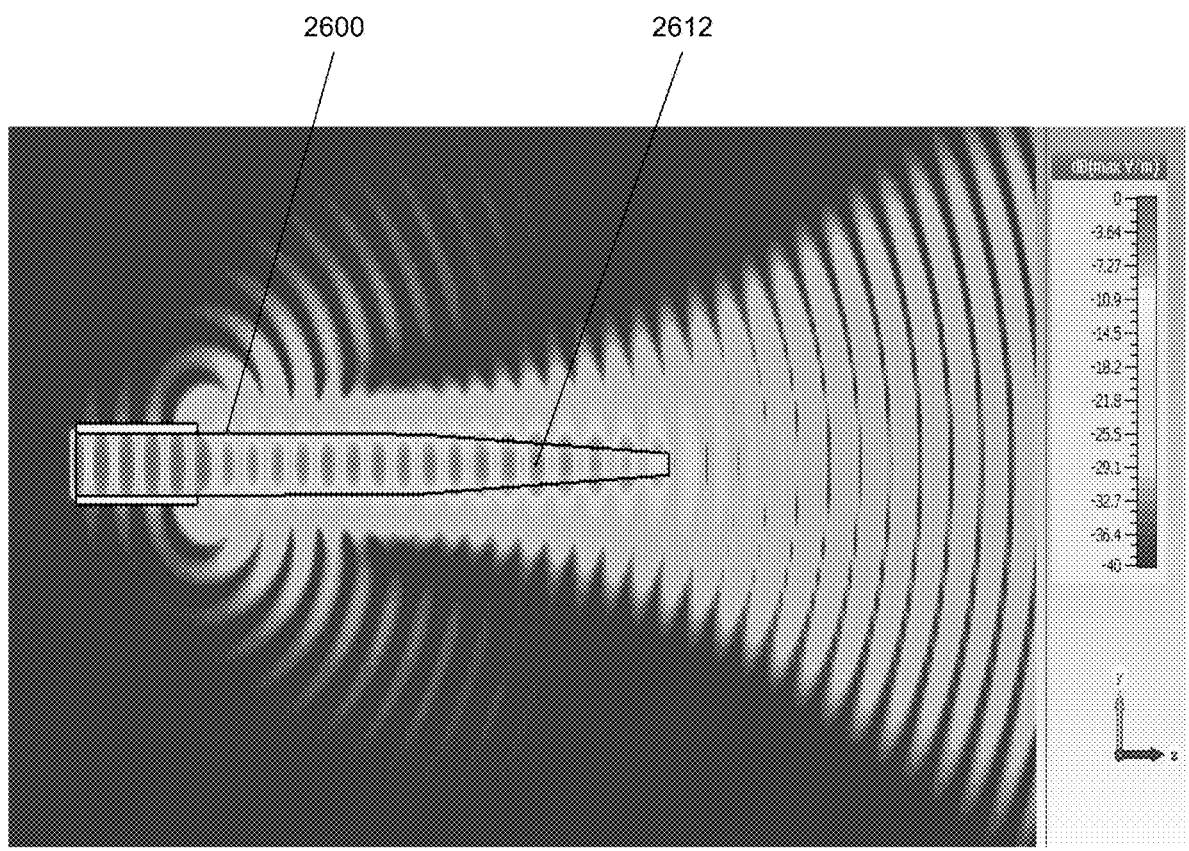
FIG. 40 is a block diagram illustrating an example, non-limiting embodiment of electric field characteristics of transmitted signals from a polyrod antenna in accordance with various aspects described herein.

Referring to FIG. 40, an e-field distribution is illustrated for the polyrod antenna 2600. As shown, the electromagnetic wave is confined or substantially confined within the waveguide 2622 and then propagates along the core 2628 until it is transmitted as a wireless signal from the region 2612 of the core.

Figure 41:
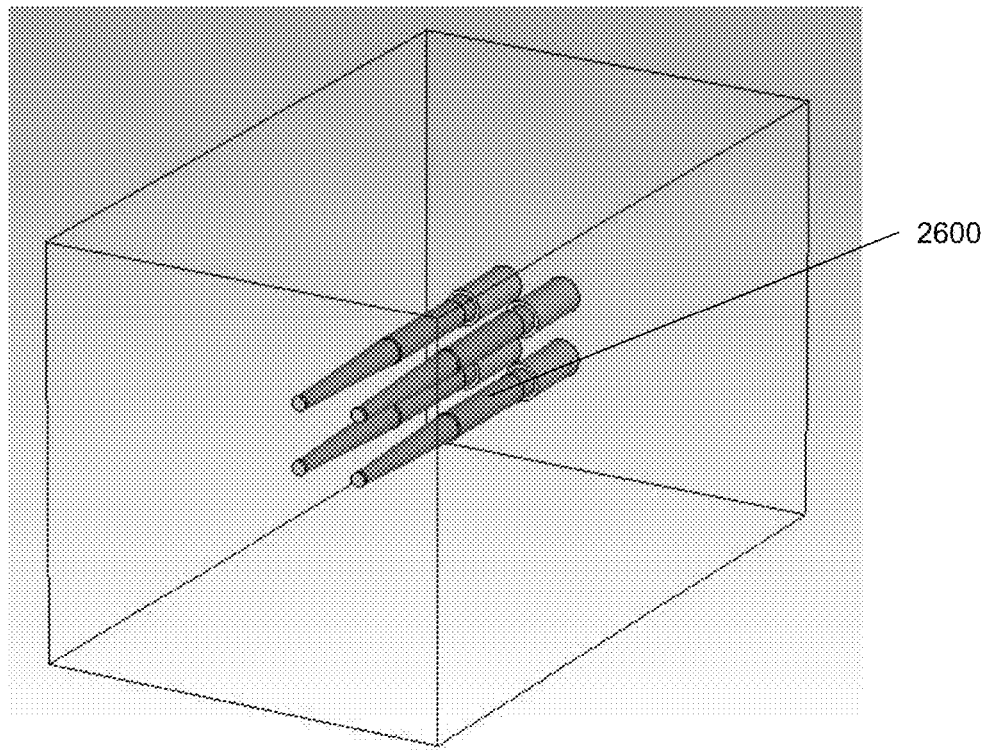
FIGS. 41 and 42 are block diagrams illustrating an example, non-limiting embodiment of a polyrod antenna array in accordance with various aspects described herein.
Figure 42:
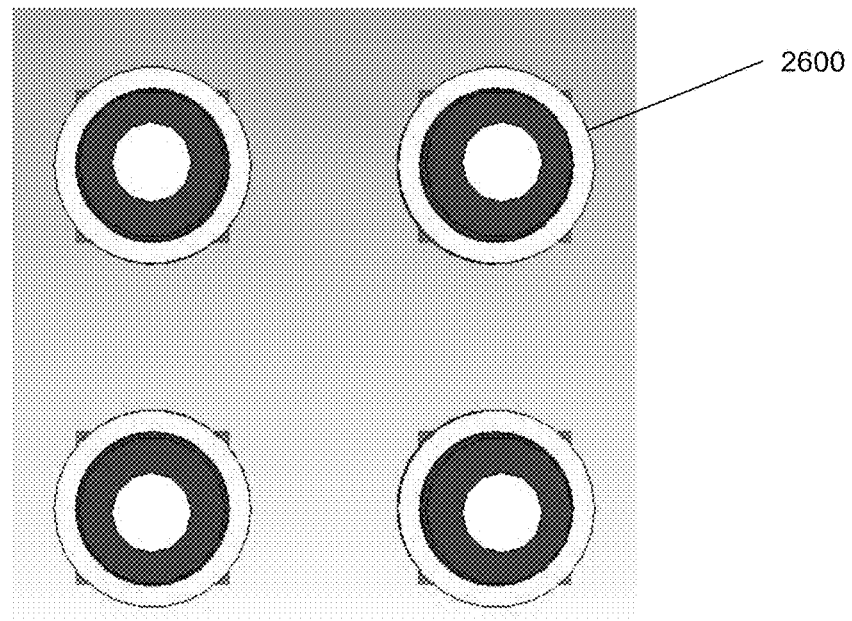

Referring now to FIGS. 41 and 42, diagrams are shown illustrating an example, non-limiting embodiment of a polyrod antenna array 2900 which utilizes four polyrod antennas 2600 for transmitting wireless signals. In this example, the polyrod antenna array 2900 utilizes the same polyrod antennas 2600, which are uniformly spaced apart, such as 0.8 cm on center. The particular type of polyrod antenna, the number of polyrod antennas, and/or the spacing in the array can be selected according to various factors, such as based on parameters of the wireless signals and/or electromagnetic waves that are being utilized.

Figure 43A:
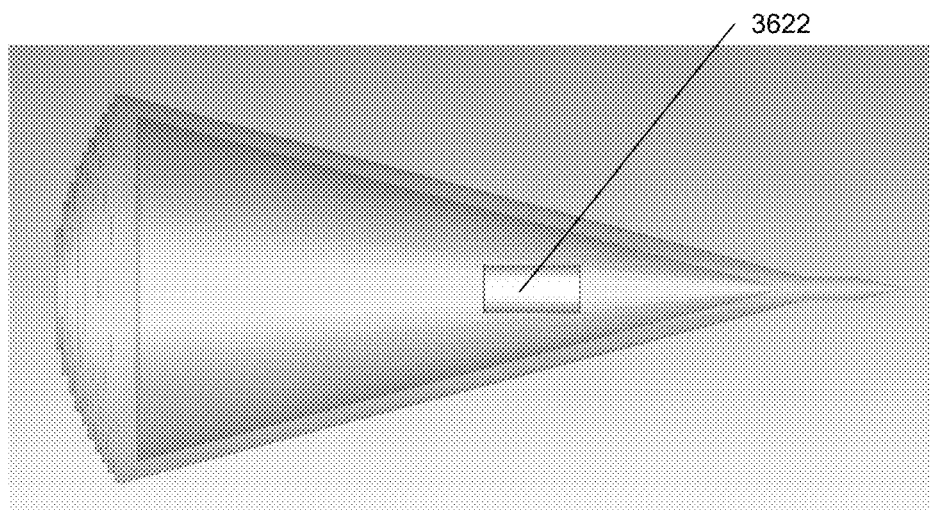
FIGS. 43A and 43B are block diagrams illustrating an example, non-limiting embodiment of an antenna, and electric field characteristics of transmitted signals from the antenna in accordance with various aspects described herein.
Figure 43B:
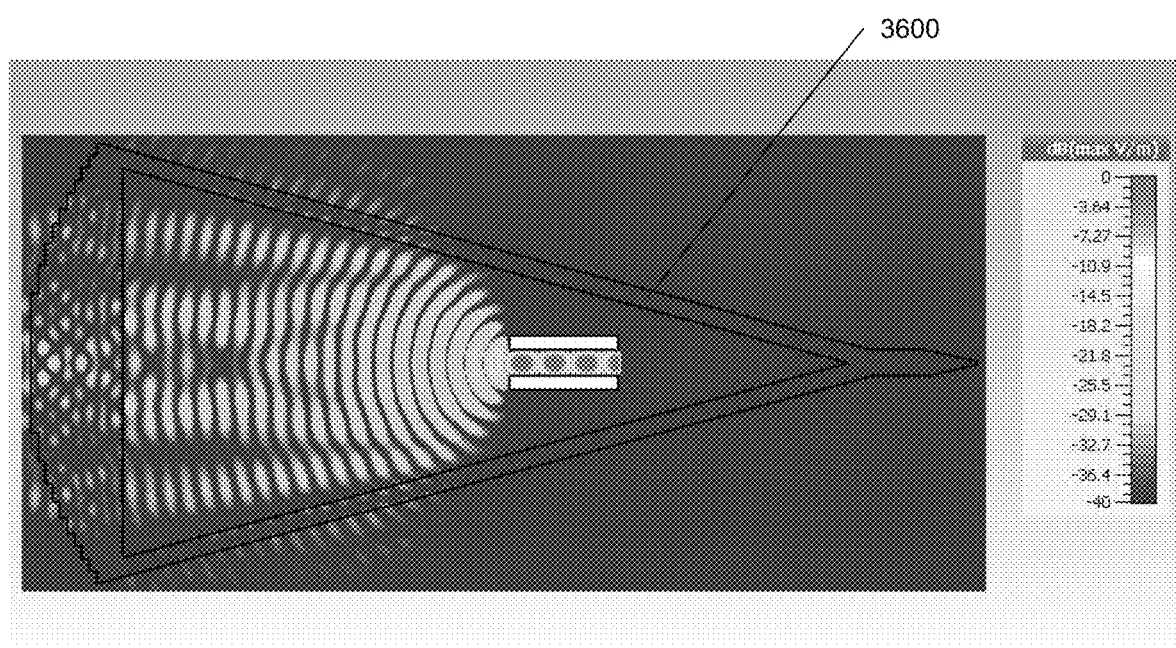

Referring now to FIG. 43A, a block diagram illustrating an example, non-limiting embodiment of a hollow horn antenna 3600 is shown. In one embodiment, the hollow horn antenna 3600 can be used in an array. As an example, hollow horn antenna 3600 can be made from Teflon® and/or can include a cylindrical V-band feed 3622 for generating a signal to be wirelessly transmitted. FIG. 43B illustrates an e-field distribution for the hollow horn antenna 3600. As shown, the electromagnetic waves are confined or substantially confined within the cylinder 3622.

Figure 44A:
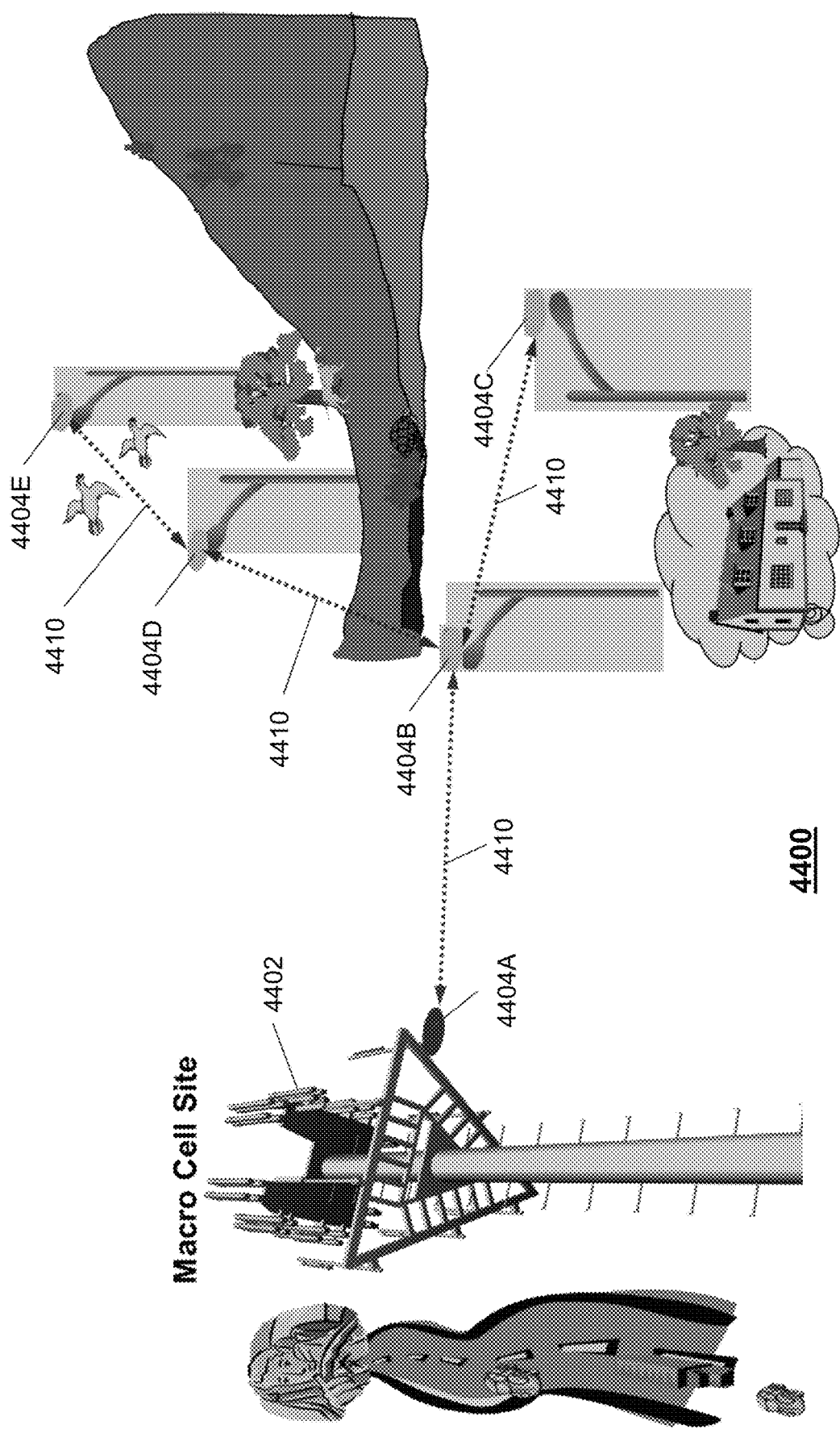
FIG. 44A is a block diagram illustrating an example, non-limiting embodiment of a communication system in accordance with various aspects described herein.

Turning now to FIG. 44A, a block diagram illustrating an example, non-limiting embodiment of a communication system 4400 in accordance with various aspects of the subject disclosure is shown. The communication system 4400 can include a macro base station 4402 such as a base station or access point having antennas that covers one or more sectors (e.g., 6 or more sectors). The macro base station 4402 can be communicatively coupled to a communication node 4404A that serves as a master or distribution node for other communication nodes 4404B-E distributed at differing geographic locations inside or beyond a coverage area of the macro base station 4402. The communication nodes 4404 operate as a distributed antenna system configured to handle communications traffic associated with client devices such as mobile devices (e.g., cell phones) and/or fixed/stationary devices (e.g., a communication device in a residence, or commercial establishment) that are wirelessly coupled to any of the communication nodes 4404. In particular, the wireless resources of the macro base station 4402 can be made available to mobile devices by allowing and/or redirecting certain mobile and/or stationary devices to utilize the wireless resources of a communication node 4404 in a communication range of the mobile or stationary devices.

The communication nodes 4404A-E can be communicatively coupled to each other over an interface 4410. In one embodiment, the interface 4410 can comprise a wired or tethered interface (e.g., fiber optic cable). In other embodiments, the interface 4410 can comprise a wireless RF interface forming a radio distributed antenna system. In various embodiments, the communication nodes 4404A-E can include one or more antennas, such as dielectric horn antennas or antenna arrays, poly rod antennas or antenna arrays or any of the other antennas described herein. The communication nodes 4404A-E can be configured to provide communication services to mobile and stationary devices according to instructions provided by the macro base station 4402. In other examples of operation however, the communication nodes 4404A-E operate merely as analog repeaters to spread the coverage of the macro base station 4402 throughout the entire range of the individual communication nodes 4404A-E.

The micro base stations (depicted as communication nodes 4404) can differ from the macro base station in several ways. For example, the communication range of the micro base stations can be smaller than the communication range of the macro base station. Consequently, the power consumed by the micro base stations can be less than the power consumed by the macro base station. The macro base station optionally directs the micro base stations as to which mobile and/or stationary devices they are to communicate with, and which carrier frequency, spectral segment(s) and/or timeslot schedule of such spectral segment(s) are to be used by the micro base stations when communicating with certain mobile or stationary devices. In these cases, control of the micro base stations by the macro base station can be performed in a master-slave configuration or other suitable control configurations. Whether operating independently or under the control of the macro base station 4402, the resources of the micro base stations can be simpler and less costly than the resources utilized by the macro base station 4402.

Turning now to FIG. 44B, a block diagram illustrating an example, non-limiting embodiment of the communication nodes 4404B-E of the communication system 4400 of FIG. 44A is shown. In this illustration, the communication nodes 4404B-E are placed on a utility fixture such as a light post. In other embodiments, some of the communication nodes 4404B-E can be placed on a building or a utility post or pole that is used for distributing power and/or communication lines. The communication nodes 4404B-E in these illustrations can be configured to communicate with each other over the interface 4410, which in this illustration is shown as a wireless interface. The communication nodes 4404B-E can also be configured to communicate with mobile or stationary devices 4406A-C over a wireless interface 4411 that conforms to one or more communication protocols (e.g., fourth generation (4G) wireless signals such as LTE signals or other 4G signals, fifth generation (5G) wireless signals, WiMAX, 802.11 signals, ultra-wideband signals, etc.). The communication nodes 4404 can be configured to exchange signals over the interface 4410 at an operating frequency that is may be higher (e.g., 28 GHz, 38 GHz, 60 GHz, 80 GHz or higher) than the operating frequency used for communicating with the mobile or stationary devices (e.g., 1.9 GHz) over interface 4411. The high carrier frequency and a wider bandwidth can be used for communicating between the communication nodes 4404 enabling the communication nodes 4404 to provide communication services to multiple mobile or stationary devices via one or more differing frequency bands, (e.g. a 900 MHz band, 1.9 GHz band, a 2.4 GHz band, and/or a 5.8 GHz band, etc.) and/or one or more differing protocols. In other embodiments, particularly where the interface 4410 is implemented via a guided wave communications system on a wire, a wideband spectrum in a lower frequency range (e.g. in the range of 2-6 GHz, 4-10 GHz, etc.) can be employed.

Figure 44C:
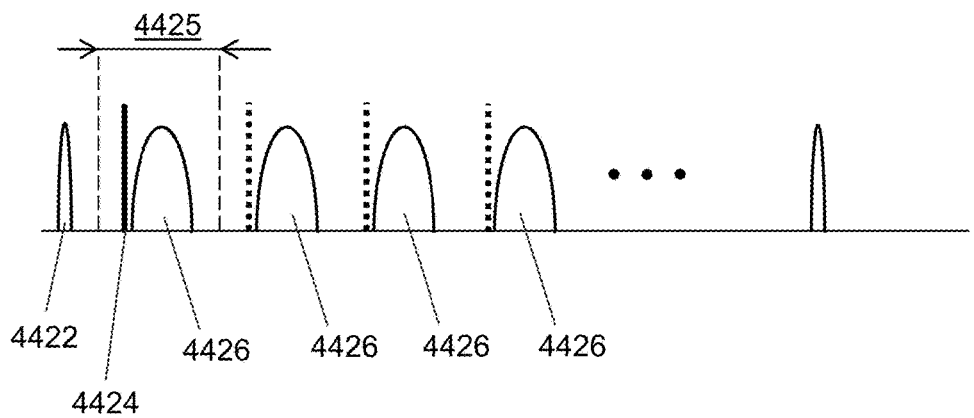
FIG. 44C is a graphical diagram illustrating an example, non-limiting embodiment of downlink and uplink communication techniques for enabling a base station to communicate with communication nodes in accordance with various aspects described herein.
Figure 44C:
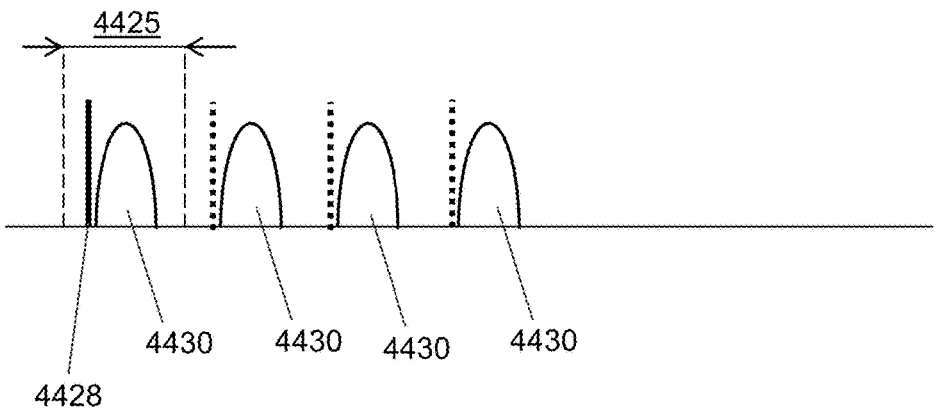

Turning now to FIG. 44C, a block diagram illustrating an example, non-limiting embodiment of downlink and uplink communication techniques for enabling a base station to communicate with the communication nodes 4404 of FIG. 44A is shown. In the illustrations of FIG. 44C, downlink signals (i.e., signals directed from the macro base station 4402 to the communication nodes 4404) can be spectrally divided into control channels 4422, downlink spectral segments 4426 each including modulated signals which can be frequency converted to their original/native frequency band (e.g., cellular band, or other native frequency band) for enabling the communication nodes 4404 to communicate with one or more mobile or stationary devices, and pilot signals 4424 which can be supplied with some or all of the spectral segments 4426 for mitigating distortion created between the communication nodes 4404. The pilot signals 4424 can be processed by tethered or wireless transceivers of downstream communication nodes 4404 to remove distortion from a receive signal (e.g., phase distortion). Each downlink spectral segment 4426 can be allotted a bandwidth 4425 sufficiently wide (e.g., 50 MHz) to include a corresponding pilot signal 4424 and one or more downlink modulated signals located in frequency channels (or frequency slots) in the spectral segment 4426. The modulated signals can represent cellular channels, WLAN channels or other modulated communication signals (e.g., 10-20 MHz), which can be used by the communication nodes 4404 for communicating with one or more mobile or stationary devices 4406.

Uplink modulated signals generated by mobile or stationary communication devices in their native/original frequency bands (e.g., cellular band, or other native frequency band) can be frequency converted and thereby located in frequency channels (or frequency slots) in the uplink spectral segment 4430. The uplink modulated signals can represent cellular channels, WLAN channels or other modulated communication signals. Each uplink spectral segment 4430 can be allotted a similar or same bandwidth 4425 to include a pilot signal 4428 which can be provided with some or each spectral segment 4430 to enable upstream communication nodes 4404 and/or the macro base station 4402 to remove distortion (e.g., phase error).

In the embodiment shown, the downlink and uplink spectral segments 4426 and 4430 each comprise a plurality of frequency channels (or frequency slots), which can be occupied with modulated signals that have been frequency converted from any number of native/original frequency bands (e.g. a 900 MHz band, 1.9 GHz band, a 2.4 GHz band, and/or a 5.8 GHz band, etc.). The modulated signals can be up-converted to adjacent frequency channels in downlink and uplink spectral segments 4426 and 4430. In this fashion, while some adjacent frequency channels in a downlink spectral segment 4426 can include modulated signals originally in a same native/original frequency band, other adjacent frequency channels in the downlink spectral segment 4426 can also include modulated signals originally in different native/original frequency bands, but frequency converted to be located in adjacent frequency channels of the downlink spectral segment 4426. For example, a first modulated signal in a 1.9 GHz band and a second modulated signal in the same frequency band (i.e., 1.9 GHz) can be frequency converted and thereby positioned in adjacent frequency channels of a downlink spectral segment 4426. In another illustration, a first modulated signal in a 1.9 GHz band and a second communication signal in a different frequency band (i.e., 2.4 GHz) can be frequency converted and thereby positioned in adjacent frequency channels of a downlink spectral segment 4426. Accordingly, frequency channels of a downlink spectral segment 4426 can be occupied with any combination of modulated signals of the same or differing signaling protocols and of a same or differing native/original frequency bands.

Similarly, while some adjacent frequency channels in an uplink spectral segment 4430 can include modulated signals originally in a same frequency band, adjacent frequency channels in the uplink spectral segment 4430 can also include modulated signals originally in different native/original frequency bands, but frequency converted to be located in adjacent frequency channels of an uplink segment 4430. For example, a first communication signal in a 2.4 GHz band and a second communication signal in the same frequency band (i.e., 2.4 GHz) can be frequency converted and thereby positioned in adjacent frequency channels of an uplink spectral segment 4430. In another illustration, a first communication signal in a 1.9 GHz band and a second communication signal in a different frequency band (i.e., 2.4 GHz) can be frequency converted and thereby positioned in adjacent frequency channels of the uplink spectral segment 4426. Accordingly, frequency channels of an uplink spectral segment 4430 can be occupied with any combination of modulated signals of a same or differing signaling protocols and of a same or differing native/original frequency bands. It should be noted that a downlink spectral segment 4426 and an uplink spectral segment 4430 can themselves be adjacent to one another and separated by only a guard band or otherwise separated by a larger frequency spacing, depending on the spectral allocation in place.

It will be appreciated that downlink modulated signals generated by a base station in their native/original frequency bands (e.g., cellular band, or other native frequency band) can be frequency shifted to one of the downlink spectral segments 4426 without re-modulating the modulated signals. That is, frequency shifting the downlink modulated signals can include transitioning the downlink modulated signals from its native/original frequency bands to a spectral segment 4426 without modifying the signaling protocol (e.g., LTE, 5G, DOCSIS, etc.) and/or the modulation technique (e.g., orthogonal frequency-division multiple access; generally, referred to as OFDMA, etc.) used by the base station to generate the downlink modulated signal in its native/original frequency bands. Frequency shifting the downlink modulated signals in this manner preserves the signaling protocol and/or modulation technique used to generate the downlink modulated signals, and thereby enables any of the communication nodes 4404 to restore the downlink modulated signals in spectral segment 4426 to its respective native/original frequency bands with only a frequency conversion process.

Similarly, uplink modulated signals generated by mobile or stationary communication devices in their native/original frequency bands (e.g., cellular band, or other native frequency band) can be frequency shifted to one of the uplink segment spectral segments 4430 without re-modulating the modulated signals. That is, frequency shifting the uplink modulated signals can include transitioning the uplink modulated signals from its native/original frequency bands to a spectral segment 4430 without modifying the signaling protocol (e.g., LTE, 5G, DOCSIS, etc.) and/or the modulation technique (e.g., single carrier frequency-division multiple access; generally, referred to as SC-FDMA, etc.) used by the mobile or stationary communication devices to generate the uplink modulated signal in its native/original frequency bands. Frequency shifting the uplink modulated signals in this manner preserves the signaling protocol and/or modulation technique used to generate the uplink modulated signals, and thereby enables any of the communication nodes 4404 to restore the uplink modulated signals in spectral segment 4430 to its respective native/original frequency bands with only a frequency conversion process.

The foregoing frequency conversion processes can correspond to a frequency up-conversion, a frequency down-conversion, or a combination thereof. The frequency conversion process can be performed with analog circuitry (e.g., amplifiers, mixers, filters, etc.) without digital conversion, which can simplify the design requirements of the communication nodes 4404. It will be appreciated that the foregoing principles of frequency conversion without modifying the signaling protocol and/or the modulation technique of previously modulated signals its native/original frequency bands can be applied to any embodiments of the subject disclosure including without limitation wireless signals propagating in free space between antenna systems of a distributed antenna system, and/or guided electromagnetic waves that propagate along a physical transmission medium.

Figure 44D:
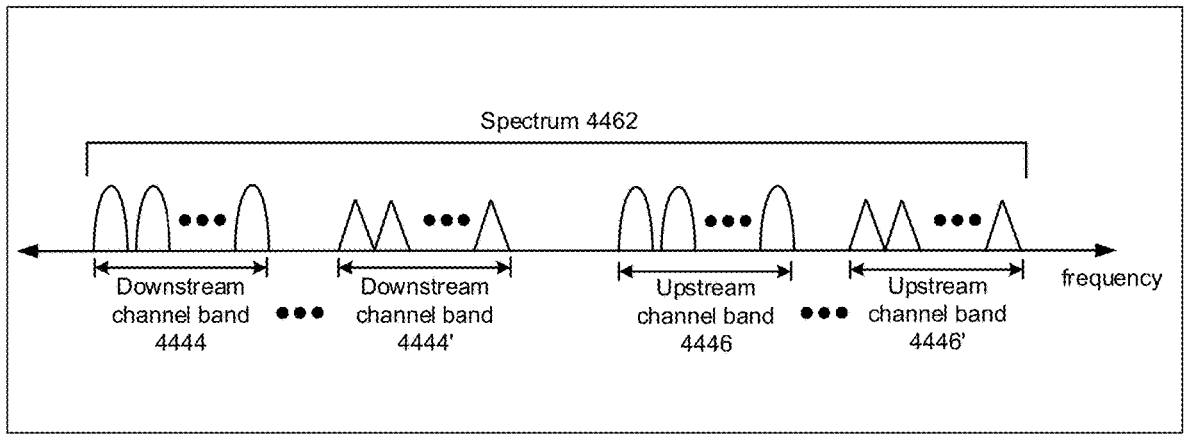
FIG. 44D is a graphical diagram illustrating an example, non-limiting embodiment of a frequency spectrum in accordance with various aspects described herein.

Turning now to FIG. 44D, a graphical diagram 4460 illustrating an example, non-limiting embodiment of a frequency spectrum is shown. In particular, a spectrum 4462 is shown for a distributed antenna system that conveys modulated signals occupying frequency channels of uplink or downlink spectral segments after they have been converted in frequency (e.g. via up-conversion or down-conversion) from one or more original/native spectral segments into the spectrum 4462.

As previously discussed two or more different communication protocols can be employed to communicate upstream and downstream data. When two or more differing protocols are employed, a first subset of the downlink frequency channels of a downlink spectral segment 4426 can be occupied by frequency converted modulated signals in accordance with a first standard protocol and a second subset of the downlink frequency channels of the same or a different downlink spectral segment 4430 can be occupied by frequency converted modulated signals in accordance with a second standard protocol that differs from the first standard protocol. Likewise a first subset of the uplink frequency channels of an uplink spectral segment 4430 can be received by the system for demodulation in accordance with the first standard protocol and a second subset of the uplink frequency channels of the same or a different uplink spectral segment 4430 can be received in accordance with a second standard protocol for demodulation in accordance with the second standard protocol that differs from the first standard protocol.

In the example shown, the downstream channel band 4444 includes a first plurality of downstream spectral segments represented by separate spectral shapes of a first type representing the use of a first communication protocol. The downstream channel band 4444' includes a second plurality of downstream spectral segments represented by separate spectral shapes of a second type representing the use of a second communication protocol. Likewise the upstream channel band 4446 includes a first plurality of upstream spectral segments represented by separate spectral shapes of the first type representing the use of the first communication protocol. The upstream channel band 4446' includes a second plurality of upstream spectral segments represented by separate spectral shapes of the second type representing the use of the second communication protocol. These separate spectral shapes are meant to be placeholders for the frequency allocation of each individual spectral segment along with associated reference signals, control channels and/or clock signals. While the individual channel bandwidth is shown as being roughly the same for channels of the first and second type, it should be noted that upstream and downstream channel bands 4444, 4444', 4446 and 4446' may be of differing bandwidths. Additionally, the spectral segments in these channel bands of the first and second type may be of differing bandwidths, depending on available spectrum and/or the communication standards employed.

Figure 44E:
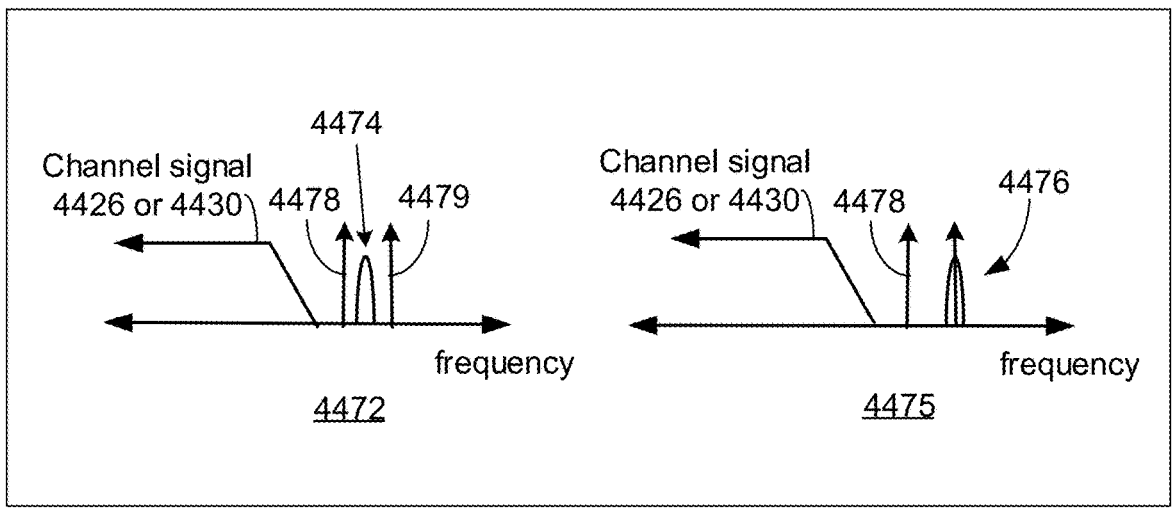
FIG. 44E is a graphical diagram illustrating an example, non-limiting embodiment of a frequency spectrum in accordance with various aspects described herein.

Turning now to FIG. 44E, a graphical diagram 4470 illustrating an example, non-limiting embodiment of a frequency spectrum is shown. In particular a portion of the spectrum 4462 of FIG. 44D is shown for a distributed antenna system that conveys modulated signals in the form of channel signals that have been converted in frequency (e.g. via up-conversion or down-conversion) from one or more original/native spectral segments.

The portion 4472 includes a portion of a downlink or uplink spectral segment 4426 and 4430 that is represented by a spectral shape and that represents a portion of the bandwidth set aside for a control channel, reference signal, and/or clock signal. The spectral shape 4474, for example, represents a control channel that is separate from reference signal 4479 and a clock signal 4478. It should be noted that the clock signal 4478 is shown with a spectral shape representing a sinusoidal signal that may require conditioning into the form of a more traditional clock signal. In other embodiments however, a traditional clock signal could be sent as a modulated carrier wave such by modulating the reference signal 4479 via amplitude modulation or other modulation technique that preserves the phase of the carrier for use as a phase reference. In other embodiments, the clock signal could be transmitted by modulating another carrier wave or as another signal. Further, it is noted that both the clock signal 4478 and the reference signal 4479 are shown as being outside the frequency band of the control channel 4474.

In another example, the portion 4475 includes a portion of a downlink or uplink spectral segment 4426 and 4430 that is represented by a portion of a spectral shape that represents a portion of the bandwidth set aside for a control channel, reference signal, and/or clock signal. The spectral shape 4476 represents a control channel having instructions that include digital data that modulates the reference signal, via amplitude modulation, amplitude shift keying or other modulation technique that preserves the phase of the carrier for use as a phase reference. The clock signal 4478 is shown as being outside the frequency band of the spectral shape 4476. The reference signal, being modulated by the control channel instructions, is in effect a subcarrier of the control channel and is in-band to the control channel. Again, the clock signal 4478 is shown with a spectral shape representing a sinusoidal signal, in other embodiments however, a traditional clock signal could be sent as a modulated carrier wave or other signal. In this case, the instructions of the control channel can be used to modulate the clock signal 4478 instead of the reference signal.

Consider the following example, where the control channel 4476 is carried via modulation of a reference signal in the form of a continuous wave (CW) from which the phase distortion in the receiver is corrected during frequency conversion of the downlink or uplink spectral segment 4426 and 4430 back to its original/native spectral segment. The control channel 4476 can be modulated with a robust modulation such as pulse amplitude modulation, binary phase shift keying, amplitude shift keying or other modulation scheme to carry instructions between network elements of the distributed antenna system such as network operations, administration and management traffic and other control data. In various embodiments, the control data can include without limitation:

Status information that indicates online status, offline status, and network performance parameters of each network element.

Network device information such as module names and addresses, hardware and software versions, device capabilities, etc.

Spectral information such as frequency conversion factors, channel spacing, guard bands, uplink/downlink allocations, uplink and downlink channel selections, etc.

Environmental measurements such as weather conditions, image data, power outage information, line of sight blockages, etc.

In a further example, the control channel data can be sent via ultra-wideband (UWB) signaling. The control channel data can be transmitted by generating radio energy at specific time intervals and occupying a larger bandwidth, via pulse-position or time modulation, by encoding the polarity or amplitude of the UWB pulses and/or by using orthogonal pulses. In particular, UWB pulses can be sent sporadically at relatively low pulse rates to support time or position modulation, but can also be sent at rates up to the inverse of the UWB pulse bandwidth. In this fashion, the control channel can be spread over an UWB spectrum with relatively low power, and without interfering with CW transmissions of the reference signal and/or clock signal that may occupy in-band portions of the UWB spectrum of the control channel.

Figure 45:
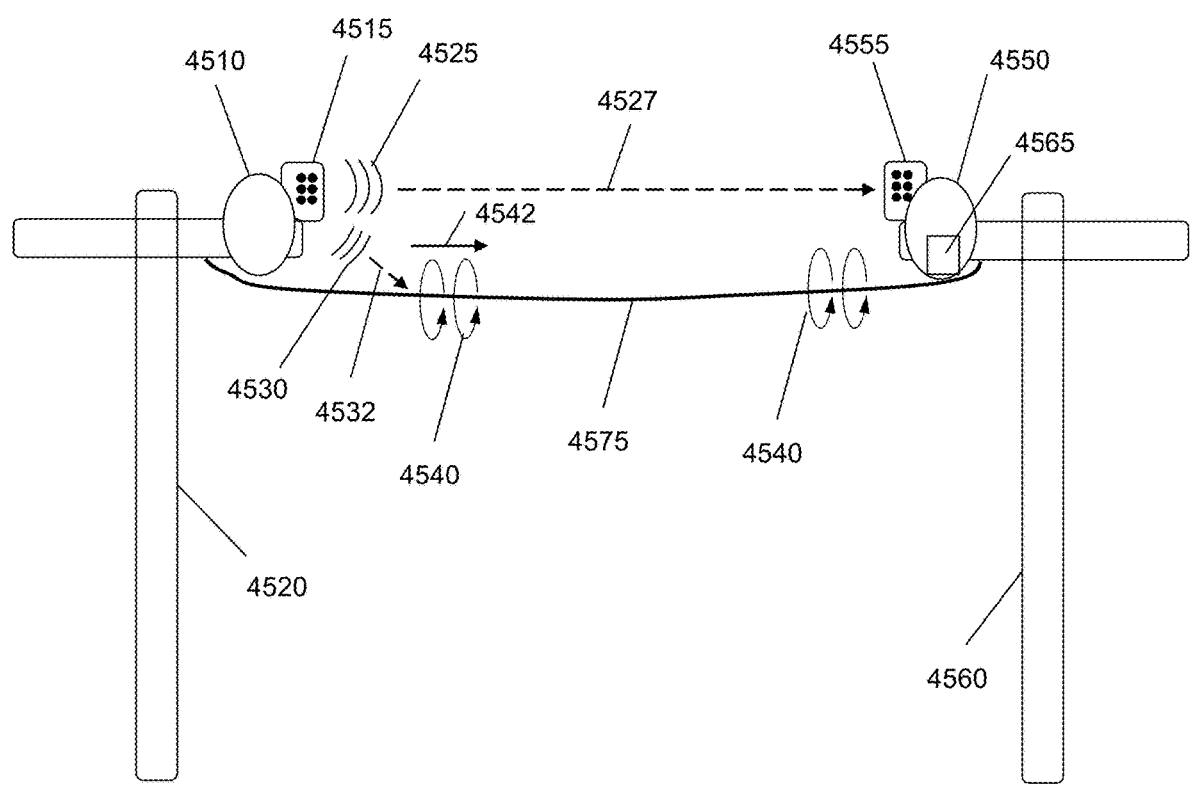
FIG. 45 is a block diagram illustrating an example, non-limiting embodiment of a communication system that utilizes beam steering in accordance with various aspects described herein.

FIG. 45 illustrates a system 4500. In one or more embodiments, communication device 4510 can include an antenna array 4515 for transmitting wireless signals. In one or more embodiments, the antenna array 4515 can perform beam steering. For example, the antenna array 4515 can utilize a first subset of antennas of the antenna array to transmit first wireless signals 4525 directed (as shown by reference number 4527) via beam steering towards the communication device 4550. A second subset of antennas of the antenna array 4515 can transmit second wireless signals 4530 directed (as shown by reference number 4532) via the beam steering towards a transmission medium 4575 (e.g., a power line connected between the utility poles 4520, 4560). In one or more embodiments, the aforementioned beams can be simultaneously created by the same set of antennas in arrays 4515 and 4555. In one or more embodiments, the beam steering can enable the antenna array to communicate with more than one wireless receiver with or without directing wireless signals to a transmission medium. In one or more embodiments, the beam steering can enable the antenna array to direct the wireless signals to more than one transmission medium with or without communicating with a wireless receiver.

The first and second wireless signals 4525, 4530 can be associated with communication signals that are to be transmitted over the network. For instance, the first and second wireless signals 4525, 4530 can be the same signals. In another example, the first wireless signals 4525 can represent a first subset of the communication signals, while the second wireless signals 4530 represent a second subset of the communication signals. In one embodiment, the first and second wireless signals 4525, 4530 can be different and can be based on interleaving of a group of communication signals, such as video packets, and so forth. The communication signals can be various types of signals including information associated with subscriber services, network control, testing, and so forth.

In one or more embodiments, the second wireless signals 4530 induce electromagnetic waves 4540. For example, the electromagnetic waves 4540 are induced at a physical interface of the transmission medium 4575 and propagate (as shown by reference number 4542) without requiring an electrical return path. The electromagnetic waves 4540 are guided by the transmission medium 4575 towards the communication device 4550, which is positioned in proximity to the transmission medium. The electromagnetic waves 4540 can be representative of the second wireless signals 4530 which are associated with the communication signals.

In one or more embodiments, the communication device 4550 can include a receiver that is configured to receive the electromagnetic waves 4540 that are propagating along the transmission medium 4575. Various types of receivers can be used for receiving the electromagnetic waves 4540, such as devices shown in FIGS. 7, 8 and 9A. System 4500 enables the communication device 4510 to transmit information which is received by the communication device 4550 (e.g., another antenna array 4555) via the wireless communication path 4527 and via being guided by the transmission medium 4575.

In one or more embodiments, the antenna arrays 4515, 4555 can include polyrod antennas. For example, each of the polyrod antennas can include a core that is connected with a waveguide that is configured to confine an electromagnetic wave at least in part within the core in a particular region of the core. In one embodiment, each of the polyrod antennas can include a core having a first region, a second region, a third region, and a fourth region, where the core comprises an interface in the first region. One of the plurality of transmitters can generate a first electromagnetic wave that induces a second electromagnetic wave at the interface of the first region. The core can be connected with a waveguide that is configured to confine the second electromagnetic wave at least in part within the core in the first region, where the second region of the core is configured to reduce a radiation loss of the second electromagnetic wave as the second electromagnetic wave propagates into the second region. The third region of the core can be configured to reduce a propagation loss of the second electromagnetic wave as the second electromagnetic wave propagates into the third region. The fourth region of the core can be outside of the waveguide and can be tapered to facilitate transmitting one of the first or second wireless signals based on the second electromagnetic wave.

In one or more embodiments, the communication device 4510 can provide a phase adjustment to the second wireless signals 4530 to accomplish beam steering towards the transmission medium 4575. FIG. 45 illustrates the antenna array 4555 and the receiver 4565 being co-located at communication device 4550, however, in another embodiment the antenna array 4555 and the receiver 4565 can be separate devices that may or may not be in proximity to each other. For example, the first wireless signals 4525 can be received by the antenna array 4555 of the communication device 4550 while the electromagnetic waves 4540 can be received by a receiver of a different communication device (not shown) that is in proximity to the transmission medium 4575.

Figure 46A:
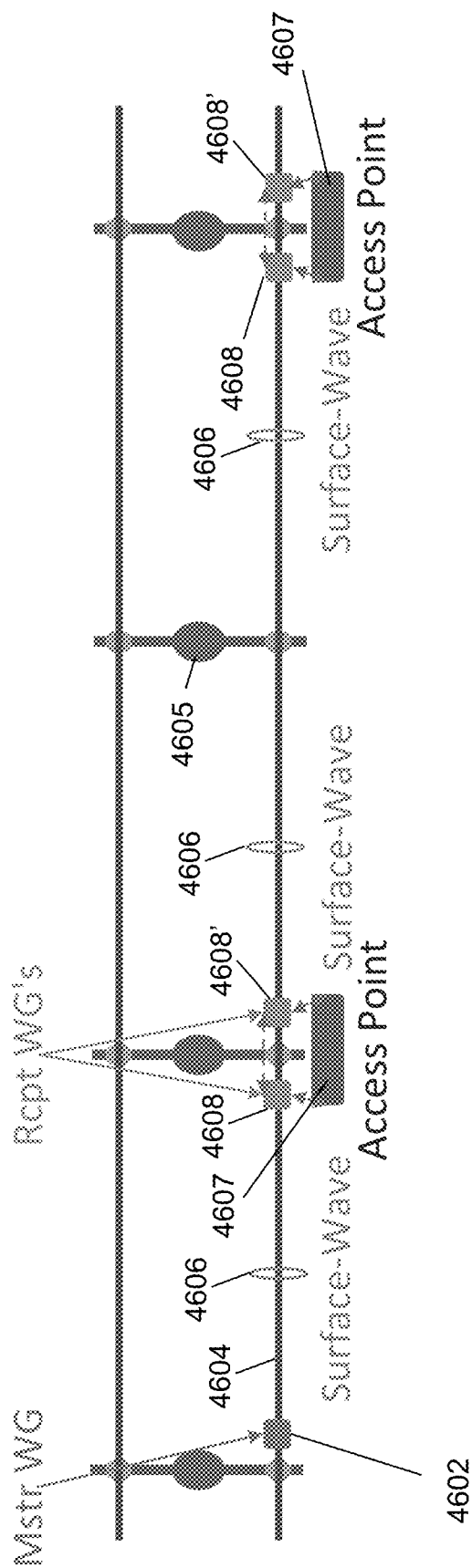
FIGS. 46A, 46B, 46C, 46D, 46E, and 46F are graphical diagrams illustrating example, non-limiting embodiments of network configurations of waveguide systems in accordance with various aspects described herein.

FIGS. 46A, 46B, 46C, 46D, 46E, and 46F are graphical diagrams illustrating example, non-limiting embodiments of network configurations 4600 of waveguide systems in accordance with various aspects described herein. In the illustration of FIG. 46A, a master waveguide system 4602 is coupled to a transmission medium 4604, which in the present illustration, represents a physical transmission medium such as a cable (e.g., a power line supported by a utility pole). The master waveguide system 4602 can be configured to use any of the embodiments of the subject disclosure singly or in any combination. The master waveguide system 4602 can be configured, for example, to transmit electromagnetic waves 4606 that propagate on a surface of the transmission medium 4604 and are directed to a recipient waveguide system 4608. The master waveguide system 4602 can also be configured, for example, to receive the electromagnetic waves that propagate on the surface of the transmission medium 4604 that are generated by the recipient waveguide system 4608.

The recipient waveguide system 4608 can also be configured to use any of the embodiments of the subject disclosure singly or in any combination for receiving and transmitting electromagnetic waves 4606. An access point 4607 comprising, for example, an Ethernet switch can be used for distributing to communication devices in a vicinity of the access point 4607 data extracted by the recipient waveguide system 4608 from the electromagnetic waves 4606. The data can comprise, for example, different types of communication signals including without limitation voice communication signals, video streaming signals, and/or non-real-time communication signals conveying data.

The master waveguide system 4602 and the recipient waveguide system 4608 can be configured to use a power supply that inductively obtains energy from the transmission medium 4604 (e.g., a medium voltage power line delivering energy between 1 kV-69 kV) to power the components of the master waveguide system 4602 and the recipient waveguide system 4608. The master waveguide system 4602 and the recipient waveguide system 4608 can also be configured with a battery backup supply to mitigate the effects of a power outage. The access point 4607, on the other hand, can be configured to couple to a low voltage line such as 220 V to power its components, and can also be configured with a battery backup supply to mitigate a power outage.

The master waveguide system 4602 and the recipient waveguide system 4608 can be configured to send and receive low-power ultra-wideband (UWB) electromagnetic wave pulses (e.g., UWB pulses operating at millimeter-wave frequencies at low energy such as, for example, nano-watts). In one embodiment, for example, the master waveguide system 4602 and the recipient waveguide system 4608 can be configured with a transmitter 4610 (see FIG. 46G) and receiver 4620 (see FIG. 46 J) for transmitting and receiving low-power UWB electromagnetic wave pulses, respectively. In one embodiment, the transmitter 4610 and receiver 4620 can be configured to transmit and receive communication signals without demodulating or re-modulating an original modulation scheme used for generating the communication signal. For example, the transmitter 4610 and receiver 4620 can be configured to transmit and receive signals without demodulating or re-modulating an original modulation scheme. In various embodiments, the signals may be formatted as LTE signals (e.g., in accordance with orthogonal frequency-division multiple access, generally, referred to as OFDMA; or single carrier frequency-division multiple access, generally, referred to as SC-FDMA) however, signals formatted in conjunction with other communication protocols can likewise be employed. Configuring the transmitter 4610 and receiver 4620 to maintain the original modulation scheme can simplify an implementation of the transmitter 4610 and receiver 4620, which helps reduce cost and power consumption of the master waveguide system 4602 and the recipient waveguide system 4608.

Figure 46B:
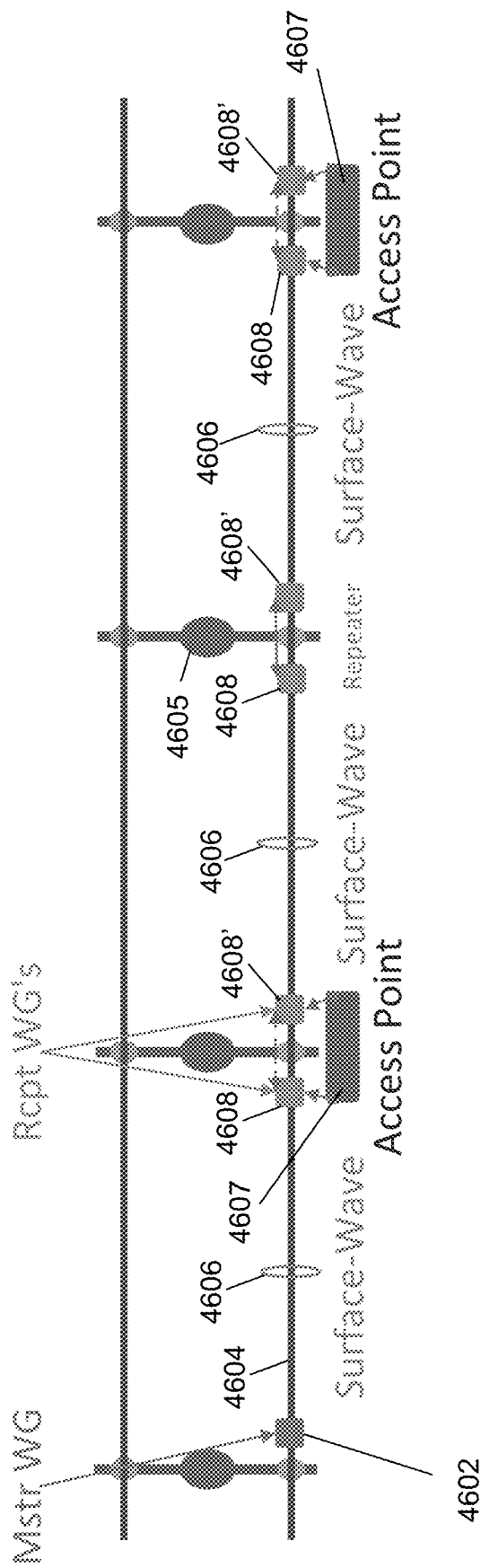
Figure 46C:
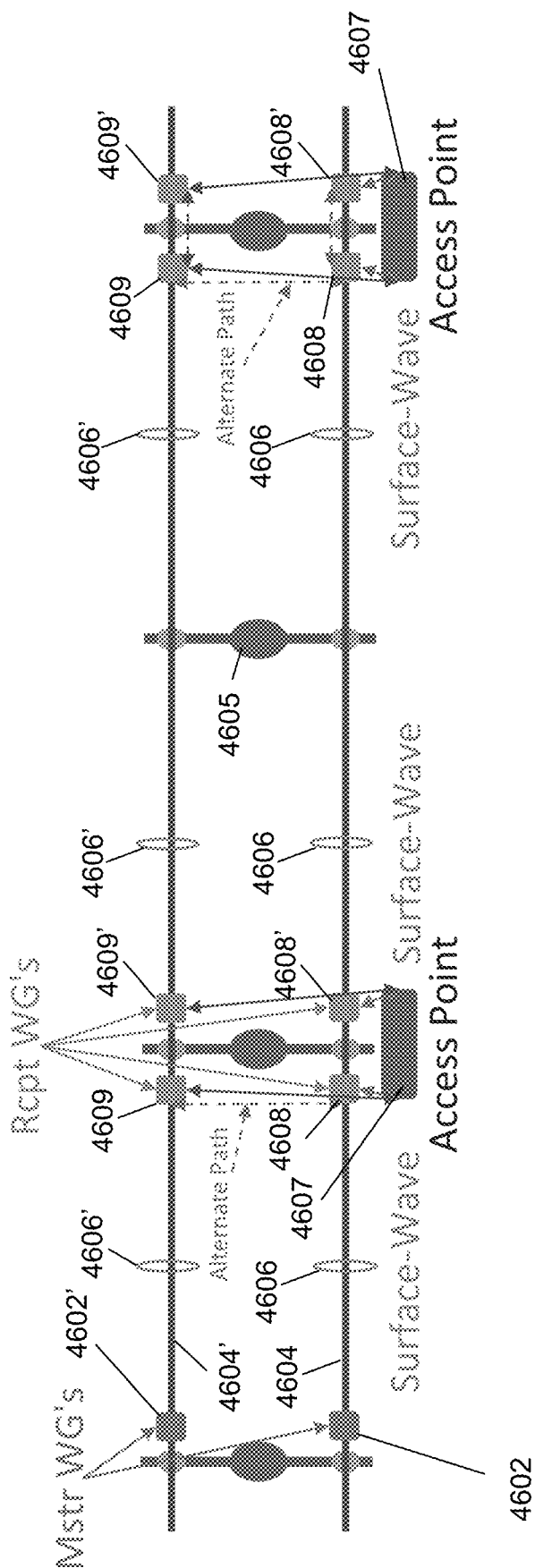
Figure 46D:
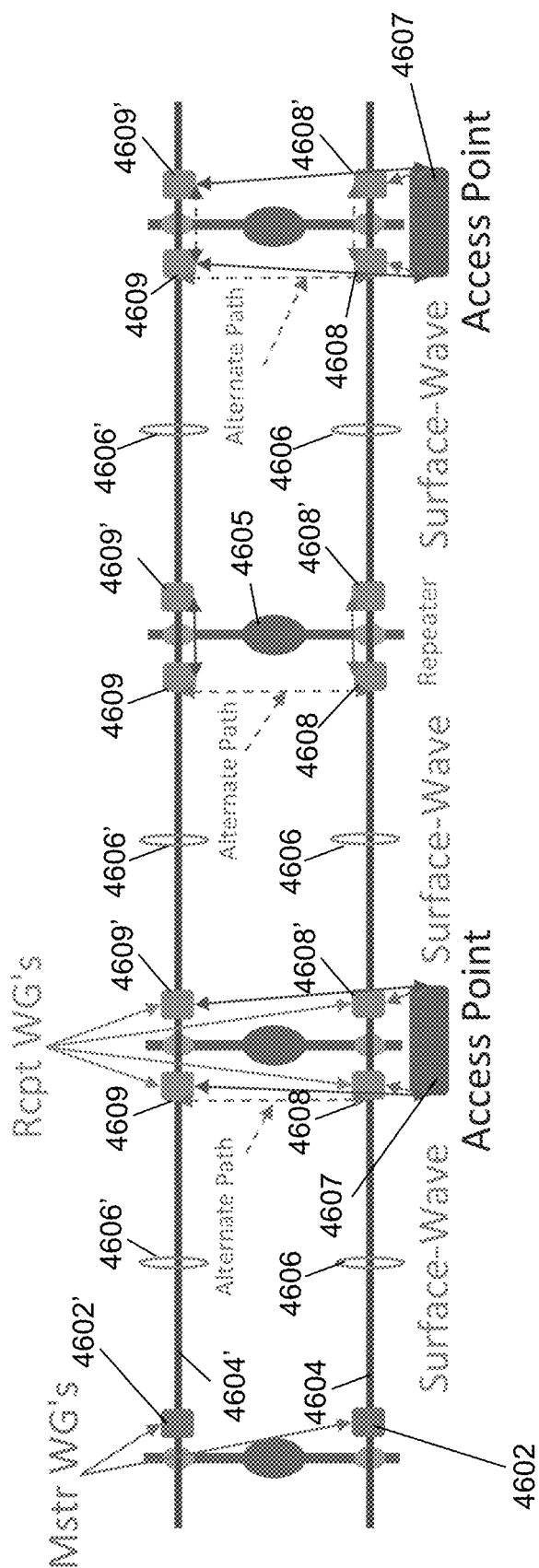
Figure 46E:
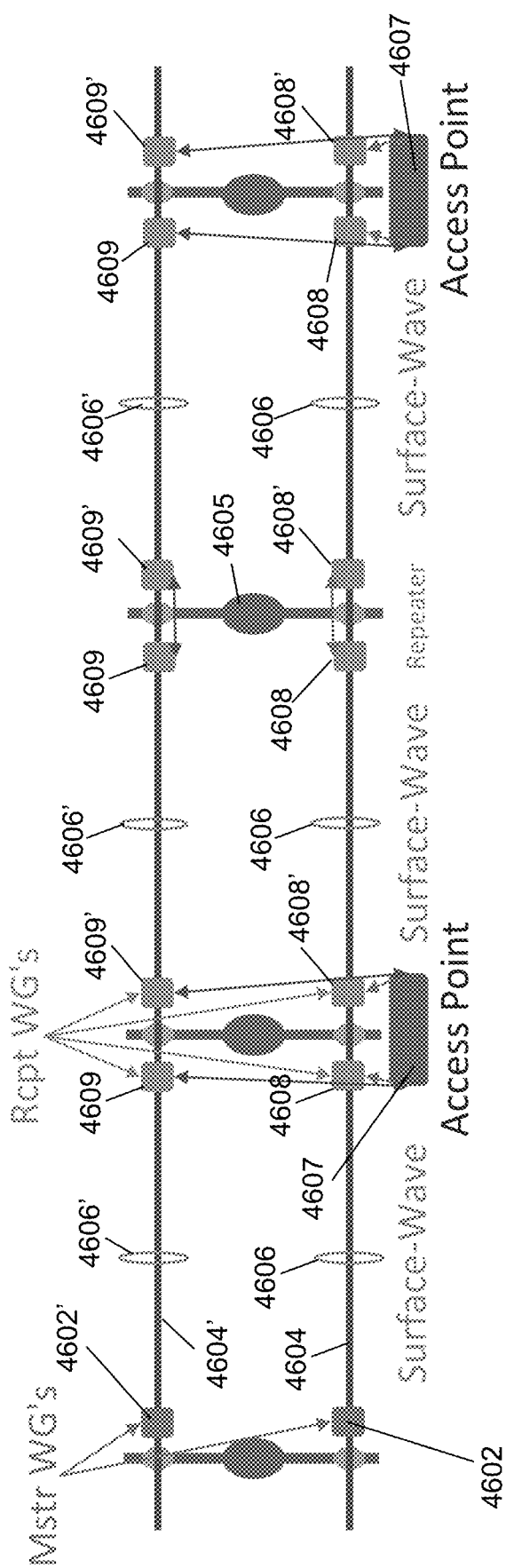
Figure 46F:
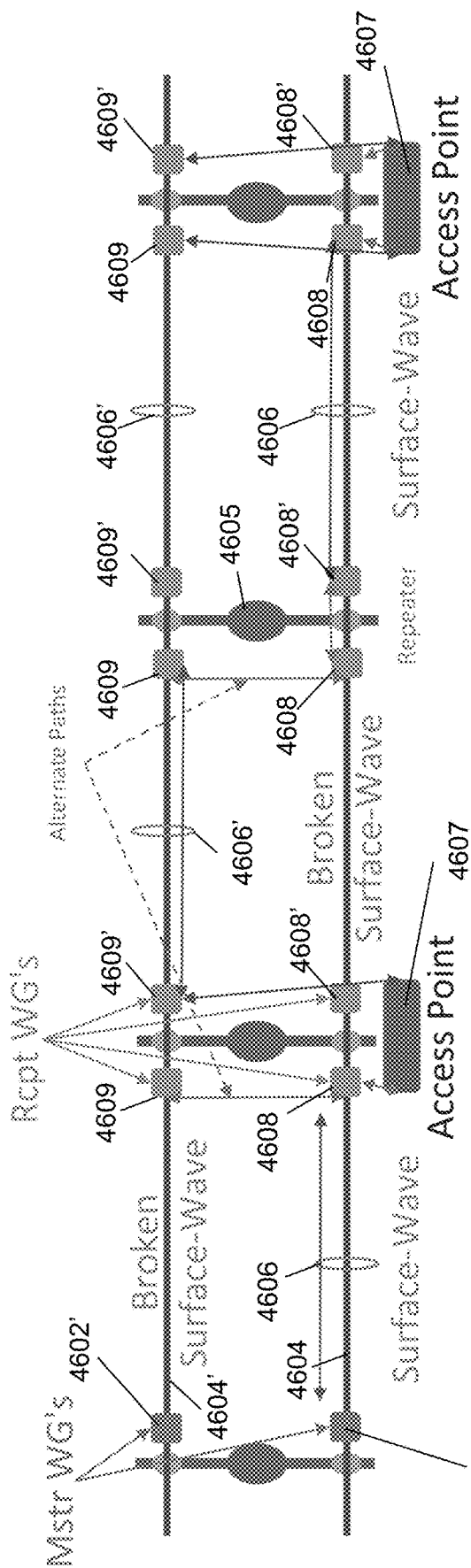
Figure 46G:
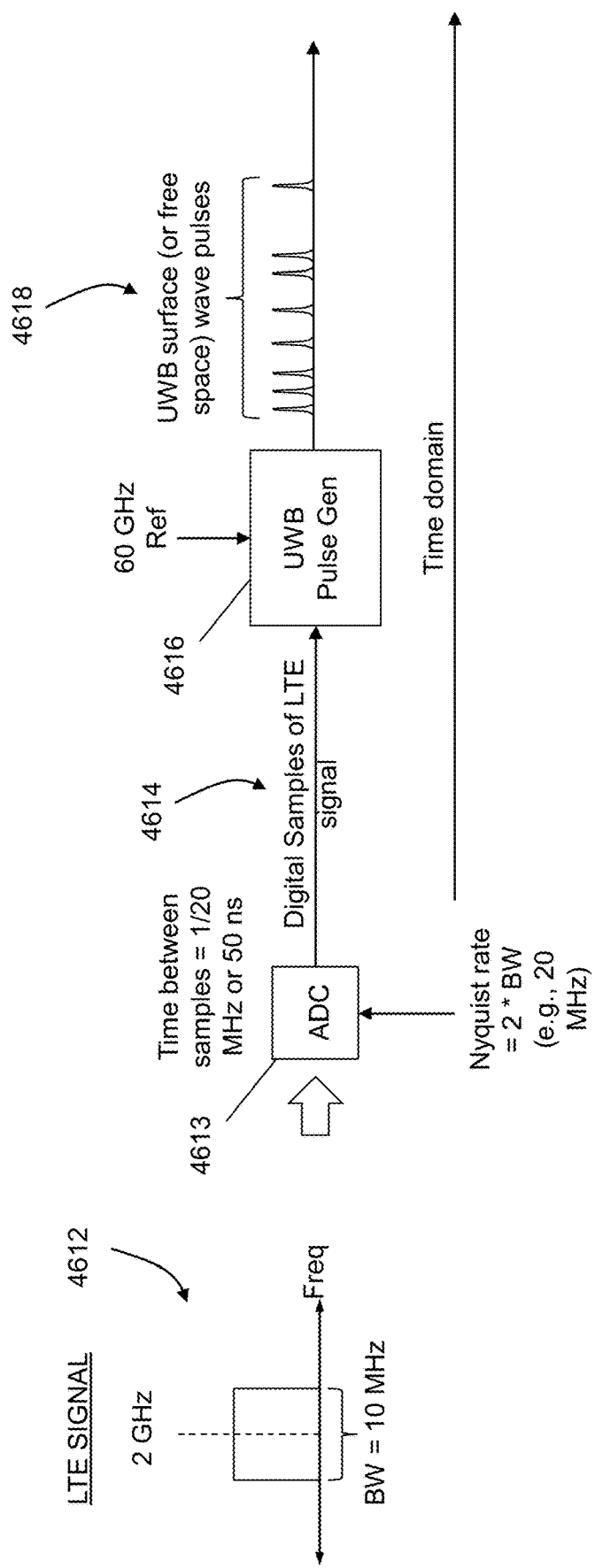
FIG. 46G is a graphical diagram illustrating an example, non-limiting embodiment of a device for transmitting ultra-wideband electromagnetic pulses based on a communication signal in accordance with various aspects described herein.

For instance, in FIG. 46G, the transmitter 4610 can be configured with an analog-to-digital converter (ADC) 4613 to sample an original signal 4612 (e.g. an LTE signal or other signal formatted in accordance with a communication protocol) at a sampling rate such as the Nyquist rate. Assuming the original signal 4612 has a 10 MHz bandwidth centered at 2 GHz, a sampling rate of at least 20 MHz can be used to produce digital word samples of the original signal (e.g., 16 bit words) every 50 ns, however in other embodiments, oversampling the RF frequency of the original signal 4612 can be employed to, for example, preserve the phase of the original signal 4612. Each digital word sample represents a voltage value of the original signal 4612 during a specific sampling time. An ultra-wideband (UWB) pulse generator 4616 can be configured with RF circuitry (such as a mixer, amplifier, antenna) to send time domain UWB pulses, each UWB pulse representative of each bit in the digital word sample. The UWB pulse generator 4616 can be configured, for example, to use a reference signal of 60 GHz to enable the transmission of a 60 GHz pulse that corresponds in the present illustration to two cycles of a sign wave. At 60 GHz this represents a pulse width in the time domain of 33 ps. In one embodiment, the UWB pulse generator 4616 can be configured to transmit a pulse when a bit in the digital word is a "1", and no pulse when the bit in the digital word is a "0". FIG. 46G illustrates a pulse train 4618 of 8 time-domain pulses representing 8 bits in the 16 bit digital word with "1's". Each time-domain pulse illustrated in FIG. 46G corresponds to a two cycle sine wave at 60 GHz (33 ps pulse). The pulse train 4618 also illustrates 8 intermingled slots of 33 ps with no energy representative of 8 bits in the 16 bit digital word with "0's". This is, of course, an illustration and any combination of "1 's" and "0' s" is possible.

In an alternative embodiment, the UWB pulse generator 4616 can be configured to use phase modulation (e.g., binary phase-shift keying or binary PSK). In this embodiment, the UWB pulse generator 4616 would always generate 16 time-domain pulses, each having a width of 33 ps. The UWB pulses, however, may have differing phases. Other modulation techniques for transmitting and receiving UWB electromagnetic wave pulses are contemplated by the subject disclosure.

Figure 46H:
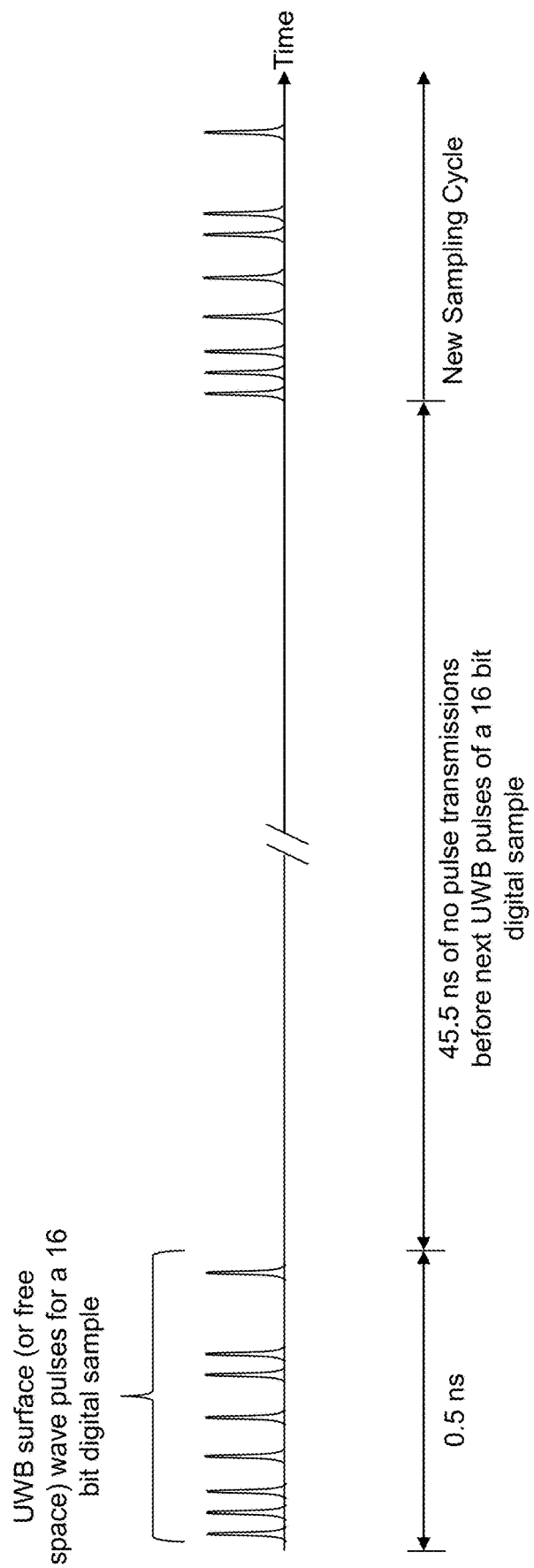
FIGS. 46H and 46I is a graphical diagram illustrating an example, non-limiting embodiment of timing diagrams for exchanging ultra-wideband electromagnetic pulses between communication nodes in accordance with various aspects described herein.
Figure 46I:
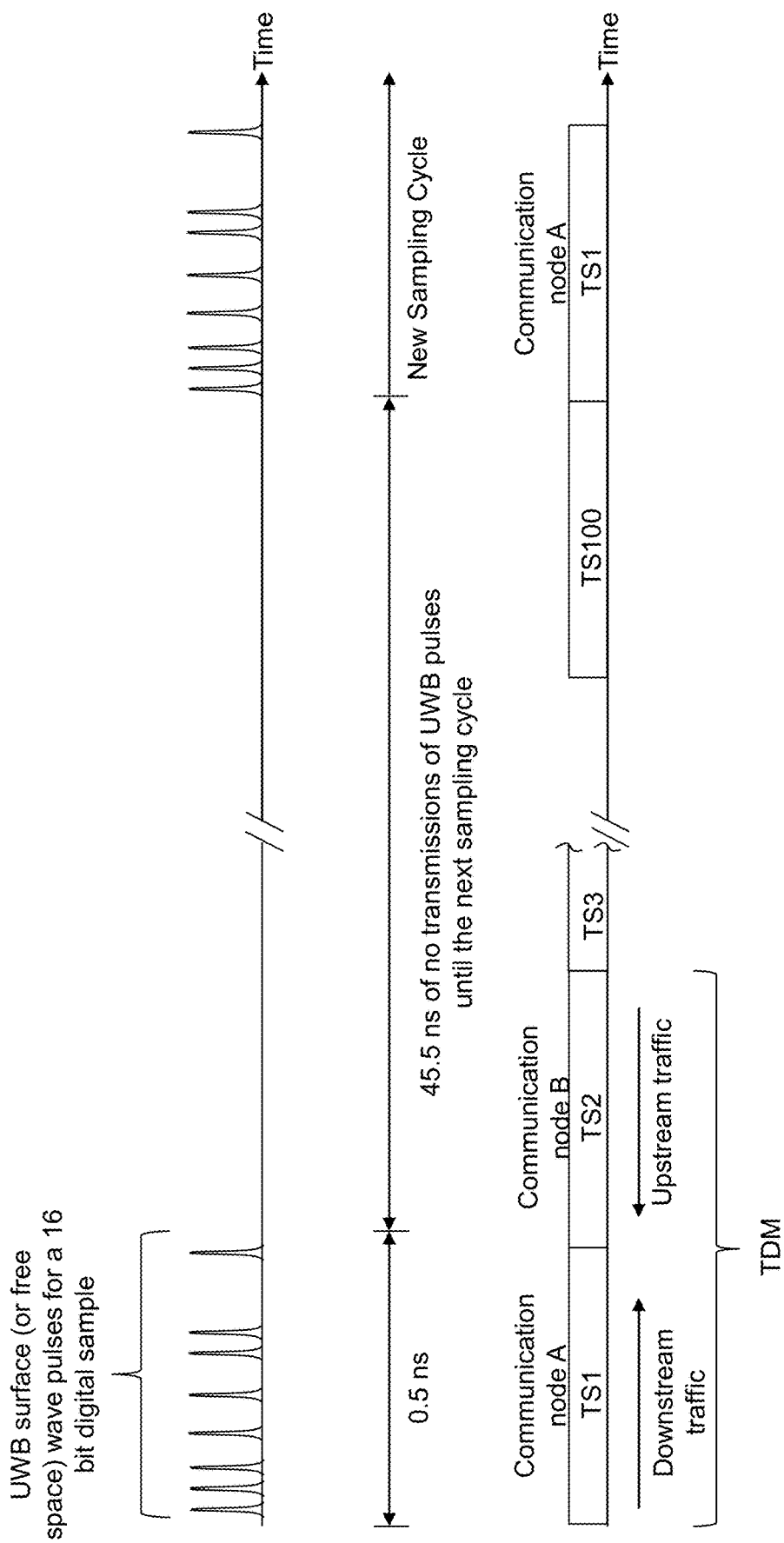

The pulse train 4618 shown in FIG. 46G occupies approximately a 0.5 ns slot (33 ps*16) as shown in FIG. 46H. Since the ADC 4613 produces samples at a rate of one 16 bit digital word sample every 50 ns, there is a period of approximately, 45.5 ns after the pulse train 4618 where no UWB pulses are transmitted until the next 16 bit digital word sample. The 45.5 ns period can be used for time-division multiplexing (TDM) of downstream and upstream communications, thereby enabling two or more waveguide systems to perform bidirectional communications. For example, in FIG. 46I, communication node A can be configured to transmit signals in time slot 1 (TS1) and communication node B can be configured to transmit signals in time slot 2 (TS2). In this configuration, communication node A and communication node B can engage in simultaneous bidirectional communications during each 50 ns sampling period. Communication nodes A and B can also be assigned to multiple time slots, respectively, to enable multiple streams of transmissions, each transmission stream associated with one of a plurality of communication signals (e.g., one of a plurality LTE signals). Communication nodes A and B can represent the master waveguide system 4602 and the recipient waveguide system 4608 of FIG. A (or other combination of waveguide systems shown in FIGS. 46A-46F).

Figure 46J:
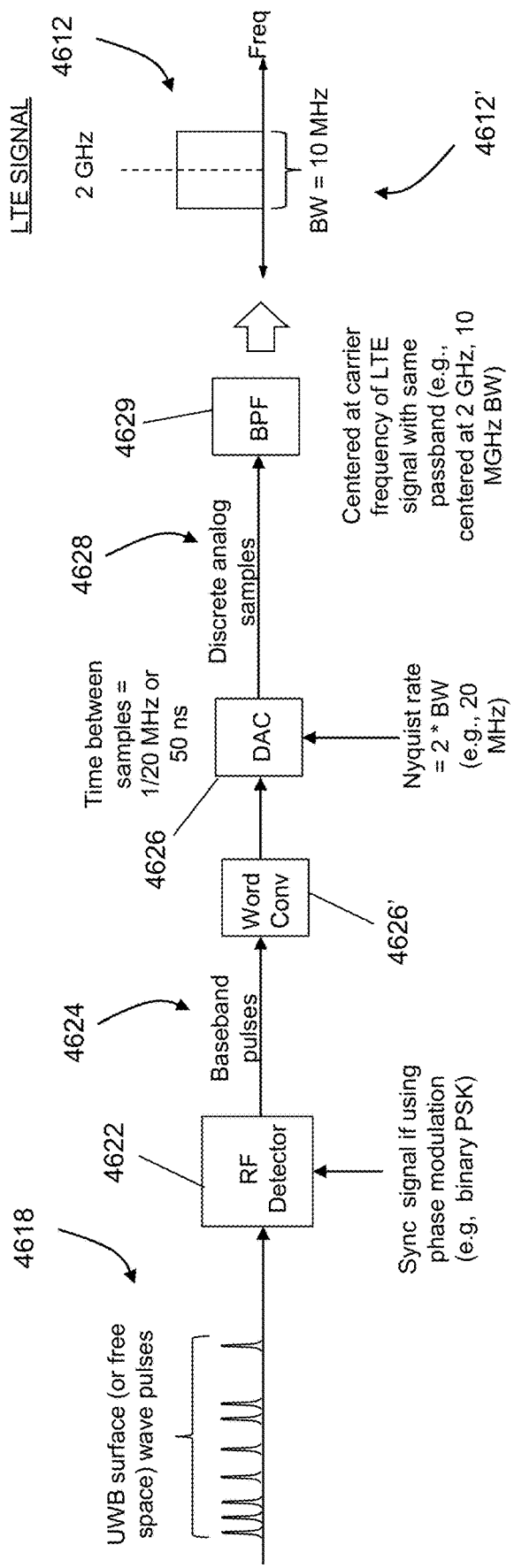
FIG. 46J is a graphical diagram illustrating an example, non-limiting embodiment of a device for receiving ultra-wideband electromagnetic pulses and generating therefrom a communication signal in accordance with various aspects described herein.

FIG. 46J illustrates an embodiment for a receiver 4620 that can be configured to receive the pulse train 4618 generated by the transmitter 4610 of FIG. 46 G, and to obtain an original signal 4612 therefrom (e.g., the original signal sampled by the transmitter 4610 of FIG. 46G). In this embodiment, an RF detector 4622 (e.g., a crystal diode, envelope detector or other detector) can be configured to detect the pulse train 4618 of UWB pulses at a center frequency of 60 GHz and to convert the UWB pulses to baseband pulses 4624 of digital bits (i.e., "1's" and "0's"). In particular, when a pulse in the pulse train 4618 is detected by the RF detector 4622, a digital "1" pulse is generated, while when no pulse is detected a digital "0" pulse is generated. A word converter 4626' (e.g., serial to parallel converter) can be used to generate 16 bit digital words that are supplied to a digital-to-analog converter (DAC) 4626 set to a Nyquist sampling rate equal to the sampling rate used by the ADC 4613 of the transmitter 4610 of FIG. 46G. Upon receiving 16 bit digital words from the word converter 4626', the DAC 4626 generates discrete analog samples 4628 of the original signal 4612. The discrete analog samples 4628 can then be supplied to a bandpass filter (BPF) 4629 which is configured with a passband equal to the bandwidth of the original signal 4612 (e.g., 10 MHz) and centered at the carrier frequency of the original signal 4612 (e.g., 2 GHz). The filtering performed by the BPF 4629 restores the original signal 4612.

Based on the illustrations of FIGS. 46G-46J, the master waveguide system 4602 and the recipient waveguide system 4608 of FIG. 46A can be configured with the transmitter 4610 and the receiver 4620 described above. Accordingly, a transmitter 4610 of the master waveguide system 4602 can be configured, according to the embodiments described above, to transmit a pulse train 4618 (represented by surface wave 4606), which is directed to a downstream recipient waveguide system 4608. A receiver 4620 of the recipient waveguide system 4608 can in turn be configured to extract, according to the embodiments described above, the original signal 4612 (e.g., LTE signal or other signal) from the pulse train 4618, and provide the original signal 4612 to the access point 4607 (via a cable or wireless interface such as infrared or other wireless technology). The access point 4607 can in turn wirelessly distribute the original signal 4612 (e.g., LTE signal or other signal) to a communication device in a vicinity of the access point 4607.

Alternatively, the recipient waveguide system 4608 can be configured to retransmit the pulse train 4618 with the assistance of another waveguide system 4608' managing another span of the transmission medium (e.g., power line). To accomplish this, the recipient waveguide system 4608 can provide the pulse train 4618 (wirelessly or via a cable) to the other waveguide system 4608' managing the other span. The other waveguide system 4608' can be configured to perform signal conditioning (e.g., amplifying, filtering) of the pulse train 4618. Once reconditioned, the other waveguide system 4608' can retransmit the reconditioned pulse train 4618 (represented by surface wave 4606) to another downstream recipient waveguide system 4608, which can be configured to either retransmit the pulse train 4618 using another waveguide system 4608' as described above, or provide an extracted original signal 4612 to the access point 4607 for wireless distribution to a local communication device.

It will be appreciated that the transmitter 4610 of FIG. 46G and the receiver 4620 of FIG. 46J can be adapted according to other embodiments. For example, if phase modulation is used (e.g., binary-PSK), the UWB pulse generator 4616 can also be configured to send a reference signal to a receiver 4620 for purposes of synchronization and phase distortion mitigation. The reference signal can be a preamble of alternating "1's" and "0's". The preamble can be sent as a separate reference signal positioned somewhere in one of the time slots shown in FIG. 46I. The reference signal can also be combined with control information that can be used to assign time slots between pairing waveguide systems for downstream and upstream communications. Alternatively, a reference signal such as a preamble can be transmitted by robbing the least significant bit of one or more 16 bit digital word samples generated by the transmitter 4610. The preamble in turn can be decoded at the receiver 4620 to obtain synchronization information and thereby mitigate distortion (such as phase distortion) experienced by the pulse train 4618.

In yet other embodiments, the transmitter 4610 of FIG. 46G can be configured to use an analog sampler in place of the ADC 4613 (i.e., equivalent to removing the digital conversion circuitry of the ADC). The analog sampler can in turn generate discrete analog samples, each analog sample representing a voltage of the original signal 4612, and each analog sample being generated at a sampling cycle of 50 ns. The UWB pulse generator 4616 can in turn generate time domain UWB pulses (of two 60 GHz sine wave cycles) having an amplitude approximately equal to the voltage of each discrete analog sample. Hence, the UWB pulses no longer represent digital bits, but rather voltage samples of the original signal 4612. The receiver 4620 can in turn be configured to use an RF detector 4622 that regenerates the discrete analog samples at baseband. The word converter 4626' and the DAC 4626 would no longer be necessary. Instead the discrete analog samples generated by the RF detector 4622 can be supplied to the BPF 4629 which reconstructs the original signal 4612.

It will be appreciated that the transmitter 4610 and receiver 4620 of FIGS. 46G and 46J can be configured with an antenna, one or more amplifiers, one or more filters, and other circuitry to transmit and receive wireless UWB electromagnetic wave pulses that propagate between communication nodes in a wireless transmission medium (e.g., air). It will be further appreciated that other UWB pulse modulation techniques for transmitting and receiving UWB pulses (wireless or surface waves) is contemplated by the subject disclosure.

Referring back to FIG. 46G, it will also be appreciated that the surface waves 4606 can be accompanied with a control channel that can be used to instruct the waveguide systems 4608 to retransmit or extract original signals 4612 for subsequent distribution by a corresponding access point 4607 to a local communication device. The control channel can be transmitted in a separate time slot (shown in FIG. 46I) as a pulse train 4618 of UWB electromagnetic wave pulses. In other embodiments, the control channel can be intermixed with the preamble of UWB pulses described earlier, which itself can occupy its own time slot. Alternatively, a control channel can be transmitted without intermixing it with the preamble, but instead by robbing one or more least significant bits from one or more time slots used for data communications between waveguide systems 4608. Other embodiments for transmitting preambles and one or more control channels are contemplated by the subject disclosure.

Referring back to FIG. 46A, a waveguide system 4608' is shown transmitting a pulse train 4618 represented by surface wave 4606 over two spans without a waveguide repeater (e.g., a waveguide system 4608 paired with another waveguide system 4608') at the third utility pole 4605. If, however, a distance of two or more spans results in significant propagation losses in the pulse train 4618, which prevents the pulse train 4618 from successfully reaching the next waveguide system 4608, then a waveguide repeater can be placed at the third utility pole 4605 to enable retransmissions to the next span as shown in FIG. 46B.

Turning now to FIGS. 46C-46F, the network configurations 4600 of the waveguide systems of FIG. 46A can be adapted with waveguide system 4609 paired with waveguide system 4609' on a parallel span as shown in FIG. 46C. Utilizing the additional span for exchanging surface waves 4606' can provide additional transmission bandwidth. An additional span can also provide backup spans if one or more waveguide systems fail, and/or a fault (e.g., an obstruction) is detected on a particular span that prevents the exchange of surface waves 4606 or 4606'. Traffic from one span can be redirected to a parallel span by configuring a waveguide system 4608 to transmit (wirelessly or over a cable) the pulse train 4618 to a neighboring waveguide system 4609, and vice-versa. If propagation losses are two high for propagating surface waves 4606 or 4606' over two spans, repeaters can be added to the third utility pose 4605 as shown in FIG. 46D. FIG. 46E illustrates a situation where no faults are detected on either of the parallel spans enabling surface waves 4606 and 4606' to propagate along the parallel spans. When a fault is detected, such as shown in FIG. 46F illustrated as a "Broken Surface-Wave", the waveguide system 4608 of the broken span can be configured to redirect traffic to a neighboring waveguide system 4609 on the alternate span.

Figure 46K:
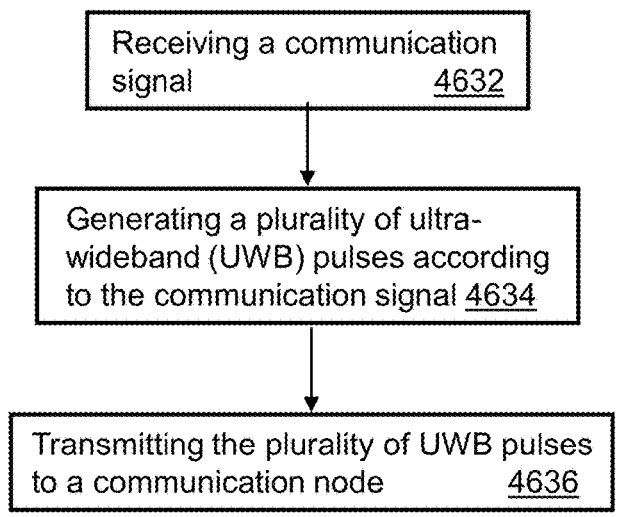
FIG. 46K illustrates a flow diagram of an example, non-limiting embodiment of a method for transmitting ultra-wideband electromagnetic pulses based on a communication signal in accordance with various aspects described herein.

FIG. 46K illustrates a flow diagram of an example, non-limiting embodiment of a method 4630 for transmitting ultra-wideband (UWB) electromagnetic pulses based on a communication signal in accordance with various aspects described herein. Method 4630 can begin with step 4632 in which a system can be configured to receive a communication signal. The system can be a waveguide system or a coupling device that can receive and process the communication signal to generate at step 4634 UWB pulses according to the communication signal. The communication signal can be baseband signals that convey data such as voice, video streams, or non-real data exchanges. The communication signal can also represent modulated signals (e.g., cellular LTE, 5G signals or other signals) in a corresponding frequency band. As noted in the descriptions of FIGS. 46G-46J such communication signals can be converted by a transmitter 4610 to pulse trains 4618 of UWB pulses without modifying the modulation scheme of the communication signals. The transmitter 4610 can in turn transmit the pulse train 4618 at step 4636 as UWB pulses represented by a surface wave 4606 or 4606' that propagates on a physical transmission medium (e.g., reference 4604), or wireless UWB pulses that propagate in a wireless transmission medium such as air.

Figure 46L:
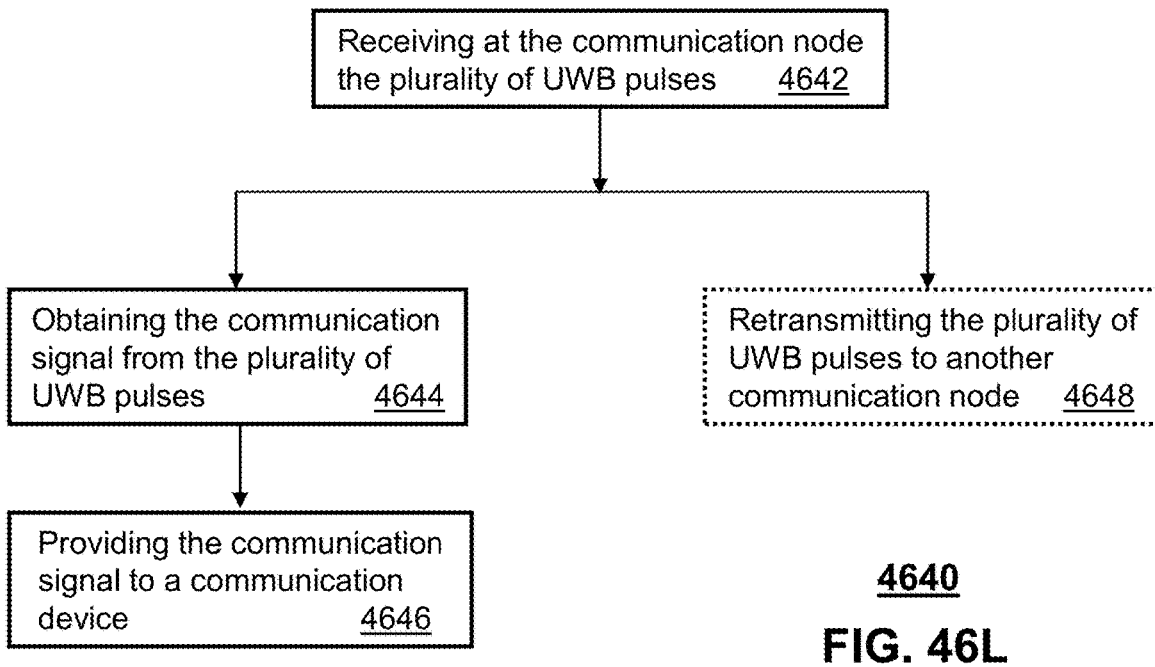
FIG. 46L illustrates a flow diagram of an example, non-limiting embodiment of a method for receiving ultra-wideband electromagnetic pulses and generating therefrom a communication signal in accordance with various aspects described herein.

FIG. 46L illustrates a flow diagram of an example, non-limiting embodiment of a method 4640 for receiving UWB electromagnetic pulses and generating therefrom a communication signal in accordance with various aspects described herein. Method 4640 can begin with step 4642 where a receiver 4620 such as shown in FIG. 46J is configured to receive a pulse train 4618 of UWB pulses represented by surface wave 4606 or 4606'. In one embodiment, the receiver 4620 can be configured to obtain at step 4644 one or more communication signals from the pulse train 4618, and provide at step 4646 the one or more communication signals to one or more corresponding communication devices wirelessly via an access point 4607, as previously described. Alternatively, the receiver 4620 can be configured to retransmit at step 4648 the pulse train 4618 of UWB pulses to a downstream receiver. The receiver 4620 can retransmit the pulse train 4618 by providing it to a repeater that reconditions the UWB pulse before retransmission.

It will be appreciated that the master waveguide system 4602 and the recipient waveguide systems 4608 can be adapted to transmit and/or receive UWB electromagnetic waves that propagate on a surface of a transmission medium (e.g., 4604 and 4604') in place of UWB pulses transmitted or received via a surface of a transmission medium. It will be further appreciated that the master waveguide system 4602 and the recipient waveguide systems 4608 can also be configured to transmit or receive UWB electromagnetic waves (or UWB pulses) that satisfy a Part 15 rule for radio frequency devices promulgated by the Federal Communications Commission (FCC). For example, the master waveguide system 4602 and the recipient waveguide systems 4608 can be adapted to transmit or receive UWB electromagnetic waves (or UWB pulses) having a bandwidth that is one-fifth of a center frequency of the surface wave or 200 MHz or greater to satisfy the FCC's Part 15 rule. Additionally, the master waveguide system 4602 and the recipient waveguide systems 4608 can be configured to transmit such UWB electromagnetic waves (or UWB pulses) at low power (e.g., less than 1 micro-watt). Accordingly, a waveguide system that transmits or receives UWB electromagnetic waves (or UWB pulses) conforming to the FCC's Part 15 rule can operate without a license from the FCC.

Obstructions along a span 4604 of a transmission medium can cause propagation losses of UWB electromagnetic waves (or UWB pulses). For example, UWB electromagnetic waves (or UWB pulses) can experience propagation losses when they traverse a supporting device or supporting structure such as an electrical insulator (e.g., ceramic insulator) 4611 located at each end of a utility pole 4605 used to support both ends of a span 4604 (see FIGS. 46A-46F). To avoid such obstructions, the master waveguide system 4602 can be positioned after an electrical insulator 4611 holding a first end of the span 4604 at a first utility pole 4605, while the recipient waveguide system 4608 can be positioned before the electrical insulator 4611 holding a second end of the span 4604 at a second utility pole 4605. By placing a master waveguide system 4602 and a corresponding recipient waveguide system 4608 in these positions, the UWB electromagnetic waves (or UWB pulses) exchanged between the master waveguide system 4602 and the recipient waveguide system 4608 can avoid traversing the electrical insulators 4611 and thereby circumvent the propagation losses that the UWB electromagnetic waves (or UWB pulses) would have otherwise experienced. The foregoing technique can be used with two recipient waveguide systems 4608 located at both ends of a span 4604; that is, after and before their respective electrical insulators 4611.

Two recipient waveguide systems 4608 positioned close to each other (e.g., 4-6 feet from each other) on both sides of an electrical insulator 4611 of a single utility pole 4605 can be configured to communicate with each other via a cable or wirelessly to avoid exchanging surface wave signals that traverse the electrical insulator 4611 located between the two recipient waveguide systems 4608. The two recipient waveguide systems 4608 positioned between the electrical insulator 4611 of the single utility pole 4605 can also be configured to exchange signals over a cable or wirelessly at unlicensed frequencies (e.g., in a range of 57 GHz-64 GHz).

It will be further appreciated that the access points 4607 shown in FIGS. 46A-46F can be configured to perform downlink drops, uplink reception, and transfer of communication signals from one frequency channel to another frequency channel.

During downlink drops, a waveguide system can provide an access point 4607 one or more communication signals conveyed by UWB electromagnetic waves (or UWB pulses) it has received. The access point 4607 in turn can transmit such signals wirelessly to communication devices. Alternatively, a waveguide system can provide an access point 4607 the UWB electromagnetic waves (or UWB pulses). In this embodiment, the access point 4607 can obtain the one or more communication signals conveyed in the UWB electromagnetic waves (or UWB pulses) and wirelessly transmit them to communication devices. In either embodiment, the waveguide system and/or the access point can perform frequency shifting of the communication signals to their native frequency bands (e.g., cellular bands) before delivering such signals wirelessly to communication devices.

During uplink reception, an access point 4607 can be configured to receive wireless signals from communication devices (e.g., LTE, 5G signals or otherwise) and provide electrical signals derived therefrom to a waveguide system for transport in the UWB electromagnetic waves (or UWB pulses) transmitted by the waveguide system. Prior to transmission of the UWB electromagnetic waves (or UWB pulses), the access point 4607 and/or the waveguide system can be configured to frequency shift the electrical signals for placement in frequency channels of the UWB electromagnetic waves (or UWB pulses).

To reduce cost and power consumption, the recipient waveguide systems 4608 can be configured to use the access point 4607 to transfer signals supplied by the recipient waveguide system 4608 from one frequency channel to another frequency channel. For example, a first recipient waveguide system 4608 that receives UWB electromagnetic waves (or UWB pulses) from a first span can provide the UWB electromagnetic waves (or UWB pulses) or electrical signals derived therefrom to the access point 4607. The UWB electromagnetic waves (or UWB pulses) can include a plurality of frequency channels, each frequency channel conveying a communication signal. The access point 4607 can be configured to transfer a communication signal in one frequency channel to another available frequency channel. Once the transfer is completed, the access point 4607 can provide updated UWB electromagnetic waves (or UWB pulses) or electrical signals to a second recipient waveguide system 4608 that can be configured to transmit the updated UWB electromagnetic waves (or UWB pulses) on a second span 4604.

The transfer of signals between frequency channels can be performed by the access point 4607 with switching technology (e.g., an Ethernet switch). To support the power necessary to operate switching technology, the access point 4607 can be configured to obtain power from a low voltage line located on the utility pole (e.g., 220 V). The recipient waveguide system 4608, on the other hand, can be coupled to a medium voltage power line (e.g., 1000 Volts or higher). The recipient waveguide system 4608 can be designed to consume low power (e.g., 1-2 Watts) by, for example, configuring the recipient waveguide system 4608 to rely on the switching technology of the access point 4607 to transfer signals between channels of a high frequency UWB signal. Accordingly, the recipient waveguide system 4608 can be configured to use a structurally small inductive power supply that can obtain power (e.g., 1-2 Watts) from a medium voltage power line.

It will be appreciated that the foregoing embodiments are applicable to the master waveguide system 4602', recipient waveguide systems 4609 and 4609' respectively, and the transmission medium 4604' shown in FIGS. 46C-46F.

Figure 46M:
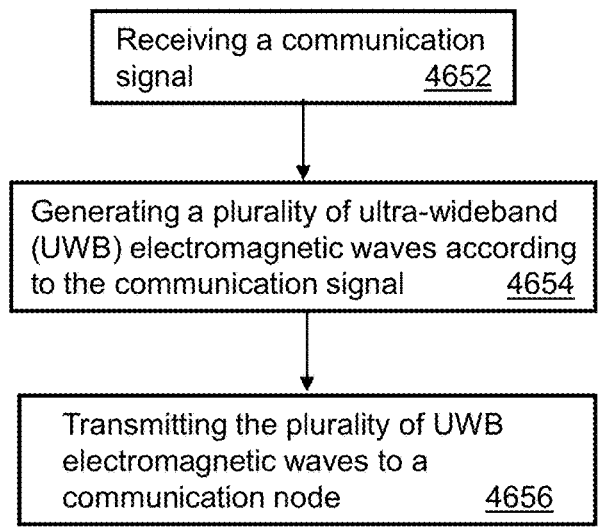
FIG. 46M illustrates a flow diagram of an example, non-limiting embodiment of a method for transmitting ultra-wideband surface waves based on a communication signal in accordance with various aspects described herein.

FIG. 46M illustrates a flow diagram of an example, non-limiting embodiment of a method 4650 for transmitting ultra-wideband (UWB) electromagnetic waves based on a communication signal in accordance with various aspects described herein. Method 4650 can begin with step 4652 in which a system can be configured to receive a communication signal. The system can be a waveguide system or a coupling device that can receive and process the communication signal to generate at step 4654 UWB electromagnetic waves according to the communication signal. The communication signal can be baseband signals that convey data such as voice, video streams, or non-real data exchanges. The communication signal can also represent modulated signals (e.g., cellular LTE, 5G signals or other signals) in a corresponding frequency band. The communication signals can be converted (e.g., frequency-shifted) by a transmitter described in the subject disclosure to UWB electromagnetic waves without modifying the modulation scheme of the communication signals. The transmitter 4610 can in turn transmit the UWB electromagnetic waves at step 4656 as a surface wave 4606 or 4606' that propagates on a physical transmission medium (e.g., reference 4604 or 4604').

Figure 46N:
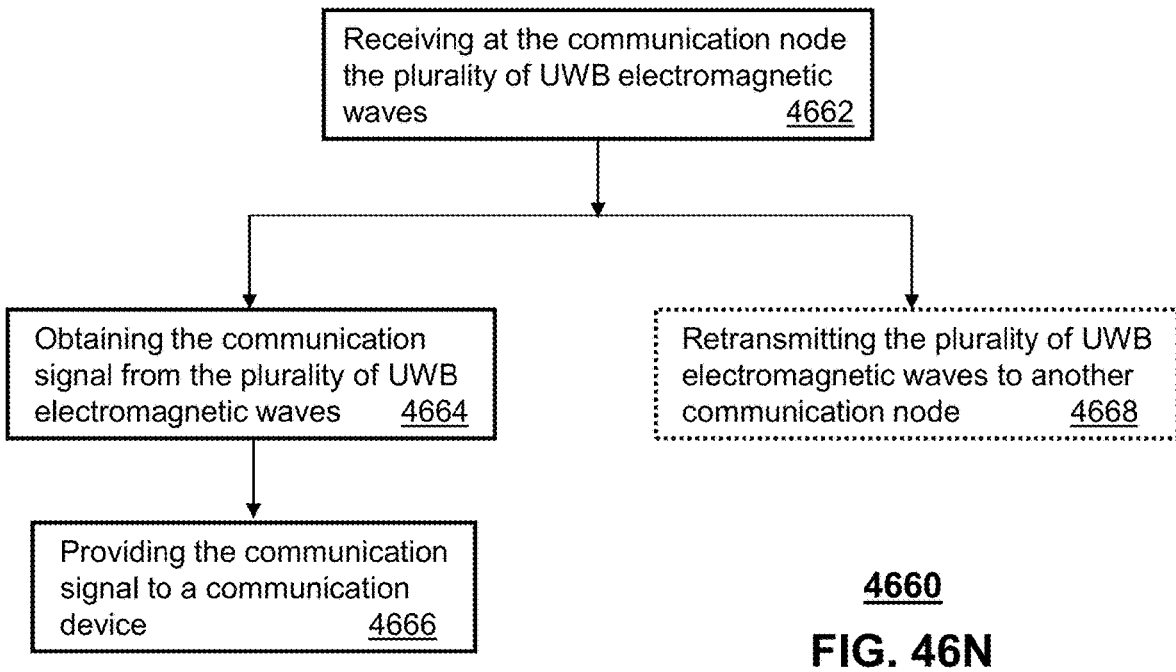
FIG. 46N illustrates a flow diagram of an example, non-limiting embodiment of a method for receiving ultra-wideband surface and generating therefrom a communication signal in accordance with various aspects described herein.

FIG. 46N illustrates a flow diagram of an example, non-limiting embodiment of a method 4660 for receiving UWB electromagnetic waves and generating therefrom one or more communication signals in accordance with various aspects described herein. Method 4660 can begin with step 4662 where a receiver such as described in the subject disclosure is configured to receive UWB electromagnetic waves that propagate as surface waves 4606 or 4606'. In one embodiment, the receiver can be configured to obtain at step 4664 one or more communication signals from the UWB electromagnetic waves, and provide at step 4666 the one or more communication signals to one or more corresponding communication devices wirelessly via an access point 4607, as previously described. Alternatively, the receiver can be configured to retransmit at step 4668 at a portion of the UWB electromagnetic waves to a downstream receiver. The receiver 4620 can retransmit the portion of the UWB electromagnetic waves by providing it to a repeater that reconditions the UWB electromagnetic waves before retransmission.

While for purposes of simplicity of explanation, the respective processes are shown and described as a series of blocks in FIGS. 46K through 46N, respectively, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

It will be appreciated that the transmitter 4610 and receiver 4620 can be collocated on the same device. It will be further appreciated that the network configurations 4600 of the waveguide systems shown in FIGS. 46A, 46B, 46C, 46D, 46E, and 46F can be represented by couplers/launchers (as described in the subject disclosure) that can be adapted to transmit and/or receive surface waves and/or wireless signals. The couplers/launchers can be configured, for example, to transmit and/or receive UWB electromagnetic wave pulses that propagate on a surface of a physical transmission medium such as the cable described in the subject disclosure, and/or can be configured to transmit and/or receive wireless UWB electromagnetic wave pulses that propagate over a wireless transmission medium such as air. Accordingly, any of the couplers/launchers, transmitters, receivers, antennas or other devices described in the subject disclosure which can be configured to transmit and/or receive ultra-wideband electromagnetic wave pulses that propagate on a surface of a physical transmission medium or that propagate as wireless ultra-wideband electromagnetic wave pulses over a wireless transmission medium such as air can be used to perform the embodiments of FIGS. 46A-46L described earlier. It will be further appreciated that any of the embodiments of the subject disclosure can be adapted or modified in whole or in part to use the embodiment described in FIGS. 46A-46L.

Figure 46O:
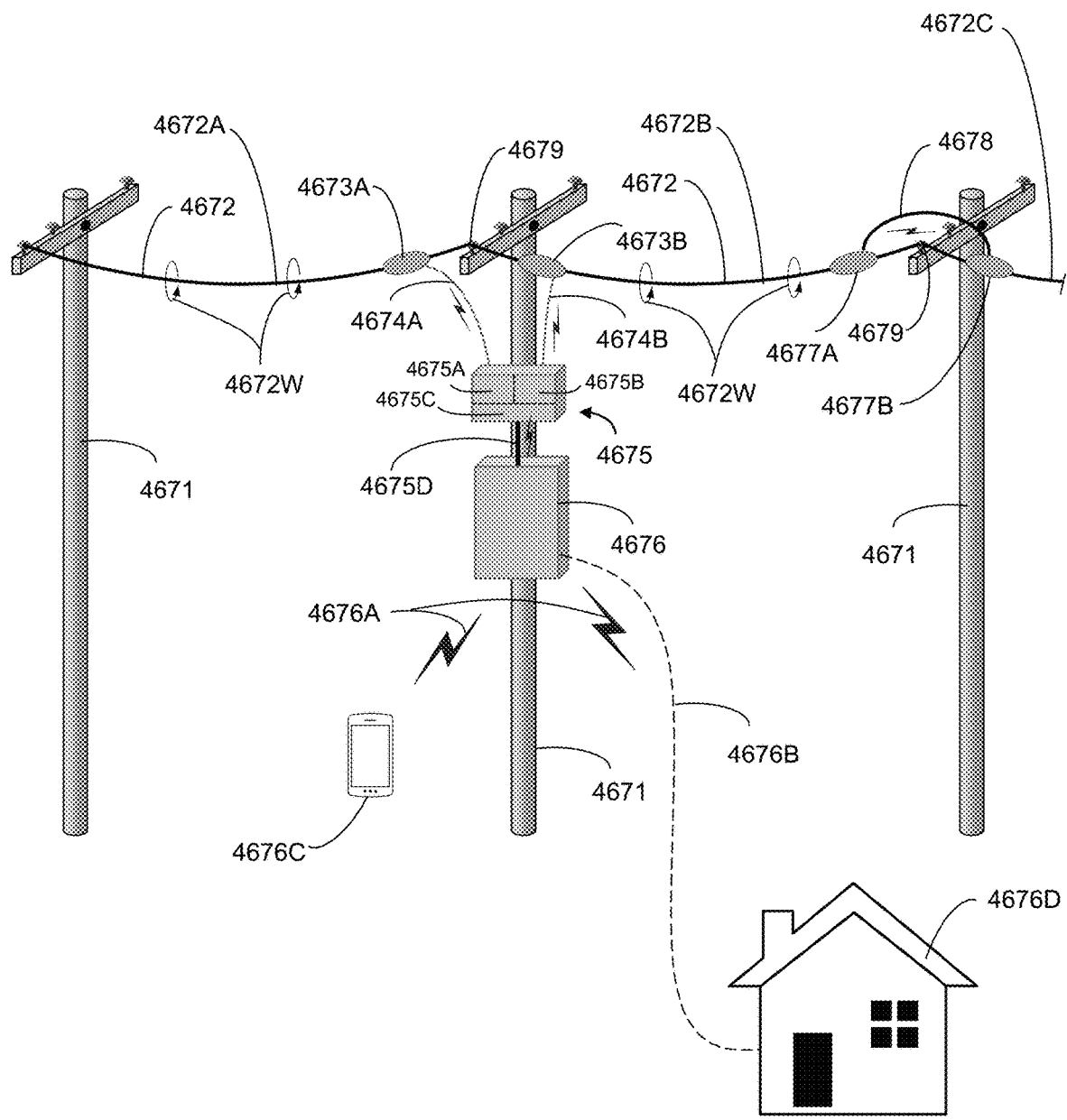
FIG. 46O is a graphical diagram illustrating an example, non-limiting embodiment of a communication system in accordance with various aspects described herein.

FIG. 46O is a graphical diagram illustrating an example, non-limiting embodiment of communication system 4670 in accordance with various aspects described herein. The communication system can comprise waveguide systems 4673A, 4673B, 4677A and 4677B coupled to a transmission medium 4672. It will be appreciated that more or less waveguide systems can be deployed in the communication system 4670, and thus the number of waveguide systems shown in FIG. 46O is for illustrative purposes only.

The transmission medium 4672 of FIG. 46O can include or correspond to insulated or uninsulated conductors such as medium voltage power lines, telecommunication or telephone lines, coaxial cables, or any combination thereof. It will be appreciated that other physical transmission media suitable for the propagation of electromagnetic waves can also be used, including those that are conductive or non-conductive. The waveguide systems 4673A, 4673B, 4677A and 4677B can utilize in whole or in part, or in any combination, the embodiments described in the subject disclosure for transmitting or receiving electromagnetic waves 4672W that propagate along the transmission medium 4672 according to one or more frequency ranges (e.g., 900 MHz-6 GHz, or other microwave or millimeter wave frequencies). The transmission medium 4672 can be supported by a supporting device 4679 fastened to a structure such as a utility pole 4671. The supporting device 4679 can be used for supporting spans 4672A, 4672B, and 4672C of the transmission medium 4672. Each of the spans 4672A, 4672B, and 4672C can be used by each of the waveguide systems 4673A, 4673B, 4677A and 4677B to transmit and receive electromagnetic waves 4672W that propagate along corresponding ones of the spans 4672A, 4672B, and 4672C.

In certain embodiments, the waveguide systems 4673A, 4673B, 4677A and 4677B can be configured to generate electromagnetic waves 4672W using a frequency division multiplexing (FDM) scheme to convey signals and control information by way of spectral segments such as shown in FIGS. 44C, 44D, and 44E for full-duplex communications between the waveguide systems 4673A, 4673B, 4677A and 4677B. In other embodiments, the waveguide systems 4673A, 4673B, 4677A and 4677B can be configured to transmit or receive electromagnetic waves 4672W using wave mode division multiplexing, time division multiplexing, MIMO, or other communication techniques in any combination. In yet other embodiments, the waveguide systems 4673A, 4673B, 4677A and 4677B can be configured to transmit or receive electromagnetic waves utilizing a combination of FDM, time division multiplexing and/or duplexing, or time division multiplexing and frequency division duplexing. It will be appreciated that any duplexing technique can be combined with any multiplexing technique. The signals conveyed by the electromagnetic waves 4672W can include pre-modulated signals that have been frequency-shifted from their native frequency bands (e.g., 800 MHz, 900 MHz, 1.9 GHz, 2.4 GHz, etc.) into corresponding spectral segments of FIG. 44C (e.g., frequency-shifted LTE, 5G, DOCSIS, or other modulated signals). In other embodiments, the signals conveyed by the electromagnetic waves 4672W can include data signals modulated in any suitable modulation scheme for transport of voice, streaming data, packet data, and/or internet traffic.

The control channels conveyed by the electromagnetic waves 4672W can include routing instructions directed to the waveguide systems 4673A, 4673B, 4677A and 4677B for the distribution of the pre-modulated signals and/or data signals. The waveguide systems 4673A, 4673B, 4677A and 4677B can be further configured with inductive power supplies that inductively obtain energy from the transmission medium 4672 in embodiments where the transmission medium conducts current (e.g., a power line). To mitigate power outages, the waveguide systems 4673A, 4673B, 4677A and 4677B can further include a backup power supply, which can also be solar powered.

In certain embodiments, the waveguide systems 4673A, 4673B, 4677A and 4677B can be configured to retransmit electromagnetic waves 4672W received thereby to generate repeated electromagnetic waves 4672W. To simplify the retransmission process, the waveguide systems 4673A, 4673B, 4677A and 4677B can be configured to retransmit the electromagnetic waves 4672W it receives using an analog-to-analog conversion that excludes digital processing. For example, the waveguide systems 4673A, 4673B, 4677A and 4677B can be configured with a transceiver design such as shown in FIG. 14. In the illustration of FIG. 14, electromagnetic waves 4672W can be received by an ingress diplexer, and processed by a number of analog components for retransmission at an egress diplexer (e.g., linear amplifier, filters such as bandpass filters (not shown), one or more mixers that perform frequency-shifting, and on the like). It will be appreciated that other analog processing techniques can be used such as pre-distortion/tilt compensation and equalization. These techniques can be integrated into analog repeaters without demodulating the signal and provide a better quality end result or possibly extend the number of repeater stages in a string. This technique is an enhancement, not a requirement. It will also be appreciated that more or less components shown in FIG. 14 can be used for the retransmission process. Excluding or minimizing digital processing, such as demodulating and baseband processing of digital signals, can significantly reduce the power consumption of the waveguide systems 4673A, 4673B, 4677A and 4677B and consequently the complexity and cost of the inductive power supply used by the waveguide systems 4673A, 4673B, 4677A and 4677B.

In certain embodiments, the waveguide systems 4673A, 4673B, 4677A and 4677B can be configured to regenerate electromagnetic waves 4672W received thereby to generate regenerated electromagnetic waves 4672W. Regeneration of electromagnetic waves 4672W can be useful when there is too much distortion caused by analog-to-analog retransmissions of the electromagnetic waves 4672W (i.e., repeated electromagnetic waves). To overcome such issues, certain waveguide systems can be configured to perform an analog-to-digital conversion of a received electromagnetic wave to generate a digital signal. The waveguide system can then perform digital conditioning of the digital signal (e.g., bit error correction) to remove errors caused by signal distortion (e.g., phase error, jitter, etc.). The waveguide system can also utilize a reference signal, a clock signal, or combination thereof extracted from the electromagnetic waves 4672W during the analog-to-digital conversion to reduce distortion as described in the subject disclosure in relation to FIG. 44E. Once the digital signal has been reconditioned, it can undergo a digital-to analog conversion for retransmission.

The analog-to-digital-to-analog conversion can be performed by a transceiver such as shown in FIG. 14 with the addition of one or more digital signal processors (not shown) to perform signal reconditioning. The process of regenerating an electromagnetic wave can be more power consuming than the process of generating repeated electromagnetic waves as previously described. Accordingly, the inductive power supply of a waveguide system performing regeneration of electromagnetic waves 4672W may be larger, heavier, and more costly than the inductive power supply of a waveguide system performing retransmission of electromagnetic waves 4672W.

In certain embodiments, the waveguide systems 4673A, 4673B, 4677A and 4677B can be configured to supply signals to routing devices that can distribute data in channels conveyed by the electromagnetic waves 4672W to local communication devices, to other waveguide systems, or both. For example, a routing device 4675 can be communicatively coupled to a first waveguide system 4673A over a tethered interface (e.g., optical fiber, coaxial cable, etc.) or a wireless interface 4674A (e.g., RF signals or optical signals). The routing device 4675 can be powered by low voltage power lines (e.g., 220V) not shown in FIG. 46O, although it will be appreciated that any other appropriate power source could likewise be used in alternative embodiments. In one embodiment, the routing device 4673 can be a switch such as an Ethernet switch (referred to herein as switch 4675). The first waveguide system 4673A can be configured to convert the electromagnetic waves 4672W to first signals (e.g., baseband Ethernet signals) that are supplied to the switch 4675 via the tethered or wireless interface 4674A. The conversion to first signals can include frequency-shifting the electromagnetic waves 4672W, demodulating the electromagnetic waves 4672W, or a combination thereof. Such conversion can be performed via circuitry such as shown in FIG. 14 and/or specialized hardware that includes digital signal processing technology (not shown) if demodulation is performed. The first signals can convey data channels and control information previously conveyed by the electromagnetic waves 4672W. The data channels can carry voice communications, internet traffic, streaming data, packetized data, or other suitable forms of data transport. The data channels supplied in the first signals can comprise modulated and/or demodulated signals that have been frequency shifted to baseband and/or intermediate frequencies.

The switch 4675 can be configured with a processing system that includes at least one processor. The processing system of the switch 4675 can be programmed with instructions to obtain from the first signals routing information to determine whether to distribute portions of the data channels in the first signals to an access point 4676, a second waveguide system 4673B, or both. In one embodiment, for example, the switch 4675 can be configured to generate third signals that convey a first portion of the data channels in the first signals to the access point 4676 via a tethered (e.g., optical fiber optic, conductive cable) or wireless interface 4675D (e.g., RF signals or optical signals). In another embodiment, the switch 4675 can be configured to generate fourth signals that convey a second portion of the data channels in the first signals to a second waveguide system 4673B via a tethered (e.g., optical fiber, coaxial cable, etc.) or wireless interface 4674B (e.g., RF signals or optical signals). The third signals supplied to the access point 4676 or the fourth signals supplied to the second waveguide system 4673B can conform to the same protocol used by the first signals (e.g., Ethernet signals). Data channels supplied to the access point 4676 and/or the second waveguide system 4673B can include, without limitation, voice signals, video streams, internet traffic, packetized data, or any other suitable of form of communication data.

If portions of the data channels in the first signals are routed to the second waveguide system 4673B by the switch 4675, the second waveguide system 4673B can in response generate second electromagnetic waves 4672W that convey the portions of the data channels in one or more spectral segments of the second electromagnetic waves 4672W generated by the second waveguide system 4673B. The second electromagnetic waves can be directed to a third waveguide system 4677A via second span 4672B of the transmission medium 4672. If other portions of the data channels are routed to the access point 4676, the access point 4676 can in response identify, from routing information provided in or with the data channels, a communication device to which such data channels are directed to. The access point 4676 can then generate a downlink wireless signal directed to the communication device that conveys in whole or in part the data channels routed to the access point 4676. The communication device can be a portable communication device 4676C or customer premises equipment (CPE) located at a residence or business establishment 4676D (e.g., a set-top box, modem, computer, etc.). It will be appreciated that in certain embodiments, the access point 4676 can transmit signals that convey at least a portion of the data channels over a tethered interface 4676B that are directed to the CPE at the residence or business establishment 4676D.

The access point 4676 can be further configured to receive uplink wireless signals from the portable communication device 4676C or the CPE in the residence or business establishment 4676D. Alternatively, the access point 4676 can receive uplink signals from the CPE via a tethered interface 4676B. The access point 4676 can be configured to convert uplink signals to other signals that conform to the signaling protocol of the switch 4675 (e.g., Ethernet protocol). The switch 4675 can in turn distribute portions of the signals supplied by the access point 4676 to the first waveguide system 4673A, the second waveguide system 4673B, or both based on routing information included in the signals. In some embodiments, the access point 4676 can also be configured to route portions of data channels associated with signals exchanged with the switch 4675 in fixed downlink paths, fixed uplink paths, or both without the use of routing information to determine such paths. It will be appreciated that the switch 4675 can also be configured to use fixed downlink paths, fixed uplink paths, or both for certain data channels of signals exchanged with the communication devices 4676C-4676D via the access point 4676.

It will also be appreciated that access point 4676 can operate as a base station (e.g., macro base station, micro base station, mini base station, or otherwise) capable of demodulating and modulating signals, frequency-shifting signals, and transmitting downlink signals and receiving uplink signals over a wireless or tethered interface. It will also be appreciated that if the signals received by the access point 4676 from the switch 4675 have been pre-modulated according to a modulation scheme (e.g., LTE, DOCSIS, etc.) utilized by the communication devices 4676C-4676D, the access point 4676 can be configured to frequency-shift (if necessary) such signals without demodulating or re-modulating the modulated signals received from the switch 4675. Similarly, the access point 4676 can also be configured to receive modulated signals from the communication devices 4676C-4676D and convey such signals to the switch 4675 without demodulation or re-modulation.

It will be further appreciated that the first waveguide system 4673A can include a modem that demodulates signals associated with the electromagnetic waves 4672W it receives, thereby providing unmodulated downlink signals that can be directed to the switch 4675. The first waveguide system 4673A can be further configured to frequency-shift signals associated with the electromagnetic waves 4672W to an intermediate frequency or baseband frequency. Accordingly, the first waveguide system 4673A can provide demodulated and frequency shifted downlink signals to the switch 4675. The switch 4675 can provide portions of the downlink signals to the access point 4676 and/or to the second waveguide system 4673B.

In this embodiment, the second waveguide system 4673B can be configured to frequency-shift and re-modulate the portions of the signals provided by the switch 4675 to generate modulated and frequency shifted signals and thereby launch electromagnetic waves 4672W that convey the modulated and frequency shifted signals. The electromagnetic waves 4672W can propagate along a second span 4672A of the transmission medium 4672 to a third waveguide system 4677A for additional processing.

Similarly, the access point 4676 can be configured to modulate and frequency-shift the downlink signals provided by the switch 4675 to a native operating frequency and modulation technique used by the communication devices 4676C-4675D. Similarly, the access point 4676 can be configured to demodulate and frequency-shift the uplink signals provided by the communication devices 4676C-4675D and direct the updated uplink signals to the switch 4675 for distribution to the first waveguide system 4673A or the second waveguide system 4673B. The first waveguide system 4673A and/or the second waveguide system 4673B can re-modulate and frequency shift the signals it receives from the switch 4675 and thereby launches electromagnetic waves 4672W that convey the modulated and frequency shifted signals and that propagate along a first span 4672A or second span 4672B, respectively, to other waveguide systems.

In some embodiments, the routing device 4675 can comprise one or more modems. For illustration purposes only, it will be assumed that the routing device 4675 comprises two modems (referred to herein as modem 4675A and modem 4675B), which are coupled to the first waveguide system 4673A and the second waveguide system 4673B, respectively, and to a switch 4675C that functions as previously described. In this embodiment, the first waveguide system 4673A can be configured to obtain signals from electromagnetic waves 4672W it receives over a first span 4672A of the transmission medium 4672. The signals can be frequency converted to generate downlink signals that are frequency shifted to baseband or intermediate frequencies without demodulation, which are provided to the modem 4675A via tethered or wireless interface 4674A. Removing the demodulation (and modulation functions) from the first waveguide system 4673A can simplify its design, production, weight, form factor/size, and power consumption. Accordingly, modem 4675A can serve to demodulate downlink signals supplied by the first waveguide system 4673A. Similarly, the modem 4675B can be configured to demodulate downlink signals supplied by the second waveguide system 4673B.

For example, the modem 4675A can be configured to receive from the first waveguide 4673A downlink signals that convey one or more modulated signals. The modem 4675A can demodulate the downlink signals to generate demodulated downlink signals. The demodulated downlink signals can be supplied to switch 4675C that can perform the functions previously described and direct a portion or all of these signals to the access point 4676 (and/or to modem 4675B for processing and distribution to the second waveguide system 4673B). In this configuration, the access point 4676 can perform the functions previously described above. It will be appreciated that in some embodiments, the access point 4676 can incorporate the functions of the switch 4675C. The access point 4676 can serve as a base station having computing resources to perform operations such as re-modulating signals supplied by the modem 4675A to generate modulated signals according to a modulation scheme utilized by the communication devices 4676C-4676D, and transmit the modulated signals via a downlink path (wireless or tethered) for delivery to the communication devices 4676C-4676D.

Similarly, the access point 4676 can be configured to receive modulated uplink signals from communication devices 4676C-4676D, demodulate these signals to generate demodulated signals that are supplied to the switch 4675C. The switch 4675C can be configured according to routing information obtained thereby through a control channel or otherwise to route portions of the demodulated signals to modem 4675A and/or modem 4675B. The modem 4675A can be configured to modulate the signals provided by the access point 4676 in a modulation scheme used by the first waveguide system 4673A to launch the electromagnetic waves 4672W in span 4672A. Modem 4675B can be configured to modulate the signals provided by the access point 4676 in a modulation scheme used by the second waveguide system 4673B to launch the electromagnetic waves 4672W in span 4672B. The modulation scheme used for launching the electromagnetic waves 4672W (e.g., phase-shift keying, frequency-shift keying, quadrature amplitude modulation, etc.) can differ from the modulation scheme used for signals exchanged between the access point 4676 and the communication devices 4676C-4676D (e.g., OFDMA, SC-FDMA).

In the foregoing embodiments, it will be appreciated that the access point 4676 can be powered by low voltage power lines (e.g., 220V, telephone cable pairs, or coaxial systems) not shown in FIG. 46O or other appropriate power source. It is further appreciated that the access point 4676 can be configured with circuitry similar to FIG. 14 (with the addition of digital signal processors and other common circuitry) to perform modulation, demodulation, frequency-shifting, wireless signal transmissions, and reception of wireless signals of signals exchanged with the communication devices 4676C-4676D and the switch 4675.

It will be further appreciated that any of the foregoing embodiments relating to descriptions of FIG. 46O can be combined in whole or in part. It will also be appreciated that the waveguide systems 4673A, 4673B, 4677A and 4677B can be configured to receive and transmit, respectively, uplink and downlink electromagnetic waves 4672W that propagate along the transmission medium 4672. The uplink and downlink electromagnetic waves 4672W can be propagating simultaneously without interference utilizing frequency division multiplexing, time division multiplexing, wave mode multiplexing, or combinations thereof. It will be further appreciated that the aforementioned direction of communications described for the first and second waveguide systems 4673A and 4673B can also be described in reverse order according to similar embodiments described above.

In addition, some of the waveguide systems 4673A, 4673B, 4677A and 4677B can be configured to repeat or regenerate electromagnetic waves 4672W across spans of the transmission medium 4672. For example, waveguide system 4677A can be communicatively coupled by a tethered (e.g., optical fiber, coaxial cable, etc.) or wireless interface 4678. A supporting device 4679 holding a portion of the transmission medium 4672 between spans 4672B and 4672C (e.g., an insulator supporting a power line) can be bypassed by way of the tethered or wireless interface 4678. Accordingly, the waveguide system 4677A can be configured to generate, responsive to receiving electromagnetic waves 4672W along span 4672B, repeated or regenerated electromagnetic waves 4672W (as described earlier), which can be supplied to waveguide system 4677B via the tethered or wireless interface 4678 for transport in span 4672C. Similarly, the waveguide system 4677B can be configured to generate, responsive to receiving electromagnetic waves 4672W along span 4672C, repeated or regenerated electromagnetic waves 4672W, which can be supplied to waveguide system 4677A via the tethered or wireless interface 4678 for transport in span 4672B. This technique avoids distortion that may be caused by the supporting device 4679 to electromagnetic waves 4672W propagating between spans 4672B and 4672C.

Figure 46P:
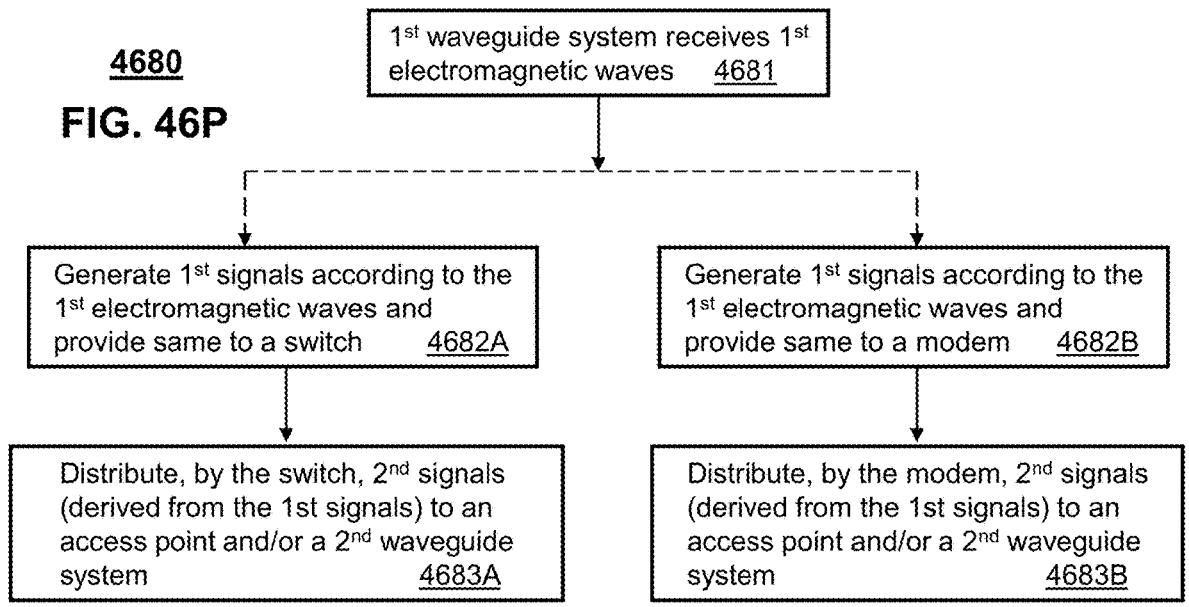
FIG. 46P illustrates a flow diagram of an example, non-limiting embodiment of a method for delivering, by a waveguide, signals to a switch or modem in accordance with various aspects described herein.

FIG. 46P illustrates a flow diagram of an example, non-limiting embodiment of a method 4680 for delivering, by a waveguide, signals to a switch or modem in accordance with various aspects described herein. Method 4680 can begin at step 4681 where a first waveguide system receives first electromagnetic waves propagating along a transmission medium as described in the illustrations of FIG. 46O. In one embodiment, the first waveguide system can be configured to generate, according to the first electromagnetic waves, first signals that are provided to a switch at step 4682A. The switch can be configured to generate, according to the first signals, second signals that can be provided in part to an access point, a second waveguide system, or both at step 4683A. The switch can be configured to obtain routing information from the first signals and route portions of data channels included in the first signals by generating second signals directed to the access point, the second waveguide system, or both. The first signals can be baseband signals or signals at an intermediate frequency. The data channels in the first signals can include demodulated signals, modulated signals, or both.

In other embodiments, the first waveguide system can be configured to generate, according to the first electromagnetic waves, first signals that are provided to a modem at step 4682B as illustrated in FIG. 46O. The modem can be configured to generate, according to the first signals, second signals that can be provided in part to the access point, the second waveguide system, or both at step 4683B as illustrated in FIG. 46O. The modem can be configured to demodulate some or all of the data channels included in the first signals that may have been modulated according to a certain modulation scheme (e.g., OFDMA, SC-FDMA, PSK, QPSK, etc.). The modem can distribute some or all of the demodulated signals to the access point, the second waveguide system, or both. The first signals can be baseband signals or signals at an intermediate frequency. The data channels in the first signals can include demodulated signals, modulated signals, or both.

Figure 46Q:
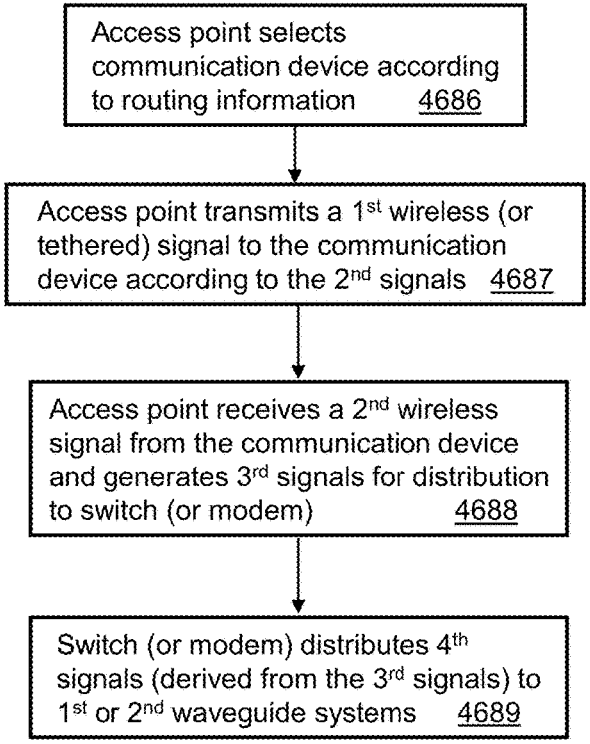
FIG. 46Q illustrates a flow diagram of an example, non-limiting embodiment of a method for processing, by an access point, signals provided by a switch, modem or communication device in accordance with various aspects described herein.

FIG. 46Q illustrates a flow diagram of an example, non-limiting embodiment of a method 4685 for processing, by an access point, signals provided by a switch, modem or communication device in accordance with various aspects described herein. At step 4686 the access point can be configured to select a communication device according to routing information. The routing information can be obtained from second signals provided by the switch or modem. In other embodiments, routing information can be stored in a memory of the access point and may remain static or change over a time period by polling, by the access point, a control channel included in the second signals which provides periodic updates to routing information. At step 4687, the access point can transmit, according to the second signals, a first wireless (or tethered) signal that is directed to the selected communication device. The first wireless (or tethered) signal can include one or more data channels provided in the second signals supplied to the access point.

In certain embodiments, the access point can be configured to conform the data channels to a given signaling protocol of the selected communication device (e.g., LTE, DOCSIS), modulate the data channels according to a modulation technique used by the selected communication device (e.g., OFDM signals), and/or perform frequency shifting to generate the first wireless (or tethered) signals at downlink frequency that the selected communication device is configured to receive the first wireless (or tethered) signals. In other embodiments, the data channels in the second signals may be pre-modulated (e.g., OFDM) conforming to a native signaling protocol (e.g., 5G/LTE) of the selected communication device, thereby foregoing a need for the access point to perform modulation on such data channels. Depending on the operating frequency of the data channels, the access point may or may not require frequency-shifting of the pre-modulated signals before they are converted to the first wireless (or tethered) signals.

The access point can be further configured to process uplink signals generated by the selected communication device at step 4688. For example, the access point can be configured to receive second wireless (or tethered) signals from the selected communication device and thereby generate third signals for distribution to the switch. In one embodiment, the third signals provided to the switch by the access point may remain modulated in the modulation scheme used by the communication device and may also retain the signaling protocol used by the communication device. In one embodiment, the third signals provided to the switch by the access point can comprise demodulated signals generated by demodulating portions of the second wireless (or tethered) signals according to the signaling protocol utilized by the communication device. At step 4689, the switch can redirect portions of the third signals, according to routing information, to produce fourth signals distributed to the first waveguide system, the second waveguide system, or both.

In other embodiments, the third signals generated by the access point are provided to the modem. Such signals may convey signals modulated in the modulation scheme used by the communication device and may also retain the signaling protocol used by the communication device. In this embodiment, the modem may demodulate channels of the third signals or allow the pre-modulated signals to be distributed to first or second waveguide systems as fourth signals without demodulation and/or re-modulation at step 4689. In one embodiment, the third signals provided to the modem by the access point can comprise demodulated signals generated by demodulating portions of the second wireless (or tethered) signals according to the signaling protocol utilized by the communication device. At step 4689, the modem can re-modulate data channels in the third signals and can redirect portions of the third signals, according to routing information, to produce fourth signals distributed to the first waveguide system, the second waveguide system, or both.

Figure 46R:
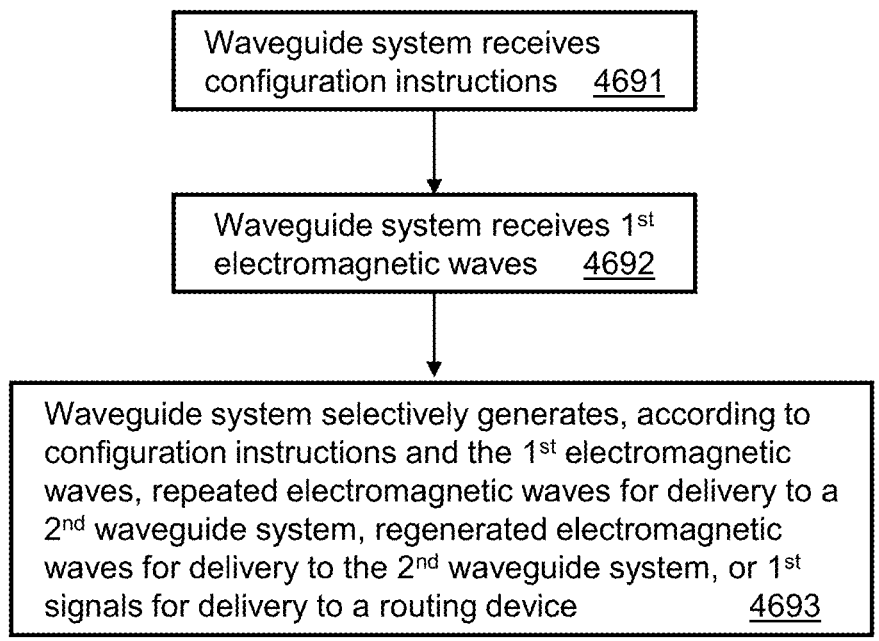
FIG. 46R illustrates a flow diagram of an example, non-limiting embodiment of a method for configuring a waveguide system in accordance with various aspects described herein.

FIG. 46R illustrates a flow diagram of an example, non-limiting embodiment of a method 4690 for configuring a waveguide system in accordance with various aspects described herein. At step 4691, a waveguide system can be configured to receive configuration instructions. The configuration instructions can be received from electromagnetic waves it receives over the transmission medium or from other sources (e.g., an access point by way of a modem or switch, wireless signals, etc.). The configuration instructions can represent executable instructions such as software instructions that can change a modality of the waveguide system. The waveguide system can include hardware to operate in several modalities including without limitation, repeating electromagnetic waves, regenerating electromagnetic waves, or generating first signals to a routing device. Accordingly, the waveguide system can operate as a software-definable network element, which can also be configured according to virtualization techniques described below in relation to FIG. 49. Responsive to receiving first electromagnetic waves propagating along a transmission medium at step 4692, the waveguide system can selectively generate, according to configuration instructions and the first electromagnetic waves, repeated electromagnetic waves for delivery to a second waveguide system, regenerated electromagnetic waves for delivery to the second waveguide system, or first signals for delivery to a routing device as described above in relation to FIG. 46O.

While for purposes of simplicity of explanation, the respective processes are shown and described as a series of blocks in FIGS. 46P, 46Q, and 46R, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

It is further appreciated that the foregoing embodiments of FIGS. 46O, 46P, 46Q, and 46R can be combined in whole or in part with one another, and/or can be combined in whole or in part with other embodiments of the subject disclosure, and/or can be adapted for use in whole or in part with other embodiments of the subject disclosure.

Figure 47A:
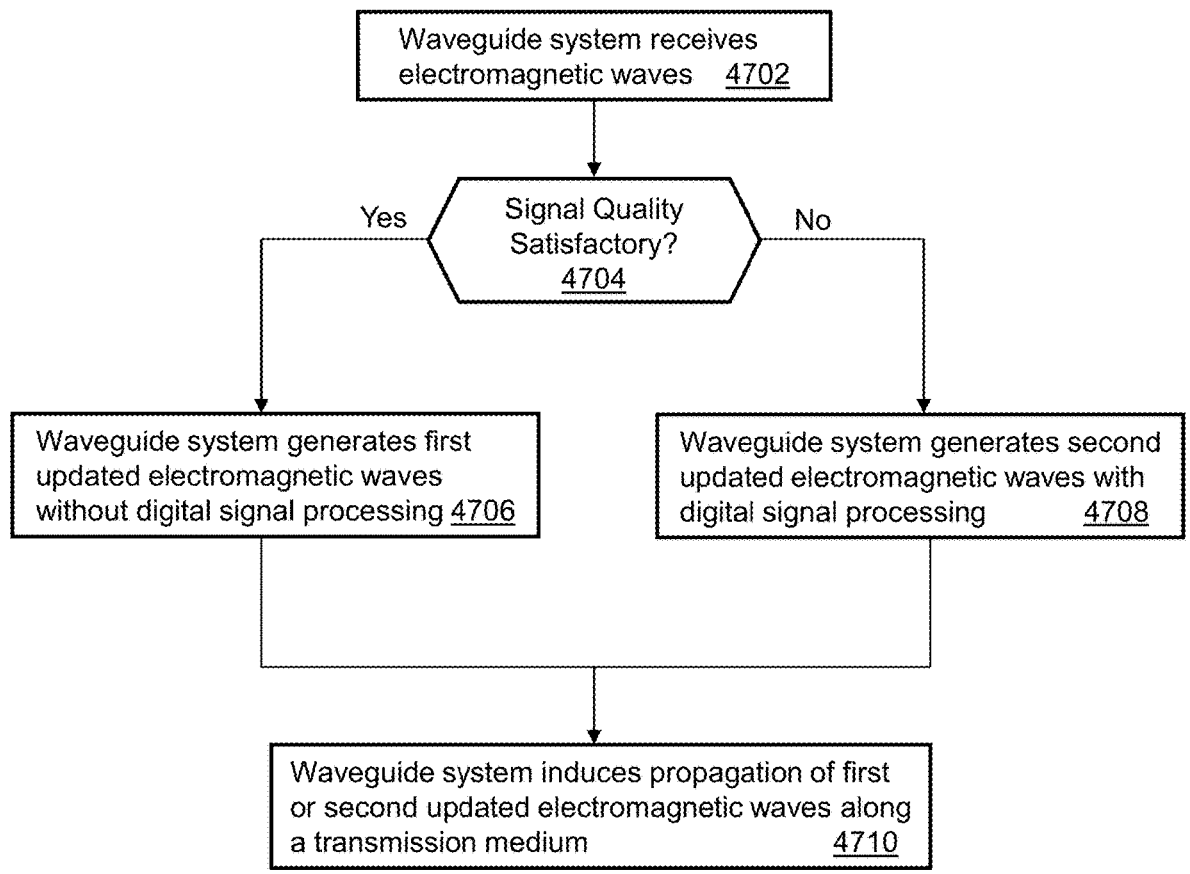
FIG. 47A illustrates a flow diagram of an example, non-limiting embodiment of a method for switching between modes transmission in accordance with various aspects described herein.

FIG. 47A illustrates a flow diagram of an example, non-limiting embodiment of a method 4700 for switching between modes transmission in accordance with various aspects described herein. Method 4700 can be applied to waveguide systems of the subject disclosure configured to transmit and receive electromagnetic waves that propagate along a physical transmission medium such as an insulated or uninsulated wire without requiring an electrical return path to enable such propagation. Method 4700 can begin at step 4702 where a waveguide system receives electromagnetic waves that propagate along a transmission medium. At step 4704 the waveguide system can be configured to measure a signal quality of the electromagnetic waves and determine from the measurement whether the signal quality is satisfactory. In one embodiment, the signal quality can represent a measurement of a signal-to-noise (SNR) level, a measurement of a signal strength level (e.g., received signal strength indication or RSSI), or a combination thereof. It will be appreciated that the signal quality measurement can represent other measurements that can be used to identify signal degradation. For example, the signal quality measurement can include a bit error rate measurement, a jitter measurement, a phase distortion measurement, a quality of service measurement, a signal reflection measurement for determining a propagation loss of the electromagnetic waves, and so on.

At step 4704, the signal quality measurement can be compared to a threshold which can be represented by an expected or desirable signal quality range. For example, the measured signal quality measurement can be a measured SNR that is compared to a desired SNR level that serves as a threshold for satisfactory operations. If the measured SNR meets or exceeds the desired SNR, the signal quality measured at step 4704 would be considered satisfactory and the waveguide system would then proceed to step 4706. If the measured SNR falls below the desired SNR, the signal quality measured at step 4704 would be considered unsatisfactory and the waveguide system would then proceed to step 4708 to mitigate the signal degradation. Signal degradation can be caused by any number of factors such as, but not limited to, repeater degradation (e.g., too many retransmissions without digital signal processing), a malfunction of a transmitting waveguide system, an obstruction or discontinuity (e.g., sharp angle) on the transmission medium causing propagation losses, and so on.

It will be appreciated that the waveguide system can be configured to perform more than one measurement and more than one comparison against one or more signal quality thresholds. It will be further appreciated that a service provider can configure a waveguide system with criteria identifying one or more desirable signal quality thresholds that must be satisfied and one or more other desirable signal quality thresholds that need not always be satisfied but can cause the waveguide system to report a warning, track and report measurements, and so on.

When the signal quality measurement is considered satisfactory based on one more thresholds established by the service provider, the waveguide system can proceed to step 4706 where it generates first updated electromagnetic waves based on signal conditioning that avoids performing digital signal processing on the electromagnetic waves received at step 4702. In one embodiment, the waveguide system can be configured to perform signal conditioning of analog signals associated with the electromagnetic waves utilizing stages of amplification, stages of frequency-shifting (e.g., down-shifting, up-shifting), stages of filtering (e.g., bandpass, low pass, and/or notch filtering), and/or stages of phase adjustment (e.g., using a pilot signal) without performing digital signal processing on digital signals conveyed by the electromagnetic waves received at step 4702.

In one embodiment, the aforementioned stages can be performed without conversion of analog signals associated with the electromagnetic waves to digital signals using, for example, an analog-to-digital converter (ADC) and thus avoiding digital signal processing of digital signals conveyed by the electromagnetic waves, which can consume a significant amount of power. The updated analog signals generated by the aforementioned stages result in updated electromagnetic waves, which the waveguide system can use to induce at step 4710 their propagation along a transmission medium according to techniques described by the subject disclosure.

In other embodiments, analog to digital conversion using an ADC may be employed without digital signal processing of the digital signals generated by the ADC. For example, the ADC can be utilized to convert analog signals of the electromagnetic waves to digital signals. The digital signals generated by the ADC can be converted back to updated analog signals utilizing a DAC (Digital to Analog Converter) without performing digital signal processing on the digital signals (i.e., without bit error detection and correction) supplied to the DAC. The updated analog signals generated by the ADC/DAC combination result in updated electromagnetic waves, which the waveguide system can use to induce at step 4710 their propagation along a transmission medium according to techniques described by the subject disclosure. The conversions performed by the ADC and DAC can be performed in combination with the amplification, frequency-shifting, filtering and/or phase adjustment stages without processing or modifying the digital signals generated by the ADC.

Referring back to step 4704, if the signal quality measurement is considered unsatisfactory based on one more thresholds established by the service provider, the waveguide system can proceed to step 4708 where it generates second updated electromagnetic waves. Analog signals associated with the electromagnetic waves can be converted to digital signals by an ADC. Before or after the ADC conversion, amplification, filtering, frequency shifting, and/or phase adjustment techniques may be applied using analog or digital processing techniques. To improve the fidelity of the electromagnetic waves, signal conditioning can be applied to the digital signals generating by the ADC. For example, digital error detection and/or correction techniques can be used to detect and correct bit errors to generate updated digital signals. The updated digital signals can then be converted by a DAC to analog signals resulting in updated electromagnetic waves. The waveguide system can then induce at step 4710 propagation of the updated electromagnetic waves along a transmission medium according to techniques described by the subject disclosure.

Bit errors may be caused by signal degradation, burst errors, or other sources of interference. Signal degradation may be caused by an obstruction on the transmission medium (e.g., film of water, a tree limb, etc.), exceeding a threshold of retransmissions without digital signal processing, or a combination thereof. Performing signal conditioning by employing digital signal processing at high frequencies (e.g., 30-60 GHz) with one or more high speed digital signal processors (DSPs) can result in a high power consumption (e.g., 5 Watts), while performing signal conditioning without digital signal processing (e.g., analog-to-analog conditioning or analog-to-digital-to-analog without digital signal processing) can require much less power consumption (e.g., 0.5 Watts). Accordingly, when possible, employing the repeater-transmissions techniques of step 4706 is more desirable than employing the repeater-transmissions techniques of step 4708.

It will be appreciated that method 4700 as described above can be performed by a sole waveguide system such as those described by the subject disclosure. Alternatively, the waveguide system can be configured as a first waveguide device 4677A and a second waveguide device 4677B communicatively coupled by a tethered or wireless interface 4678 as illustrated in FIG. 46O. In this illustration, the first waveguide device 4677A can perform steps 4702 and 4704 and inform the second waveguide device 4677B whether the signal quality measured is satisfactory or unsatisfactory. If the first waveguide device 4677A indicates the signal quality measured is satisfactory, the second waveguide device 4677B can then perform steps 4706 and 4710 without performing digital signal processing on signals provided thereto over the tethered or wireless interface 4678 by the first waveguide device 4677A.

If the first waveguide device 4677A indicates the signal quality measured is unsatisfactory, the second waveguide device 4677B can then perform steps 4708 and 4710 by performing digital signal processing on signals provided thereto over the tethered or wireless interface 4678 by the first waveguide device 4677A. Alternatively, the first waveguide device 4677A can be configured to perform method 4700, while the second waveguide device 4677B is configured to perform only steps 4706 and 4710 based on conditioned signals provided by the first waveguide device 4677A according to method 4700.

It will be appreciated that method 4700 is applicable to first electromagnetic waves flowing into the first waveguide system 4677A and retransmitted by the second waveguide system 4677B, as well as, second electromagnetic waves flowing into the second waveguide system 4677B and retransmitted by the first waveguide system 4677A. It is further appreciated that in an embodiment where the waveguide system is a single device, the waveguide system can be configured to receive and retransmit first and second electromagnetic waves flowing into the waveguide system from two or more spans connected to the waveguide system according to method 4700.

Figure 47B:
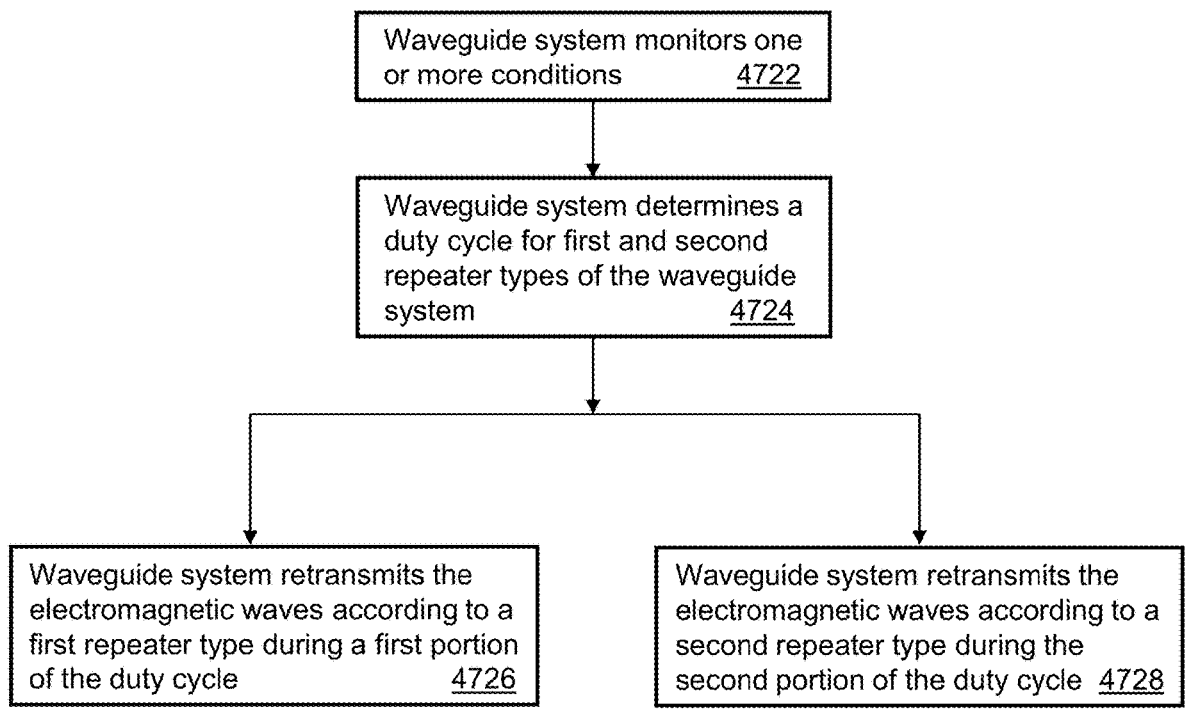
FIG. 47B illustrates a flow diagram of an example, non-limiting embodiment of a method for switching between modes transmission in accordance with various aspects described herein.

FIG. 47B illustrates a flow diagram of an example, non-limiting embodiment of a method 4720 for switching between modes transmission in accordance with various aspects described herein. Method 4720 can be applied to waveguide systems of the subject disclosure configured to transmit and receive electromagnetic waves that propagate along a physical transmission medium such as an insulated or uninsulated wire without requiring an electrical return path to enable such propagation. Method 4720 can begin at step 4722 where the waveguide system monitors one or more conditions which can be used to select one of several possible modes of transmission. The one or more conditions can include a signal quality of the electromagnetic waves, a charging capacity of a storage device of the waveguide system, a range of energy a power supply of waveguide system is able to draw from the transmission medium, a time of day of operation of the waveguide system, one or more user-generated condition, or combinations thereof.

The signal quality of the electromagnetic waves can include the signal measurement types described earlier (e.g., SNR, RSSI, bit error rate, jitter, etc.). As will be describe below, the charging capacity of the storage device of the waveguide system, a range of energy a power supply of waveguide system is able to draw from the transmission medium, and a time of day of operation of the waveguide system can singly or in combination be used to select a duty cycle of repeater types of the waveguide system. Additionally, one or more user-generated conditions can be established by, for example, a service provider for selecting one or more corresponding duty cycles of repeater types of the waveguide system. Also, a service provider can generate user-generated input to invoke in real-time a change to a duty cycle of repeater types of the waveguide system. Alternatively, the service provider can configure a waveguide system to select a duty cycle according to user-generated thresholds associated with the above conditions (e.g., for signal quality X use duty cycle Y, for signal quality Y use duty cycle Z, etc.).

Referring back to method 4700, a first mode of transmission can be represented by the combination of steps 4706 and 4710 illustrated in FIG. 47A. These steps involve the retransmission of electromagnetic waves received at step 4702 by carrying out signal conditioning of the electromagnetic waves without performing digital signal processing of digital signals as previously described. The first mode of transmission will be referred to as a first repeater type. A second mode of transmission can be represented by the combination of steps 4708 and 4710 illustrated in FIG. 47A. These steps involve the retransmission of electromagnetic waves received at step 4702 by carrying out signal conditioning of the electromagnetic waves with digital signal processing as previously described. The second mode of transmission will be referred to as a second repeater type.

Although the subject disclosure that follows describes two modes of transmission, each associated with a corresponding repeater type, it will be appreciated that these embodiments are non-limiting illustrations and that more than two modes transmission and corresponding repeater types can be applied to the subject disclosure. For example, each of the following illustrations can be considered a different mode of transmission and corresponding repeater type: 1) analog-to-analog signal conditioning of the electromagnetic waves without digital signal processing applied to digital signals conveyed by the electromagnetic waves, 2) analog-to-digital-to-analog signal conditioning of the electromagnetic waves without digital signal processing applied to digital signals conveyed by the electromagnetic waves, and 3) analog-to-digital-to-analog signal conditioning of the electromagnetic waves with digital signal processing applied to digital signals conveyed by the electromagnetic waves. Software functions and hardware circuitry of a waveguide system can be utilized in numerous configurations, each can also be considered a different mode of transmission and corresponding repeater type. Although an exhaustive list of modes of transmission and corresponding repeater types is not described by the subject disclosure such modes of transmission and repeater types is contemplated by the subject disclosure as embodiments that are applicable to method 4720.

Referring back to subject matter described above, the first repeater type does not perform digital signal processing on digital signals conveyed by the electromagnetic waves. Accordingly, the power consumed by the first repeater type can be significantly less than the power consumed by the second repeater type which performs digital signal processing on digital signals (e.g., 0.5 Watts for the first repeater type and 5 Watts for the second repeater type). It is also noted that selecting a duty cycle that increases the utilization of the first repeater type can have several advantages.

For example, suppose the duty cycle of the first repeater type and the second repeater type are equal (i.e., 50/50). Further suppose the maximum required wattage for the first repeater type is 0.5 Watts and the maximum wattage for the second repeater type is 5 Watts, and that the waveguide system is equipped with an inductive power supply that draws energy from the transmission medium (e.g., a power line) to power the first and second repeater types, respectively. In this configuration, the inductive power supplies 0.5 Watts while the first repeater type is in operation for half the duty cycle, and 5 Watts while the second repeater type is in operation during the second half of the duty cycle. Accordingly, the average power consumed is 2.75 Watts. If the second repeater type were utilized at all times the average power consumption would be 5 Watts. Hence, a duty cycle that includes the first repeater type reduces overall power consumption (in the above illustration by 50%).

Now suppose that the waveguide system is also equipped with a storage device (e.g., a rechargeable battery, one or more rechargeable super capacitors, combinations thereof, etc.) that is used to assist in power management of the first repeater type and second repeater type. In this configuration, the inductive power can be configured, for example, to supply 2.75 Watts. When the first repeater type is active, the inductive power supply can supply 0.5 Watts to power the first repeater type, and 2.25 Watts to charge the storage device. When the duty cycle switches to the second repeater type, the inductive power supply can supply 2.75 Watts and the storage device can contribute an additional 2.25 Watts to collectively provide 5 Watts to power the second repeater type. In this illustration and the prior, the average power consumption remains at 2.75 Watts. However, in the present illustration, use of a storage device can significantly reduce a size of a magnetic core of the inductive power supply (e.g., by 50% for a lossless storage device or slightly less if limitations of the storage device are considered). If, for example, a size of the magnetic core of the inductive power supply can be reduced by 50% using a storage device, when compared to the magnetic core of the inductive power supply of the first illustration above, such a reduction can significantly decrease the weight and dimensions of the waveguide system and may also decrease cost.

It is further noted that when the duty cycle of the first repeater type is greater than the second repeater type, the average power consumption will be less than 2.75 Watts in the illustrations above. When such a duty cycle is consistent, and the waveguide system is equipped with a storage device for power management purposes, the size of the magnetic core can be reduced even further than described above.

It is also noted that the term duty cycle as described in the subject disclosure can refer to a period in time in which a combination of the first repeater type and the second repeater type is in use at different times and duration, or a time period in which the first repeater type or the second repeater type is in use, but not both. It will be further appreciated that in one embodiment the duty cycle period may have a fixed time period, while in other embodiments the duty cycle period may have a variable time period. In either embodiment, application of method 4720 by the waveguide system may result in 1) a use of the first repeater type that exceeds the use of the second repeater type during a duty cycle period (e.g., 70%/30%, 80%/20%, 100%/0%), 2) a use of the second repeater type that exceeds the use of the first repeater type during the duty cycle period (e.g., 70%/30%, 80%/20%, 100%/0%), or 3) a use of the first repeater type that equals the use of the first repeater type during the duty cycle period (50%/50%). These embodiments are applicable to the subject disclosure that follows.

Referring back to step 4722 of method 4720, the waveguide system can be configured to monitor one or more conditions such as a signal quality of the electromagnetic waves, a charging capacity of a storage device of the waveguide system, a range of energy a power supply of waveguide system is able to draw from the transmission medium, a time of day of operation of the waveguide system, one or more user-generated conditions, or combinations thereof. For instance, if the signal quality (e.g., SNR and/or signal strength, or other measurable signal parameter) is below a desired threshold, the waveguide system can choose a duty cycle at step 4724 that compensates for signal degradation by increasing the duty cycle of the second repeater type which carries out signal conditioning with digital signal processing techniques (e.g., bit error detection and correction of digital signals conveyed by the electromagnetic waves) to improve the signal quality of the electromagnetic waves retransmitted to a downstream waveguide system. If the charge capacity of a storage device of the waveguide system decreases (e.g., drops from 2.25 Watts to 2 Watts due to a degradation in, for example, the storage cells of the storage device), the waveguide system can be configured at step 4274 to choose a duty cycle that compensates for the degradation in storage capacity of the storage device by decreasing the duty cycle of the second repeater type and alternately increasing the utility of the first repeater type during the duty cycle. In this embodiment, the waveguide system can submit an alarm signal to the network management system 1601 to invoke a maintenance schedule to replace or repair the storage device.

In another embodiment, the waveguide system can be configured to measure how much energy can be drawn by the inductive power supply of the waveguide system from the transmission medium. For example, in off-peak hours (e.g., 12 am-5 am) energy drawn from power lines by businesses and residences may be substantially lower than at other times of the day. During off-peak hours, communication activities may also be less active, and the amount of energy an inductive power supply can draw from the power line may be decreased due to the lower energy flowing through the transmission medium. Accordingly, the waveguide system can be configured at step 4274 to choose a duty cycle that compensates for the reduction in communication activities and/or in energy that can be drawn by the inductive power supply by decreasing the duty cycle of the second repeater type and thereby increasing the use of the first repeater type. The waveguide system can also be configured to obtain and/or gather historical time-of-day data associated with communication activities and/or energy flow in a transmission medium. Accordingly, on select time-of-day periods, the waveguide system can be configured at step 4274 to choose a duty cycle that compensates for a reduction in communication activities and/or energy that can be drawn by the inductive power supply by decreasing the duty cycle of the second repeater type and thereby increasing the use of the first repeater type. On other select time-of-day periods, the waveguide system can be configured at step 4274 to choose a duty cycle that compensates for an increase in communication activities and/or takes advantage on an increase in energy that can be drawn by the inductive power supply by increasing the duty cycle of the second repeater type and thereby reducing the use of the first repeater type.

The waveguide system can also be configured at step 4724 to choose a duty cycle based on one or more user-generated conditions monitored at step 4722. For example, a service provider can initiate in real-time a change to a duty cycle of repeater types of the waveguide system by causing the network management system 1601 to generate a signal directed to the waveguide system to recognize a condition that is to be immediately acted upon by the waveguide system to reconfigure the duty cycle of the first and second repeater types. Alternatively, the service provider can configure via the network management system 1601 a waveguide system to select a duty cycle according to time of day settings, and/or set thresholds associated with the above monitored conditions (e.g., for signal quality X1 use duty cycle Y1, for signal quality X2 use duty cycle Y2, for time of day period X3 use duty cycle Y3, for time of day period X4 use duty cycle Y4, etc.).

It will be appreciated that method 4720 as described above can be performed by a sole waveguide system such as those described by the subject disclosure. Alternatively, the waveguide system can be configured as a first waveguide device 4677A and a second waveguide device 4677B communicatively coupled by a tethered or wireless interface 4678 as illustrated in FIG. 46O. In this illustration, the first waveguide device 4677A can perform steps 4722 and 4724 and inform the second waveguide device 4677B and provide a duty cycle to perform steps 4726 and 4728. Alternatively, the first waveguide device 4677A can be configured to perform method 4720, while the second waveguide device 4677B is configured to perform only steps 4706 and 4710 of method 4700 based on conditioned signals provided by the first waveguide device 4677A according to method 4720.

It will be further appreciated that method 4720 is applicable to first electromagnetic waves flowing into the first waveguide system 4677A and retransmitted by the second waveguide system 4677B, as well as, second electromagnetic waves flowing into the second waveguide system 4677B and retransmitted by the first waveguide system 4677A. It is further appreciated that in an embodiment where the waveguide system is a single device, the waveguide system can be configured to receive and retransmit first and second electromagnetic waves flowing into the waveguide system from two spans connected to the waveguide system according to method 4720.

Figure 47C:
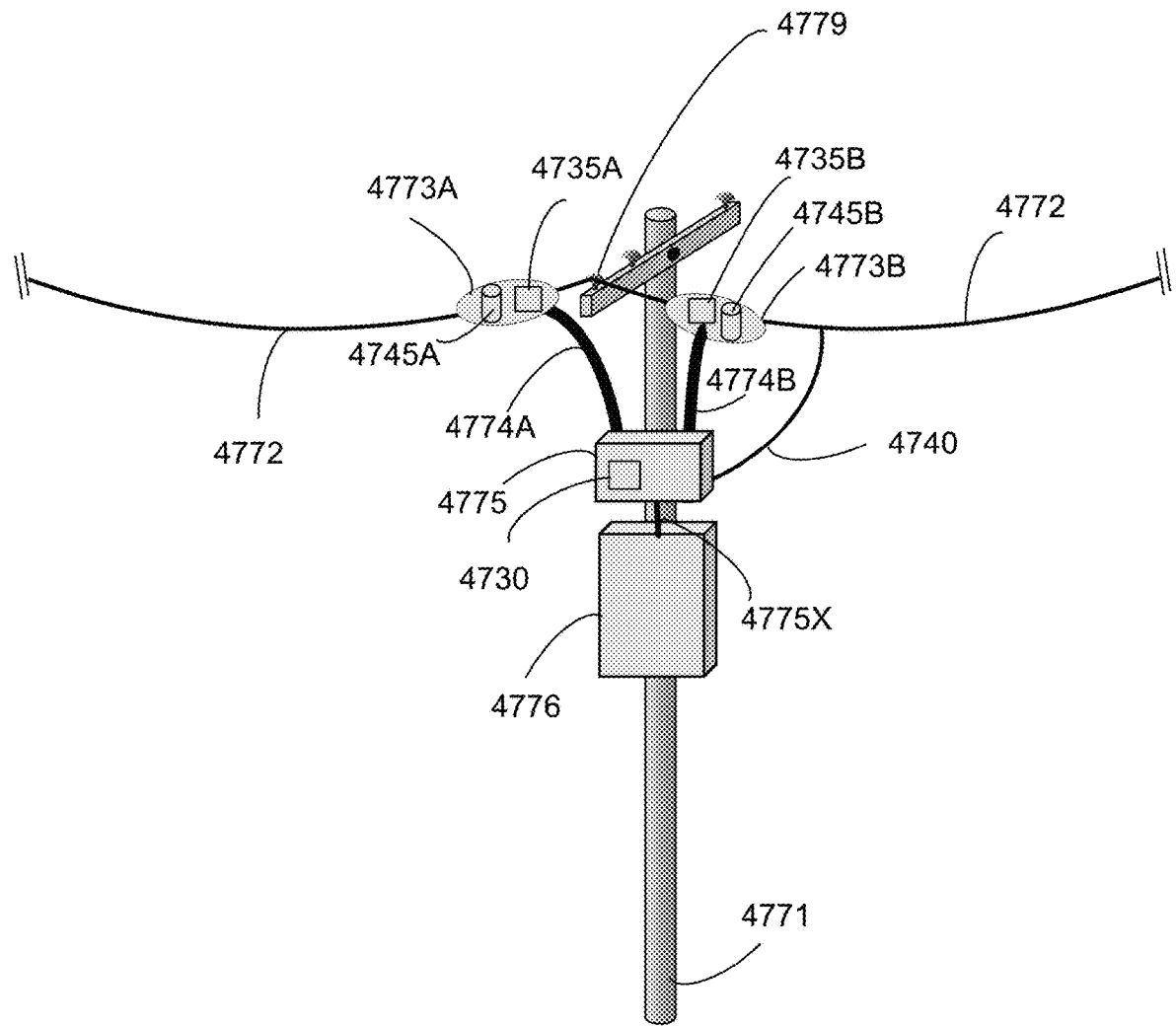
FIG. 47C is a graphical diagram illustrating an example, non-limiting embodiment of a communication system that delivers optical power in accordance with various aspects described herein.

FIG. 47C is a graphical diagram illustrating an example, non-limiting embodiment of communication system 4770A in accordance with various aspects described herein. The communication system 4770A can comprise one or more waveguide systems 4773 (only two of which are shown as 4773A, 4773B and collectively referred to as 4773) coupled to a transmission medium 4772 (only two spans of which are shown). It will be appreciated that more or less waveguide systems can be deployed in the communication system 4770A, and thus the number of waveguide systems shown in FIG. 47C is for illustrative purposes only. The waveguide systems 4773 can be various types of waveguide systems as described herein which can facilitate generating, transmitting and/or receiving electromagnetic waves (which can convey data associated with a communication service that can be user data and/or network data) that propagate along a transmission medium without requiring an electrical return path.

System 4770A provides various devices and/or various techniques that facilitate delivering power to the waveguide system(s) 4773 to enable operations of one, some or all of the components of the particular waveguide system(s) for facilitating one or more communication services including voice, video, data and/or messaging services. As described herein, the techniques that are utilized (and/or the devices and/or components that are implemented) to deliver the power to the particular waveguide system(s) 4773 can be static or can change over time, such as selectively implementing different power delivery techniques to a particular waveguide system based on particular circumstances (e.g., low battery storage, high network traffic, type of communication service to be provided via the waveguide system, and so forth).

The transmission medium 4772 can include insulated or uninsulated conductors such as medium voltage power lines, telecommunication or telephone lines, coaxial cables, or any combination thereof. It will be appreciated that other physical transmission media suitable for the propagation of electromagnetic waves can also be used, including those that are conductive or non-conductive. The waveguide systems 4773 can utilize in whole or in part, or in any combination, the embodiments described in the subject disclosure for transmitting and/or receiving electromagnetic waves that propagate along the transmission medium 4772 according to one or more frequency ranges (e.g., 900 MHz-6 GHz, or other microwave or millimeter wave frequencies). The electromagnetic waves can be generated and communicated using various techniques including FDM scheme, wave mode division multiplexing, time division multiplexing, MIMO, or other communication techniques in any combination.

The transmission medium 4772 can be supported by a supporting device or insulating structure 4779, such as connected to a cross beam of a utility structure 4771 (e.g., a utility pole), although other structures can be utilized for supporting the transmission medium. The supporting device 4779 can be used for supporting spans of the transmission medium 4772, such as in a power grid and/or a telecommunications network. In one embodiment, each of the spans can be used by a different waveguide system(s) 4773 to transmit and/or receive electromagnetic waves that propagate along corresponding ones of the spans.

In certain embodiments, the waveguide systems 4773 can be configured to supply signals to routing devices that can distribute data in channels conveyed by the electromagnetic waves to communication devices (e.g., local devices), to other waveguide systems, or both. For example, a network device 4775 (e.g., a routing device) can be communicatively coupled to the waveguide system 4773A via an optical fiber 4774A. The network device 4775 can be mounted on the utility structure or pole 4771. The optical fiber 4774A can be a single fiber or can be a fiber bundle, such as selecting a particular bundle (e.g., diameter, length, number of fibers, etc.) to accommodate communication requirements and/or power requirements for the waveguide system 4773A, such as based on delivering optical power signals to the waveguide system that are converted to power by the waveguide system as will be described herein.

In one embodiment, the network device 4775 and the waveguide system 4773A can communicate via a wireless interface (e.g., utilizing RF communication signals and/or wireless communication optical signals), such as in addition to or in place of communication via the optical fiber 4774A. In one embodiment, the network device 4775 can be powered by a low voltage power line 4740 (e.g., 220V) that obtains electrical energy (e.g., via a direct electrical connection and/or via an inductive coupling) from a conduit that conducts current such as a power grid power line (which may or may not be the same transmission medium utilized for propagating electromagnetic waves without requiring an electrical return path), although it will be appreciated that other appropriate power source(s) could be used in other embodiments.

In one embodiment, the network device 4775 can be a switch such as an Ethernet switch (referred to herein as switch 4775) that can function similar to the switch or routing device 4675 of FIG. 46O. In one embodiment, the waveguide system 4773A and the network device 4775 can communicate with each other utilizing optical communication signals via optical fiber 4774A. This can include the waveguide system 4773A converting electromagnetic waves (received along the transmission medium 4772) to optical communication signals (e.g., baseband Ethernet signals) to be transmitted to the network device 4775, as well as generating electromagnetic waves (for propagation along the transmission medium 4772) according to optical communication signals received from the network device 4775.

In one or more embodiments, the waveguide system 4773A can utilize a power-over-fiber configuration with another device(s), such as the network device 4775, to obtain some or all of the power that is utilized for operation of some or all of the components of the waveguide system. For example, the network device 4775 can include a light source 4730 that generates optical power signals (e.g., from electrical energy such as through use of a Laser) which are utilized to supply power to the waveguide system 4773A. For example, optical power signals can be transmitted from the network device 4775 via the optical fiber 4774A to an optical power converter 4735A of the waveguide system 4773A. In this example, the optical power converter 4735A can include various types of devices that can receive optical power signals and convert those optical power signals to electrical energy or power, such as a photocell, a photodiode, a photovoltaic device, a solar cell, or any other devices or materials that can perform a light-to-electricity conversion. The waveguide system 4773A can include various power components, such as regulators, switches, and so forth, which facilitate power management from a single source (e.g., optical power via the optical fiber 4774A) or from multiple sources (which can include the optical power).

In one embodiment, the optical fiber 4774A can be utilized by the waveguide system 4773A for: receiving first optical power signals from the network device 4775 where the first optical power signals are converted to electrical energy to power all or a portion of the waveguide system; receiving second optical communication signals from the network device where the second optical communication signals convey data; and/or transmitting third optical communication signals to the network device where the third optical communication signals convey other data. In one or more embodiments, the first optical power signals (power), the second optical communication signals (received data) and/or the third optical communication signals (transmitted data) can have different wavelengths. In one embodiment, the waveguide system 4773A can perform, at the same time, two or more of: receiving the first optical power signals; receiving the second optical communication signals; and transmitting the third optical communication signals, although the exemplary embodiments can also include performing these functions at different times that do not overlap. In one embodiment, various components and/or techniques can be utilized by the waveguide system 4773 and/or the network device 4775 to facilitate optical communication and/or optical power delivery, including mitigation of modal dispersion, chromatic dispersion, and/or interference.

In one embodiment, multiple optical fibers can be connected between the waveguide system 4773A and the network device 4775, where each optical fiber is dedicated to one of: receiving first optical power signals from the network device where the first optical power signals are converted to electrical energy to power all or a portion of the waveguide system; receiving second optical communication signals from the network device where the second optical communication signals convey data; and transmitting third optical communication signals to the network device where the third optical communication signals convey other data.

In one embodiment, the waveguide system 4773A and the network device 4775 can perform bi-directional communication utilizing the optical fiber 4774A (which also delivers power to the waveguide system) or utilizing a separate optical fiber (not shown) which can be a single optical fiber where wavelength division multiplexing and BiDi transceivers are used by the waveguide system and the network device. In one embodiment, the waveguide system 4773A can transmit, via a coupler, electromagnetic waves that are generated according to the second optical communication signals or other received signals (e.g., received electromagnetic waves from another waveguide system or received wireless signals from a wireless transmitter which may or may not be different from the network device 4775), where the electromagnetic waves propagate along the transmission medium 4772 without requiring an electrical return path, where the transmission medium comprises an external surface, and where the electromagnetic waves convey the data of the second optical communication signals received from the network device 4775 or the data from the other received signals.

In one or more embodiments, the waveguide system 4773A can include one or more energy storage devices 4745A. For example, the energy storage device 4745A can be recharged from various sources utilizing various techniques, such as recharging via optical power (received via the optical fiber 4774A from the network device 4775) utilizing trickle charging. Other sources for recharging the energy storage device 4745A can be utilized, such as an inductive coupling with a conduit that conducts current, such as a power line, which may or may not be the same conduit as the transmission medium 4772. The energy storage device 4745A can be various types of devices or combinations of devices, including a battery, a super-capacitor, and so forth. In one embodiment where multiple energy storage devices 4745A are utilized by the waveguide system 4773A, different types of energy storage devices can be provided according to various criteria, such as based on the power source charging the energy storage device, power requirements of components of the waveguide system, and so forth.

In one embodiment, the waveguide system 4773A can rely exclusively on optical power via the optical fiber 4774A. For example, the waveguide system 4773A may not have an inductive coupler and may not have a direct electrical connection with a power line. In another embodiment, the waveguide system 4773A can utilize optical power obtained via the optical fiber 4774A in conjunction with power obtained from another source. For example, the waveguide system 4773A can include an inductive coupler, where energy is obtained by the inductive coupler via an inductive coupling with a power line or other lines that have current running therethrough. In one embodiment, the inductive coupler of the waveguide system 4773A can be inductively coupled with the same transmission medium 4772 that the waveguide system is coupled to for transmitting or receiving electromagnetic waves. Various inductive coupling devices can be used (e.g., inductive couplers that can be opened to be positioned around a transmission medium) such as described in U.S. Patent Publication 2018/0219579 filed Jan. 27, 2017, the disclosure of which is hereby incorporated by reference herein in its entirety. Various other components and/or techniques can be utilized for power delivery and management and/or to facilitate communications such as in conjunction with or in place of components and techniques described with respect to the exemplary embodiments, including components and techniques described in U.S. Pat. No. 9,654,173 filed Nov. 20, 2014 and in U.S. Patent Publication 2018/0166920 filed Dec. 8, 2016, the disclosures of both of which are hereby incorporated by reference herein in their entirety.

In one or more embodiments, the waveguide system 4773A can obtain power via the optical fiber 4774A and via an inductive coupler of the waveguide system, without having a direct electrical connection with a power line (or the particular transmission medium 4772). In one or more embodiments, the waveguide system 4773A can include an electrical switch that enables switching between different power sources or switching components of the waveguide system to different power sources. In one or more embodiments, the waveguide system 4773A can obtain power from multiple sources at the same time, such as simultaneously obtaining optical power via the optical fiber 4774A and obtaining energy via an inductive coupler.

In one embodiment, the waveguide system 4773A and the network device 4775 can communicate with each other regarding optical power delivery. For example, the waveguide system 4773A can provide notice to the network device 4775 as to when optical power is needed or not needed, such as by a notification sent via the optical fiber 4774A or by a wireless interface. In other embodiments, the optical power delivery from the network device 4775 can be continuous, which may include trickle charging.

In one embodiment where the optical fiber 4774A is utilized for both power delivery and communication, the waveguide system 4773A and the network device 4775 can provide notification to each other as to a change to the particular mode that is being utilized for the optical fiber, such as a power delivery mode, a communication mode or both. The notification can be sent via the optical fiber 4774A or via another interface, such as a wireless interface.

In one or more embodiments, the waveguide system 4773A can include various components such as a coupler (e.g., illustrated in FIGS. 7, 8, 9A, 10, 11, 12, 18E-18K), a processing system, and a memory, where electrical energy converted from the optical power signals powers all of the components or powers only a subset of the components. In one embodiment, a switching system can be utilized for selecting particular components of the waveguide system 4773A that are powered by optical power while allowing other components to be powered by a different power source. For example, the switching system can dynamically adjust obtaining energy for certain components or all components of the waveguide system 4773A from different power sources (or obtaining the energy from different power storage devices being charged by the different power sources) according to various criteria, such as battery storage capacity, components and resources being utilized, expected power requirements, and so forth.

As described herein, system 4770A can include any number of waveguide systems 4773 that can be in various configurations and utilized with other network devices to facilitate communication services provided over a network. For example, waveguide system 4773B can be coupled to the transmission medium 4772 and communicatively coupled to the network device 4775 via an optical fiber 4774B. In one embodiment, waveguide system 4773B can include components as described with respect to waveguide system 4773A (e.g., an optical power converter 4735B and an energy storage device 4745B) and can perform one or more functions as described with respect to waveguide system 4773A (e.g., receiving optical power, communicating optical communication signals, electromagnetic wave communication, and so forth). In another embodiment, waveguide system 4773B can include components that are different from the components described with respect to waveguide system 4773A and can perform one or more functions that are different from the functions described with respect to waveguide system 4773A. As an example, the first waveguide system 4773A may rely exclusively on optical power and not include an inductive coupler, whereas the second waveguide system 4773B may include or otherwise be connected with an inductive coupler that obtains energy via an inductive coupling with the transmission medium 4772 or another conduit through which a current is flowing. In one embodiment, the first waveguide system 4773A can be coupled to a first span of the transmission medium 4772, the second waveguide system 4773B can be coupled to a second span of the transmission medium, first electromagnetic waves propagate along the first span, second electromagnetic waves propagate along the second span, and the first electromagnetic waves propagating along the first span can be substantially isolated from the second electromagnetic waves propagating along the second span. In this example, the data conveyed by the first electromagnetic waves can be the same or different from the data conveyed by the second electromagnetic waves. In one embodiment, the first and second waveguide systems 4773A, 4773B can communicate with each other (e.g., via a wireless interface, via a direct tethered interface, and/or via an indirect interface such as through the network device 4775) regarding power management, control information, data, and so forth.

In one embodiment, one or more waveguide systems 4773 can be configured to retransmit electromagnetic waves that are received using an analog-to-analog conversion that excludes digital processing. Excluding or minimizing digital processing, such as demodulating and baseband processing of digital signals, can significantly reduce the power consumption of the one or more waveguide systems 4773, and consequently the need for an inductive power supply used by the waveguide systems. In this example, the particular waveguide system 4773 can utilize optical power exclusively or in combination with another power source.

In one or more embodiments, one or more waveguide systems 4773 can be configured to regenerate electromagnetic waves received thereby to generate regenerated electromagnetic waves. The process of regenerating an electromagnetic wave can be more power consuming than the process of generating repeated electromagnetic waves as previously described. Accordingly, an inductive power supply device can be included in that particular waveguide system 4773 performing the regeneration of electromagnetic waves. In this example, the particular waveguide system 4773 can utilize inductive power coupling alone or in combination with optical power. In one or more embodiments to mitigate power outages, the waveguide systems 4773A, 4773B, can further include a backup power supply, which can also be solar powered.

In one or more embodiments, signal processing can be performed by the waveguide systems 4773 including frequency-shifting electromagnetic waves, demodulating electromagnetic waves, or a combination thereof. In one embodiment, the data conveyed by the electromagnetic waves and/or the optical communication signals can include control information, voice communications, internet traffic, streaming data, packetized data, or other suitable forms of information. In one embodiment, the data channels supplied in the signals can comprise modulated and/or demodulated signals that have been frequency shifted to baseband and/or intermediate frequencies.

In one embodiment, the network device 4775 can include one or more modems. For instance, the network device 4775 can include two modems, which are coupled to the first waveguide system 4773A and the second waveguide system 4673B, respectively, and to a switch that functions as previously described.

In one or more embodiments, an access point (e.g., a wireless access point device) 4776 can be mounted to the utility structure 4771 or otherwise positioned in proximity to the network device 4775 and can be in communication with the network device via a wired and/or wireless interface 4775X. The access point 4776 can perform similar functions as access point 4676 of FIG. 46O. For example, the access point 4776 can provide communication services in conjunction with the waveguide systems 4773 and the network device 4775. For example, the access point 4776 can generate a downlink wireless signal directed to, or receive an uplink wireless signal from, a communication device that conveys in whole or in part data channels routed to or from the access point 4776 by the network device 4775 via the waveguide system(s) 4773. For instance, the communication device can be a portable communication device or customer premises equipment (CPE) located at a residence or business establishment (e.g., a set-top box, modem, computer, etc.). The network device 4775 can distribute portions of the signals supplied by the access point 4776 to the first waveguide system 4773A, the second waveguide system 4773B, or both based on routing information included in the signals.

In one embodiment, the access point 4776 can be powered by low voltage power lines (e.g., 220V, telephone cable pairs, coaxial systems, and so forth) not shown in FIG. 47C or other appropriate power sources. In one embodiment, the access point device 4776 can provide power to the network device 4775 or the network device 4775 can provide power to the access point device 4776. In one embodiment, the network device 4775 can be part of the access point device 4776.

It will be further appreciated that any of the foregoing embodiments relating to descriptions of FIG. 47C can be combined in whole or in part. It will also be appreciated that the waveguide systems 4773A, 4773B can be configured to receive and transmit, respectively, uplink and downlink electromagnetic waves that propagate along the transmission medium 4772. The uplink and downlink electromagnetic waves can be propagating simultaneously without interference utilizing frequency division multiplexing, time division multiplexing, wave mode multiplexing, or combinations thereof.

Figure 47D:
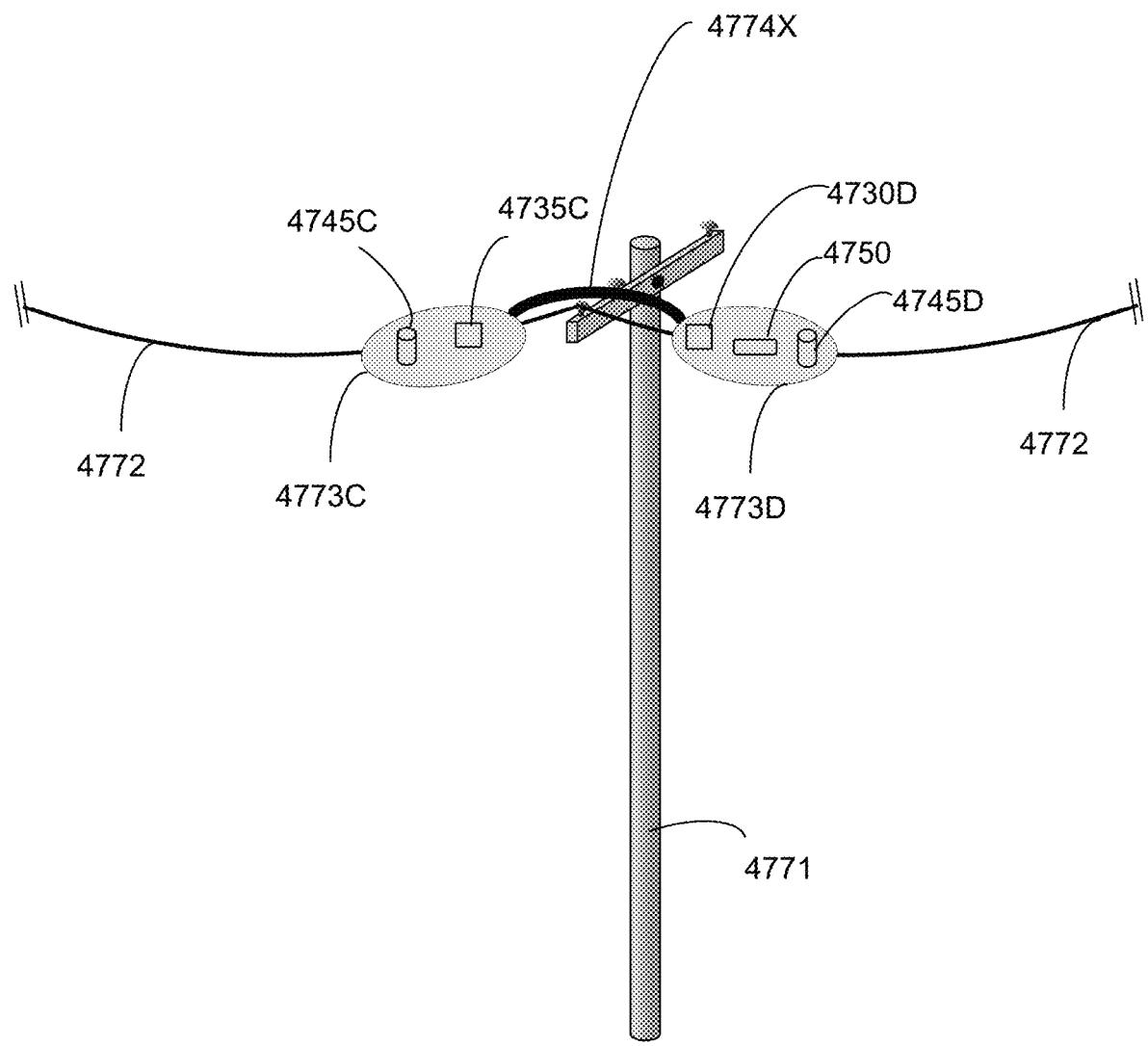
FIG. 47D is a graphical diagram illustrating an example, non-limiting embodiment of a communication system that delivers optical power in accordance with various aspects described herein.

FIG. 47D is a graphical diagram illustrating an example, non-limiting embodiment of communication system 4770B in accordance with various aspects described herein. The communication system 4770B can comprise one or more waveguide systems 4773 (only two of which are shown as 4773C, 4773D and are collectively referred to as 4773) coupled to a transmission medium 4772 (only two spans of which are shown), which can include power lines, telecommunication lines, or other conduits. It will be appreciated that more or less waveguide systems can be deployed in the communication system 4770B, and thus the number of waveguide systems shown in FIG. 47D is for illustrative purposes only. The waveguide systems 4773 can be various types of waveguide systems as described herein which can facilitate generating, transmitting and/or receiving electromagnetic waves (which can convey data associated with a communication service including user data and/or network data) that propagate along a transmission medium without requiring an electrical return path.

System 4770B provides for optical power delivery between waveguide systems 4773. For example, a second waveguide system 4773D can include a light source 4730D for generating optical power signals, such as a Laser. The second waveguide system 4773D can transmit, via an optical fiber 4774X, optical power signals to a first waveguide system 4773C, where the first and second waveguide systems are separate devices. The first waveguide system 4773C can include an optical power converter 4735C to convert the optical power signals to electrical energy. The electrical energy generated from the optical power signals can be utilized to power all or a subset of the components of the first waveguide system. The waveguide systems 4773C and 4773D can transmit and/or receive electromagnetic waves that convey data, where the electromagnetic waves propagate along the transmission medium 4772 without requiring an electrical return path, and where the transmission medium comprises an external surface.

In one embodiment, the second waveguide system 4773D can include an inductive coupler 4750, where the inductive coupler obtains energy from the transmission medium 4772 via an inductive coupling with the transmission medium. In one embodiment, the first and second waveguides system 4773C, 4773D do not obtain any power via a direct electrical connection with the transmission medium 4772. In one embodiment, the second waveguide system 4773D can obtain power from another source which may be in addition to or in place of the inductive coupling, such as from another network device or from a direct connection with a conduit having a suitable current running therethrough.

In one embodiment, the optical fiber 4774X can further be utilized to communicate data to each other via optical communication signals over the optical fiber. For example, the waveguide systems 4773C, 4773D can utilize the optical fiber 4774X for uni-directional or bi-directional optical communications. In one embodiment, different wavelengths can be utilized for the optical power signals and the optical communication signals. Other components and techniques can be utilized to facilitate communication between the first and second waveguide systems 4773C, 4773D including wired and/or wireless interfaces.

In one embodiment, the optical power received by the first waveguide system 4773C can be the sole power source for the waveguide system. In one embodiment, the waveguide systems 4773C, 4773D can include one or more energy storage devices 4745C, 4745D. For example, the energy storage devices 4745C, 4745D can include a supercapacitor, a battery, or a combination thereof. In one embodiment, the waveguide systems 4773C, 4773D can communicate with each other regarding power management. In one embodiment, the optical power signals utilized for optical power can be continuously transmitted via the optical fiber 4774X. In one embodiment, the optical power can be utilized for trickle charging a battery 4745C of the waveguide system 4773C. In another embodiment, the optical power signals utilized for optical power can be selectively transmitted via the optical fiber 4774X, such as based on low battery power storage.

In one embodiment, the waveguide systems 4773C, 4773D can be configured to retransmit electromagnetic waves that are received using an analog-to-analog conversion that excludes digital processing. In this example, the particular waveguide system 4773 can utilize optical power exclusively or in combination with another power source. In one or more embodiments, the waveguide systems 4773C, 4773D can be configured to regenerate electromagnetic waves received thereby to generate regenerated electromagnetic waves. An inductive power supply device can be included in the particular waveguide system 4773 performing the regeneration of electromagnetic waves. In this example, the particular waveguide system 4773 can utilize inductive power coupling alone or in combination with optical power.

Figure 47E:
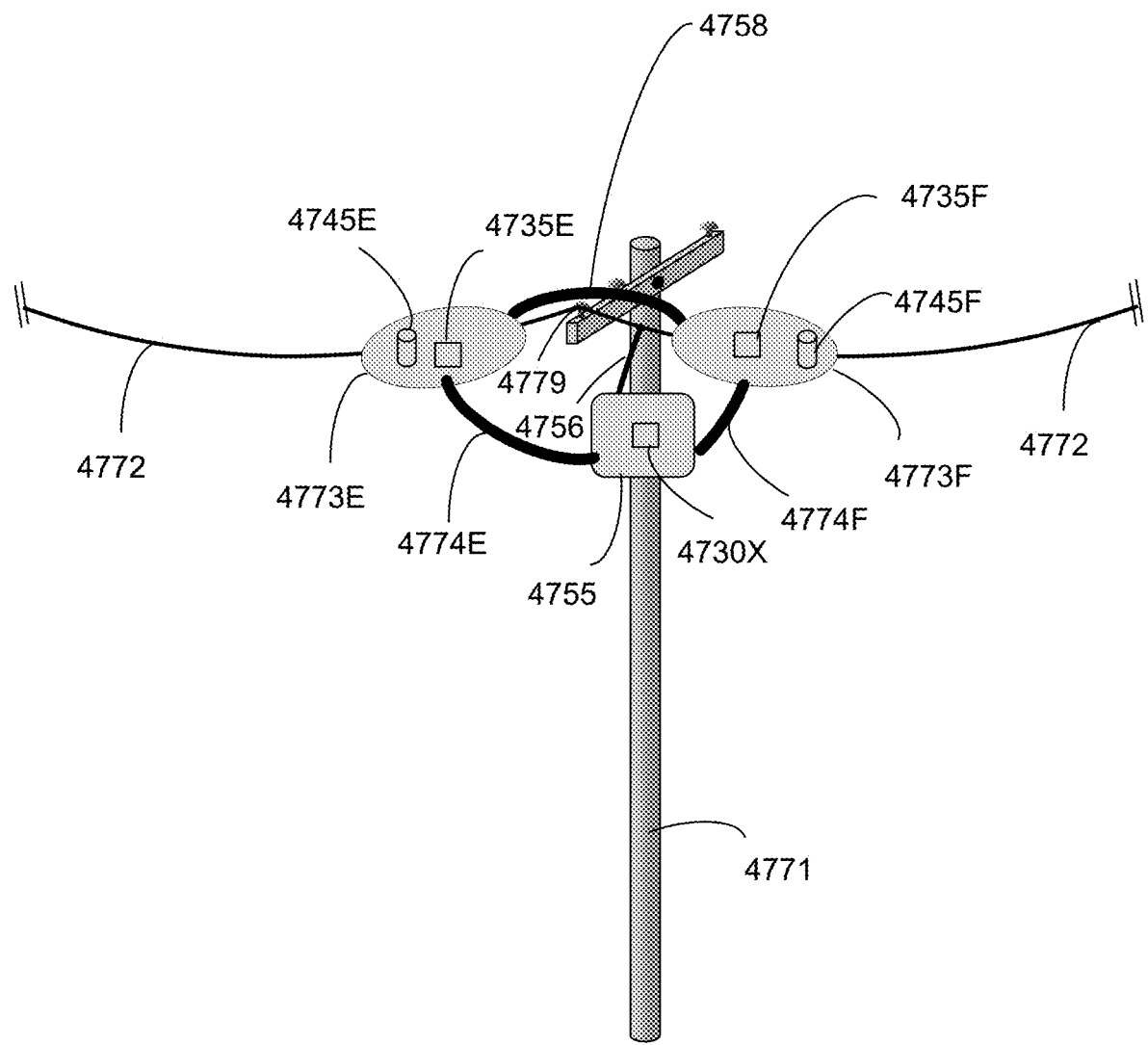
FIG. 47E is a graphical diagram illustrating an example, non-limiting embodiment of a communication system that delivers optical power to a waveguide system in accordance with various aspects described herein.

FIG. 47E is a graphical diagram illustrating an example, non-limiting embodiment of communication system 4770C in accordance with various aspects described herein. The communication system 4770C can comprise one or more waveguide systems 4773 (only two of which are shown as 4773E, 4773F and are collectively referred to as 4773) coupled to a transmission medium 4772 (only two spans of which are shown), which can include power lines, telecommunication lines, or other conduits. It will be appreciated that more or less waveguide systems can be deployed in the communication system 4770C, and thus the number of waveguide systems shown in FIG. 47E is for illustrative purposes only. The waveguide systems 4773 can be various types of waveguide systems as described herein which can facilitate generating, transmitting and/or receiving electromagnetic waves (which can convey data associated with a communication service including user data and/or network data) that propagate along a transmission medium without requiring an electrical return path.

System 4770C provides for optical power delivery to one or more waveguide systems 4773 from a power device 4755. For example, the power device 4755 can include a light source 4730X for generating optical power signals, such as a Laser. The power device 4755 can transmit, via optical fibers 4774E, 4774F, optical power signals to the waveguide systems 4773E, 4773F, respectively. The waveguide system 4773E, 4773F can include optical power converters 4735E, 4735F to convert the optical power signals to electrical energy. The electrical energy generated from the optical power signals can be utilized to power all or a subset of the components of the waveguide systems 4773E, 4773F.

The power device 4755 can include various components that facilitate delivering optical power to the waveguide systems 4773E, 4773F. The power device 4755 can draw its own power from various sources or combinations of sources, including an electrical connection 4756 to the transmission medium 4772 or to another conduit (not shown) having a suitable current flowing therethrough, an inductive coupler (not shown), solar power, and so forth.

In one embodiment, the power source 4755 can be a dedicated device that is not a network communication device but rather a device for delivering power. In one embodiment, the power device 4755 can communicate with the waveguide systems 4773E, 4773F regarding power management, such as via optical communication signals over the optical fibers 4774E, 4774F and/or via a wireless interface. In one embodiment, the waveguide systems 4773E, 4773F communicate with each other via a wired interface 4758 over the insulator 4779. This wired interface can be an optical fiber or can utilize other communication techniques and components.

In one embodiment, the waveguide systems 4773E, 4773F can be configured to retransmit electromagnetic waves that are received using an analog-to-analog conversion that excludes digital processing. In this example, the particular waveguide system 4773 can utilize optical power exclusively or in combination with another power source. In one or more embodiments, the waveguide systems 4773E, 4773F can be configured to regenerate electromagnetic waves received thereby to generate regenerated electromagnetic waves. In one embodiment, an inductive power supply device (not shown) can be included in the particular waveguide system 4773 performing the regeneration of electromagnetic waves. In this example, the particular waveguide system 4773 can utilize inductive power coupling alone or in combination with optical power.

In one embodiment, the optical power received by the waveguide systems 4773E, 4773F can be the sole power source for the waveguide systems. In one embodiment, the waveguide systems 4773E, 4773F can include one or more energy storage devices 4745E, 4745F. For example, the energy storage devices 4745E, 4745F can include a supercapacitor, a battery, or a combination thereof. In one embodiment, the waveguide systems 4773E, 4773F can communicate with the power device 4755 regarding power management. In one embodiment, the optical power signals utilized for optical power can be continuously transmitted via the optical fibers 4774E, 4774F. In one embodiment, the optical power can be utilized for trickle charging a battery 4745E, 4745F of the waveguide systems 4773E, 4773F. In another embodiment, the optical power signals utilized for optical power can be selectively transmitted via the optical fibers 4774E, 4774F, such as based on low battery power storage.

In one embodiment, the power device 4755 can be mounted to the utility structure 4771 supporting the transmission medium 4772. In one embodiment, the power device 4755 can include or otherwise can be connected to an inductive coupler (not shown), where the inductive coupler obtains energy via an inductive coupling with a power line. In one embodiment, the waveguide systems 4773E, 4773F do not obtain any power via a direct electrical connection with the transmission medium 4772. In one embodiment, the optical fibers 4774E, 4774F can be utilized exclusively for delivering power to the waveguide systems 4773E, 4773F, although other power sources can also be utilized in other embodiments, such as power received from another network device or from an inductive coupler. In one embodiment, the optical fibers 4774E, 4774F can be utilized for delivering optical communication signals between the waveguide systems 4773E, 4773F (e.g., utilizing uni-directional or bi-directional optical communications), in addition to delivering optical power (which may include the optical power signals having different wavelengths from the optical communication signals). In one or more embodiments, one or more of the optical fibers 4774 (e.g., optical fibers 4774A-F) described herein can be a single fiber or can be a fiber bundle, such as selecting a particular bundle (e.g., diameter, length, number of fibers, material, etc.) to accommodate communication requirements and/or power requirements for the waveguide system(s) 4773, such as based on delivering optical power signals to the waveguide system that are converted to power by the waveguide system as described herein. In one or more embodiments, parameters for the optical power signals can be selected to facilitate generating electrical power therefrom. In one embodiment, power and communication signals can be embedded together in transmissions via one or more optical fibers, such as transmissions between a pair of waveguide systems or transmissions between a network device and a waveguide system.

Figure 47F:
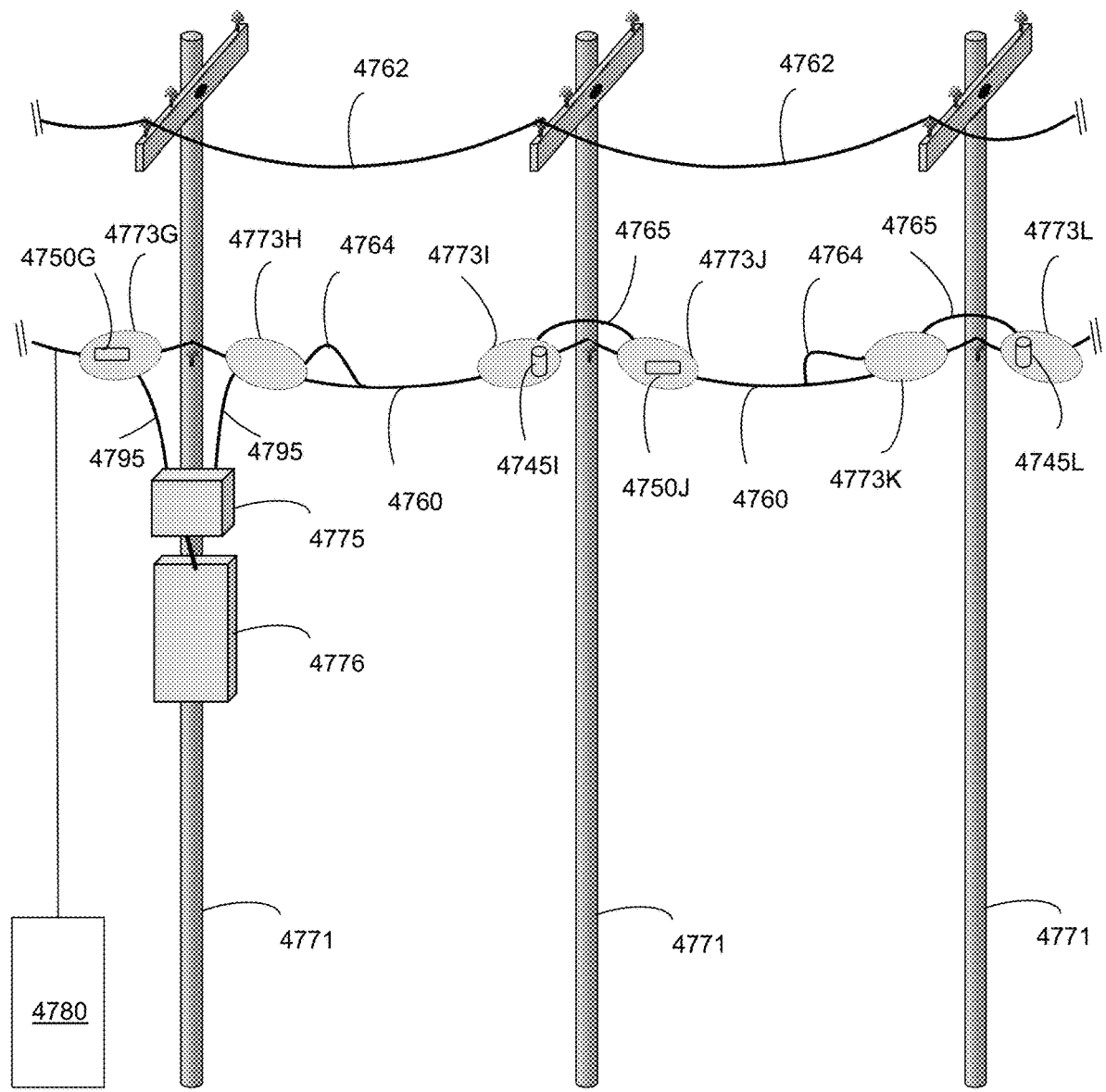
FIG. 47F is a graphical diagram illustrating an example, non-limiting embodiment of a communication system that delivers power in accordance with various aspects described herein.

FIG. 47F is a graphical diagram illustrating an example, non-limiting embodiment of communication system 4770D in accordance with various aspects described herein. The communication system 4770D can comprise one or more waveguide systems 4773 (six of which are shown as 4773G-L and are collectively referred to as 4773) coupled to a telecommunication line 4760 of a telecommunication network (only four spans of which are shown). In one embodiment, pairs of the waveguide systems can be coupled near opposing ends of each span of the telecommunication line 4760, although various configurations can be utilized. In one or more embodiments, the telecommunication or telephone line 4760 can be utilized for conveying electrical communication signals (generated by other devices not shown) for communication services provided by the telecommunication network. In one embodiment, the communication services provided by the telecommunication network are limited to voice services. In another embodiment, the communication services provided by the telecommunication network are various services such as voice, video, data and/or messaging services (e.g., a digital subscriber line service). In this or other embodiments, the telecommunication or telephone line can be a cable comprising 24 binders, each binder including 25 twisted pair wires, totaling 600 twisted pair wires in the cable. Each wire in a twisted pair wire can be insulated so that the 600 wires are not electrically shorted with each other. The 24 binders of the cable can be surrounded by a tubular conducting shield covered by a jacket or insulator to prevent exposure of the conducting shield and the twisted pairs wires to environmental conditions (e.g., rain, soil, etc.). The cable can be coupled to a messenger cable constructed of high strength steel that can provide aerial support of the cable along fixtures like utility poles. Various other components and/or techniques can be utilized for power delivery and management and/or to facilitate communications such as in conjunction with or in place of components and techniques described with respect to the exemplary embodiments, including cables or other features or techniques described in U.S. application Ser. No. 16/158,354 filed Oct. 12, 2018, the disclosure of which is hereby incorporated by reference herein in its entirety.

The telecommunication line 4760 can be supported by the utility structure or pole 4771 which also supports a power line 4762 of a power grid. It will be appreciated that more or less waveguide systems can be deployed in the communication system 4770D, and thus the number of waveguide systems shown in FIG. 47F is for illustrative purposes only. The waveguide systems 4773 can be various types of waveguide systems as described herein which can facilitate generating, transmitting and/or receiving electromagnetic waves (which can convey data associated with a communication service including user data and/or network data) that propagate along the telecommunication line 4760 without requiring an electrical return path. In one or more embodiments described herein, the distinction between a power line as compared to a telecommunication line can be understood by one of ordinary skill in the art (e.g., based on the requirements of the National Electric Safety Code (NESC)) and can include, among other criteria, the capability to deliver power as part of a power grid (as compared to delivering voice signals as electrical signals for a telecommunication network), structural safety requirements, positioning requirements on a utility structure such as vertical clearance requirements, and so forth. In one embodiment, the telecommunication line can include a telephone line or other wired connection (e.g., twisted pair) that is utilized for providing voice services (e.g., connected with the public switched telephone network) and may or may not provide video, data and/or messaging services. In another embodiment, the telecommunication line can include a wired connection (e.g., twisted pair) that is utilized for providing one or more of voice, video, data and/or messaging services (e.g., a digital subscriber line service).

In one or more embodiments, system 4770D can provide communications utilizing electromagnetic waves propagating along the telecommunication line 4760 (which can also be conveying electrical communication signals of the telecommunication network) without requiring an electrical return path and can deliver power from the telecommunication line 4760 to various devices including the waveguide systems 4773G-L, the network device 4775 and/or the wireless access point 4776. The waveguide systems 4773, the network device 4775 and/or the wireless access point 4776 can perform one or more functions similar to those described with respect to system 4770A of FIG. 47C. For example, the access point 4776 can provide communication services in conjunction with the waveguide systems 4773 and the network device 4775. For instance, the access point 4776 can generate a downlink wireless signal directed to, or receive an uplink wireless signal from, a communication device that conveys in whole or in part data channels routed to or from the access point 4776 by the network device 4775 via the waveguide system(s) 4773. As an example, the communication device can be a portable communication device or CPE located at a residence or business establishment (e.g., a set-top box, modem, computer, etc.). The network device 4775 can distribute portions of the signals supplied by the access point 4776 to one, some or all of the waveguide systems 4773 based on routing information included in the signals.

In one embodiment, the waveguide systems 4773, the network device 4775 and/or the wireless access point 4776 can provide communication services that are separate from the communication services provided by the telecommunication network. In another embodiment, the waveguide systems 4773, the network device 4775 and/or the wireless access point 4776 can provide communication services in conjunction with or part of the communication services provided by the telecommunication network.

In one embodiment, pairs of waveguide systems 4773 can be connected via a wired interface 4765. The wired interface 4765 can provide communication and/or power delivery between the waveguide systems. For example, the waveguide system 4773K can have a direct electrical connection with the telecommunication line 4760 via wired connection 4764. In one embodiment, the waveguide system 4773K can obtain the electrical power and provide it to waveguide system 4773L via the wired connection 4765. In another embodiment, the waveguide system 4773J can include an inductive coupler 4750J providing an inductive coupling (without a direct electrical connection) with the telecommunication line 4760. In one embodiment, the waveguide system 4773J can obtain the electrical power via the inductive coupling and then provide the electrical power to waveguide system 47731 via the wired connection 4765. The wired connection can be various types of wired connections including an optical fiber, a conductor wire, and so forth. One or more of the waveguide systems 4773 can include one or more energy storage devices 47451, 4745L. For example, the energy storage devices 47451, 4745L can include a supercapacitor, a battery, or a combination thereof.

In one or more embodiments, wired connections 4795 can be provided between the waveguide systems 4773G, 4773H and the network device 4775. The wired interface 4795 can provide communication and/or power delivery between the waveguide systems and the network device 4775. The wired connection 4795 can be various types of wired connections including an optical fiber, a conductor wire, and so forth. In one embodiment, one or both of the waveguide systems 4773G, 4773H can provide electrical power (e.g., obtained from a direct electrical connection 4764 and/or obtained from an inductive coupler 4750G) via the wired connection 4795 to the network device 4775 and to the wireless access point 4776. The electrical power received from the waveguide systems 4773G, 4773H via the wired connection 4795 may or may not be the exclusive power source of the network device 4775 and the wireless access point 4776. In one embodiment, the direct electrical connection 4764 can be between the telecommunication line 4760 and one or both of the network device 4775 and the access point 4776. In this example, one or both of the waveguide systems 4773G, 4773H can receive power from the network device 4775 and/or the access point 4776 via the wired connections 4795.

In one embodiment, a power injection device 4780 is utilized to provide a Direct Current or an Alternating Current through the telecommunication line 4760. The DC or AC power can be obtained by one, some or all of the waveguide systems 4773 via a direct electrical connection with the telecommunication line 4760 and/or via an inductive coupling with the telecommunication line. In one embodiment, communication signals communicated via wired interface 4795 conform to an Ethernet protocol, and the network device 4775 includes an Ethernet switch. In one embodiment, one or more of the waveguide systems 4773 include a wireless receiver. In one embodiment, DC or AC power obtained from the telecommunication line 4760 is utilized by all or a subset of components of a particular waveguide system 4773. In one embodiment, an inductive coupler can be a stand-alone device coupled to the telecommunication line 4760 with a wired connection to a particular waveguide system 4773 to deliver power, which can be an exclusive power source of the particular waveguide system or can be used in conjunction with another power source, such as receiving power from another waveguide system.

In one or more embodiments, system 4770D can provide communication services via electromagnetic waves that propagate along the telecommunication line 4760 without requiring an electrical return path and can provide power to the waveguide systems via a direct electrical connection to the telecommunication line and/or via an inductive coupling to the telecommunication line, without utilizing the power line 4762 for electromagnetic wave communication and/or without utilizing the power line for obtaining power for the waveguide systems 4773.

Figure 47G:
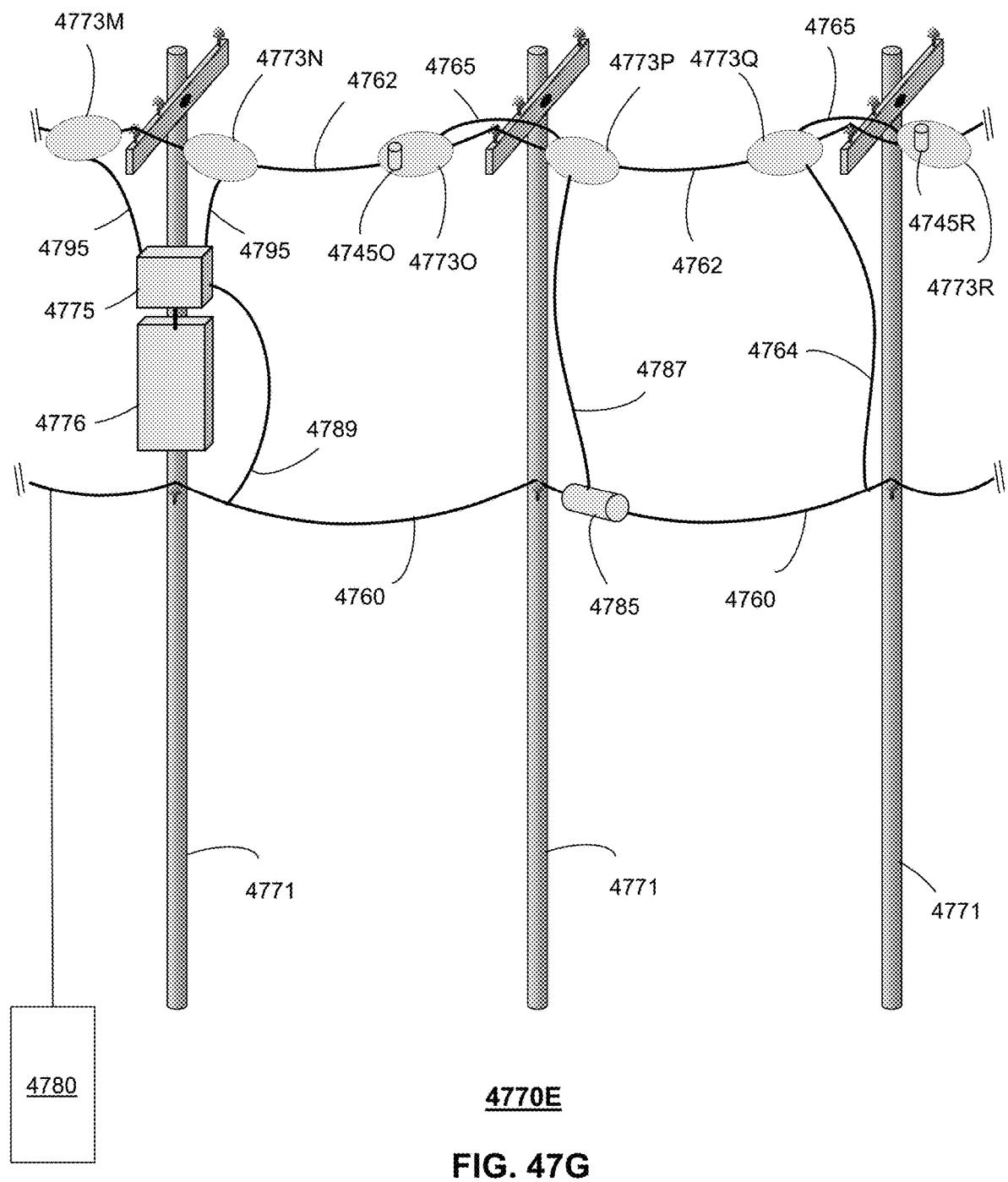
FIG. 47G is a graphical diagram illustrating an example, non-limiting embodiment of a communication system that delivers power in accordance with various aspects described herein.

FIG. 47G is a graphical diagram illustrating an example, non-limiting embodiment of communication system 4770E in accordance with various aspects described herein. The communication system 4770E can comprise one or more waveguide systems 4773 (six of which are shown as 4773M-R and are collectively referred to as 4773) coupled to a power line 4762 of a power grid (only four spans of which are shown). In one embodiment, pairs of the waveguide systems can be coupled near opposing ends of each span of the power line 4762, although various configurations can be utilized. The power line 4762 can be utilized for delivering power to residences, businesses and so forth that are connected with the power grid.

The power line 4762 can be supported by the utility structure or pole 4771 which also supports a telecommunication or telephone line 4760 of a telecommunication network. The telecommunication line 4760 can convey electrical communication signals (generated by other devices not shown) for communication services provided by the telecommunication network. In one embodiment, the communication services provided by the telecommunication network are limited to voice services. In another embodiment, the communication services provided by the telecommunication network are various services, such as voice, video and/or data services (e.g., a digital subscriber line service).

It will be appreciated that more or less waveguide systems 4773 can be deployed in the communication system 4770E, and thus the number of waveguide systems shown in FIG. 47G is for illustrative purposes only. The waveguide systems 4773 can be various types of waveguide systems as described herein which can facilitate generating, transmitting and/or receiving electromagnetic waves (which can convey data associated with a communication service including user data and/or network data) that propagate along the power line 4762 without requiring an electrical return path.

In one or more embodiments, system 4770E can provide communication services utilizing electromagnetic waves propagating along the power line 4762 (which can also be conveying power operating as a power grid) without requiring an electrical return path. In one or more embodiments, system 4760E can deliver power from the telecommunication line 4760 to various devices including the waveguide systems 4773M-R, the network device 4775 and/or the wireless access point 4776. The waveguide systems 4773, the network device 4775 and/or the wireless access point 4776 can perform one or more functions similar to those described with respect to system 4770A of FIG. 47C. For example, the access point 4776 can provide communication services in conjunction with the waveguide systems 4773 and the network device 4775. For instance, the access point 4776 can generate a downlink wireless signal directed to, or receive an uplink wireless signal from, a communication device that conveys in whole or in part data channels routed to or from the access point 4776 by the network device 4775 via the waveguide system(s) 4773. As an example, the communication device can be a portable communication device or CPE located at a residence or business establishment (e.g., a set-top box, modem, computer, etc.). The network device 4775 can distribute portions of the signals supplied by the access point 4776 to one, some or all of the waveguide systems 4773 based on routing information included in the signals.

In one embodiment, the waveguide systems 4773, the network device 4775 and/or the wireless access point 4776 can provide communication services that are separate from the communication services provided by the telecommunication network. In another embodiment, the waveguide systems 4773, the network device 4775 and/or the wireless access point 4776 can provide communication services in conjunction with or part of the communication services provided by the telecommunication network.

In one embodiment, pairs of waveguide systems 4773 can be connected via a wired interface 4765. The wired interface 4765 can provide communication and/or power delivery between the waveguide systems. In one embodiment, the waveguide system 4773Q can have a direct electrical connection with the telecommunication line 4760 via wired connection 4764. In one embodiment, the waveguide system 4773Q can obtain the electrical power and provide it to waveguide system 4773R via the wired connection 4765. In another embodiment, the waveguide system 4773P can be connected via wired connection 4787 to an inductive coupler 4785 that provides an inductive coupling (without a direct electrical connection) with the telecommunication line 4760. In this example, the inductive coupler is a stand-alone device, however, in other embodiments, the inductive coupler can be part of another network communication device (e.g., another waveguide system not shown) which is coupled with the telecommunication line 4760. In one embodiment, the waveguide system 4773P can obtain the electrical power via the inductive coupling and then provide the electrical power to waveguide system 4773O via the wired connection 4765. The wired connection can be various types of wired connections including an optical fiber, a conductor wire, and so forth. One or more of the waveguide systems 4773 can include one or more energy storage devices 47450, 4745R. For example, the energy storage devices 47450, 4745R can include a supercapacitor, a battery, or a combination thereof.

In one or more embodiments, wired connections 4795 can be provided between the waveguide systems 4773M, 4773N and the network device 4775. The wired interface 4795 can provide communication and/or power delivery between the waveguide systems 4773M, 4773N and the network device 4775. The wired connection can be various types of wired connections including an optical fiber, a conductor wire, and so forth. In one embodiment, one or both of the waveguide systems 4773M, 4773N can receive electrical power (e.g., obtained from a direct electrical connection 4789 of the network device 4775 or the access point 4776 with the telecommunication line and/or obtained from an inductive coupling with the telecommunication line (not shown)) via the wired connection 4795 to the network device 4775. The electrical power received by the waveguide systems 4773M, 4773N via the wired connection 4795 may or may not be the exclusive power source of the waveguide systems 4773M, 4773N. In one embodiment, the direct electrical connection 4789 can be between the telecommunication line 4760 and one or both of the waveguide systems 4773M, 4773R. In this example, one or both of the waveguide systems 4773M, 4773R can deliver power to the network device 4775 and the access point 4776 via the wired connections 4795.

In one embodiment, a power injection device 4780 is utilized to provide a Direct Current or an Alternating Current through the telecommunication line 4760. The DC or AC energy can be obtained by one, some or all of the waveguide systems 4773 via a direct electrical connection with the telecommunication line 4760 and/or via an inductive coupling with the telecommunication line. In one embodiment, signals communicated via wired interface 4795 conform to an Ethernet protocol, and the network device 4775 includes an Ethernet switch. In one embodiment, one or more of the waveguide systems 4773 include a wireless receiver. In one embodiment, DC or AC power obtained from the telecommunication line 4760 is utilized by all or a subset of components of a particular waveguide system 4773. In one embodiment, an inductive coupler can be a stand-alone device coupled to the telecommunication line 4760 with a wired connection to more than one waveguide system 4773 to deliver power.

In one or more embodiments, system 4770E can provide communication services via electromagnetic waves that propagate along the power line 4762 without requiring an electrical return path and can provide power to the waveguide systems (which launch the electromagnetic waves) via a direct electrical connection to the telecommunication line 4760 and/or via an inductive coupling to the telecommunication line, without utilizing the power line 4762 for obtaining power for the waveguide systems 4773.

In one embodiment, one or more of the waveguide systems 4773 do not obtain any power via a direct electrical connection with the telecommunication line 4760, where the particular waveguide systems do not obtain any power from the power line 4762. In one embodiment, one or more waveguide systems 4773 can obtain power from an inductive coupling with the telecommunication line 4760 and/or from another waveguide system.

Figure 47H:
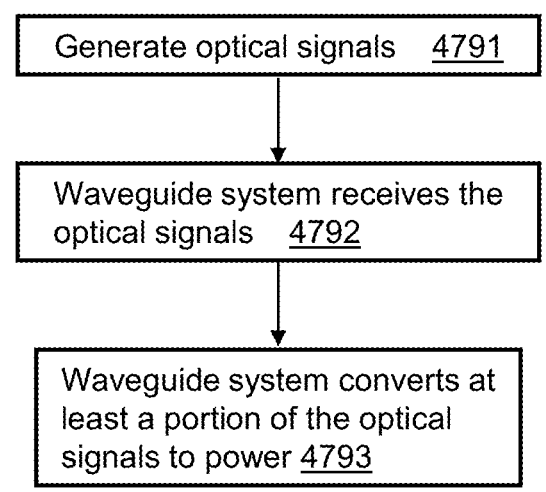
FIG. 47H illustrates a flow diagram of an example, non-limiting embodiment of a method for delivering optical power to a waveguide system in accordance with various aspects described herein.

FIG. 47H illustrates a flow diagram of an example, non-limiting embodiment of a method 4790 for delivering optical power to one or more waveguide systems in accordance with various aspects described herein. Method 4790 can be applied to waveguide systems of the subject disclosure configured to transmit and receive electromagnetic waves (which can convey data associated with a communication service including user data and/or network data) that propagate along a physical transmission medium such as an insulated or uninsulated wire without requiring an electrical return path to enable such propagation. At 4791, a light source can generate optical power signals. The light source can be various types of devices such as a Laser. The light source can be part of various devices, such as another waveguide system, a dedicated power device, a network device, and so forth.

At 4792, a waveguide system can receive the optical power signals generated by the light source. The waveguide system can receive the optical power signals via a single optical fiber or a bundle of optical fibers. In one embodiment, the same optical fiber(s) that deliver the optical power signals also can be utilized for communication of optical communication signals (uni-directional or bi-directional optical communication such as utilizing different wavelengths for the different optical signals). In another embodiment, different optical fibers can be utilized for optical power and optical communications.

At 4793, an optical power converter of the waveguide system can convert the optical power signals to electrical energy to be utilized as power by the waveguide system (e.g., to power all or a subset of components of the waveguide system). The waveguide system can then utilize the power for generating electromagnetic waves that propagate along a transmission medium without requiring an electrical return path, wherein the transmission medium comprises an external surface, and wherein the electromagnetic waves convey data (which can include voice, video, data or messages). In one embodiment, the power can also be utilized by the waveguide system to power other components, such as a wireless transceiver of the waveguide system.

Figure 47I:
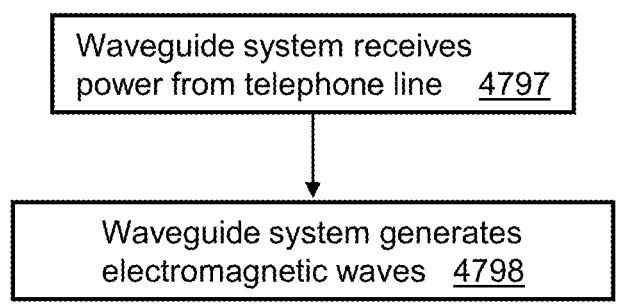
FIG. 47I illustrates a flow diagram of an example, non-limiting embodiment of a method for delivering power to a waveguide system in accordance with various aspects described herein.

FIG. 47I illustrates a flow diagram of an example, non-limiting embodiment of a method 4796 for delivering optical power from a telecommunication or telephone line to one or more waveguide systems in accordance with various aspects described herein. Method 4796 can be applied to waveguide systems of the subject disclosure configured to transmit and receive electromagnetic waves (which can convey data associated with a communication service including user data and/or network data) that propagate along a physical transmission medium such as an insulated or uninsulated wire (e.g., a power line or a telecommunication line) without requiring an electrical return path to enable such propagation. At 4797, the waveguide system obtains power from the telecommunication line. In one embodiment, the waveguide system does not obtain any power from a power line, such as a power line that is supported by the same utility pole supporting the telecommunication line. The power can be obtained via a direct electrical connection with the telecommunication line and/or via an inductive coupling (utilizing an inductive coupler) with the telecommunication line. In one embodiment, the inductive coupler can be a stand-alone device coupled to the telecommunication line and having a wired connection to the waveguide system(s). A power injector can be utilized to inject DC or AC power into the telecommunication line. At 4798, the waveguide system can then utilize the power for generating electromagnetic waves that propagate along a transmission medium (which can be a power line or the telecommunication line) without requiring an electrical return path, where the electromagnetic waves convey data (which can include voice, video, data or messages). In one embodiment, the power can also be utilized by the waveguide system to power other components, such as a wireless transceiver of the waveguide system. In one or more embodiments, a light source can generate artificial light from electrical energy, such as obtained via a direct or inductive coupling with a conduit that has electrical current flowing therethrough, and the artificial light can be provided (e.g., via one or more optical fibers) to an optical power converter for obtaining power.

It will also be appreciated that the embodiments of FIGS. 47A-I can be combined in whole or in part. While for purposes of simplicity of explanation, the respective processes are shown and described as a series of blocks in FIGS. 47A, B, H, I, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

It is further appreciated that the foregoing embodiments of FIGS. 47A-I can be combined in whole or in part with one another, and/or can be combined in whole or in part with other embodiments of the subject disclosure, and/or can be adapted for use in whole or in part with other embodiments of the subject disclosure. It should be further understood that power flow according to the techniques and components described with respect to FIGS. 47A-47I can be in other directions (e.g., power delivery from a waveguide system to a network device) and/or to other devices.

It is further appreciated that any of the embodiments of the subject disclosure (singly or in any combination) which are adaptable for transmitting or receiving communication signals can be utilized as network elements for the distribution and/or routing of media content, voice communications, video streaming, internet traffic or other data transport. It is further appreciated that such network elements can be adapted or otherwise utilized in a communication network described below in relation to FIG. 48 for the distribution or routing of media content, voice communications, video streaming, internet traffic or other data transport. It is also appreciated that such network elements can also be configured to utilize virtualized communication network techniques described below in relation to FIG. 49.

Figure 48:
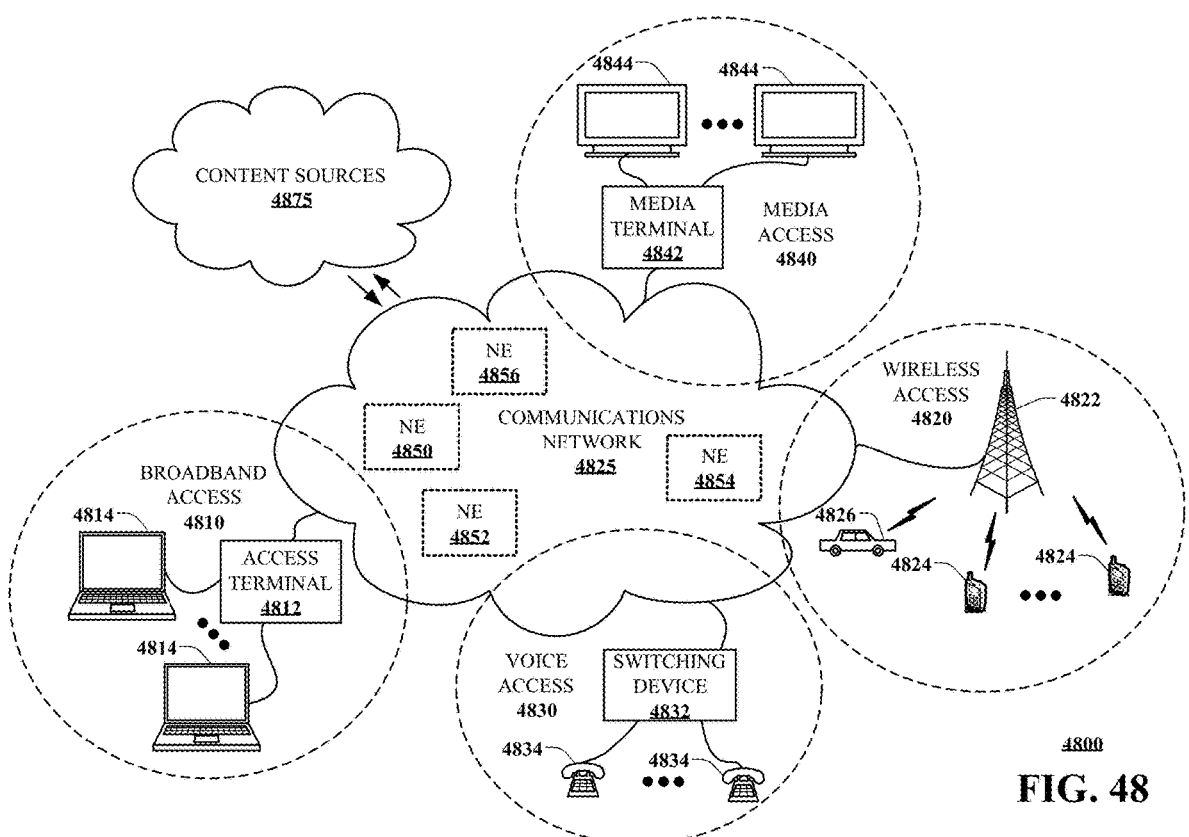
FIG. 48 is a block diagram illustrating an example, non-limiting embodiment of a communications network in accordance with various aspects described herein.

Referring now to FIG. 48, a block diagram is shown illustrating an example, non-limiting embodiment of a communications network 4800 in accordance with various aspects described herein. In particular, a communications network 4825 is presented for providing broadband access 4810 to a plurality of data terminals 4814 via access terminal 4812, wireless access 4820 to a plurality of mobile devices 4824 and vehicle 4826 via base station or access point 4822, voice access 4830 to a plurality of telephony devices 4834, via switching device 4832 and/or media access 4840 to a plurality of audio/video display devices 4844 via media terminal 4842. In addition, communication network 4825 is coupled to one or more content sources 4875 of audio, video, graphics, text and/or other media. While broadband access 4810, wireless access 4820, voice access 4830 and media access 4840 are shown separately, one or more of these forms of access can be combined to provide multiple access services to a single client device (e.g., mobile devices 4824 can receive media content via media terminal 4842, data terminal 4814 can be provided voice access via switching device 4832, and so on).

The communications network 4825 includes a plurality of network elements (NE) 4850, 4852, 4854, 4856, etc. for facilitating the broadband access 4810, wireless access 4820, voice access 4830, media access 4840 and/or the distribution of content from content sources 4875. The communications network 4825 can include a circuit switched or packet switched network, a voice over Internet protocol (VoIP) network, Internet protocol (IP) network, a cable network, a passive or active optical network, a 4G, 5G, or higher generation wireless access network, WIMAX network, UltraWideband network, personal area network or other wireless access network, a broadcast satellite network and/or other communications network.

In various embodiments, the access terminal 4812 can include a digital subscriber line access multiplexer (DSLAM), cable modem termination system (CMTS), optical line terminal (OLT) and/or other access terminal. The data terminals 4814 can include personal computers, laptop computers, netbook computers, tablets or other computing devices along with digital subscriber line (DSL) modems, data over coax service interface specification (DOCSIS) modems or other cable modems, a wireless modem such as a 4G, 5G, or higher generation modem, an optical modem and/or other access devices.

In various embodiments, the base station or access point 4822 can include a 4G, 5G, or higher generation base station, an access point that operates via an 802.11 standard such as 802.11n, 802.11ac or other wireless access terminal. The mobile devices 4824 can include mobile phones, e-readers, tablets, phablets, wireless modems, and/or other mobile computing devices.

In various embodiments, the switching device 4832 can include a private branch exchange or central office switch, a media services gateway, VoIP gateway or other gateway device and/or other switching device. The telephony devices 4834 can include traditional telephones (with or without a terminal adapter), VoIP telephones and/or other telephony devices.

In various embodiments, the media terminal 4842 can include a cable head-end or other TV head-end, a satellite receiver, gateway or other media terminal 4842. The display devices 4844 can include televisions with or without a set top box, personal computers and/or other display devices.

In various embodiments, the content sources 4875 include broadcast television and radio sources, video on demand platforms and streaming video and audio services platforms, one or more content data networks, data servers, web servers and other content servers, and/or other sources of media.

In various embodiments, the communications network 4825 can include wired, optical and/or wireless links and the network elements 4850, 4852, 4854, 4856, etc. can include service switching points, signal transfer points, service control points, network gateways, media distribution hubs, servers, firewalls, routers, edge devices, switches and other network nodes for routing and controlling communications traffic over wired, optical and wireless links as part of the Internet and other public networks as well as one or more private networks, for managing subscriber access, for billing and network management and for supporting other network functions.

It will be appreciated that any of the subsystems (e.g., access terminal 4812, network elements 4850-4856, media terminal 4842, switching device 4832, wireless access 4820, and so on) of the communication network 4800 can be configured or otherwise adapted to utilize in whole or in part any of the embodiments of the subject disclosure for transmitting and receiving communication signals via electromagnetic waves that propagate over wireless or physical transmission media.

Figure 49:
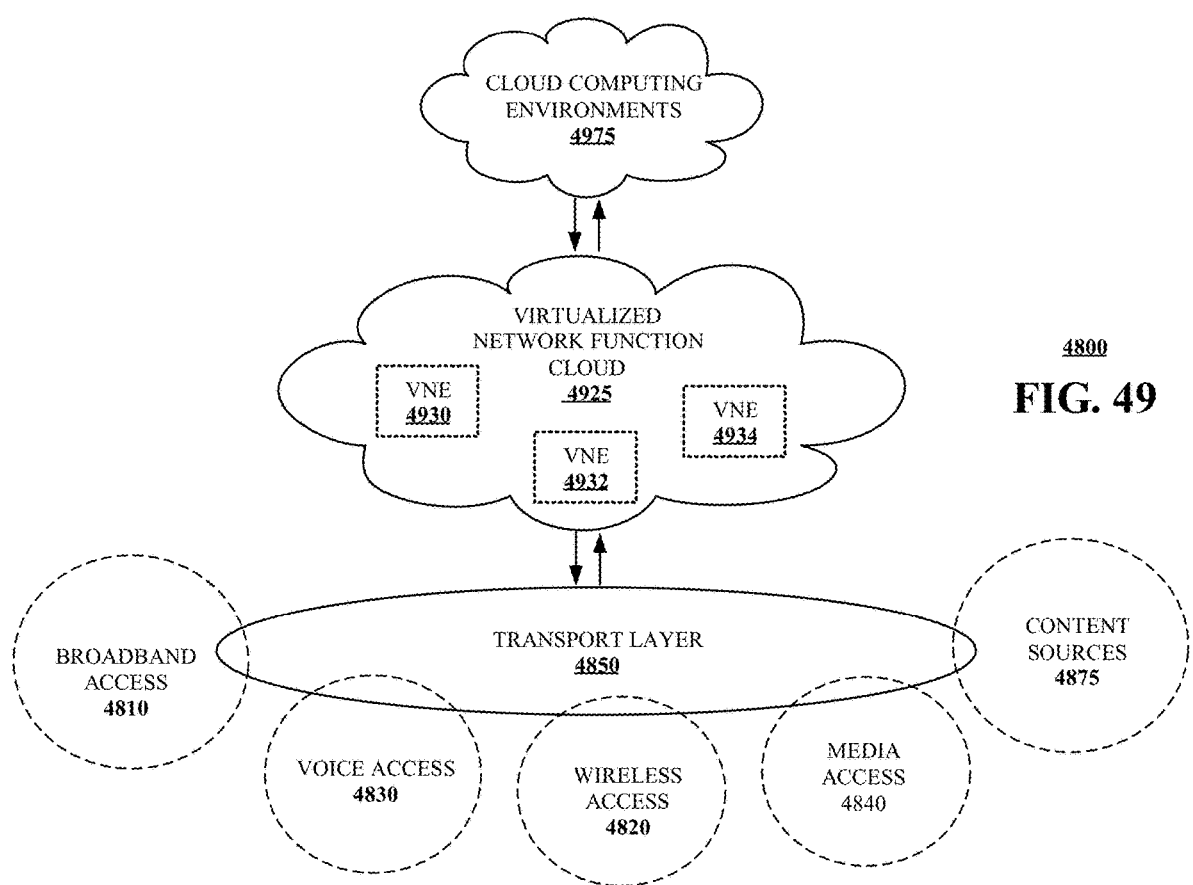
FIG. 49 is a block diagram illustrating an example, non-limiting embodiment of a virtualized communication network in accordance with various aspects described herein.

Referring now to FIG. 49, a block diagram 4900 is shown illustrating an example, non-limiting embodiment of a virtualized communication network in accordance with various aspects described herein. In particular a virtualized communication network is presented that can be used to implement some or all of the subsystems and functions of communication network 4800, some or all of the embodiments associated with waveguide systems and methods thereof, some or all of the embodiments associated with distributed antenna systems, or other embodiments and methods thereof described by the subject disclosure.

In particular, a cloud networking architecture is shown that leverages cloud technologies and supports rapid innovation and scalability via a transport layer 4950, a virtualized network function cloud 4925 and/or one or more cloud computing environments 4975. In various embodiments, this cloud networking architecture is an open architecture that leverages application programming interfaces (APIs);

reduces complexity from services and operations; supports more nimble business models; and rapidly and seamlessly scales to meet evolving customer requirements including traffic growth, diversity of traffic types, and diversity of performance and reliability expectations.

In contrast to traditional network elements—which are typically integrated to perform a single function, the virtualized communication network employs virtual network elements 4930, 4932, 4934, etc. that perform some or all of the functions of network elements 4850, 4852, 4854, 4856, etc. For example, the network architecture can provide a substrate of networking capability, often called Network Function Virtualization Infrastructure (NFVI) or simply infrastructure that is capable of being directed with software and Software Defined Networking (SDN) protocols to perform a broad variety of network functions and services. This infrastructure can include several types of substrates. The most typical type of substrate being servers that support Network Function Virtualization (NFV), followed by packet forwarding capabilities based on generic computing resources, with specialized network technologies brought to bear when general purpose processors or general purpose integrated circuit devices offered by merchants (referred to herein as merchant silicon) are not appropriate. In this case, communication services can be implemented as cloud-centric workloads.

As an example, a traditional network element 4850 (shown in FIG. 48), such as an edge router can be implemented via a virtual network element 4930 composed of NFV software modules, merchant silicon, and associated controllers. The software can be written so that increasing workload consumes incremental resources from a common resource pool, and moreover so that it's elastic: so the resources are only consumed when needed. In a similar fashion, other network elements such as other routers, switches, edge caches, and middle-boxes are instantiated from the common resource pool. Such sharing of infrastructure across a broad set of uses makes planning and growing infrastructure easier to manage.

In an embodiment, the transport layer 4950 includes fiber, cable, wired and/or wireless transport elements, network elements and interfaces to provide broadband access 4810, wireless access 4820, voice access 4830, media access 4840 and/or access to content sources 4875 for distribution of content to any or all of the access technologies. In particular, in some cases a network element needs to be positioned at a specific place, and this allows for less sharing of common infrastructure. Other times, the network elements have specific physical layer adapters that cannot be abstracted or virtualized, and might require special DSP code and analog front-ends (AFEs) that do not lend themselves to implementation as virtual network elements 4930, 4932 or 4934. These network elements can be included in transport layer 4950.

The virtualized network function cloud 4925 interfaces with the transport layer 4950 to provide the virtual network elements 4930, 4932, 4934, etc. to provide specific NFVs. In particular, the virtualized network function cloud 4925 leverages cloud operations, applications, and architectures to support networking workloads. The virtualized network elements 4930, 4932 and 4934 can employ network function software that provides either a one-for-one mapping of traditional network element function or alternately some combination of network functions designed for cloud computing. For example, virtualized network elements 4930, 4932 and 4934 can include route reflectors, domain name system (DNS) servers, and dynamic host configuration protocol (DHCP) servers, system architecture evolution (SAE) and/or mobility management entity (MME) gateways, broadband network gateways, IP edge routers for IP-VPN, Ethernet and other services, load balancers, distributers and other network elements. Because these elements don't typically need to forward large amounts of traffic, their workload can be distributed across a number of servers—each of which adds a portion of the capability, and overall which creates an elastic function with higher availability than its former monolithic version. These virtual network elements 4930, 4932, 4934, etc. can be instantiated and managed using an orchestration approach similar to those used in cloud compute services.

The cloud computing environments 4975 can interface with the virtualized network function cloud 4925 via APIs that expose functional capabilities of the VNE 4930, 4932, 4934, etc. to provide the flexible and expanded capabilities to the virtualized network function cloud 4925. In particular, network workloads may have applications distributed across the virtualized network function cloud 4925 and cloud computing environment 4975 and in the commercial cloud, or might simply orchestrate workloads supported entirely in NFV infrastructure from these third party locations.

It will be appreciated that any of the foregoing techniques can be applied or combined in whole or in party with any embodiments of the subsystems and functions of communication network 4800, some or all of the embodiments associated with waveguide systems and methods thereof, some or all of the embodiments associated with distributed antenna systems, as well as other embodiments and methods thereof described by the subject disclosure.

Figure 50:
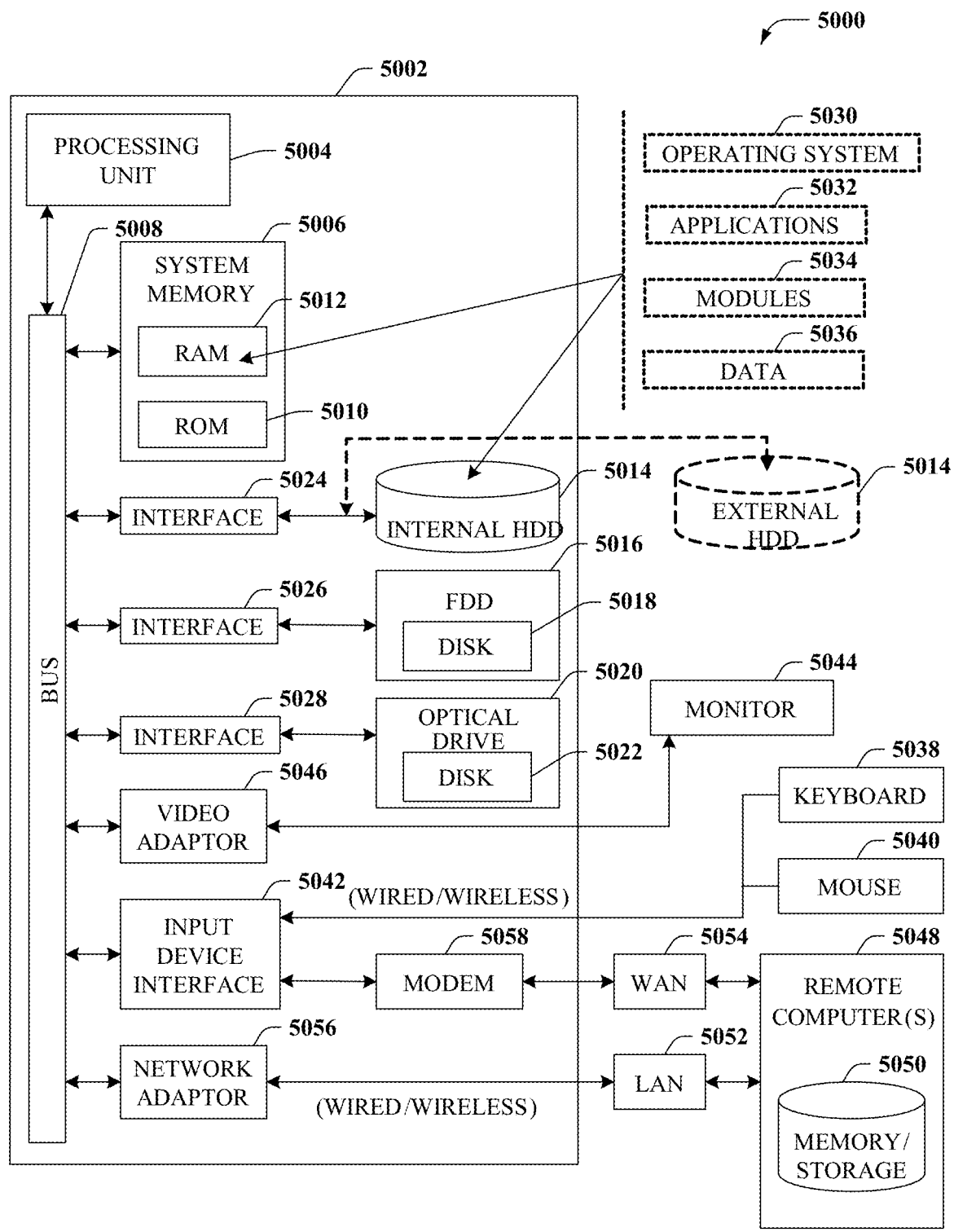
FIG. 50 is a block diagram of an example, non-limiting embodiment of a computing environment in accordance with various aspects described herein.

Referring now to FIG. 50, there is illustrated a block diagram of a computing environment in accordance with various aspects described herein. In order to provide additional context for various embodiments of the embodiments described herein, FIG. 50 and the following discussion are intended to provide a brief, general description of a suitable computing environment 5000 in which the various embodiments of the subject disclosure can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules comprise routines, programs, components, data structures, etc., that perform particular tasks or implement particular abstract data types. Moreover, those skilled in the art will appreciate that the inventive methods can be practiced with other computer system configurations, comprising single-processor or multiprocessor computer systems, minicomputers, mainframe computers, as well as personal computers, hand-held computing devices, microprocessor-based or programmable consumer electronics, and the like, each of which can be operatively coupled to one or more associated devices.

As used herein, a processing circuit includes processor as well as other application specific circuits such as an application specific integrated circuit, digital logic circuit, state machine, programmable gate array or other circuit that processes input signals or data and that produces output signals or data in response thereto. It should be noted that while any functions and features described herein in association with the operation of a processor could likewise be performed by a processing circuit.

The terms "first," "second," "third," and so forth, as used in the claims, unless otherwise clear by context, is for clarity only and doesn't otherwise indicate or imply any order in time. For instance, "a first determination," "a second determination," and "a third determination," does not indicate or imply that the first determination is to be made before the second determination, or vice versa, etc.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically comprise a variety of media, which can comprise computer-readable storage media and/or communications media, which two terms are used herein differently from one another as follows. Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data or unstructured data.

Computer-readable storage media can comprise, but are not limited to, random access memory (RAM), read only memory (ROM), electrically erasable programmable read only memory (EEPROM), flash memory or other memory technology, compact disk read only memory (CD-ROM), digital versatile disk (DVD) or other optical disk storage, magnetic cassettes, magnetic tape, magnetic disk storage or other magnetic storage devices or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communication media comprise wired media, such as a wired network or direct-wired connection, and wireless media such as acoustic, RF, infrared and other wireless media.

With reference again to FIG. 50, the example environment 5000 for transmitting and receiving signals via or forming at least part of a base station (e.g., base station devices 1504, macrocell site 1502, or base stations 1614) or central office (e.g., central office 1501 or 1611). At least a portion of the example environment 5000 can also be used for transmission devices 101 or 102. The example environment can comprise a computer 5002, the computer 5002 comprising a processing unit 5004, a system memory 5006 and a system bus 5008. The system bus 5008 couple's system components including, but not limited to, the system memory 5006 to the processing unit 5004. The processing unit 5004 can be any of various commercially available processors. Dual microprocessors and other multiprocessor architectures can also be employed as the processing unit 5004.

The system bus 5008 can be any of several types of bus structure that can further interconnect to a memory bus (with or without a memory controller), a peripheral bus, and a local bus using any of a variety of commercially available bus architectures. The system memory 5006 comprises ROM 5010 and RAM 5012. A basic input/output system (BIOS) can be stored in a non-volatile memory such as ROM, erasable programmable read only memory (EPROM), EEPROM, which BIOS contains the basic routines that help to transfer information between elements within the computer 5002, such as during startup. The RAM 5012 can also comprise a high-speed RAM such as static RAM for caching data.

The computer 5002 further comprises an internal hard disk drive (HDD) 5014 (e.g., EIDE, SATA), which internal hard disk drive 5014 can also be configured for external use in a suitable chassis (not shown), a magnetic floppy disk drive (FDD) 5016, (e.g., to read from or write to a removable diskette 5018) and an optical disk drive 5020, (e.g., reading a CD-ROM disk 5022 or, to read from or write to other high capacity optical media such as the DVD). The hard disk drive 5014, magnetic disk drive 5016 and optical disk drive 5020 can be connected to the system bus 5008 by a hard disk drive interface 5024, a magnetic disk drive interface 5026 and an optical drive interface 5028, respectively. The interface 5024 for external drive implementations comprises at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 5002, the drives and storage media accommodate the storage of any data in a suitable digital format. Although the description of computer-readable storage media above refers to a hard disk drive (HDD), a removable magnetic diskette, and a removable optical media such as a CD or DVD, it should be appreciated by those skilled in the art that other types of storage media which are readable by a computer, such as zip drives, magnetic cassettes, flash memory cards, cartridges, and the like, can also be used in the example operating environment, and further, that any such storage media can contain computer-executable instructions for performing the methods described herein.

A number of program modules can be stored in the drives and RAM 5012, comprising an operating system 5030, one or more application programs 5032, other program modules 5034 and program data 5036. All or portions of the operating system, applications, modules, and/or data can also be cached in the RAM 5012. The systems and methods described herein can be implemented utilizing various commercially available operating systems or combinations of operating systems. Examples of application programs 5032 that can be implemented and otherwise executed by processing unit 5004 include the diversity selection determining performed by transmission device 101 or 102.

A user can enter commands and information into the computer 5002 through one or more wired/wireless input devices, e.g., a keyboard 5038 and a pointing device, such as a mouse 5040. Other input devices (not shown) can comprise a microphone, an infrared (IR) remote control, a joystick, a game pad, a stylus pen, touch screen or the like. These and other input devices are often connected to the processing unit 5004 through an input device interface 5042 that can be coupled to the system bus 5008, but can be connected by other interfaces, such as a parallel port, an IEEE 1394 serial port, a game port, a universal serial bus (USB) port, an IR interface, etc.

A monitor 5044 or other type of display device can be also connected to the system bus 5008 via an interface, such as a video adapter 5046. It will also be appreciated that in alternative embodiments, a monitor 5044 can also be any display device (e.g., another computer having a display, a smart phone, a tablet computer, etc.) for receiving display information associated with computer 5002 via any communication means, including via the Internet and cloud-based networks. In addition to the monitor 5044, a computer typically comprises other peripheral output devices (not shown), such as speakers, printers, etc.

The computer 5002 can operate in a networked environment using logical connections via wired and/or wireless communications to one or more remote computers, such as a remote computer(s) 5048. The remote computer(s) 5048 can be a workstation, a server computer, a router, a personal computer, portable computer, microprocessor-based entertainment appliance, a peer device or other common network node, and typically comprises many or all of the elements described relative to the computer 5002, although, for purposes of brevity, only a memory/storage device 5050 is illustrated. The logical connections depicted comprise wired/wireless connectivity to a local area network (LAN) 5052 and/or larger networks, e.g., a wide area network (WAN) 5054. Such LAN and WAN networking environments are commonplace in offices and companies, and facilitate enterprise-wide computer networks, such as intranets, all of which can connect to a global communications network, e.g., the Internet.

When used in a LAN networking environment, the computer 5002 can be connected to the local network 5052 through a wired and/or wireless communication network interface or adapter 5056. The adapter 5056 can facilitate wired or wireless communication to the LAN 5052, which can also comprise a wireless AP disposed thereon for communicating with the wireless adapter 5056.

When used in a WAN networking environment, the computer 5002 can comprise a modem 5058 or can be connected to a communications server on the WAN 5054 or has other means for establishing communications over the WAN 5054, such as by way of the Internet. The modem 5058, which can be internal or external and a wired or wireless device, can be connected to the system bus 5008 via the input device interface 5042. In a networked environment, program modules depicted relative to the computer 5002 or portions thereof, can be stored in the remote memory/storage device 5050. It will be appreciated that the network connections shown are example and other means of establishing a communications link between the computers can be used.

The computer 5002 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This can comprise Wireless Fidelity (Wi-Fi) and Bluetooth® wireless technologies. Thus, the communication can be a predefined structure as with a conventional network or simply an ad hoc communication between at least two devices.

Wi-Fi can allow connection to the Internet from a couch at home, a bed in a hotel room or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, n, ac, ag etc.) to provide secure, reliable, fast wireless connectivity. A Wi-Fi network can be used to connect computers to each other, to the Internet, and to wired networks (which can use IEEE 802.3 or Ethernet). Wi-Fi networks operate in the unlicensed 2.4 and 5 GHz radio bands for example or with products that contain both bands (dual band), so the networks can provide real-world performance similar to the basic 10BaseT wired Ethernet networks used in many offices.

Figure 51:
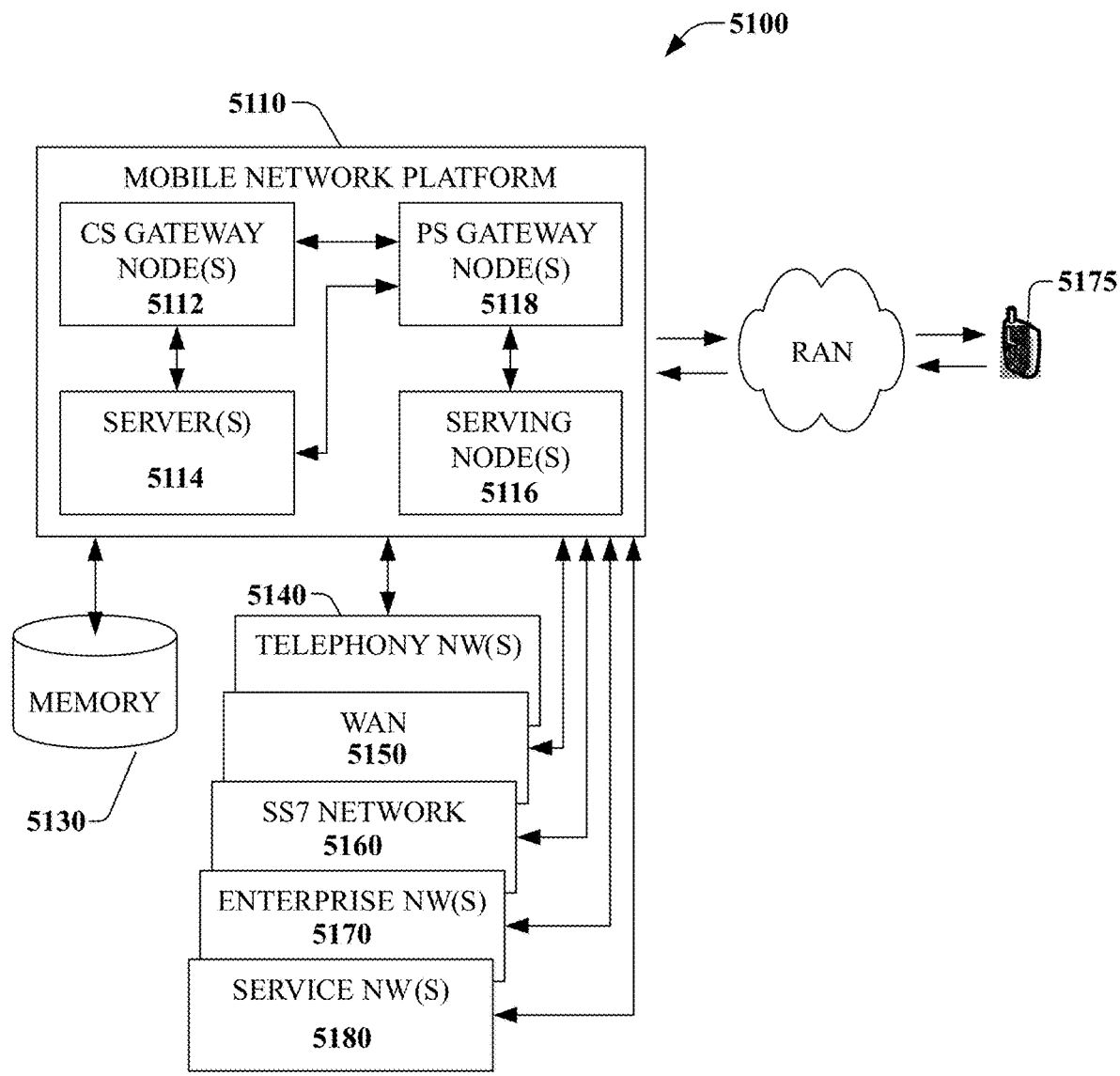
FIG. 51 is a block diagram of an example, non-limiting embodiment of a mobile network platform in accordance with various aspects described herein.

FIG. 51 presents an example embodiment 5100 of a mobile network platform 5110 that can implement and exploit one or more aspects of the disclosed subject matter described herein. In one or more embodiments, the mobile network platform 5110 can generate and receive signals transmitted and received by base stations (e.g., base station devices 1504, macrocell site 1502, or base stations 1614), central office (e.g., central office 1501 or 1611), or transmission device 101 or 102 associated with the disclosed subject matter. Generally, wireless network platform 5110 can comprise components, e.g., nodes, gateways, interfaces, servers, or disparate platforms, that facilitate both packet-switched (PS) (e.g., internet protocol (IP), frame relay, asynchronous transfer mode (ATM)) and circuit-switched (CS) traffic (e.g., voice and data), as well as control generation for networked wireless telecommunication. As a non-limiting example, wireless network platform 5110 can be included in telecommunications carrier networks, and can be considered carrier-side components as discussed elsewhere herein. Mobile network platform 5110 comprises CS gateway node(s) 5122 which can interface CS traffic received from legacy networks like telephony network(s) 5140 (e.g., public switched telephone network (PSTN), or public land mobile network (PLMN)) or a signaling system #7 (SS7) network 5170. Circuit switched gateway node(s) 5122 can authorize and authenticate traffic (e.g., voice) arising from such networks. Additionally, CS gateway node(s) 5122 can access mobility, or roaming, data generated through SS7 network 5170; for instance, mobility data stored in a visited location register (VLR), which can reside in memory 5130. Moreover, CS gateway node(s) 5122 interfaces CS-based traffic and signaling and PS gateway node(s) 5118. As an example, in a 3GPP UMTS network, CS gateway node(s) 5122 can be realized at least in part in gateway GPRS support node(s) (GGSN). It should be appreciated that functionality and specific operation of CS gateway node(s) 5122, PS gateway node(s) 5118, and serving node(s) 5116, is provided and dictated by radio technology(ies) utilized by mobile network platform 5110 for telecommunication.

In addition to receiving and processing CS-switched traffic and signaling, PS gateway node(s) 5118 can authorize and authenticate PS-based data sessions with served mobile devices. Data sessions can comprise traffic, or content(s), exchanged with networks external to the wireless network platform 5110, like wide area network(s) (WANs) 5150, enterprise network(s) 5170, and service network(s) 5180, which can be embodied in local area network(s) (LANs), can also be interfaced with mobile network platform 5110 through PS gateway node(s) 5118. It is to be noted that WANs 5150 and enterprise network(s) 5160 can embody, at least in part, a service network(s) like IP multimedia subsystem (IMS). Based on radio technology layer(s) available in technology resource(s) 5117, packet-switched gateway node(s) 5118 can generate packet data protocol contexts when a data session is established; other data structures that facilitate routing of packetized data also can be generated. To that end, in an aspect, PS gateway node(s) 5118 can comprise a tunnel interface (e.g., tunnel termination gateway (TTG) in 3GPP UMTS network(s) (not shown)) which can facilitate packetized communication with disparate wireless network(s), such as Wi-Fi networks.

In embodiment 5100, wireless network platform 5110 also comprises serving node(s) 5116 that, based upon available radio technology layer(s) within technology resource(s) 5117, convey the various packetized flows of data streams received through PS gateway node(s) 5118. It is to be noted that for technology resource(s) 5117 that rely primarily on CS communication, server node(s) can deliver traffic without reliance on PS gateway node(s) 5118; for example, server node(s) can embody at least in part a mobile switching center. As an example, in a 3GPP UMTS network, serving node(s) 5116 can be embodied in serving GPRS support node(s) (SGSN).

For radio technologies that exploit packetized communication, server(s) 5114 in wireless network platform 5110 can execute numerous applications that can generate multiple disparate packetized data streams or flows, and manage (e.g., schedule, queue, format ... ) such flows. Such application(s) can comprise add-on features to standard services (for example, provisioning, billing, customer support ... ) provided by wireless network platform 5110. Data streams (e.g., content(s) that are part of a voice call or data session) can be conveyed to PS gateway node(s) 5118 for authorization/authentication and initiation of a data session, and to serving node(s) 5116 for communication thereafter. In addition to application server, server(s) 5114 can comprise utility server(s), a utility server can comprise a provisioning server, an operations and maintenance server, a security server that can implement at least in part a certificate authority and firewalls as well as other security mechanisms, and the like. In an aspect, security server(s) secure communication served through wireless network platform 5110 to ensure network's operation and data integrity in addition to authorization and authentication procedures that CS gateway node(s) 5122 and PS gateway node(s) 5118 can enact. Moreover, provisioning server(s) can provision services from external network(s) like networks operated by a disparate service provider; for instance, WAN 5150 or Global Positioning System (GPS) network(s) (not shown). Provisioning server(s) can also provision coverage through networks associated to wireless network platform 5110 (e.g., deployed and operated by the same service provider), such as the distributed antennas networks shown in FIG. 1 that enhance wireless service coverage by providing more network coverage. Repeater devices such as those shown in FIGS. 7, 8, and 9 also improve network coverage in order to enhance subscriber service experience by way of UE 5175.

It is to be noted that server(s) 5114 can comprise one or more processors configured to confer at least in part the functionality of macro network platform 5110. To that end, the one or more processor can execute code instructions stored in memory 5130, for example. It is should be appreciated that server(s) 5114 can comprise a content manager 5115, which operates in substantially the same manner as described hereinbefore.

In example embodiment 5100, memory 5130 can store information related to operation of wireless network platform 5110. Other operational information can comprise provisioning information of mobile devices served through wireless platform network 5110, subscriber databases; application intelligence, pricing schemes, e.g., promotional rates, flat-rate programs, couponing campaigns; technical specification(s) consistent with telecommunication protocols for operation of disparate radio, or wireless, technology layers; and so forth. Memory 5130 can also store information from at least one of telephony network(s) 5140, WAN 5150, enterprise network(s) 5170, or SS7 network 5160. In an aspect, memory 5130 can be, for example, accessed as part of a data store component or as a remotely connected memory store.

In order to provide a context for the various aspects of the disclosed subject matter, FIG. 51, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules comprise routines, programs, components, data structures, etc. that perform particular tasks and/or implement particular abstract data types.

Figure 52:
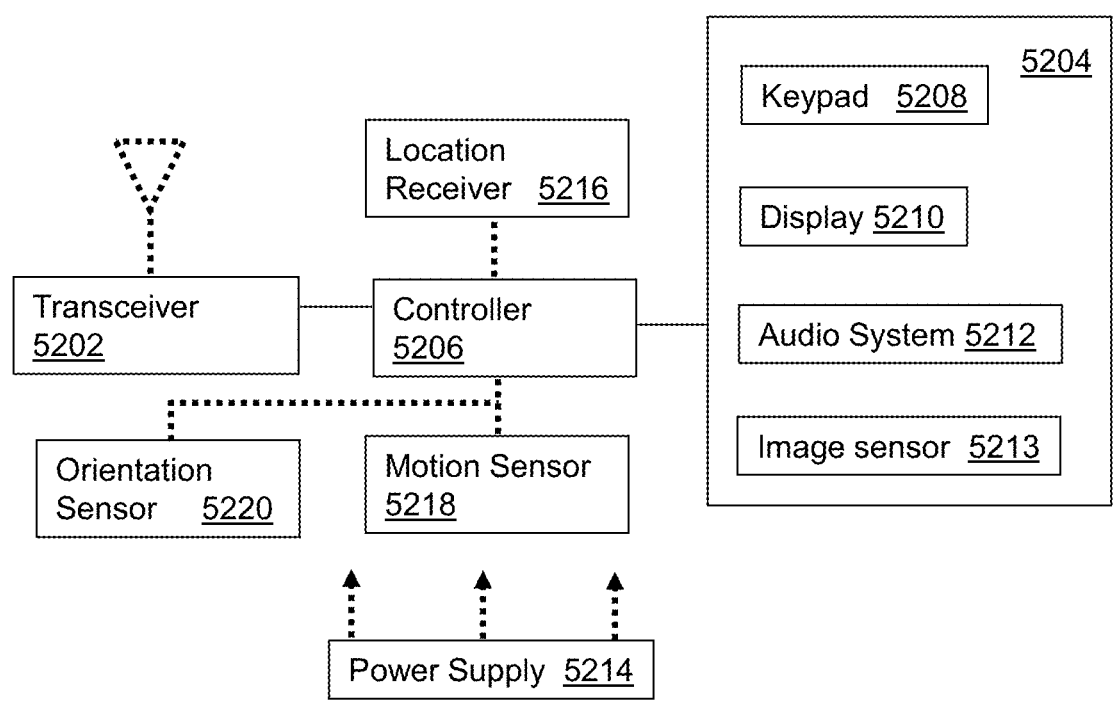
FIG. 52 is a block diagram of an example, non-limiting embodiment of a communication device in accordance with various aspects described herein.

FIG. 52 depicts an illustrative embodiment of a communication device 5200. The communication device 5200 can serve as an illustrative embodiment of devices such as mobile devices and in-building devices referred to by the subject disclosure (e.g., in FIGS. 15, 16A and 16B).

The communication device 5200 can comprise a wireline and/or wireless transceiver 5202 (herein transceiver 5202), a user interface (UI) 5204, a power supply 5214, a location receiver 5216, a motion sensor 5218, an orientation sensor 5220, and a controller 5206 for managing operations thereof. The transceiver 5202 can support short-range or long-range wireless access technologies such as Bluetooth®, ZigBee®, WiFi, DECT, or cellular communication technologies, just to mention a few (Bluetooth® and ZigBee® are trademarks registered by the Bluetooth® Special Interest Group and the ZigBee® Alliance, respectively). Cellular technologies can include, for example, CDMA-1x, UMTS/HSDPA, GSM/GPRS, TDMA/EDGE, EV/DO, WiMAX, SDR, LTE, as well as other next generation wireless communication technologies as they arise. The transceiver 5202 can also be adapted to support circuit-switched wireline access technologies (such as PSTN), packet-switched wireline access technologies (such as TCP/IP, VoIP, etc.), and combinations thereof.

The UI 5204 can include a depressible or touch-sensitive keypad 5208 with a navigation mechanism such as a roller ball, a joystick, a mouse, or a navigation disk for manipulating operations of the communication device 5200. The keypad 5208 can be an integral part of a housing assembly of the communication device 5200 or an independent device operably coupled thereto by a tethered wireline interface (such as a USB cable) or a wireless interface supporting for example Bluetooth®. The keypad 5208 can represent a numeric keypad commonly used by phones, and/or a QWERTY keypad with alphanumeric keys. The UI 5204 can further include a display 5210 such as monochrome or color LCD (Liquid Crystal Display), OLED (Organic Light Emitting Diode) or other suitable display technology for conveying images to an end user of the communication device 5200. In an embodiment where the display 5210 is touch-sensitive, a portion or all of the keypad 5208 can be presented by way of the display 5210 with navigation features.

The display 5210 can use touch screen technology to also serve as a user interface for detecting user input. As a touch screen display, the communication device 5200 can be adapted to present a user interface having graphical user interface (GUI) elements that can be selected by a user with a touch of a finger. The touch screen display 5210 can be equipped with capacitive, resistive or other forms of sensing technology to detect how much surface area of a user's finger has been placed on a portion of the touch screen display. This sensing information can be used to control the manipulation of the GUI elements or other functions of the user interface. The display 5210 can be an integral part of the housing assembly of the communication device 5200 or an independent device communicatively coupled thereto by a tethered wireline interface (such as a cable) or a wireless interface.

The UI 5204 can also include an audio system 5212 that utilizes audio technology for conveying low volume audio (such as audio heard in proximity of a human ear) and high volume audio (such as speakerphone for hands free operation). The audio system 5212 can further include a microphone for receiving audible signals of an end user. The audio system 5212 can also be used for voice recognition applications. The UI 5204 can further include an image sensor 5213 such as a charged coupled device (CCD) camera for capturing still or moving images.

The power supply 5214 can utilize common power management technologies such as replaceable and rechargeable batteries, supply regulation technologies, and/or charging system technologies for supplying energy to the components of the communication device 5200 to facilitate long-range or short-range portable communications. Alternatively, or in combination, the charging system can utilize external power sources such as DC power supplied over a physical interface such as a USB port or other suitable tethering technologies.

The location receiver 5216 can utilize location technology such as a global positioning system (GPS) receiver capable of assisted GPS for identifying a location of the communication device 5200 based on signals generated by a constellation of GPS satellites, which can be used for facilitating location services such as navigation. The motion sensor 5218 can utilize motion sensing technology such as an accelerometer, a gyroscope, or other suitable motion sensing technology to detect motion of the communication device 5200 in three-dimensional space. The orientation sensor 5220 can utilize orientation sensing technology such as a magnetometer to detect the orientation of the communication device 5200 (north, south, west, and east, as well as combined orientations in degrees, minutes, or other suitable orientation metrics).

The communication device 5200 can use the transceiver 5202 to also determine a proximity to a cellular, WiFi, Bluetooth®, or other wireless access points by sensing techniques such as utilizing a received signal strength indicator (RSSI) and/or signal time of arrival (TOA) or time of flight (TOF) measurements. The controller 5206 can utilize computing technologies such as a microprocessor, a digital signal processor (DSP), programmable gate arrays, application specific integrated circuits, and/or a video processor with associated storage memory such as Flash, ROM, RAM, SRAM, DRAM or other storage technologies for executing computer instructions, controlling, and processing data supplied by the aforementioned components of the communication device 5200.

Other components not shown in FIG. 52 can be used in one or more embodiments of the subject disclosure. For instance, the communication device 5200 can include a slot for adding or removing an identity module such as a Subscriber Identity Module (SIM) card or Universal Integrated Circuit Card (UICC). SIM or UICC cards can be used for identifying subscriber services, executing programs, storing subscriber data, and so on.

In the subject specification, terms such as "store," "storage," "data store," data storage," "database," and substantially any other information storage component relevant to operation and functionality of a component, refer to "memory components," or entities embodied in a "memory" or components comprising the memory. It will be appreciated that the memory components described herein can be either volatile memory or nonvolatile memory, or can comprise both volatile and nonvolatile memory, by way of illustration, and not limitation, volatile memory, non-volatile memory, disk storage, and memory storage. Further, non-volatile memory can be included in read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

Moreover, it will be noted that the disclosed subject matter can be practiced with other computer system configurations, comprising single-processor or multiprocessor computer systems, mini-computing devices, mainframe computers, as well as personal computers, hand-held computing devices (e.g., PDA, phone, smartphone, watch, tablet computers, netbook computers, etc.), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

Some of the embodiments described herein can also employ artificial intelligence (AI) to facilitate automating one or more features described herein. For example, artificial intelligence can be used in optional training controller 230 evaluate and select candidate frequencies, modulation schemes, MIMO modes, and/or guided wave modes in order to maximize transfer efficiency. The embodiments (e.g., in connection with automatically identifying acquired cell sites that provide a maximum value/benefit after addition to an existing communication network) can employ various AI-based schemes for carrying out various embodiments thereof. Moreover, the classifier can be employed to determine a ranking or priority of the each cell site of the acquired network. A classifier is a function that maps an input attribute vector, x=(x1, x2, x3, x4, . . . , xn), to a confidence that the input belongs to a class, that is, f(x)=confidence (class). Such classification can employ a probabilistic and/or statistical-based analysis (e.g., factoring into the analysis utilities and costs) to prognose or infer an action that a user desires to be automatically performed. A support vector machine (SVM) is an example of a classifier that can be employed. The SVM operates by finding a hypersurface in the space of possible inputs, which the hypersurface attempts to split the triggering criteria from the non-triggering events. Intuitively, this makes the classification correct for testing data that is near, but not identical to training data. Other directed and undirected model classification approaches comprise, e.g., naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

As will be readily appreciated, one or more of the embodiments can employ classifiers that are explicitly trained (e.g., via a generic training data) as well as implicitly trained (e.g., via observing UE behavior, operator preferences, historical information, receiving extrinsic information). For example, SVMs can be configured via a learning or training phase within a classifier constructor and feature selection module. Thus, the classifier(s) can be used to automatically learn and perform a number of functions, including but not limited to determining according to a predetermined criteria which of the acquired cell sites will benefit a maximum number of subscribers and/or which of the acquired cell sites will add minimum value to the existing communication network coverage, etc.

As used in some contexts in this application, in some embodiments, the terms "component," "system" and the like are intended to refer to, or comprise, a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, computer-executable instructions, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components. While various components have been illustrated as separate components, it will be appreciated that multiple components can be implemented as a single component, or a single component can be implemented as multiple components, without departing from example embodiments.

Further, the various embodiments can be implemented as a method, apparatus or article of manufacture using standard programming and/or engineering techniques to produce software, firmware, hardware or any combination thereof to control a computer to implement the disclosed subject matter. The term "article of manufacture" as used herein is intended to encompass a computer program accessible from any computer-readable device or computer-readable storage/communications media. For example, computer readable storage media can include, but are not limited to, magnetic storage devices (e.g., hard disk, floppy disk, magnetic strips), optical disks (e.g., compact disk (CD), digital versatile disk (DVD)), smart cards, and flash memory devices (e.g., card, stick, key drive). Of course, those skilled in the art will recognize many modifications can be made to this configuration without departing from the scope or spirit of the various embodiments.

In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or". That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, terms such as "user equipment," "mobile station," "mobile," "subscriber station," "access terminal," "terminal," "handset," "mobile device" (and/or terms representing similar terminology) can refer to a wireless device utilized by a subscriber or user of a wireless communication service to receive or convey data, control, voice, video, sound, gaming or substantially any data-stream or signaling-stream. The foregoing terms are utilized interchangeably herein and with reference to the related drawings.

Furthermore, the terms "user," "subscriber," "customer," "consumer" and the like are employed interchangeably throughout, unless context warrants particular distinctions among the terms. It should be appreciated that such terms can refer to human entities or automated components supported through artificial intelligence (e.g., a capacity to make inference based, at least, on complex mathematical formalisms), which can provide simulated vision, sound recognition and so forth.

As employed herein, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components or any combination thereof designed to perform the functions described herein. Processors can exploit nano-scale architectures such as, but not limited to, molecular and quantum-dot based transistors, switches and gates, in order to optimize space usage or enhance performance of user equipment. A processor can also be implemented as a combination of computing processing units.

As used herein, terms such as "data storage," data storage," "database," and substantially any other information storage component relevant to operation and functionality of a component, refer to "memory components," or entities embodied in a "memory" or components comprising the memory. It will be appreciated that the memory components or computer-readable storage media, described herein can be either volatile memory or nonvolatile memory or can include both volatile and nonvolatile memory.

What has been described above includes mere examples of various embodiments. It is, of course, not possible to describe every conceivable combination of components or methodologies for purposes of describing these examples, but one of ordinary skill in the art can recognize that many further combinations and permutations of the present embodiments are possible. Accordingly, the embodiments disclosed and/or claimed herein are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

As may also be used herein, the term(s) "operably coupled to", "coupled to", and/or "coupling" includes direct coupling between items and/or indirect coupling between items via one or more intervening items. Such items and intervening items include, but are not limited to, junctions, communication paths, components, circuit elements, circuits, functional blocks, and/or devices. As an example of indirect coupling, a signal conveyed from a first item to a second item may be modified by one or more intervening items by modifying the form, nature or format of information in a signal, while one or more elements of the information in the signal are nevertheless conveyed in a manner than can be recognized by the second item. In a further example of indirect coupling, an action in a first item can cause a reaction on the second item, as a result of actions and/or reactions in one or more intervening items.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

What is claimed is:

1. A waveguide system, comprising:
   a telecommunication line comprising a cable of twisted pair wires and an optical fiber;
   an inductive coupler;
   an optical power converter;
   a processing system including a processor; and
   a memory that stores executable instructions that, when executed by the processing system, facilitate performance of operations, the operations comprising:
     receiving signals that convey data;
     obtaining, by the optical power converter, first energy via the optical fiber, wherein the first energy is utilized by at least a subset of components of the waveguide system;
     obtaining, by the inductive coupler, second energy via inductive coupling with the telecommunication line of a telecommunications network, wherein an Alternating Current (AC) power signal is injected into the telecommunication line, and wherein the second energy is utilized by a transceiver to generate electromagnetic waves, wherein the transceiver is separate from the subset of components of the waveguide system; and
     transmitting the electromagnetic waves that convey the data, wherein the electromagnetic waves propagate along a power line of a power grid without requiring an electrical return path.

2. The waveguide system of claim 1, wherein the waveguide system does not obtain any energy via a direct electrical connection with the telecommunication line, and wherein the waveguide system does not obtain any energy from the power line.

3. The waveguide system of claim 1, wherein the signals are received via a tethered interface connecting the waveguide system with a network device.

4. The waveguide system of claim 3, wherein the tethered interface comprises the optical fiber.

5. The waveguide system of claim 3, wherein the signals conform to an Ethernet protocol, and wherein the network device comprises an Ethernet switch.

6. The waveguide system of claim 1, further comprising a wireless receiver, wherein the signals are received by the wireless receiver.

7. The waveguide system of claim 1, wherein the signals are received as other electromagnetic waves that convey the data, wherein the other electromagnetic waves propagate along the power line without requiring the electrical return path.

8. The waveguide system of claim 1, wherein the signals are received as other electromagnetic waves that convey the data, wherein the other electromagnetic waves propagate along a transmission medium without requiring the electrical return path, wherein the transmission medium, the power line, and the telecommunication line are separate conduits.

9. The waveguide system of claim 1, further comprising an energy storage device.

10. The waveguide system of claim 9, wherein the energy storage device comprises a supercapacitor, a battery, or a combination thereof.

11. A waveguide system, comprising:
a processing system including a processor; and
a memory that stores executable instructions that, when executed by the processing system, facilitate performance of operations, the operations comprising:
receiving signals that convey data;
obtaining Direct Current (DC) power from an optical power converter and a telecommunication line of a telecommunications network, wherein the telecommunication line comprises a cable of twisted pair wires and an optical fiber, and wherein the DC power is utilized by at least a subset of components of the waveguide system;
obtaining second energy by an inductive coupler with the telecommunication line, wherein an Alternating Current (AC) power signal is injected into the telecommunication line, and wherein the second energy is utilized by a transceiver to generate electromagnetic waves, wherein the transceiver is separate from the subset of components of the waveguide system; and
transmitting the electromagnetic waves that convey the data, wherein the electromagnetic waves propagate along a power line of a power grid without requiring an electrical return path.

12. The waveguide system of claim 11, further comprising an energy storage device.

13. The waveguide system of claim 11, wherein the signals are received via a tethered interface connecting the waveguide system with a network device.

14. The waveguide system of claim 13, wherein the processing system comprises a plurality of processors operating in a distributed computing environment.

15. The waveguide system of claim 13, wherein the signals conform to an Ethernet protocol, and wherein the network device comprises an Ethernet switch.

16. The waveguide system of claim 11, further comprising a wireless receiver, wherein the signals are received by the wireless receiver.

17. The waveguide system of claim 11, wherein the signals are received as other electromagnetic waves that convey the data, wherein the other electromagnetic waves propagate along the power line without requiring the electrical return path.

18. A method comprising:
receiving, by a waveguide system, signals that convey data;
obtaining, by the waveguide system, energy via laser light from a telecommunication line of a telecommunications network, wherein the telecommunication line comprises a fiber optic cable and twisted pair wires, and wherein the first energy is utilized by at least a subset of components of the waveguide system;
obtaining, by the waveguide system, second energy via inductive coupling with the telecommunication line, wherein the second energy is utilized by a transceiver to generate electromagnetic waves, and wherein the transceiver is separate from the subset of components of the waveguide system; and
transmitting, by the waveguide system, the electromagnetic waves that convey the data, wherein the electromagnetic waves propagate along a power line of a power grid without requiring an electrical return path.

19. The method of claim 18, wherein an Alternating Current (AC) power signal is injected into the telecommunication line.

20. The method of claim 18, wherein the obtaining the energy comprises obtaining Direct Current (DC) from the telecommunication line.

* * * * *

UNITED STATES PATENT AND TRADEMARK OFFICE
CERTIFICATE OF CORRECTION

PATENT NO. : 11,082,091 B2
APPLICATION NO. : 16/203899
DATED : August 3, 2021
INVENTOR(S) : Farhad Barzegar et al.

Page 1 of 1

It is certified that error appears in the above-identified patent and that said Letters Patent is hereby corrected as shown below:

In the Claims

Column 154 Line 19 In Claim 18 should read:
A method comprising:
receiving, by a waveguide system, signals that convey data;
obtaining, by the waveguide system, first energy via laser light from a telecommunication line of a telecommunications network, wherein the telecommunication line comprises a fiber optic cable and twisted pair wires, and wherein the first energy is utilized by at least a subset of components of the waveguide system;
obtaining, by the waveguide system, second energy via inductive coupling with the telecommunications line, wherein the second energy is utilized by a transceiver to generate electromagnetic waves, and wherein the transceiver is separate from the subset of components of the waveguide system; and
transmitting, by the waveguide system, the electromagnetic waves that convey the data, wherein the electromagnetic waves propagate along a power line of a power grid without requiring an electrical return path.

Signed and Sealed this
Thirtieth Day of November, 2021

Drew Hirshfeld
*Performing the Functions and Duties of the
Under Secretary of Commerce for Intellectual Property and
Director of the United States Patent and Trademark Office*